US010607707B2

(12) United States Patent
Shibata et al.

(10) Patent No.: US 10,607,707 B2
(45) Date of Patent: Mar. 31, 2020

(54) SEMICONDUCTOR MEMORY WITH DIFFERENT THRESHOLD VOLTAGES OF MEMORY CELLS

(71) Applicant: Toshiba Memory Corporation, Minato-ku (JP)

(72) Inventors: Noboru Shibata, Kawasaki (JP); Hironori Uchikawa, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/123,162

(22) Filed: Sep. 6, 2018

(65) Prior Publication Data

US 2019/0259458 A1   Aug. 22, 2019

(30) Foreign Application Priority Data

Feb. 22, 2018   (JP) .................................. 2018-029437

(51) Int. Cl.

| G11C 16/04 | (2006.01) |
| G11C 16/26 | (2006.01) |
| H01L 27/11582 | (2017.01) |
| H01L 27/1157 | (2017.01) |
| G11C 8/14 | (2006.01) |
| G11C 16/08 | (2006.01) |
| G11C 16/10 | (2006.01) |
| G11C 7/08 | (2006.01) |

(52) U.S. Cl.
CPC ............... *G11C 16/26* (2013.01); *G11C 7/08* (2013.01); *G11C 8/14* (2013.01); *G11C 16/0483* (2013.01); *G11C 16/08* (2013.01); *G11C 16/10* (2013.01); *H01L 27/1157* (2013.01); *H01L 27/11582* (2013.01); *G11C 2207/2245* (2013.01)

(58) Field of Classification Search
CPC ..................................................... G11C 16/04
USPC .................................................... 365/185.03
See application file for complete search history.

(56) References Cited

U.S. PATENT DOCUMENTS

| 2004/0170056 A1 | 9/2004 | Shibata et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |

(Continued)

FOREIGN PATENT DOCUMENTS

| JP | 2004-192789 | 7/2004 |
| JP | 2017-224370 | 12/2017 |

*Primary Examiner* — Hoai V Ho

(74) *Attorney, Agent, or Firm* — Oblon, McClelland, Maier & Neustadt, L.L.P.

(57) ABSTRACT

According to one embodiment, a semiconductor memory includes a first memory cell array including a plurality of first memory cells; and a second memory cell array including a plurality of second memory cells. Each of threshold voltages of the first memory cells and the second memory cells is set to any of a first threshold voltage, a second threshold voltage higher than the first threshold voltage, and a third threshold voltage higher than the second threshold voltage. Data of three or more bits including a first bit, a second bit, and a third bit is stored using a combination of a threshold voltage of the first memory cell and a threshold voltage of the second memory cell.

21 Claims, 128 Drawing Sheets

(56) References Cited

U.S. PATENT DOCUMENTS

2013/0272071 A1\* 10/2013 Moschiano ............ G11C 16/10
                                                        365/185.24
2017/0365335 A1   12/2017 Wang et al.

\* cited by examiner

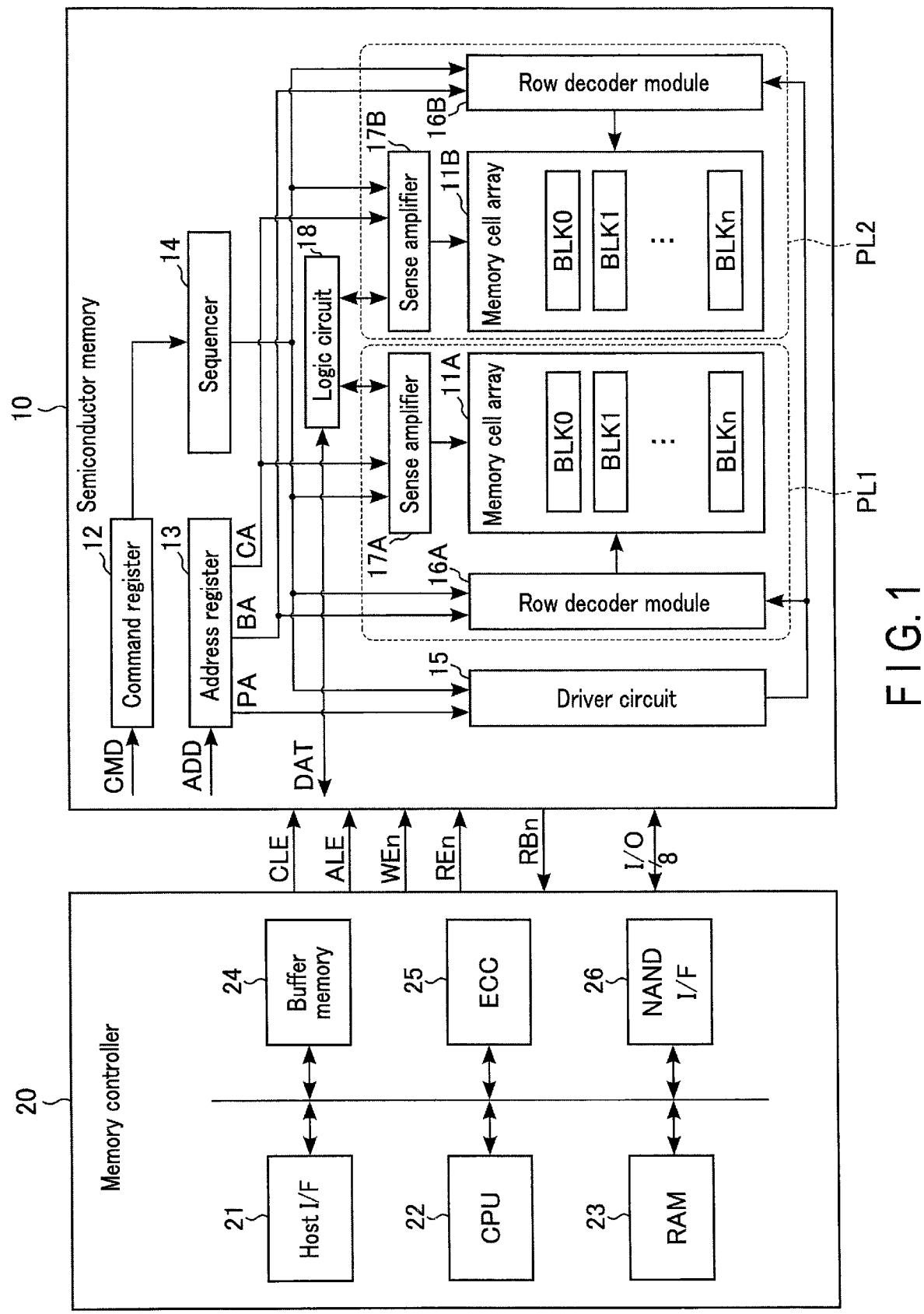
F I G. 1

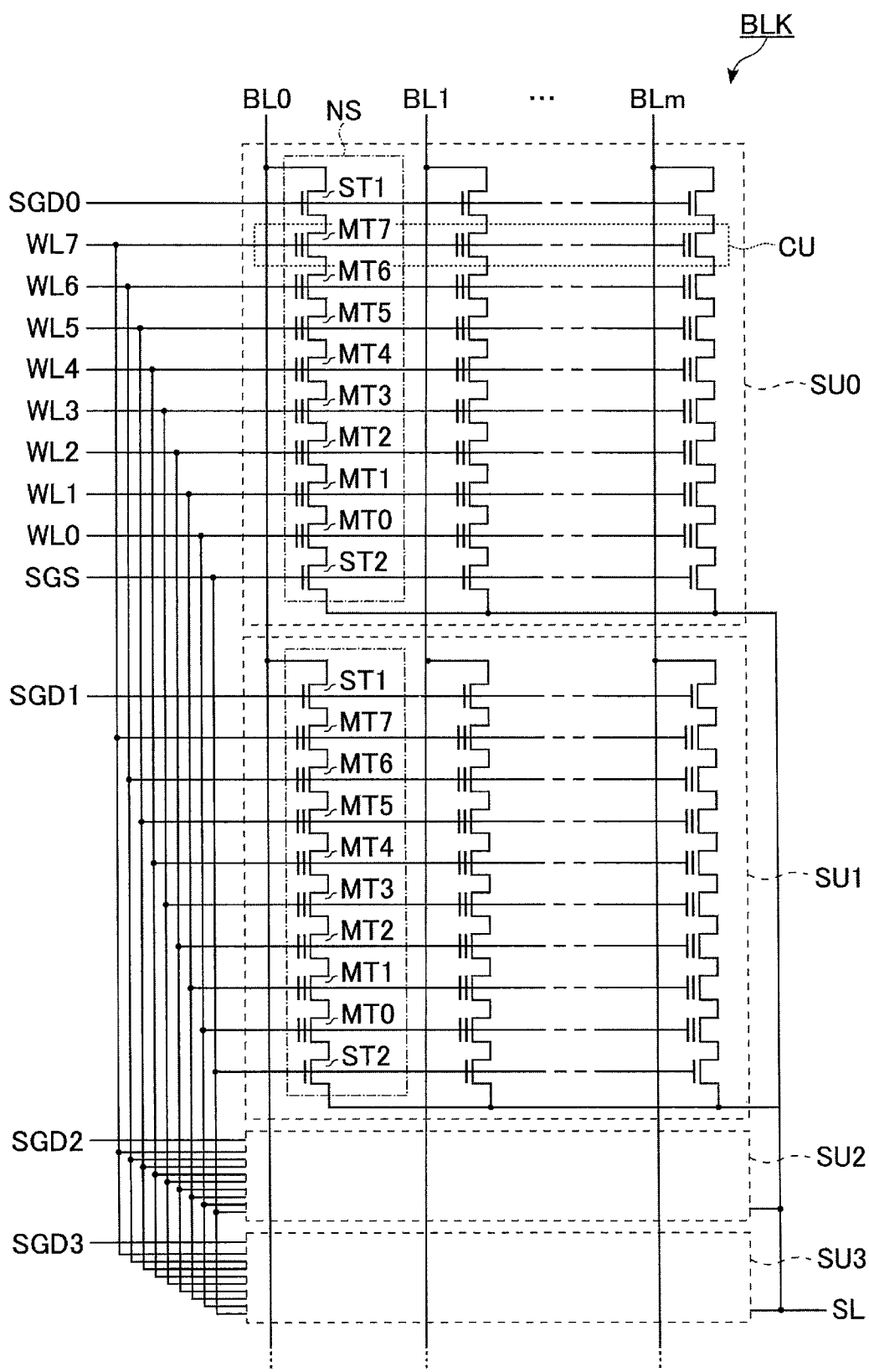
F I G. 2

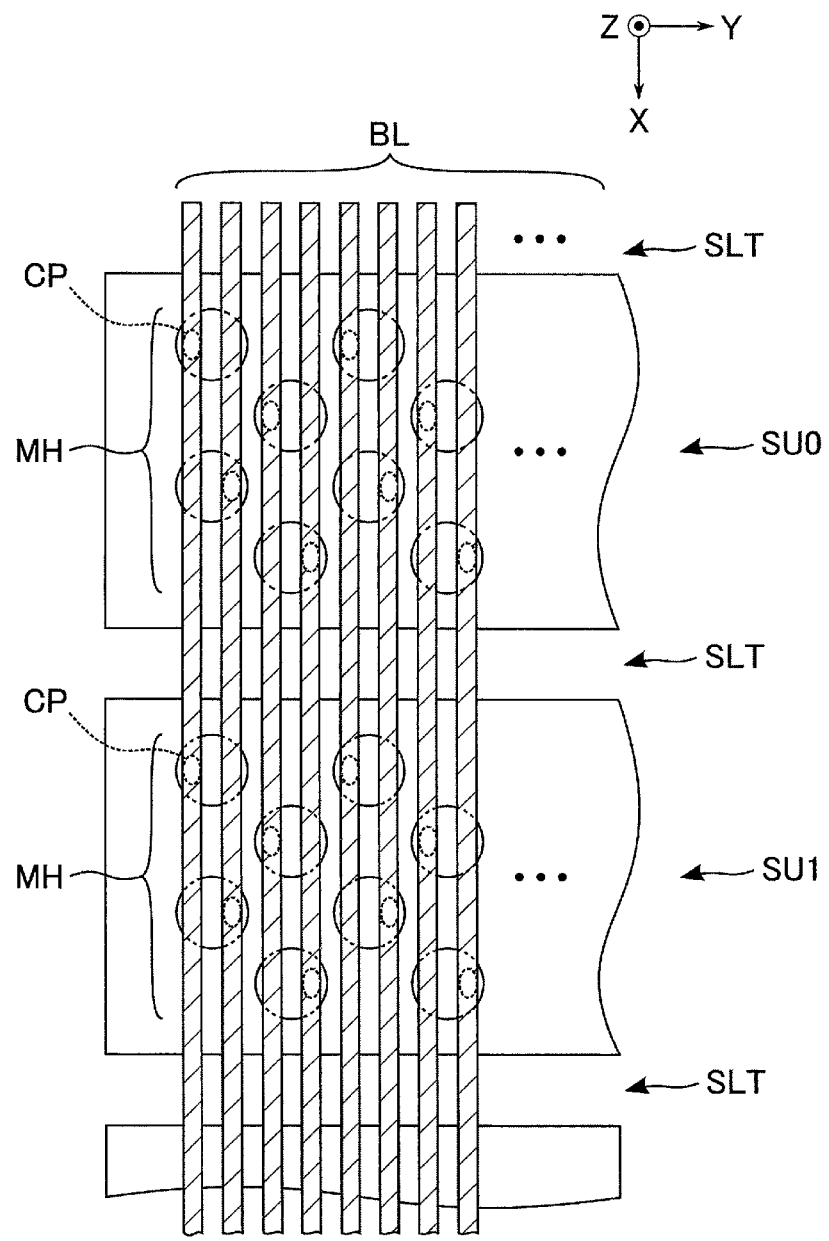
F I G. 3

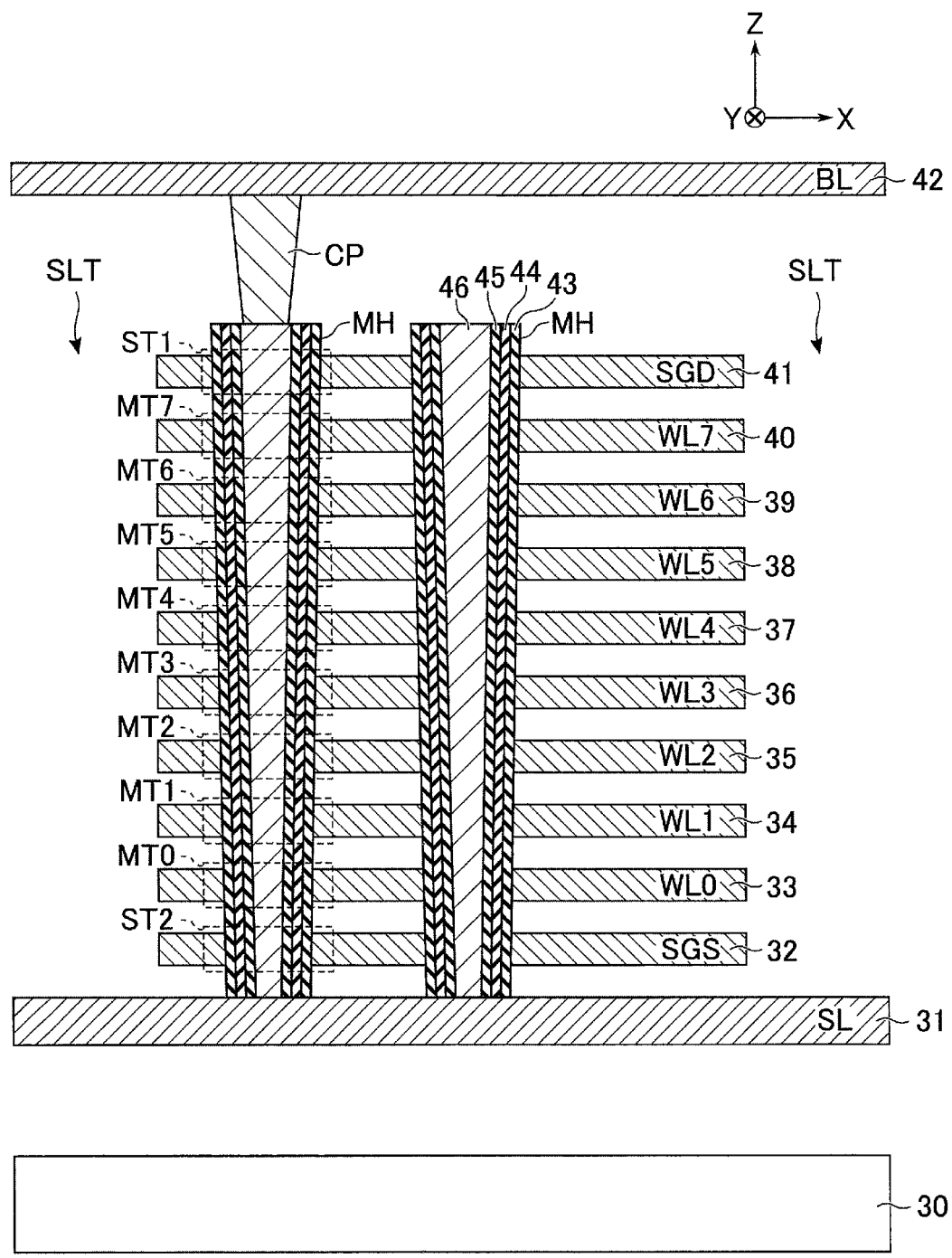
F I G. 4

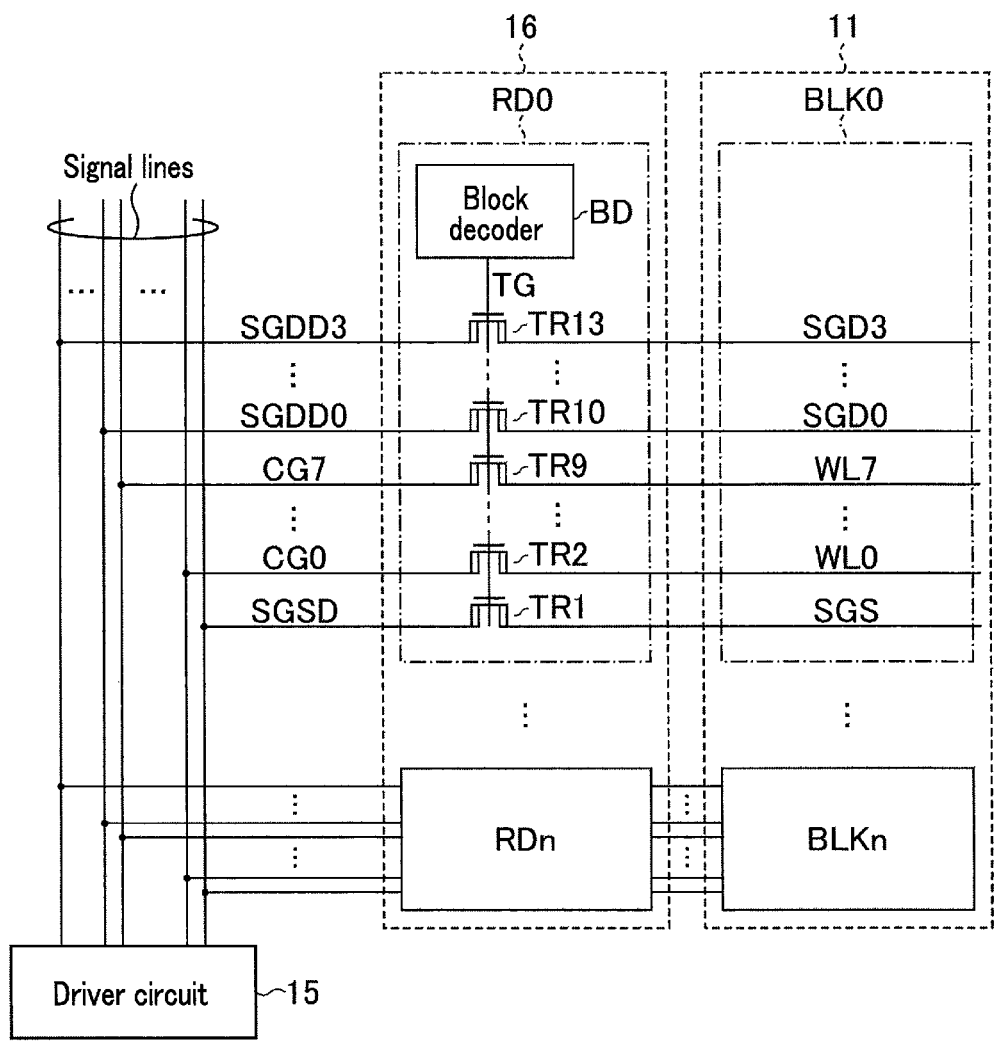
F I G. 5

Data allocation (first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 1 | 0 |
| (3) | Z | B | 1 | 0 | 0 |
| (4) | A | Z | 1 | 0 | 1 |
| (5) | A | A | 0 | 0 | 0 |
| (6) | A | B | 0 | 1 | 0 |
| (7) | B | Z | 1 | 0 | 0 |
| (8) | B | A | 0 | 0 | 1 |
| (9) | B | B | 0 | 1 | 1 |

Definitions of data (first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 1 | 1 | 0 |
| Second page | AR | BR | 1 | 0 | 0 | 1 |
| Third page | BR | AR | 1 | 0 | 0 | 1 |

FIG. 10

| Vth of memory cells | | Result of read | | | | | |
|---|---|---|---|---|---|---|---|
| First plane | Second plane | First page | | Second page | | Third page | |
| | | PL1 | PL2 | PL1 | PL2 | PL1 | PL2 |
| (1) Z | Z | L | L | L | L | L | L |
| (2) Z | A | L | H | L | L | L | H |
| (3) Z | B | L | H | L | H | L | H |
| (4) A | Z | H | L | H | L | L | L |
| (5) A | A | H | H | H | L | L | H |
| (6) A | B | H | H | H | H | L | H |
| (7) B | Z | H | L | H | L | H | L |
| (8) B | A | H | H | H | L | H | H |
| (9) B | B | H | H | H | H | H | H |
| Read voltage | | AR | AR | AR | BR | BR | AR |

F I G. 11

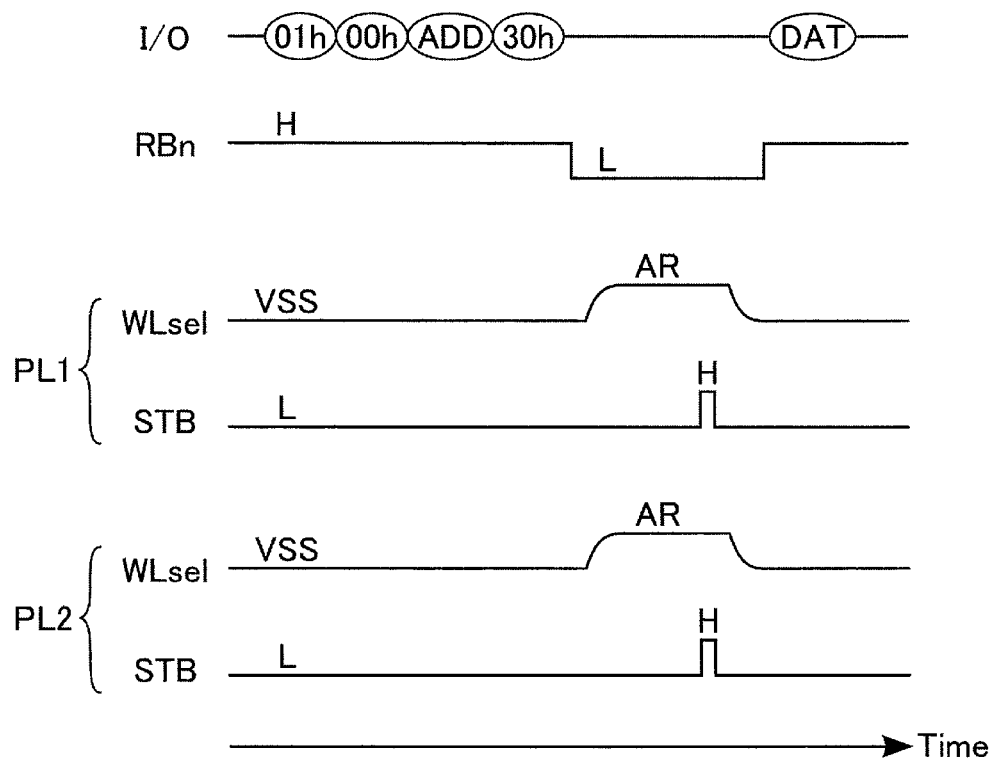
F I G. 13

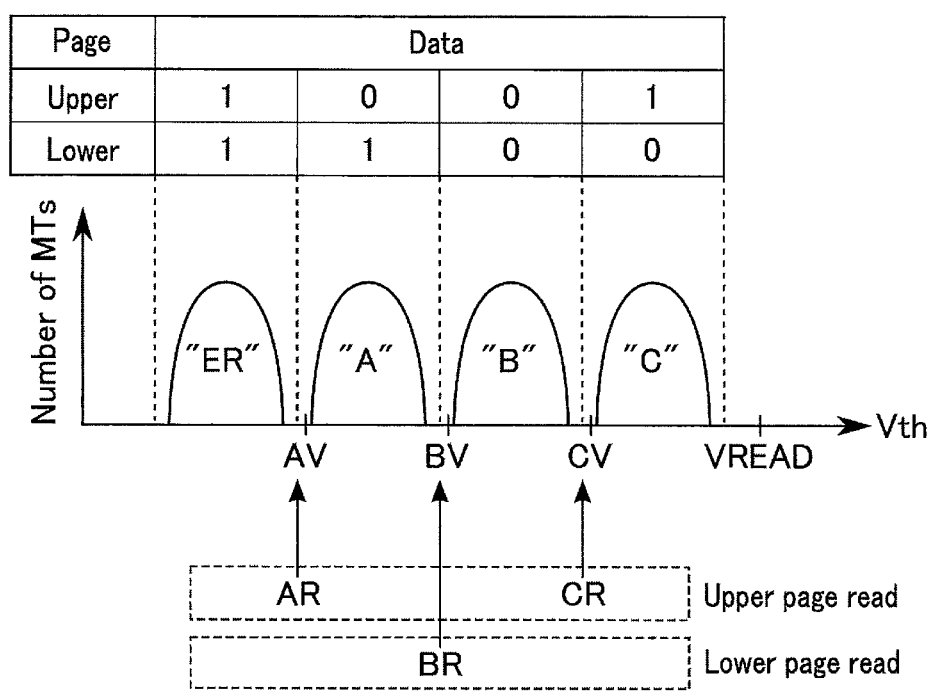
F I G. 16

Data allocation (first modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 1 | 0 |
| (3) | Z | B | 1 | 1 | 0 |
| (4) | A | Z | 1 | 0 | 1 |
| (5) | A | A | 0 | 0 | 0 |
| (6) | A | B | 0 | 1 | 0 |
| (7) | B | Z | 1 | 0 | 0 |
| (8) | B | A | 0 | 0 | 1 |
| (9) | B | B | 0 | 1 | 1 |

F I G. 17

Definitions of data (first modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 1 | 1 | 0 |
| Second page | AR | BR | 1 | 1 | 0 | 1 |
| Third page | BR | AR | 1 | 0 | 0 | 1 |

F I G. 18

Data allocation (second modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 1 | 0 |
| (3) | Z | B | 1 | 0 | 0 |
| (4) | A | Z | 1 | 0 | 1 |
| (5) | A | A | 0 | 0 | 0 |
| (6) | A | B | 0 | 1 | 0 |
| (7) | B | Z | 1 | 0 | 1 |
| (8) | B | A | 0 | 0 | 1 |
| (9) | B | B | 0 | 1 | 1 |

F I G. 19

Definitions of data (second modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 1 | 1 | 0 |
| Second page | AR | BR | 1 | 0 | 0 | 1 |
| Third page | BR | AR | 1 | 0 | 1 | 1 |

F I G. 20

Data allocation (third modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 1 | 1 |
| (3) | Z | B | 1 | 1 | 0 |
| (4) | A | Z | 1 | 0 | 1 |
| (5) | A | A | 0 | 0 | 1 |
| (6) | A | B | 0 | 1 | 0 |
| (7) | B | Z | 1 | 0 | 0 |
| (8) | B | A | 0 | 0 | 0 |
| (9) | B | B | 0 | 1 | 1 |

FIG. 21

Definitions of data (third modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 1 | 1 | 0 |
| Second page | AR | BR | 1 | 1 | 0 | 1 |
| Third page | BR | BR | 1 | 0 | 0 | 1 |

F I G. 22

Data allocation (fourth modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 0 | 1 | 1 |
| (3) | Z | B | 0 | 1 | 0 |
| (4) | A | Z | 0 | 0 | 1 |
| (5) | A | A | 1 | 0 | 1 |
| (6) | A | B | 1 | 1 | 0 |
| (7) | B | Z | 0 | 0 | 0 |
| (8) | B | A | 1 | 0 | 0 |
| (9) | B | B | 1 | 1 | 1 |

F I G. 23

Definitions of data (fourth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 0 | 0 | 1 |
| Second page | AR | BR | 1 | 1 | 0 | 1 |
| Third page | BR | BR | 1 | 0 | 0 | 1 |

F I G. 24

Data allocation (fifth modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 0 | 1 | 1 |
| (3) | Z | B | 0 | 1 | 0 |
| (4) | A | Z | 0 | 0 | 1 |
| (5) | A | A | 1 | 0 | 1 |
| (6) | A | B | 1 | 1 | 0 |
| (7) | B | Z | 0 | 0 | 0 |
| (8) | B | A | 1 | 0 | 0 |
| (9) | B | B | 1 | 1 | 0 |

F I G. 25

Definitions of data (fifth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 0 | 0 | 1 |
| Second page | AR | BR | 1 | 1 | 0 | 1 |
| Third page | BR | BR | 1 | 0 | 0 | 0 |

F I G. 26

Data allocation (sixth modification of first embodiment)

|     | Vth of memory cells | | Data | | |
| --- | --- | --- | --- | --- | --- |
|     | First plane | Second plane | First page | Second page | Third page |
| (1) | Z | Z | 1 | 1 | 1 |
| (2) | Z | A | 1 | 0 | 1 |
| (3) | Z | B | 1 | 0 | 0 |
| (4) | A | Z | 1 | 1 | 1 |
| (5) | A | A | 0 | 0 | 1 |
| (6) | A | B | 0 | 0 | 0 |
| (7) | B | Z | 1 | 1 | 0 |
| (8) | B | A | 0 | 1 | 0 |
| (9) | B | B | 0 | 1 | 1 |

F I G. 27

Definitions of data (sixth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 1 | 1 | 0 |
| Second page | BR | AR | 1 | 0 | 1 | 1 |
| Third page | BR | BR | 1 | 0 | 0 | 1 |

F I G. 28

Data allocation (seventh modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 0 | 0 | 1 |
| (3) | Z | B | 0 | 0 | 0 |
| (4) | A | Z | 0 | 1 | 1 |
| (5) | A | A | 1 | 0 | 1 |
| (6) | A | B | 1 | 0 | 0 |
| (7) | B | Z | 0 | 1 | 0 |
| (8) | B | A | 1 | 1 | 0 |
| (9) | B | B | 1 | 1 | 1 |

F I G. 29

Definitions of data (seventh modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 0 | 0 | 1 |
| Second page | BR | AR | 1 | 0 | 1 | 1 |
| Third page | BR | BR | 1 | 0 | 0 | 1 |

F I G. 30

Data allocation (eighth modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 0 | 0 | 1 |
| (3) | Z | B | 0 | 0 | 0 |
| (4) | A | Z | 0 | 1 | 1 |
| (5) | A | A | 1 | 0 | 1 |
| (6) | A | B | 1 | 0 | 0 |
| (7) | B | Z | 0 | 1 | 0 |
| (8) | B | A | 1 | 1 | 0 |
| (9) | B | B | 1 | 1 | 0 |

F I G. 31

Definitions of data (eighth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | AR | 1 | 0 | 0 | 1 |
| Second page | BR | AR | 1 | 0 | 1 | 1 |
| Third page | BR | BR | 1 | 0 | 0 | 0 |

F I G. 32

Data allocation (ninth modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 0 | 1 |
| (3) | Z | B | 1 | 0 | 0 |
| (4) | A | Z | 0 | 1 | 1 |
| (5) | A | A | 0 | 0 | 1 |
| (6) | A | B | 1 | 0 | 0 |
| (7) | B | Z | 0 | 0 | 0 |
| (8) | B | A | 0 | 1 | 0 |
| (9) | B | B | 1 | 1 | 0 |

F I G. 33

Definitions of data (ninth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | BR | 1 | 1 | 0 | 1 |
| Second page | BR | AR | 1 | 0 | 0 | 1 |
| Third page | BR | BR | 1 | 0 | 0 | 0 |

F I G. 34

Data allocation (tenth modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 0 | 1 |
| (3) | Z | B | 0 | 0 | 0 |
| (4) | A | Z | 0 | 1 | 1 |
| (5) | A | A | 0 | 0 | 1 |
| (6) | A | B | 1 | 0 | 0 |
| (7) | B | Z | 0 | 1 | 0 |
| (8) | B | A | 0 | 1 | 0 |
| (9) | B | B | 1 | 1 | 0 |

FIG. 35

Definitions of data (tenth modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | BR | 1 | 0 | 0 | 1 |
| Second page | BR | AR | 1 | 0 | 1 | 1 |
| Third page | BR | BR | 1 | 0 | 0 | 0 |

F I G. 36

Data allocation (eleventh modification of first embodiment)

| | Vth of memory cells | | Data | | |
|---|---|---|---|---|---|
| | First plane | Second plane | First page | Second page | Third page |
| (1) | Z | Z | 1 | 1 | 1 |
| (2) | Z | A | 1 | 0 | 1 |
| (3) | Z | B | 0 | 0 | 0 |
| (4) | A | Z | 0 | 1 | 1 |
| (5) | A | A | 0 | 0 | 1 |
| (6) | A | B | 1 | 0 | 0 |
| (7) | B | Z | 0 | 0 | 0 |
| (8) | B | A | 0 | 1 | 0 |
| (9) | B | B | 1 | 1 | 0 |

F I G. 37

Definitions of data (eleventh modification of first embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | BR | 1 | 0 | 0 | 1 |
| Second page | BR | AR | 1 | 0 | 0 | 1 |
| Third page | BR | BR | 1 | 0 | 0 | 0 |

F I G. 38

Data allocation:
first page write (second embodiment)

|     | Vth of memory cells | | Data |
| --- | --- | --- | --- |
|     | First plane | Second plane | First page |
| (1) | Z | Z | 1 |
| (2) | Z | A | 0 |

F I G. 39

Data allocation:
second page write (second embodiment)

|     | Vth of memory cells | | Data | |
| --- | --- | --- | --- | --- |
|     | First plane | Second plane | First page | Second page |
| (1) | Z | Z | 1 | 1 |
| (2) | Z | A | 0 | 1 |
| (3) | A | Z | 1 | 0 |
| (4) | A | A | 0 | 0 |

F I G. 40

Data allocation:
third page write (second embodiment)

|     | Vth of memory cells | | Data | | |
| --- | --- | --- | --- | --- | --- |
|     | First plane | Second plane | First page | Second page | Third page |
| (1) | Z | Z | 1 | 1 | 1 |
| (2) | Z | A | 1 | 1 | 0 |
| (3) | Z | B | 1 | 0 | 0 |
| (4) | A | Z | 1 | 0 | 1 |
| (5) | A | A | 0 | 0 | 0 |
| (6) | A | B | 0 | 1 | 0 |
| (7) | B | Z | 1 | 0 | 0 |
| (8) | B | A | 0 | 0 | 1 |
| (9) | B | B | 0 | 1 | 1 |

FIG. 41

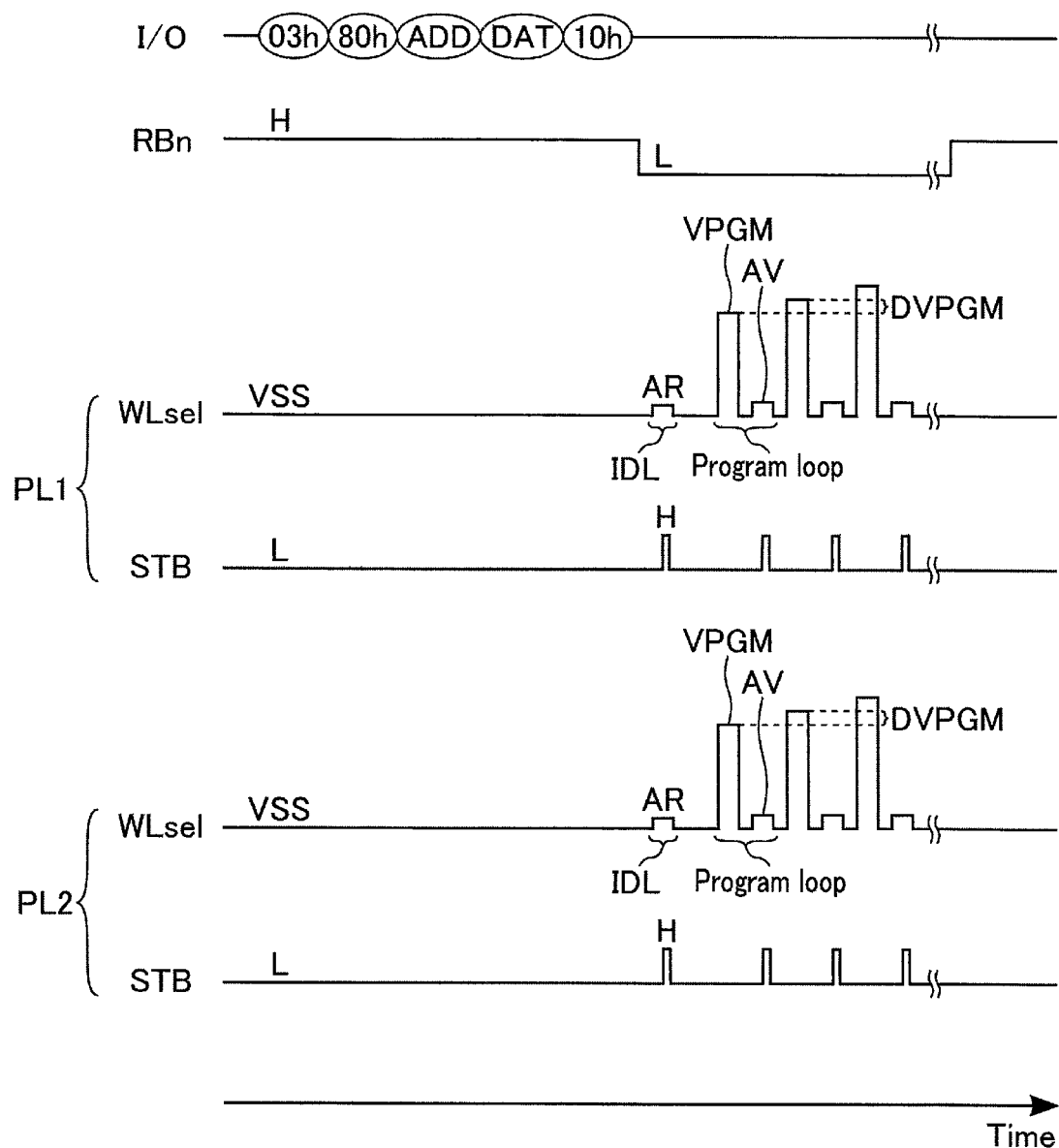
F I G. 44

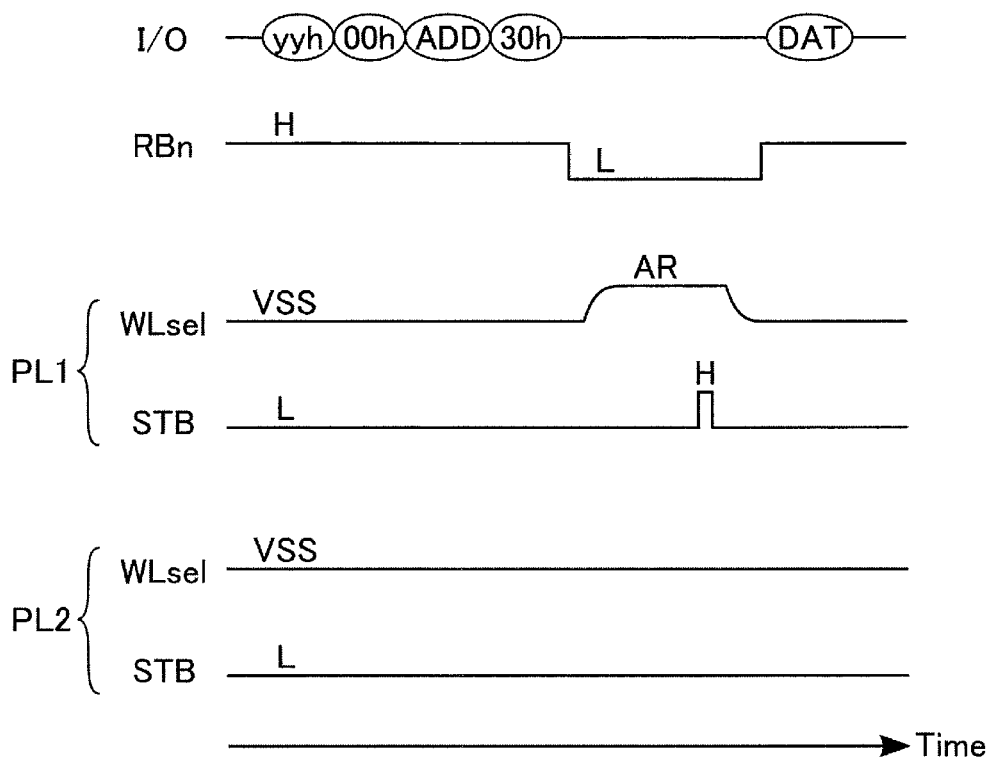
F I G. 46

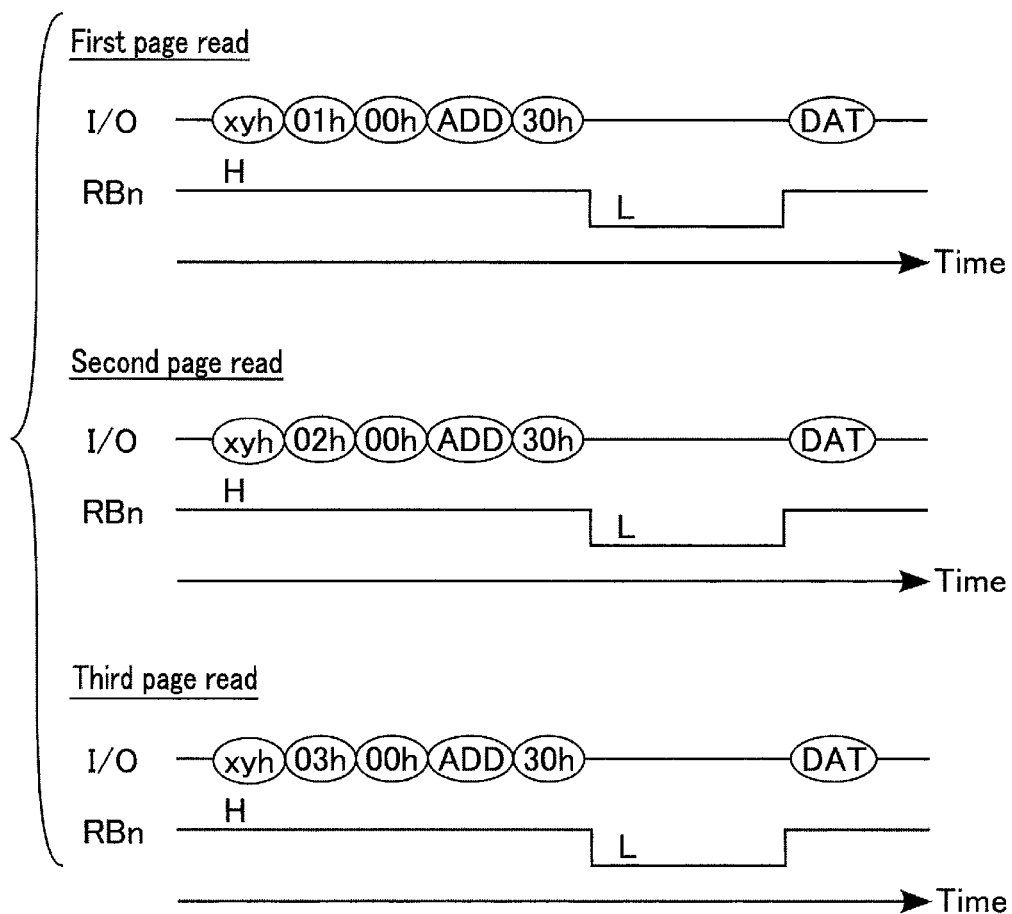
F I G. 48

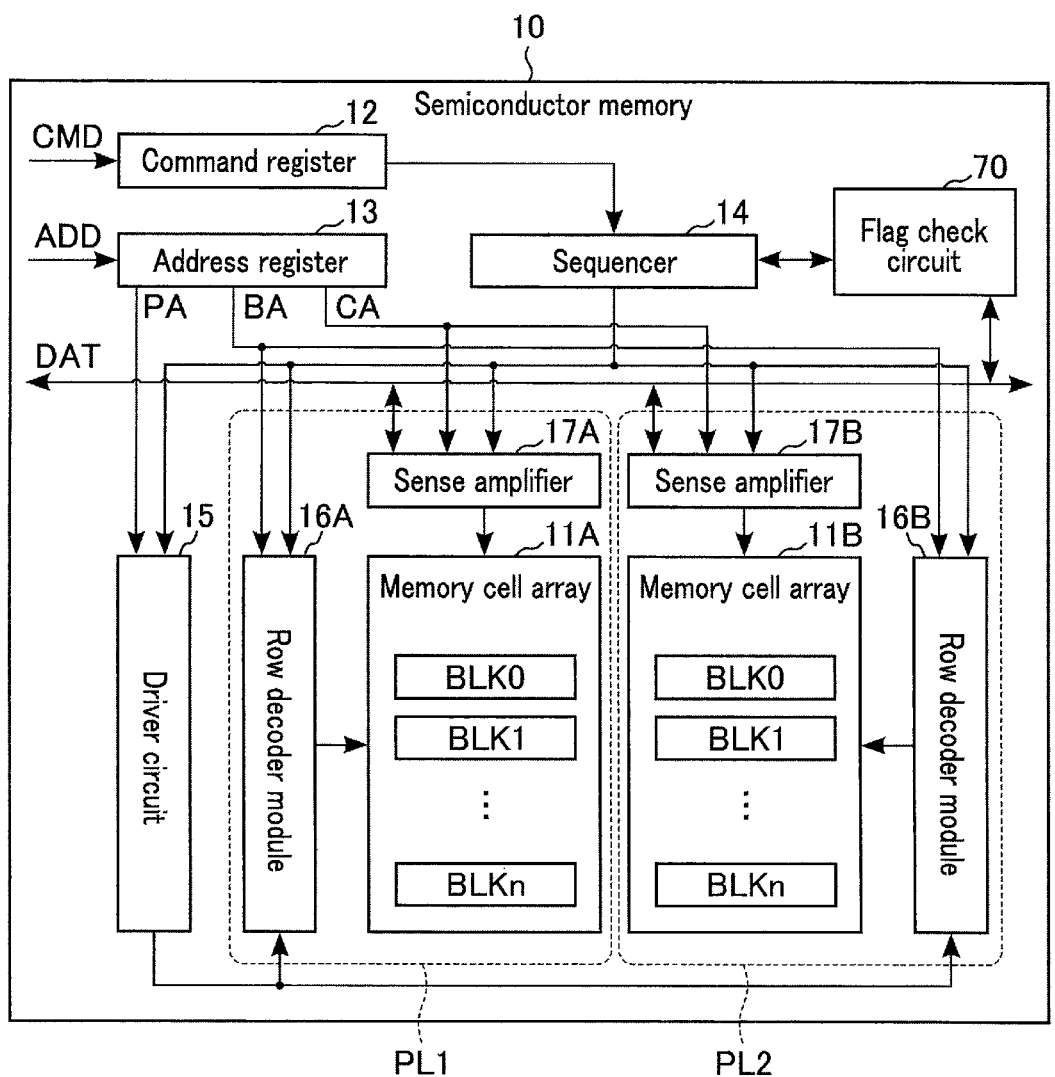
F I G. 49

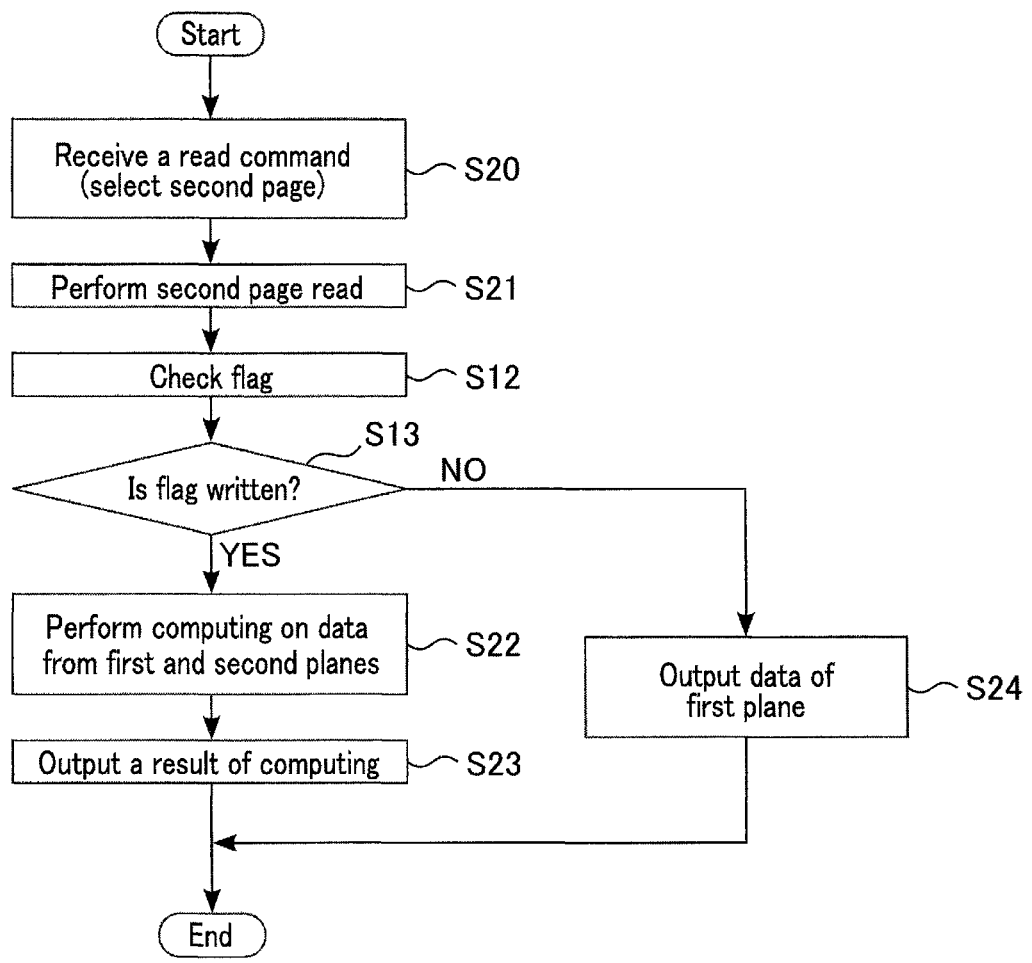
F I G. 51

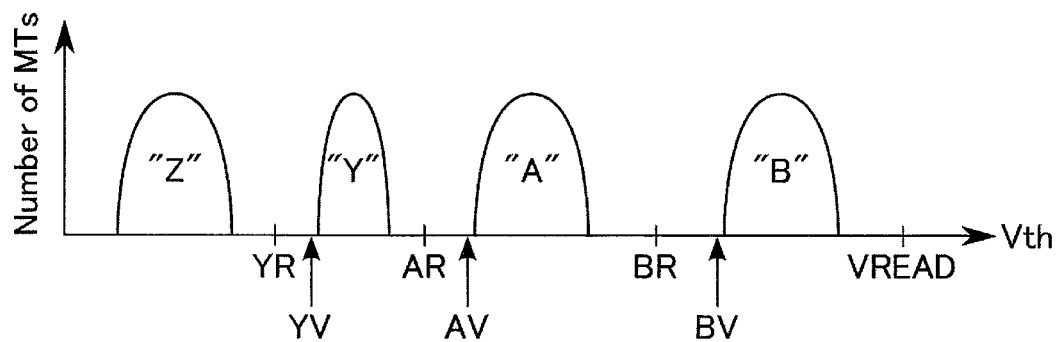
F I G. 53
Data allocation:
first page write (fourth embodiment)
| | Vth of memory cells | | Data |
|---|---|---|---|
| | First plane | Second plane | First page |
| (1) | Z | Z | 1 |
| (2) | Y | A | 0 |
F I G. 54

Data allocation:
second page write (fourth embodiment)

| Vth of memory cells | | Data | |
|---|---|---|---|
| First plane | Second plane | First page | Second page |
| (1) Z | Y | 1 | 1 |
| (2) A | Z | 1 | 0 |
| (3) A | A | 0 | 0 |
| (4) Y | B | 0 | 1 |

FIG. 55

Data allocation:
third page write (fourth embodiment)

| Vth of memory cells | | Data | | |
|---|---|---|---|---|
| First plane | Second plane | First page | Second page | Third page |
| (1) Z | Z | 1 | 1 | 1 |
| (2) Z | A | 1 | 1 | 1 |
| (3) Z | B | 1 | 1 | 0 |
| (4) A | Z | 1 | 0 | 1 |
| (5) A | A | 0 | 0 | 1 |
| (6) A | B | 0 | 1 | 0 |
| (7) B | Z | 1 | 0 | 0 |
| (8) B | A | 0 | 0 | 0 |
| (9) B | B | 0 | 1 | 1 |

FIG. 56

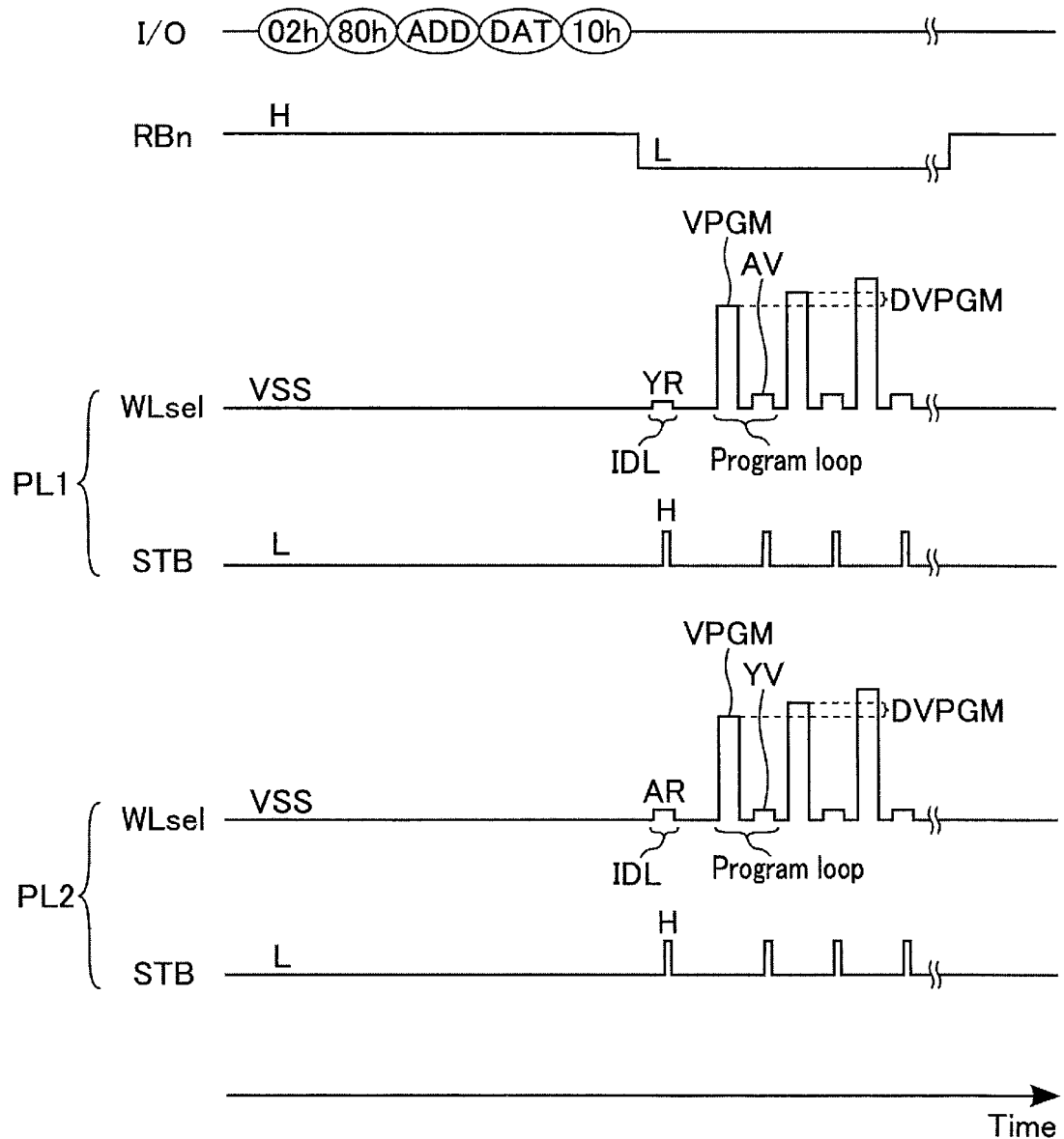
F I G. 58

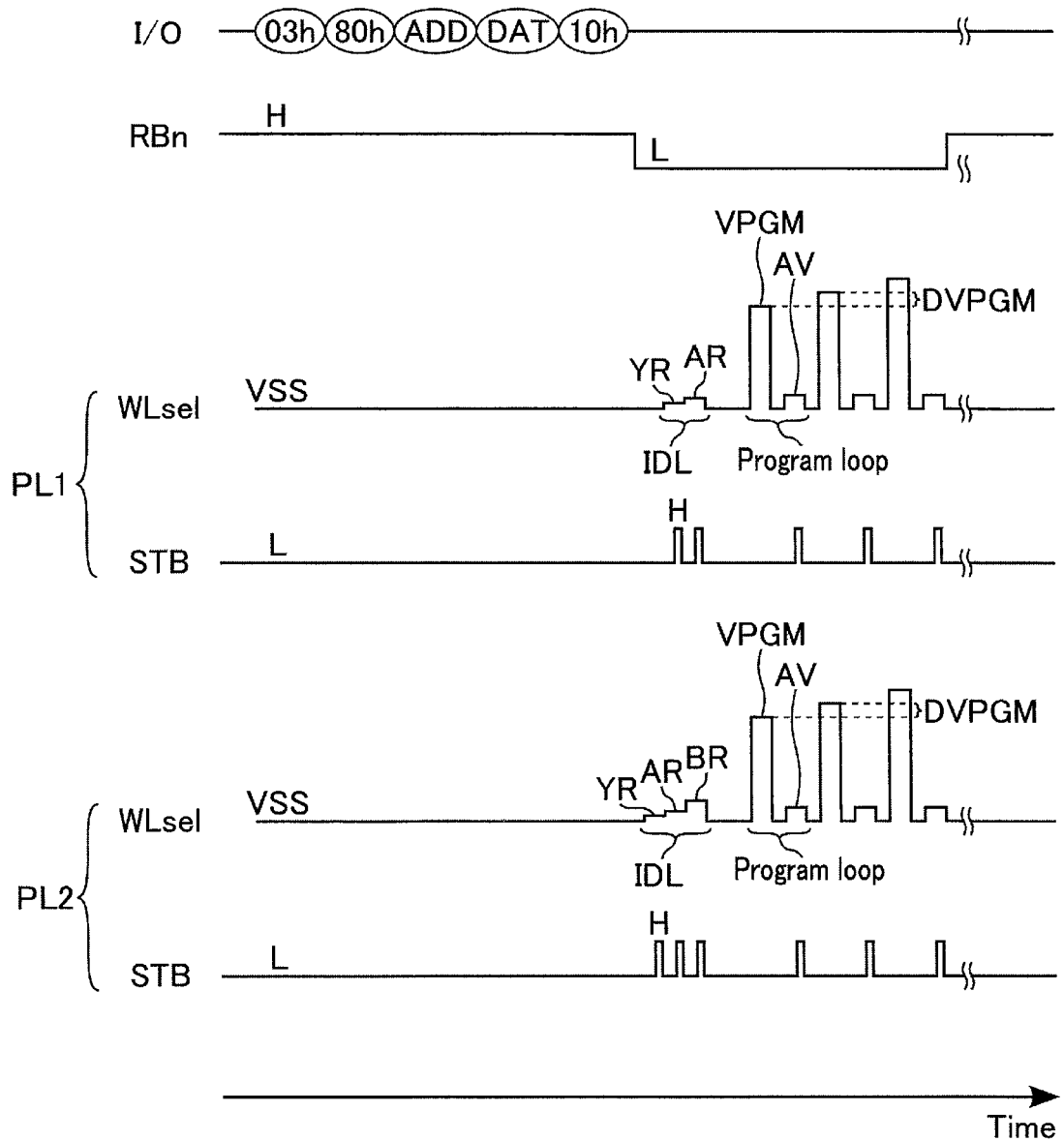
F I G. 59

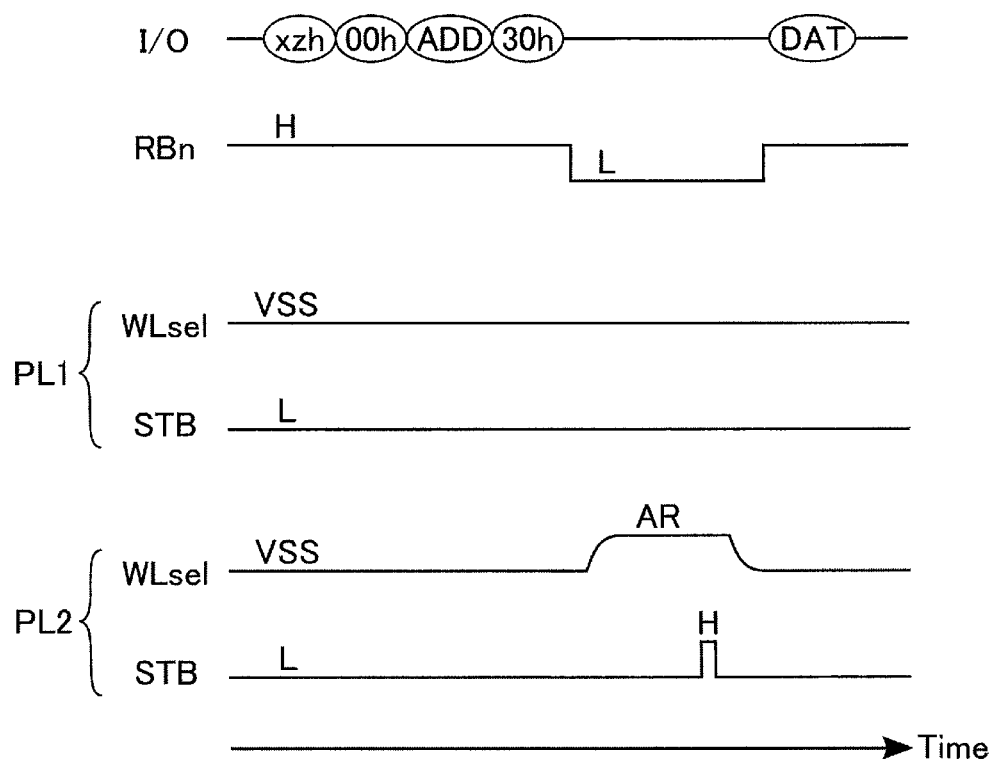
F I G. 61

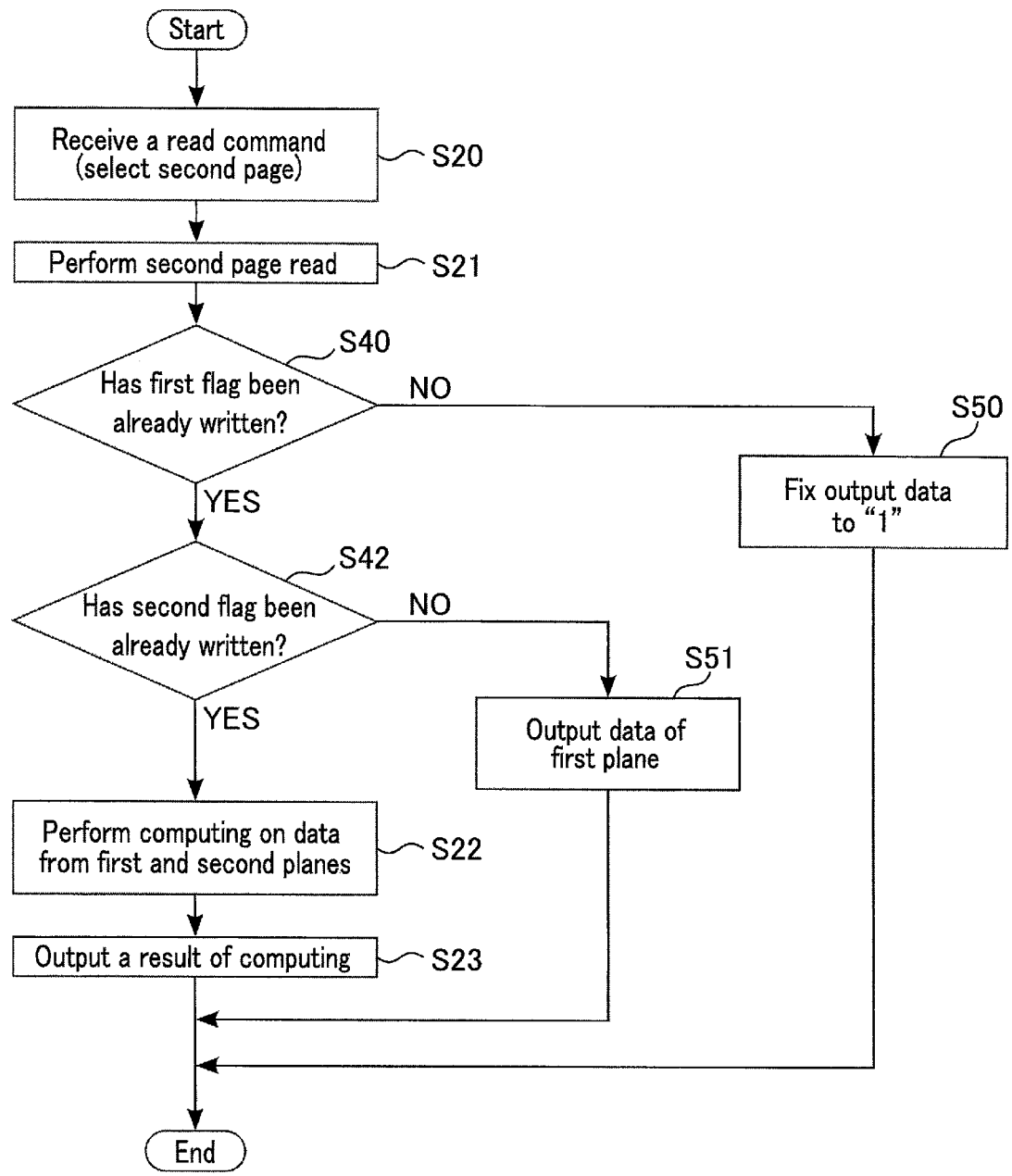
F I G. 64

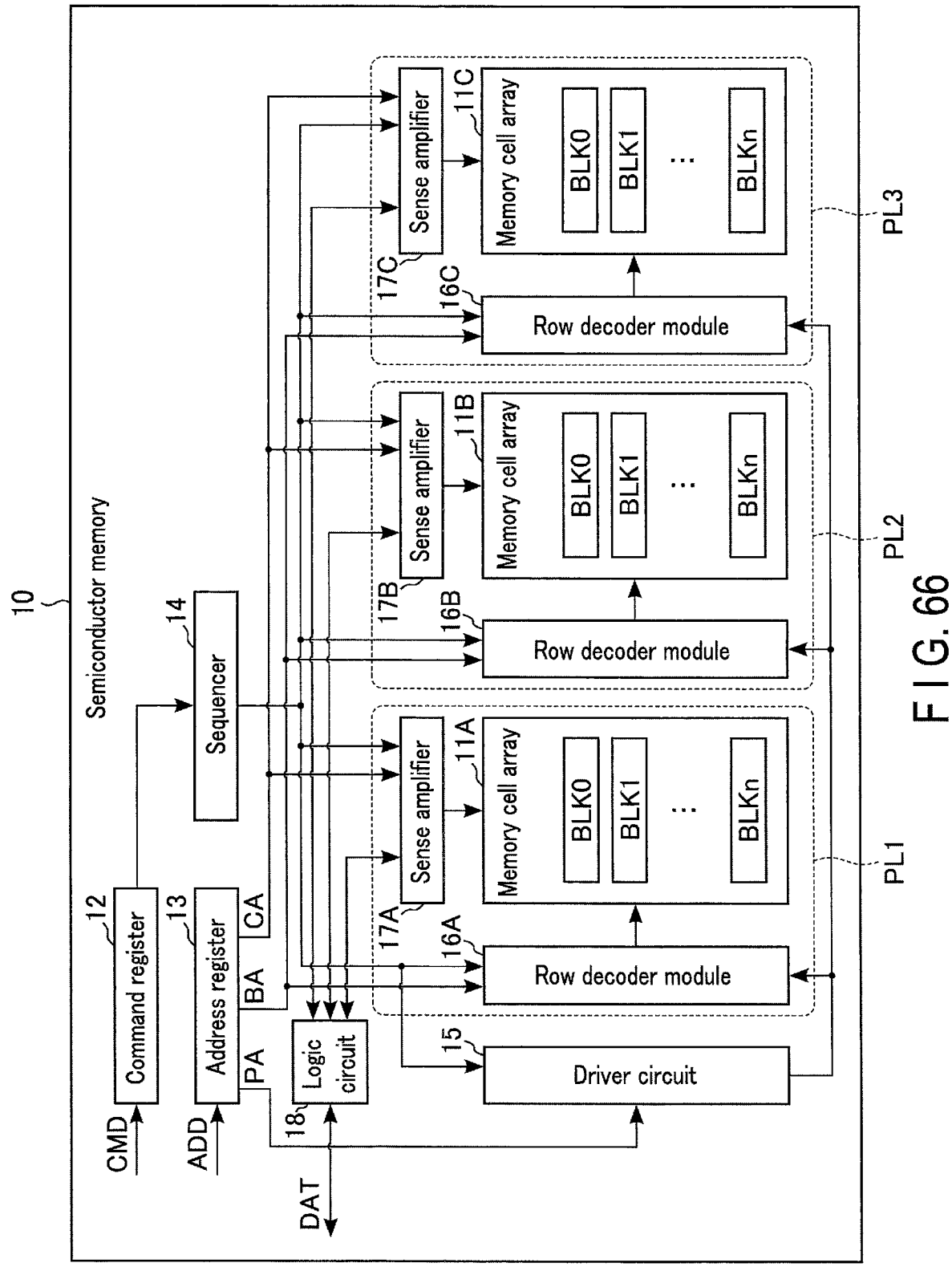
F I G. 66

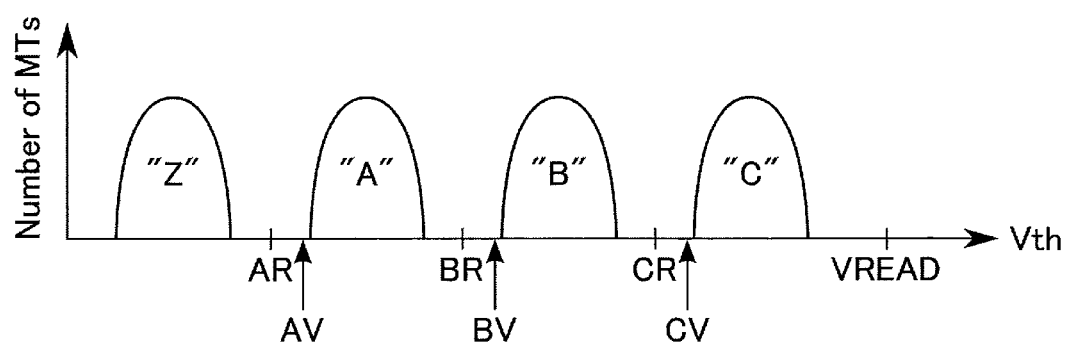
F I G. 67

Data allocation (1/2) (sixth embodiment)

| | Vth of memory cells | | | Data | | | | | |
|---|---|---|---|---|---|---|---|---|---|
| | First plane | Second plane | Third plane | First page | Second page | Third page | Fourth page | Fifth page | Sixth page |
| (1) | Z | Z | Z | 1 | 1 | 1 | 1 | 1 | 1 |
| (2) | Z | Z | A | 1 | 1 | 1 | 0 | 0 | 1 |
| (3) | Z | Z | B | 0 | 1 | 1 | 0 | 0 | 1 |
| (4) | Z | Z | C | 0 | 1 | 0 | 0 | 0 | 0 |
| (5) | Z | A | Z | 1 | 1 | 1 | 0 | 1 | 1 |
| (6) | Z | A | A | 1 | 1 | 1 | 1 | 0 | 1 |
| (7) | Z | A | B | 0 | 1 | 1 | 1 | 0 | 1 |
| (8) | Z | A | C | 0 | 1 | 0 | 1 | 0 | 0 |
| (9) | Z | B | Z | 1 | 1 | 0 | 0 | 1 | 0 |
| (10) | Z | B | A | 1 | 1 | 0 | 1 | 0 | 0 |
| (11) | Z | B | B | 0 | 0 | 0 | 1 | 0 | 0 |
| (12) | Z | B | C | 0 | 0 | 1 | 1 | 0 | 1 |
| (13) | Z | C | Z | 1 | 1 | 0 | 0 | 0 | 0 |
| (14) | Z | C | A | 1 | 1 | 0 | 1 | 1 | 0 |
| (15) | Z | C | B | 0 | 0 | 0 | 1 | 1 | 0 |
| (16) | Z | C | C | 0 | 0 | 1 | 1 | 1 | 1 |
| (17) | A | Z | Z | 1 | 1 | 0 | 1 | 1 | 1 |
| (18) | A | Z | A | 1 | 1 | 0 | 0 | 0 | 1 |
| (19) | A | Z | B | 0 | 1 | 0 | 0 | 0 | 1 |
| (20) | A | Z | C | 0 | 1 | 1 | 0 | 0 | 0 |
| (21) | A | A | Z | 1 | 1 | 0 | 0 | 1 | 1 |
| (22) | A | A | A | 1 | 1 | 0 | 1 | 0 | 1 |
| (23) | A | A | B | 0 | 1 | 0 | 1 | 0 | 1 |
| (24) | A | A | C | 0 | 1 | 1 | 1 | 0 | 0 |
| (25) | A | B | Z | 1 | 1 | 1 | 0 | 1 | 0 |
| (26) | A | B | A | 1 | 1 | 1 | 1 | 0 | 0 |
| (27) | A | B | B | 0 | 0 | 1 | 1 | 0 | 0 |
| (28) | A | B | C | 0 | 0 | 0 | 1 | 0 | 1 |
| (29) | A | C | Z | 1 | 1 | 1 | 0 | 0 | 0 |
| (30) | A | C | A | 1 | 1 | 1 | 1 | 1 | 0 |
| (31) | A | C | B | 0 | 0 | 1 | 1 | 1 | 0 |
| (32) | A | C | C | 0 | 0 | 0 | 1 | 1 | 1 |

FIG. 68

Data allocation (2/2) (sixth embodiment)

| | Vth of memory cells | | | Data | | | | | |
|---|---|---|---|---|---|---|---|---|---|
| | First plane | Second plane | Third plane | First page | Second page | Third page | Fourth page | Fifth page | Sixth page |
| (33) | B | Z | Z | 1 | 0 | 0 | 0 | 0 | 1 |
| (34) | B | Z | A | 1 | 0 | 0 | 1 | 1 | 1 |
| (35) | B | Z | B | 0 | 1 | 0 | 1 | 1 | 1 |
| (36) | B | Z | C | 0 | 1 | 1 | 1 | 1 | 0 |
| (37) | B | A | Z | 1 | 0 | 0 | 1 | 0 | 1 |
| (38) | B | A | A | 1 | 0 | 0 | 0 | 1 | 1 |
| (39) | B | A | B | 0 | 1 | 0 | 0 | 1 | 1 |
| (40) | B | A | C | 0 | 1 | 1 | 0 | 1 | 0 |
| (41) | B | B | Z | 1 | 0 | 1 | 1 | 0 | 0 |
| (42) | B | B | A | 1 | 0 | 1 | 0 | 1 | 0 |
| (43) | B | B | B | 0 | 0 | 1 | 0 | 1 | 0 |
| (44) | B | B | C | 0 | 0 | 0 | 0 | 1 | 1 |
| (45) | B | C | Z | 1 | 0 | 1 | 1 | 1 | 0 |
| (46) | B | C | A | 1 | 0 | 1 | 0 | 0 | 0 |
| (47) | B | C | B | 0 | 0 | 1 | 0 | 0 | 0 |
| (48) | B | C | C | 0 | 0 | 0 | 0 | 0 | 1 |
| (49) | C | Z | Z | 1 | 0 | 0 | 0 | 0 | 0 |
| (50) | C | Z | A | 1 | 0 | 0 | 1 | 1 | 0 |
| (51) | C | Z | B | 0 | 1 | 0 | 1 | 1 | 0 |
| (52) | C | Z | C | 0 | 1 | 1 | 1 | 1 | 1 |
| (53) | C | A | Z | 1 | 0 | 0 | 1 | 0 | 0 |
| (54) | C | A | A | 1 | 0 | 0 | 0 | 1 | 0 |
| (55) | C | A | B | 0 | 1 | 0 | 0 | 1 | 0 |
| (56) | C | A | C | 0 | 1 | 1 | 0 | 1 | 1 |
| (57) | C | B | Z | 1 | 0 | 1 | 1 | 0 | 1 |
| (58) | C | B | A | 1 | 0 | 1 | 0 | 1 | 1 |
| (59) | C | B | B | 0 | 0 | 1 | 0 | 1 | 1 |
| (60) | C | B | C | 0 | 0 | 0 | 0 | 1 | 0 |
| (61) | C | C | Z | 1 | 0 | 1 | 1 | 1 | 1 |
| (62) | C | C | A | 1 | 0 | 1 | 0 | 0 | 1 |
| (63) | C | C | B | 0 | 0 | 1 | 0 | 0 | 1 |
| (64) | C | C | C | 0 | 0 | 0 | 0 | 0 | 0 |

F I G. 69

Definitions of data (sixth embodiment)

| Read operation | Read voltage | | | Read data PL1:PL2:PL3 | | | | | | | |
|---|---|---|---|---|---|---|---|---|---|---|---|
| | PL1 | PL2 | PL3 | L:L:L | L:L:H | L:H:L | L:H:H | H:L:L | H:L:H | H:H:L | H:H:H |
| First page | AR | AR | BR | 1 | 0 | 1 | 0 | 1 | 0 | 1 | 0 |
| Second page | BR | BR | BR | 1 | 1 | 1 | 0 | 0 | 1 | 0 | 0 |
| Third page | AR | BR | CR | 1 | 0 | 0 | 1 | 0 | 1 | 1 | 0 |
| Fourth page | BR | AR | AR | 1 | 0 | 0 | 1 | 0 | 1 | 1 | 0 |
| Fifth page | BR | CR | AR | 1 | 0 | 0 | 1 | 0 | 1 | 1 | 0 |
| Sixth page | CR | BR | CR | 1 | 0 | 0 | 1 | 0 | 1 | 1 | 0 |

FIG. 70

| | Vth of memory cells | | | Result of read | | | | | | | | |
|---|---|---|---|---|---|---|---|---|---|---|---|---|
| | First plane | Second plane | Third plane | First page | | | Second page | | | Third page | | |
| | | | | PL1 | PL2 | PL3 | PL1 | PL2 | PL3 | PL1 | PL2 | PL3 |
| (1) | Z | Z | Z | L | L | L | L | L | L | L | L | L |
| (2) | Z | Z | A | L | L | L | L | L | L | L | L | L |
| (3) | Z | Z | B | L | L | H | L | L | H | L | L | L |
| (4) | Z | Z | C | L | L | H | L | L | H | L | L | H |
| (5) | Z | A | Z | L | H | L | L | L | L | L | L | L |
| (6) | Z | A | A | L | H | L | L | L | L | L | L | L |
| (7) | Z | A | B | L | H | H | L | L | H | L | L | L |
| (8) | Z | A | C | L | H | H | L | L | H | L | L | H |
| (9) | Z | B | Z | L | H | L | L | H | L | L | H | L |
| (10) | Z | B | A | L | H | L | L | H | L | L | H | L |
| (11) | Z | B | B | L | H | H | L | H | H | L | H | L |
| (12) | Z | B | C | L | H | H | L | H | H | L | H | H |
| (13) | Z | C | Z | L | H | L | L | H | L | L | H | L |
| (14) | Z | C | A | L | H | L | L | H | L | L | H | L |
| (15) | Z | C | B | L | H | H | L | H | H | L | H | L |
| (16) | Z | C | C | L | H | H | L | H | H | L | H | H |
| (17) | A | Z | Z | H | L | L | L | L | L | H | L | L |
| (18) | A | Z | A | H | L | L | L | L | L | H | L | L |
| (19) | A | Z | B | H | L | H | L | L | H | H | L | L |
| (20) | A | Z | C | H | L | H | L | L | H | H | L | H |
| (21) | A | A | Z | H | H | L | L | L | L | H | L | L |
| (22) | A | A | A | H | H | L | L | L | L | H | L | L |
| (23) | A | A | B | H | H | H | L | L | H | H | L | L |
| (24) | A | A | C | H | H | H | L | L | H | H | L | H |
| (25) | A | B | Z | H | H | L | L | H | L | H | H | L |
| (26) | A | B | A | H | H | L | L | H | L | H | H | L |
| (27) | A | B | B | H | H | H | L | H | H | H | H | L |
| (28) | A | B | C | H | H | H | L | H | H | H | H | H |
| (29) | A | C | Z | H | H | L | L | H | L | H | H | L |
| (30) | A | C | A | H | H | L | L | H | L | H | H | L |
| (31) | A | C | B | H | H | H | L | H | H | H | H | L |
| (32) | A | C | C | H | H | H | L | H | H | H | H | H |
| Read voltage | | | | AR | AR | BR | BR | BR | BR | AR | BR | CR |

F I G. 71

|  | Vth of memory cells | | | Result of read | | | | | | | | |
| --- | --- | --- | --- | --- | --- | --- | --- | --- | --- | --- | --- | --- |
|  | First plane | Second plane | Third plane | First page | | | Second page | | | Third page | | |
|  |  |  |  | PL1 | PL2 | PL3 | PL1 | PL2 | PL3 | PL1 | PL2 | PL3 |
| (33) | B | Z | Z | H | L | L | H | L | L | H | L | L |
| (34) | B | Z | A | H | L | L | H | L | L | H | L | L |
| (35) | B | Z | B | H | L | H | H | L | H | H | L | L |
| (36) | B | Z | C | H | L | H | H | L | H | H | L | H |
| (37) | B | A | Z | H | H | L | H | L | L | H | L | L |
| (38) | B | A | A | H | H | L | H | L | L | H | L | L |
| (39) | B | A | B | H | H | H | H | L | H | H | L | L |
| (40) | B | A | C | H | H | H | H | L | H | H | L | H |
| (41) | B | B | Z | H | H | L | H | H | L | H | H | L |
| (42) | B | B | A | H | H | L | H | H | L | H | H | L |
| (43) | B | B | B | H | H | H | H | H | H | H | H | L |
| (44) | B | B | C | H | H | H | H | H | H | H | H | H |
| (45) | B | C | Z | H | H | L | H | H | L | H | H | L |
| (46) | B | C | A | H | H | L | H | H | L | H | H | L |
| (47) | B | C | B | H | H | H | H | H | H | H | H | L |
| (48) | B | C | C | H | H | H | H | H | H | H | H | H |
| (49) | C | Z | Z | H | L | L | H | L | L | H | L | L |
| (50) | C | Z | A | H | L | L | H | L | L | H | L | L |
| (51) | C | Z | B | H | L | H | H | L | H | H | L | L |
| (52) | C | Z | C | H | L | H | H | L | H | H | L | H |
| (53) | C | A | Z | H | H | L | H | L | L | H | L | L |
| (54) | C | A | A | H | H | L | H | L | L | H | L | L |
| (55) | C | A | B | H | H | H | H | L | H | H | L | L |
| (56) | C | A | C | H | H | H | H | L | H | H | L | H |
| (57) | C | B | Z | H | H | L | H | H | L | H | H | L |
| (58) | C | B | A | H | H | L | H | H | L | H | H | L |
| (59) | C | B | B | H | H | H | H | H | H | H | H | L |
| (60) | C | B | C | H | H | H | H | H | H | H | H | H |
| (61) | C | C | Z | H | H | L | H | H | L | H | H | L |
| (62) | C | C | A | H | H | L | H | H | L | H | H | L |
| (63) | C | C | B | H | H | H | H | H | H | H | H | L |
| (64) | C | C | C | H | H | H | H | H | H | H | H | H |
| Read voltage | | | | AR | AR | BR | BR | BR | BR | AR | BR | CR |

F I G. 72

| | Vth of memory cells | | | Result of read | | | | | | | | |
|---|---|---|---|---|---|---|---|---|---|---|---|---|
| | First plane | Second plane | Third plane | Fourth page | | | Fifth page | | | Sixth page | | |
| | | | | PL1 | PL2 | PL3 | PL1 | PL2 | PL3 | PL1 | PL2 | PL3 |
| (1) | Z | Z | Z | L | L | L | L | L | L | L | L | L |
| (2) | Z | Z | A | L | L | H | L | L | H | L | L | L |
| (3) | Z | Z | B | L | L | H | L | L | H | L | L | L |
| (4) | Z | Z | C | L | L | H | L | L | H | L | L | H |
| (5) | Z | A | Z | L | H | L | L | L | L | L | L | L |
| (6) | Z | A | A | L | H | H | L | L | H | L | L | L |
| (7) | Z | A | B | L | H | H | L | L | H | L | L | L |
| (8) | Z | A | C | L | H | H | L | L | H | L | L | H |
| (9) | Z | B | Z | L | H | L | L | L | L | L | H | L |
| (10) | Z | B | A | L | H | H | L | L | H | L | H | L |
| (11) | Z | B | B | L | H | H | L | L | H | L | H | L |
| (12) | Z | B | C | L | H | H | L | L | H | L | H | H |
| (13) | Z | C | Z | L | H | L | L | H | L | L | H | L |
| (14) | Z | C | A | L | H | H | L | H | H | L | H | L |
| (15) | Z | C | B | L | H | H | L | H | H | L | H | L |
| (16) | Z | C | C | L | H | H | L | H | H | L | H | H |
| (17) | A | Z | Z | L | L | L | L | L | L | L | L | L |
| (18) | A | Z | A | L | L | H | L | L | H | L | L | L |
| (19) | A | Z | B | L | L | H | L | L | H | L | L | L |
| (20) | A | Z | C | L | L | H | L | L | H | L | L | H |
| (21) | A | A | Z | L | H | L | L | L | L | L | L | L |
| (22) | A | A | A | L | H | H | L | L | H | L | L | L |
| (23) | A | A | B | L | H | H | L | L | H | L | L | L |
| (24) | A | A | C | L | H | H | L | L | H | L | L | H |
| (25) | A | B | Z | L | H | L | L | L | L | L | H | L |
| (26) | A | B | A | L | H | H | L | L | H | L | H | L |
| (27) | A | B | B | L | H | H | L | L | H | L | H | L |
| (28) | A | B | C | L | H | H | L | L | H | L | H | H |
| (29) | A | C | Z | L | H | L | L | H | L | L | H | L |
| (30) | A | C | A | L | H | H | L | H | H | L | H | L |
| (31) | A | C | B | L | H | H | L | H | H | L | H | L |
| (32) | A | C | C | L | H | H | L | H | H | L | H | H |
| | Read voltage | | | BR | AR | AR | BR | CR | AR | CR | BR | CR |

FIG. 73

| | Vth of memory cells | | | Result of read | | | | | | | | |
|---|---|---|---|---|---|---|---|---|---|---|---|---|
| | First plane | Second plane | Third plane | Fourth page | | | Fifth page | | | Sixth page | | |
| | | | | PL1 | PL2 | PL3 | PL1 | PL2 | PL3 | PL1 | PL2 | PL3 |
| (33) | B | Z | Z | H | L | L | H | L | L | L | L | L |
| (34) | B | Z | A | H | L | H | H | L | H | L | L | L |
| (35) | B | Z | B | H | L | H | H | L | H | L | L | L |
| (36) | B | Z | C | H | L | H | H | L | H | L | L | H |
| (37) | B | A | Z | H | H | L | H | L | L | L | L | L |
| (38) | B | A | A | H | H | H | H | L | H | L | L | L |
| (39) | B | A | B | H | H | H | H | L | H | L | L | L |
| (40) | B | A | C | H | H | H | H | L | H | L | L | H |
| (41) | B | B | Z | H | H | L | H | L | L | L | H | L |
| (42) | B | B | A | H | H | H | H | L | H | L | H | L |
| (43) | B | B | B | H | H | H | H | L | H | L | H | L |
| (44) | B | B | C | H | H | H | H | L | H | L | H | H |
| (45) | B | C | Z | H | H | L | H | L | L | L | H | L |
| (46) | B | C | A | H | H | H | H | H | H | L | H | L |
| (47) | B | C | B | H | H | H | H | H | H | L | H | L |
| (48) | B | C | C | H | H | H | H | H | H | L | H | H |
| (49) | C | Z | Z | H | L | L | H | L | L | H | L | L |
| (50) | C | Z | A | H | L | H | H | L | H | H | L | L |
| (51) | C | Z | B | H | L | H | H | L | H | H | L | L |
| (52) | C | Z | C | H | L | H | H | L | H | H | L | H |
| (53) | C | A | Z | H | H | L | H | L | L | H | L | L |
| (54) | C | A | A | H | H | H | H | L | H | H | L | L |
| (55) | C | A | B | H | H | H | H | L | H | H | L | L |
| (56) | C | A | C | H | H | H | H | L | H | H | L | H |
| (57) | C | B | Z | H | H | L | H | L | L | H | H | L |
| (58) | C | B | A | H | H | H | H | L | H | H | H | L |
| (59) | C | B | B | H | H | H | H | L | H | H | H | L |
| (60) | C | B | C | H | H | H | H | L | H | H | H | H |
| (61) | C | C | Z | H | H | L | H | H | L | H | H | L |
| (62) | C | C | A | H | H | H | H | H | H | H | H | L |
| (63) | C | C | B | H | H | H | H | H | H | H | H | L |
| (64) | C | C | C | H | H | H | H | H | H | H | H | H |
| | Read voltage | | | BR | AR | AR | BR | CR | AR | CR | BR | CR |

F I G. 74

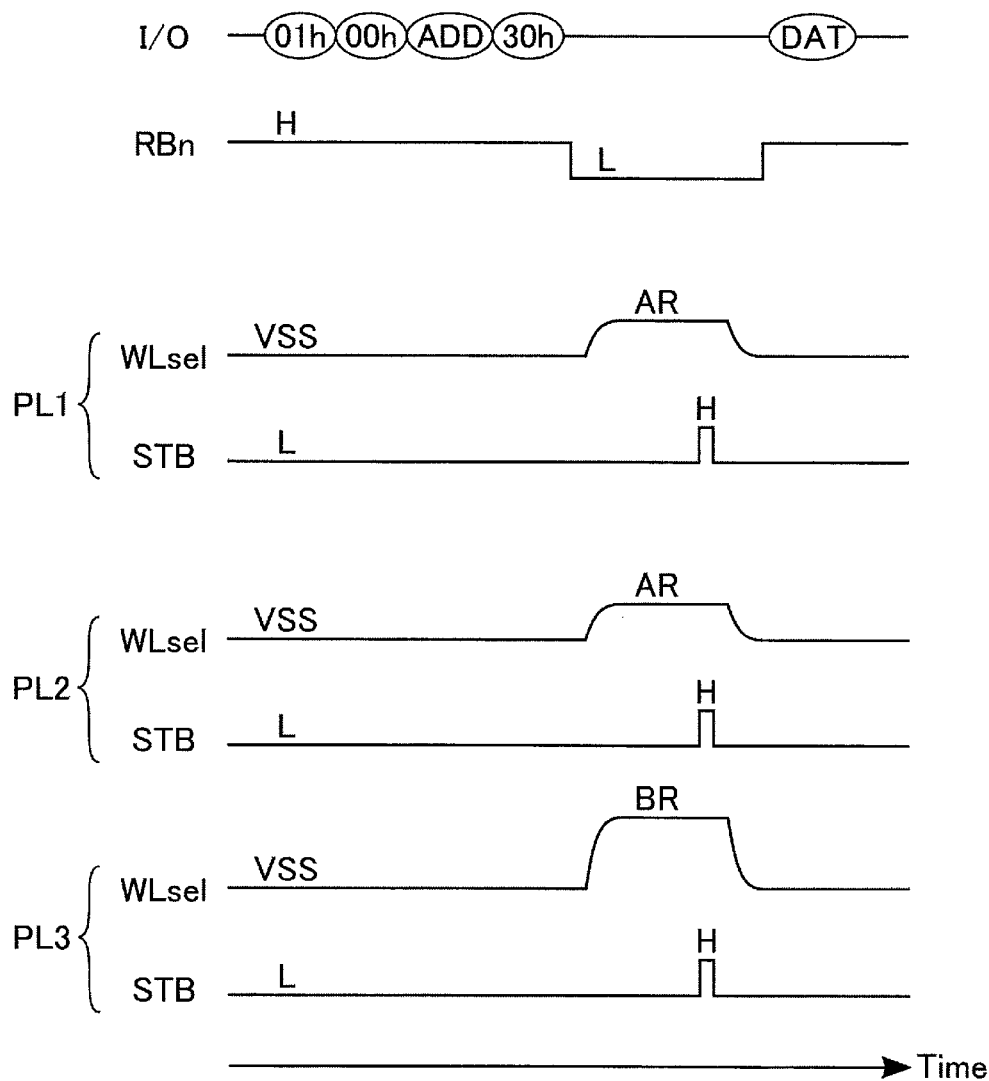
F I G. 76

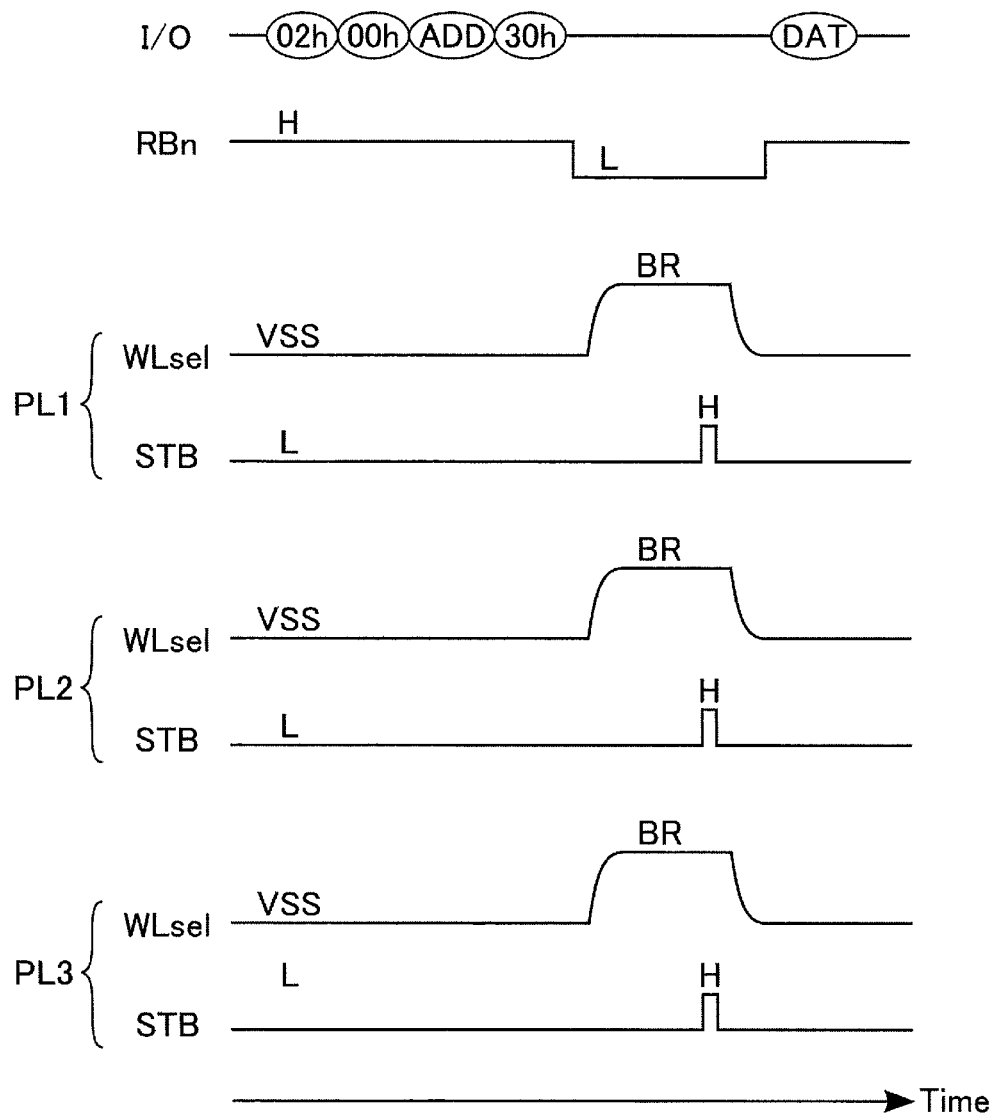
F I G. 77

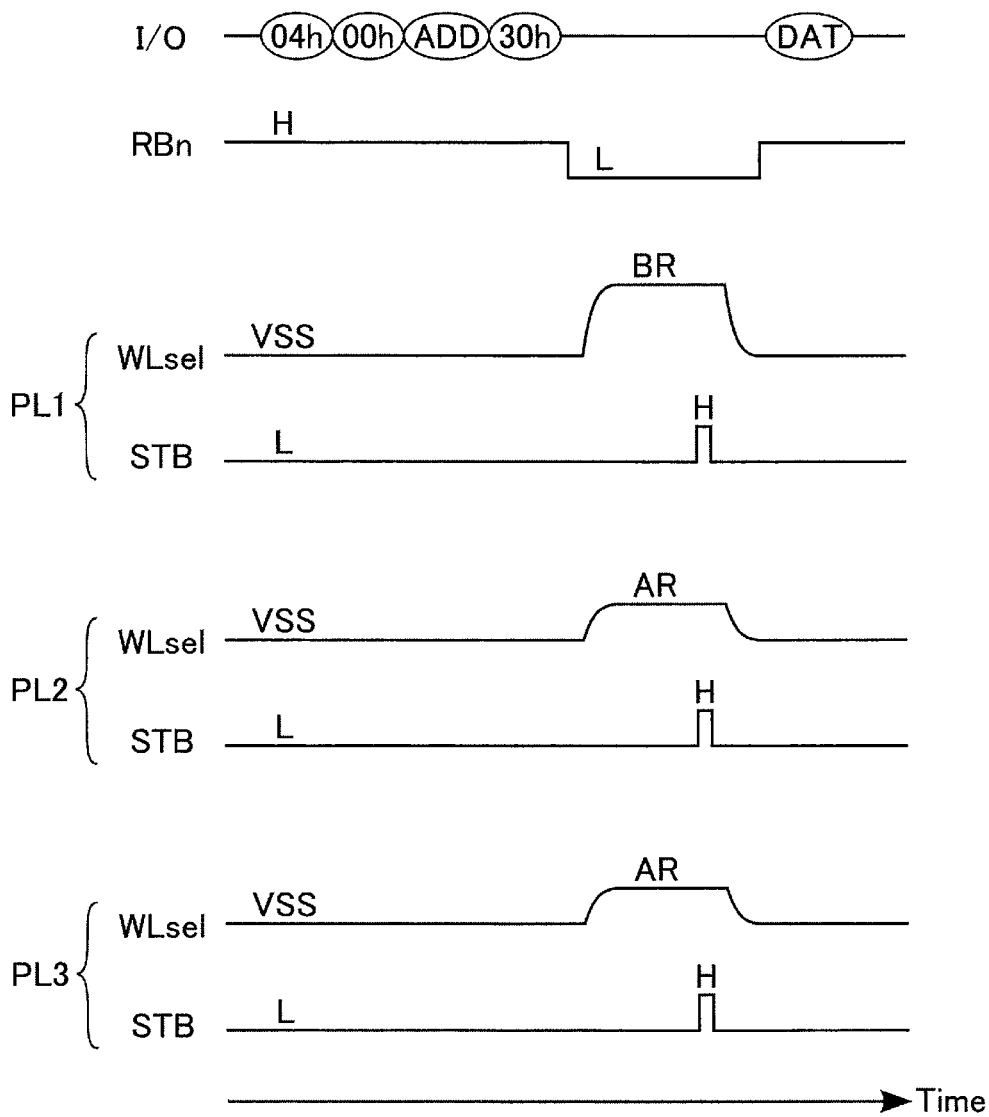
F I G. 79

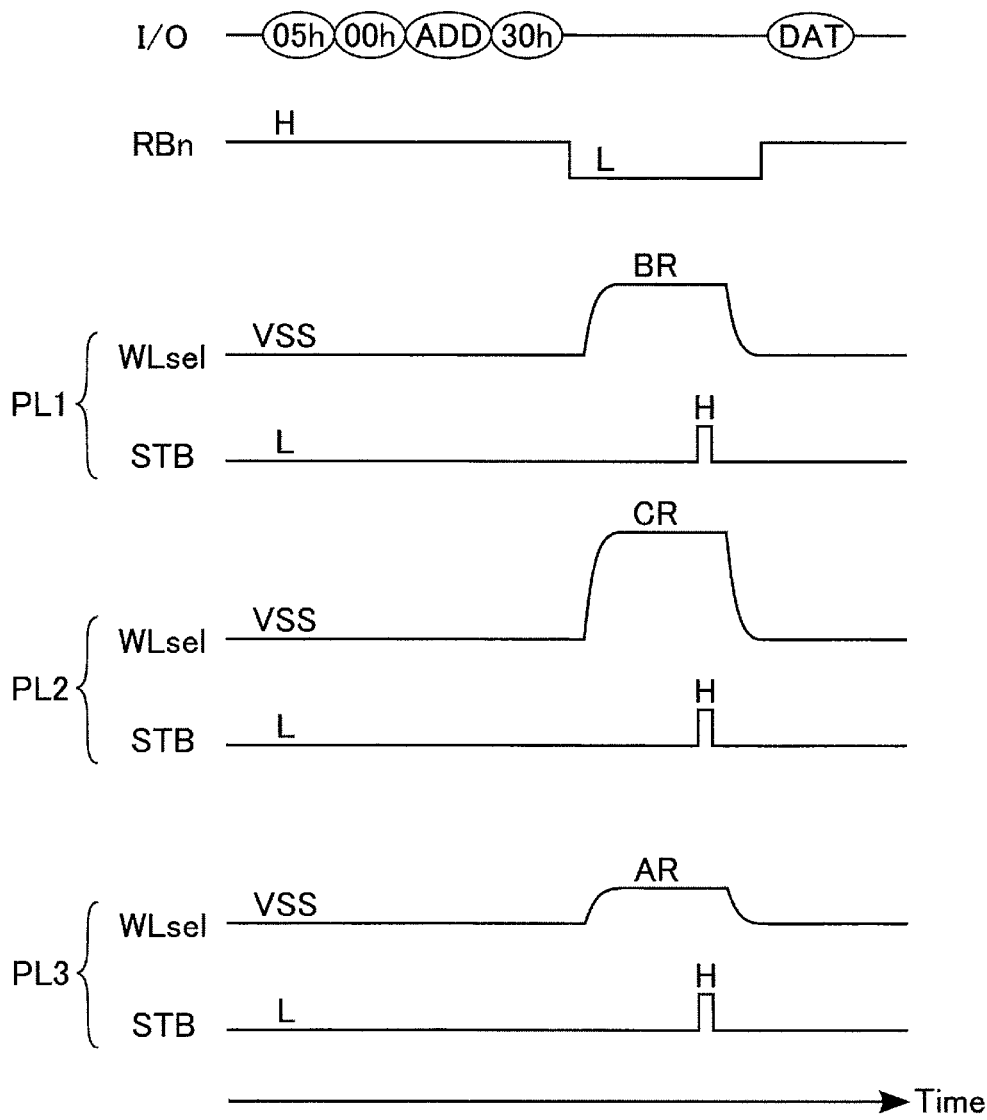
F I G. 80

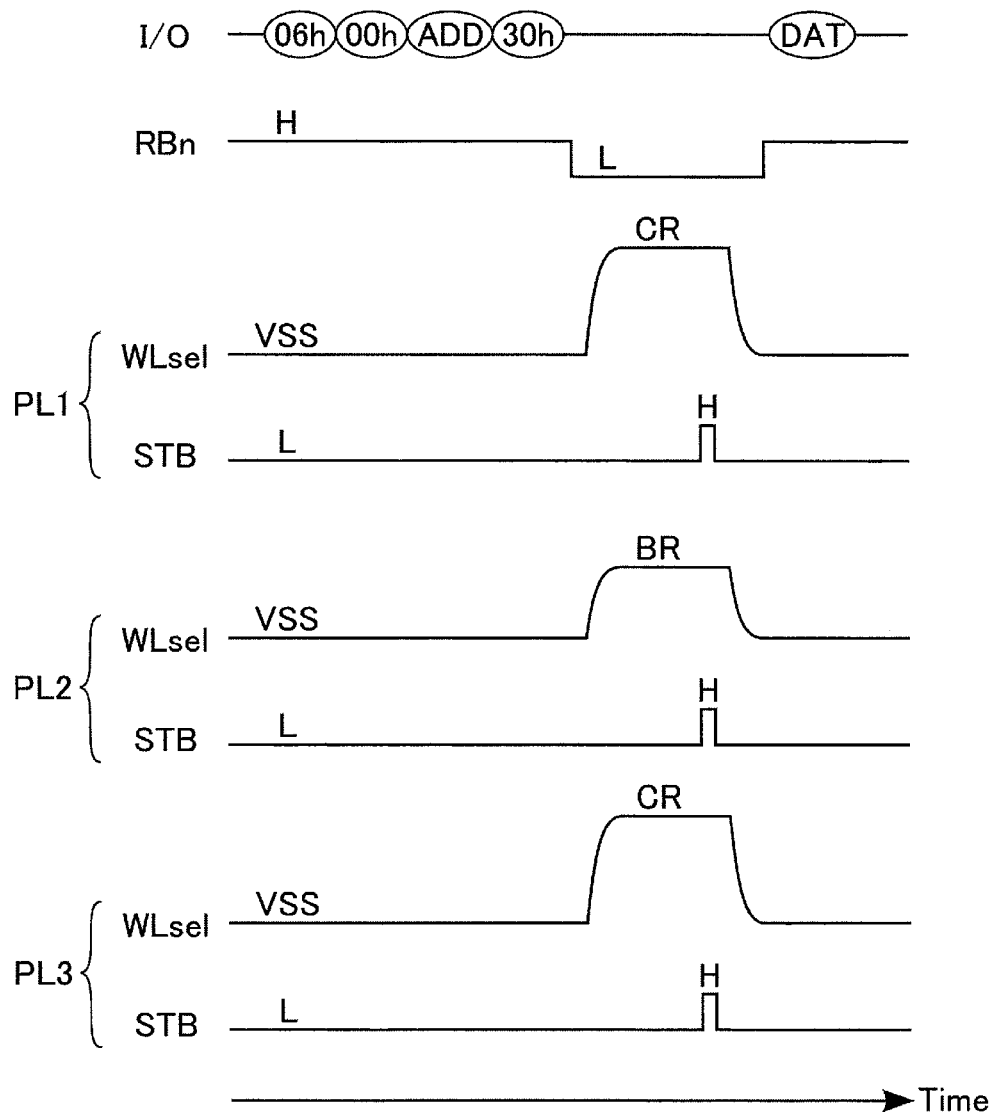
F I G. 81

Write operation:
allocation of latch circuits (seventh embodiment)

| Latch circuit | Write data | | | | | |
|---|---|---|---|---|---|---|
| | Z | A | | B | | C |
| | | VL | V | VL | V | V |
| ADL | 1 | 0 | 1 | 0 | 1 | 0 |
| BDL | 1 | 1 | | 0 | | 0 |
| XDL | 1 | 0 | | 0 | | 1 |

"A"-state write finished

| Latch circuit | Write data | | | | |
|---|---|---|---|---|---|
| | Z | A | B | | C |
| | | | VL | V | V |
| ADL | 1 | — | 0 | 1 | 0 |
| BDL | 1 | | 0 | | 1 |
| XDL | 1 | Data of next page | | | |

| Page | Read voltage | | |
|---|---|---|---|
| | First plane | Second plane | Third plane |
| First page | BR | BR | BR |
| Second page | BR | BR | BR |
| Third page | AR | BR | AR |
| Fourth page | BR | AR | CR |
| Fifth page | BR | CR | CR |
| Sixth page | CR | BR | AR |

F I G. 83

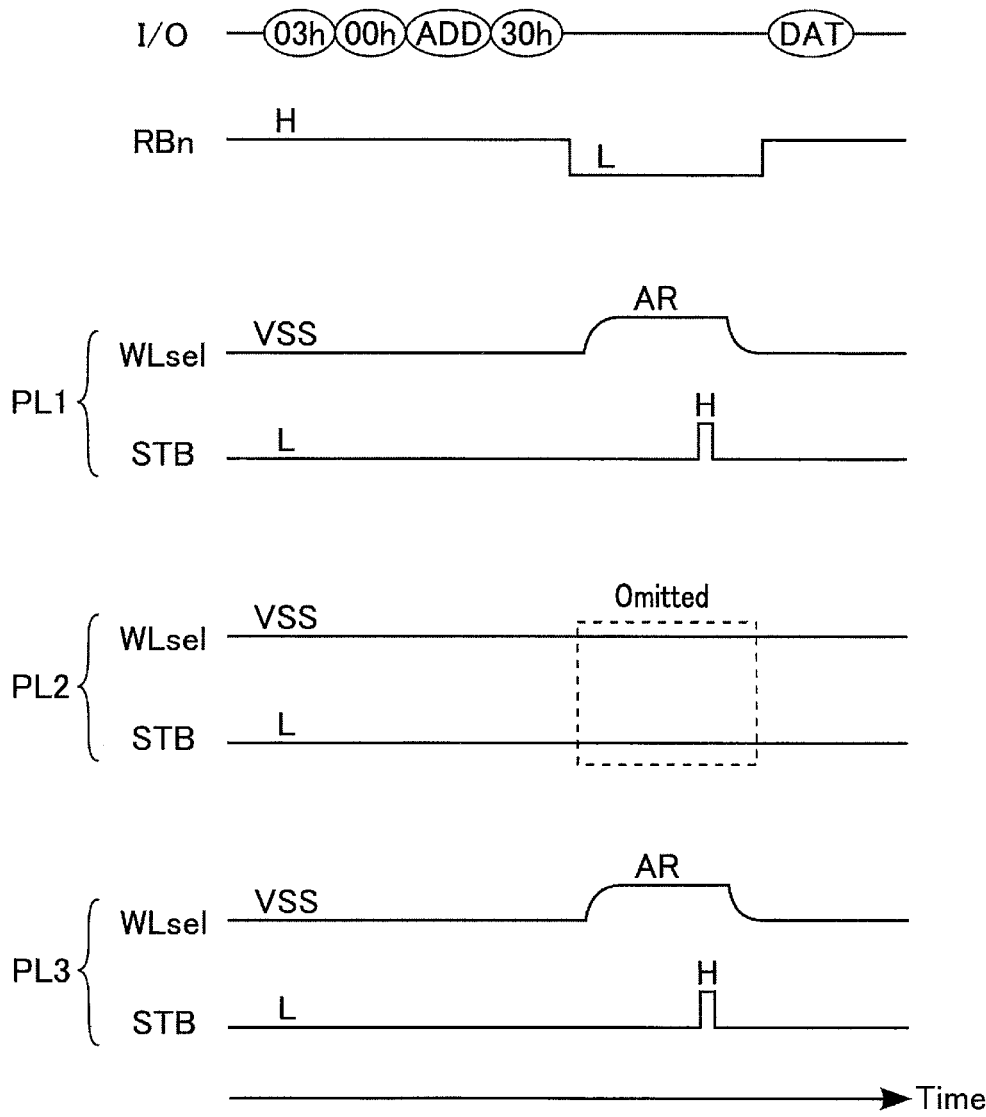
F I G. 85

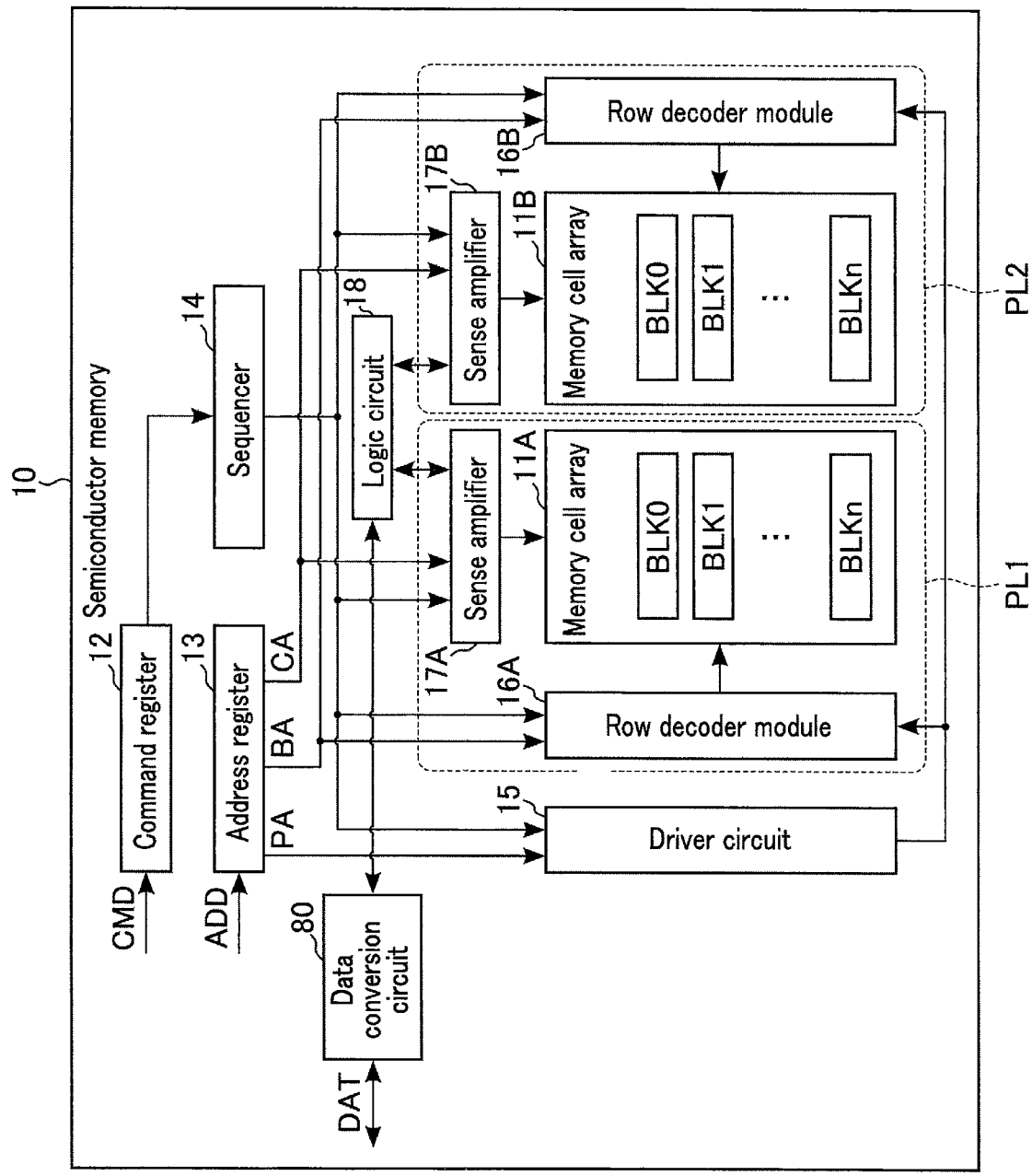
F I G. 90

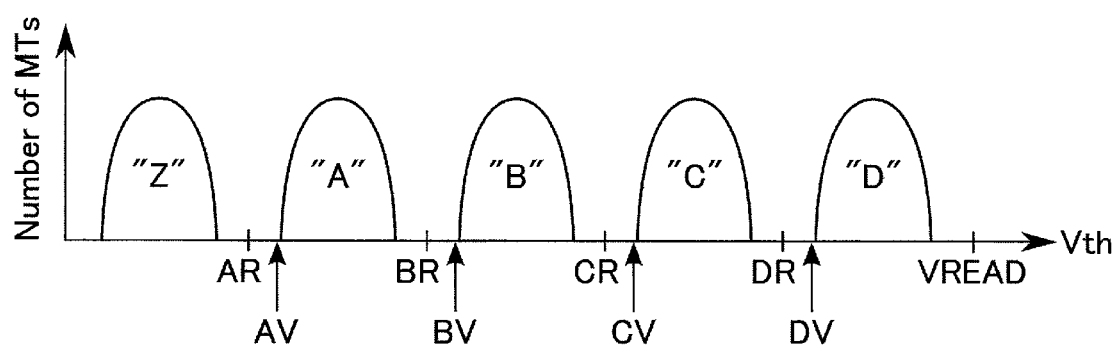
F I G. 91

Data allocation (tenth embodiment)

| | Vth of memory cells | | Data | | | |
|---|---|---|---|---|---|---|
| | First plane | Second plane | First page | Second page | Third page | Fourth page |
| (1) | Z | Z | 1 | 1 | 1 | 1 |
| (2) | Z | A | 1 | 1 | 0 | 1 |
| (3) | Z | B | 0 | 1 | 0 | 1 |
| (4) | Z | C | 0 | 1 | 0 | 0 |
| (5) | Z | D | 0 | 0 | 0 | 0 |
| (6) | A | Z | 0 | 1 | 1 | 1 |
| (7) | A | A | 0 | 1 | 0 | 1 |
| (8) | A | B | 1 | 1 | 0 | 1 |
| (9) | A | C | 1 | 1 | 0 | 0 |
| (10) | A | D | 1 | 0 | 0 | 0 |
| (11) | B | Z | 0 | 0 | 1 | 1 |
| (12) | B | A | 0 | 0 | 0 | 1 |
| (13) | B | B | 1 | 0 | 0 | 1 |
| (14) | B | C | 1 | 0 | 0 | 0 |
| (15) | B | D | 1 | 1 | 0 | 0 |
| (16) | C | Z | 0 | 0 | 0 | 1 |
| (17) | C | A | 0 | 0 | 1 | 1 |
| (18) | C | B | 1 | 0 | 1 | 1 |
| (19) | C | C | 1 | 0 | 1 | 0 |
| (20) | C | D | 1 | 1 | 1 | 0 |
| (21) | D | Z | 0 | 0 | 0 | 0 |
| (22) | D | A | 0 | 0 | 1 | 0 |
| (23) | D | B | 1 | 0 | 1 | 0 |
| (24) | D | C | 1 | 0 | 1 | 1 |
| (25) | D | D | 1 | 1 | 1 | 1 |
| (26) | Null combination | | 0 | 1 | 1 | 0 |

FIG. 92

Definitions of data (tenth embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | BR | 1 | 0 | 0 | 1 |
| Second page | BR | DR | 1 | 0 | 0 | 1 |
| Third page | CR | AR | 1 | 0 | 0 | 1 |
| Fourth page | DR | CR | 1 | 0 | 0 | 1 |

F I G. 93

| Vth of memory cells | | Result of read | | | | | | | |
|---|---|---|---|---|---|---|---|---|---|
| First plane | Second plane | First page | | Second page | | Third page | | Fourth page | |
| | | PL1 | PL2 | PL1 | PL2 | PL1 | PL2 | PL1 | PL2 |
| (1) Z | Z | L | L | L | L | L | L | L | L |
| (2) Z | A | L | L | L | L | L | H | L | L |
| (3) Z | B | L | H | L | L | L | H | L | L |
| (4) Z | C | L | H | L | L | L | H | L | H |
| (5) Z | D | L | H | L | H | L | H | L | H |
| (6) A | Z | H | L | L | L | L | L | L | L |
| (7) A | A | H | L | L | L | L | H | L | L |
| (8) A | B | H | H | L | L | L | H | L | L |
| (9) A | C | H | H | L | L | L | H | L | H |
| (10) A | D | H | H | L | H | L | H | L | H |
| (11) B | Z | H | L | H | L | L | L | L | L |
| (12) B | A | H | L | H | L | L | H | L | L |
| (13) B | B | H | H | H | L | L | H | L | L |
| (14) B | C | H | H | H | L | L | H | L | H |
| (15) B | D | H | H | H | H | L | H | L | H |
| (16) C | Z | H | L | H | L | H | L | L | L |
| (17) C | A | H | L | H | L | H | H | L | L |
| (18) C | B | H | H | H | L | H | H | L | L |
| (19) C | C | H | H | H | L | H | H | L | H |
| (20) C | D | H | H | H | H | H | H | L | H |
| (21) D | Z | H | L | H | L | H | L | H | L |
| (22) D | A | H | L | H | L | H | H | H | L |
| (23) D | B | H | H | H | L | H | H | H | L |
| (24) D | C | H | H | H | L | H | H | H | H |
| (25) D | D | H | H | H | H | H | H | H | H |
| Read voltage | | AR | BR | BR | DR | CR | AR | DR | CR |

F I G. 94

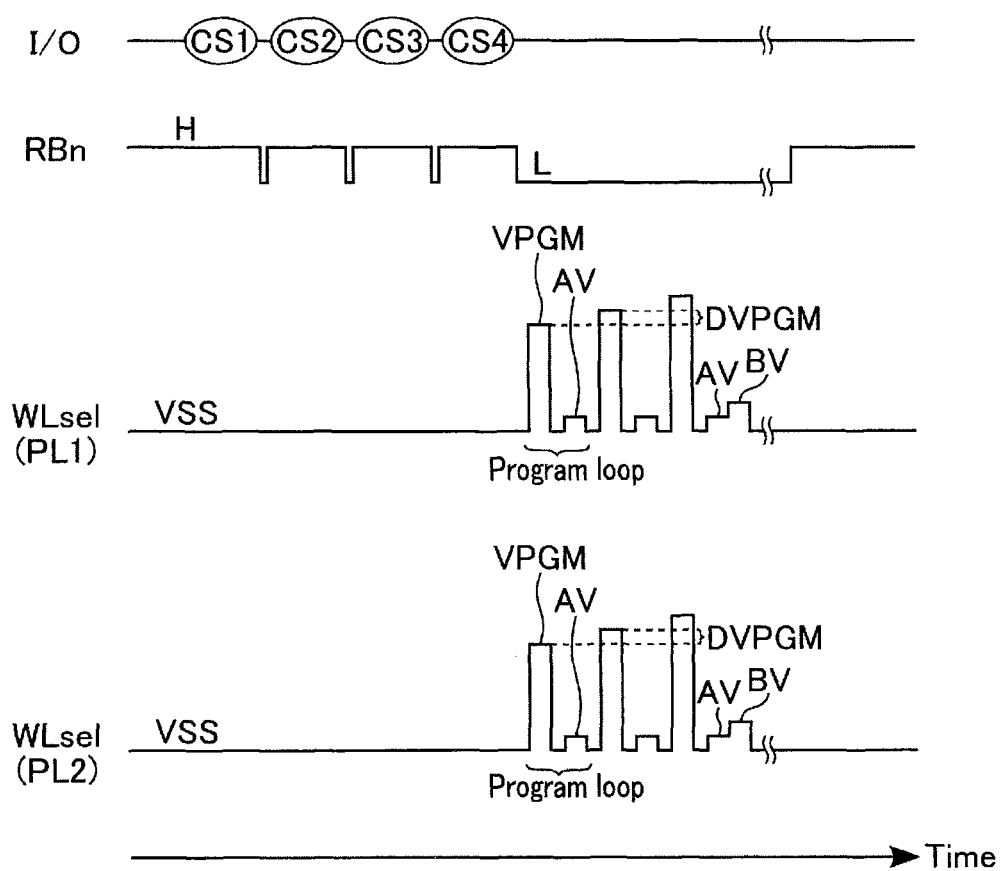
F I G. 95

Change in amount of data

| Input | After conversion | Increment |
|---|---|---|
| 1024 | 1093 | 69 |
| 2048 | 2185 | 137 |
| 4096 | 4370 | 274 |
| 8192 | 8739 | 547 |
| 16384 | 17477 | 1093 |

F I G. 96

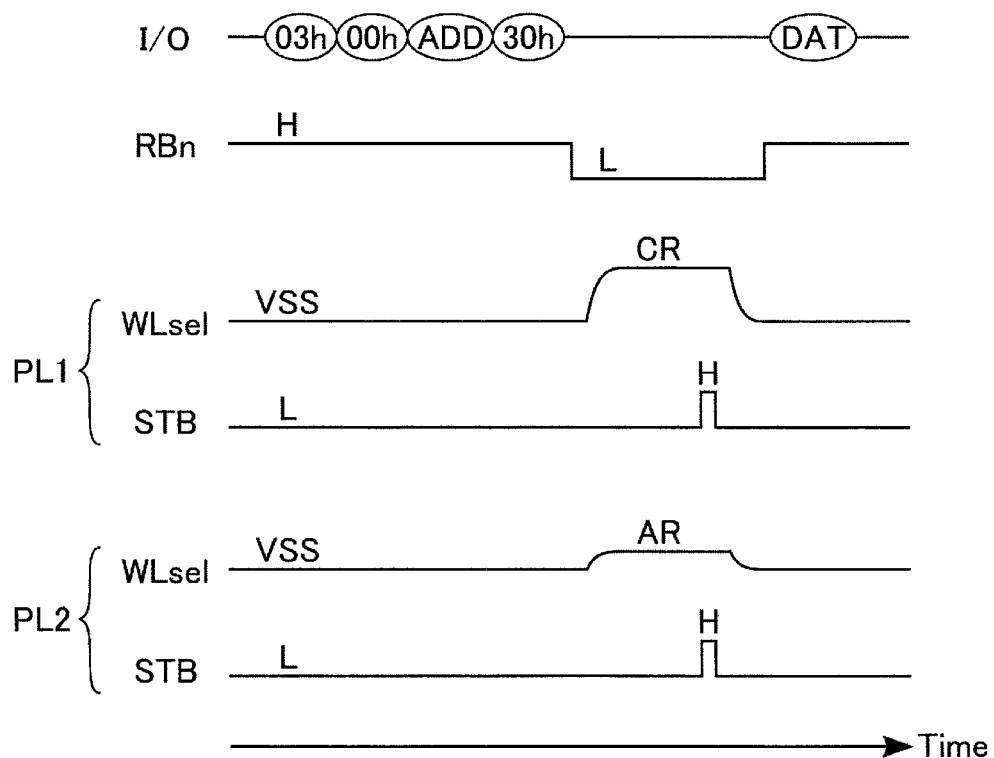
F I G. 99

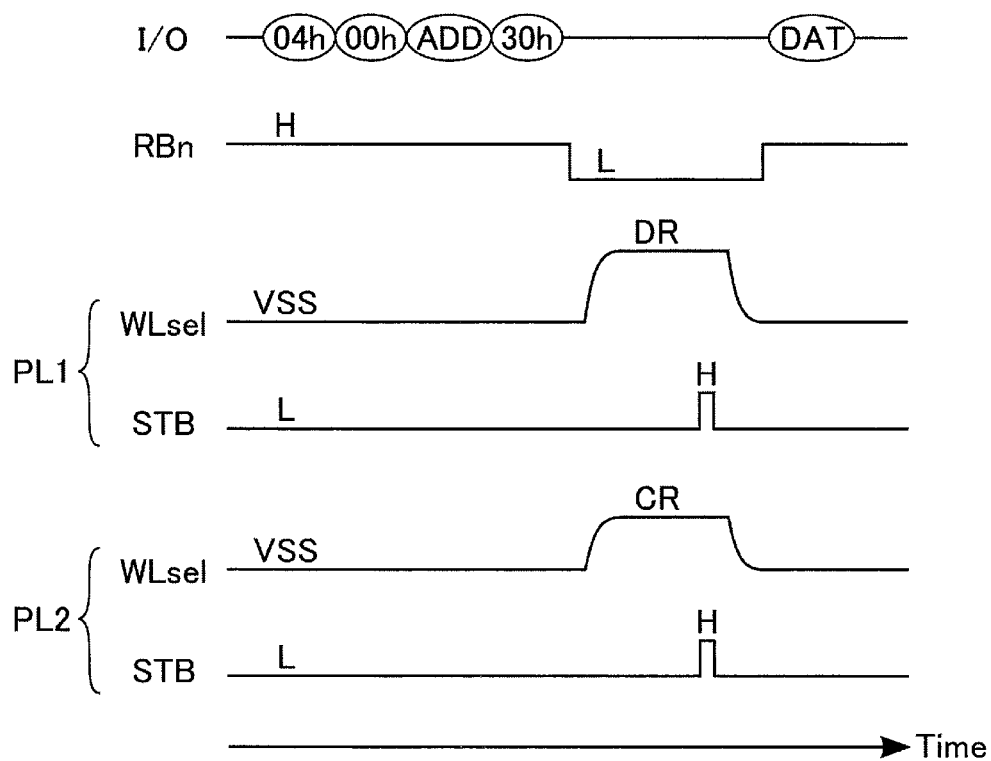
F I G. 100

Data allocation (modification of tenth embodiment)

| | Vth of memory cells | | Data | | | |
|---|---|---|---|---|---|---|
| | First plane | Second plane | First page | Second page | Third page | Fourth page |
| (1) | Z | Z | 1 | 1 | 1 | 0 |
| (2) | Z | A | 1 | 1 | 0 | 0 |
| (3) | Z | B | 1 | 1 | 0 | 0 |
| (4) | Z | C | 1 | 1 | 0 | 1 |
| (5) | Z | D | 1 | 1 | 0 | 1 |
| (6) | A | Z | 1 | 1 | 1 | 0 |
| (7) | A | A | 1 | 1 | 0 | 0 |
| (8) | A | B | 0 | 1 | 0 | 0 |
| (9) | A | C | 0 | 1 | 0 | 1 |
| (10) | A | D | 0 | 1 | 0 | 1 |
| (11) | B | Z | 1 | 0 | 1 | 0 |
| (12) | B | A | 1 | 0 | 0 | 0 |
| (13) | B | B | 0 | 0 | 0 | 0 |
| (14) | B | C | 0 | 0 | 0 | 1 |
| (15) | B | D | 0 | 1 | 0 | 1 |
| (16) | C | Z | 1 | 0 | 0 | 0 |
| (17) | C | A | 1 | 0 | 1 | 0 |
| (18) | C | B | 0 | 0 | 1 | 0 |
| (19) | C | C | 0 | 0 | 1 | 1 |
| (20) | C | D | 0 | 1 | 1 | 1 |
| (21) | D | Z | 1 | 0 | 0 | 1 |
| (22) | D | A | 1 | 0 | 1 | 1 |
| (23) | D | B | 0 | 0 | 1 | 1 |
| (24) | D | C | 0 | 0 | 1 | 0 |
| (25) | D | D | 0 | 1 | 1 | 0 |
| (26) | Null combination | | 1 | 1 | 1 | 1 |

F I G. 102

Definitions of data (modification of tenth embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | AR | BR | 1 | 1 | 1 | 0 |
| Second page | BR | DR | 1 | 1 | 0 | 1 |
| Third page | CR | AR | 0 | 1 | 1 | 0 |
| Fourth page | DR | CR | 0 | 1 | 1 | 0 |

F I G. 103

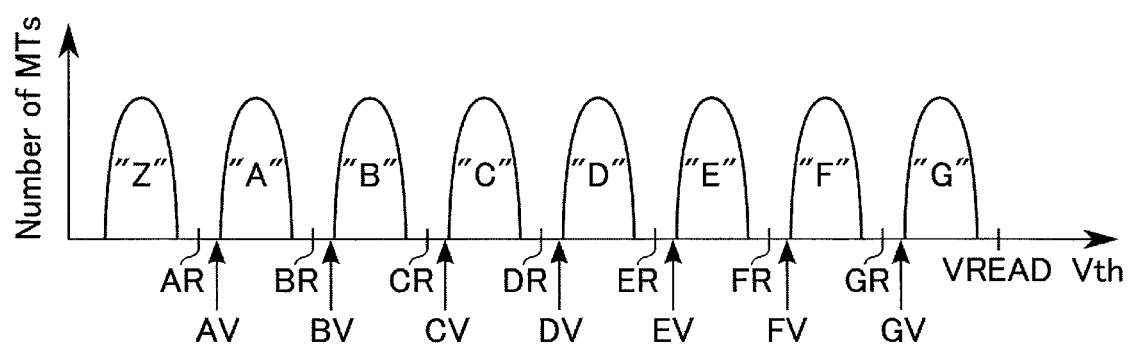
F I G. 104

Data allocation (1/2) (eleventh embodiment)

| | Vth of memory cells | | Data | | | | | |
|---|---|---|---|---|---|---|---|---|
| | First plane | Second plane | First page | Second page | Third page | Fourth page | Fifth page | Sixth page |
| (1) | Z | Z | 1 | 0 | 0 | 0 | 0 | 0 |
| (2) | Z | A | 1 | 0 | 0 | 1 | 0 | 0 |
| (3) | Z | B | 1 | 0 | 1 | 1 | 0 | 1 |
| (4) | Z | C | 1 | 0 | 1 | 0 | 0 | 1 |
| (5) | Z | D | 1 | 1 | 1 | 0 | 0 | 1 |
| (6) | Z | E | 1 | 1 | 1 | 0 | 1 | 1 |
| (7) | Z | F | 1 | 1 | 0 | 0 | 1 | 0 |
| (8) | Z | G | 1 | 1 | 0 | 0 | 0 | 0 |
| (9) | A | Z | 1 | 0 | 1 | 0 | 0 | 0 |
| (10) | A | A | 1 | 0 | 1 | 1 | 0 | 0 |
| (11) | A | B | 1 | 0 | 0 | 1 | 0 | 1 |
| (12) | A | C | 1 | 0 | 0 | 0 | 0 | 1 |
| (13) | A | D | 1 | 1 | 0 | 0 | 0 | 1 |
| (14) | A | E | 1 | 1 | 0 | 0 | 1 | 1 |
| (15) | A | F | 1 | 1 | 1 | 0 | 1 | 0 |
| (16) | A | G | 1 | 1 | 1 | 0 | 0 | 0 |
| (17) | B | Z | 1 | 0 | 1 | 1 | 1 | 0 |
| (18) | B | A | 1 | 0 | 1 | 0 | 1 | 0 |
| (19) | B | B | 1 | 0 | 0 | 0 | 1 | 1 |
| (20) | B | C | 1 | 0 | 0 | 1 | 1 | 1 |
| (21) | B | D | 1 | 1 | 0 | 1 | 1 | 1 |
| (22) | B | E | 1 | 1 | 0 | 1 | 0 | 1 |
| (23) | B | F | 1 | 1 | 1 | 1 | 0 | 0 |
| (24) | B | G | 1 | 1 | 1 | 1 | 1 | 0 |
| (25) | C | Z | 1 | 0 | 0 | 1 | 1 | 0 |
| (26) | C | A | 1 | 0 | 0 | 0 | 1 | 0 |
| (27) | C | B | 1 | 0 | 1 | 0 | 1 | 1 |
| (28) | C | C | 1 | 0 | 1 | 1 | 1 | 1 |
| (29) | C | D | 1 | 1 | 1 | 1 | 1 | 1 |
| (30) | C | E | 1 | 1 | 1 | 1 | 0 | 1 |
| (31) | C | F | 1 | 1 | 0 | 1 | 0 | 0 |
| (32) | C | G | 1 | 1 | 0 | 1 | 1 | 0 |

F I G. 105

Data allocation (2/2) (eleventh embodiment)

| | Vth of memory cells | | Data | | | | | |
|---|---|---|---|---|---|---|---|---|
| | First plane | Second plane | First page | Second page | Third page | Fourth page | Fifth page | Sixth page |
| (33) | D | Z | 0 | 1 | 0 | 1 | 1 | 0 |
| (34) | D | A | 0 | 1 | 0 | 0 | 1 | 0 |
| (35) | D | B | 0 | 1 | 1 | 0 | 1 | 1 |
| (36) | D | C | 0 | 1 | 1 | 1 | 1 | 1 |
| (37) | D | D | 0 | 0 | 1 | 1 | 1 | 1 |
| (38) | D | E | 0 | 0 | 1 | 1 | 0 | 1 |
| (39) | D | F | 0 | 0 | 0 | 1 | 0 | 0 |
| (40) | D | G | 0 | 0 | 0 | 1 | 1 | 0 |
| (41) | E | Z | 0 | 1 | 0 | 1 | 1 | 1 |
| (42) | E | A | 0 | 1 | 0 | 0 | 1 | 1 |
| (43) | E | B | 0 | 1 | 1 | 0 | 1 | 0 |
| (44) | E | C | 0 | 1 | 1 | 1 | 1 | 0 |
| (45) | E | D | 0 | 0 | 1 | 1 | 1 | 0 |
| (46) | E | E | 0 | 0 | 1 | 1 | 0 | 0 |
| (47) | E | F | 0 | 0 | 0 | 1 | 0 | 1 |
| (48) | E | G | 0 | 0 | 0 | 1 | 1 | 1 |
| (49) | F | Z | 0 | 1 | 0 | 0 | 0 | 1 |
| (50) | F | A | 0 | 1 | 0 | 1 | 0 | 1 |
| (51) | F | B | 0 | 1 | 1 | 1 | 0 | 0 |
| (52) | F | C | 0 | 1 | 1 | 0 | 0 | 0 |
| (53) | F | D | 0 | 0 | 1 | 0 | 0 | 0 |
| (54) | F | E | 0 | 0 | 1 | 0 | 1 | 0 |
| (55) | F | F | 0 | 0 | 0 | 0 | 1 | 1 |
| (56) | F | G | 0 | 0 | 0 | 0 | 0 | 1 |
| (57) | G | Z | 0 | 1 | 0 | 0 | 0 | 0 |
| (58) | G | A | 0 | 1 | 0 | 1 | 0 | 0 |
| (59) | G | B | 0 | 1 | 1 | 1 | 0 | 1 |
| (60) | G | C | 0 | 1 | 1 | 0 | 0 | 1 |
| (61) | G | D | 0 | 0 | 1 | 0 | 0 | 1 |
| (62) | G | E | 0 | 0 | 1 | 0 | 1 | 1 |
| (63) | G | F | 0 | 0 | 0 | 0 | 1 | 0 |
| (64) | G | G | 0 | 0 | 0 | 0 | 0 | 0 |

F I G. 106

Definitions of data (eleventh embodiment)

| Read operation | Read voltage | | Read data | | | |
|---|---|---|---|---|---|---|
| | PL1 | PL2 | PL1:PL2 (L:L) | PL1:PL2 (L:H) | PL1:PL2 (H:L) | PL1:PL2 (H:H) |
| First page | DR | DR | 1 | 1 | 0 | 0 |
| Second page | DR | DR | 0 | 1 | 1 | 0 |
| Third page | AR,CR | BR,FR | 0 | 1 | 1 | 0 |
| Fourth page | BR,FR | AR,CR | 0 | 1 | 1 | 0 |
| Fifth page | BR,FR | ER,GR | 0 | 1 | 1 | 0 |
| Sixth page | ER,GR | BR,FR | 0 | 1 | 1 | 0 |

F I G. 107

|  | Vth of memory cells | | Result of read | | | | | |
|---|---|---|---|---|---|---|---|---|
|  | First plane | Second plane | First page | | Second page | | Third page | |
|  |  |  | PL1 | PL2 | PL1 | PL2 | PL1 | PL2 |
| (1) | Z | Z | L | L | L | L | L | L |
| (2) | Z | A | L | L | L | L | L | L |
| (3) | Z | B | L | L | L | L | L | H |
| (4) | Z | C | L | L | L | L | L | H |
| (5) | Z | D | L | H | L | H | L | H |
| (6) | Z | E | L | H | L | H | L | H |
| (7) | Z | F | L | H | L | H | L | L |
| (8) | Z | G | L | H | L | H | L | L |
| (9) | A | Z | L | L | L | L | H | L |
| (10) | A | A | L | L | L | L | H | L |
| (11) | A | B | L | L | L | L | H | H |
| (12) | A | C | L | L | L | L | H | H |
| (13) | A | D | L | H | L | H | H | H |
| (14) | A | E | L | H | L | H | H | H |
| (15) | A | F | L | H | L | H | H | L |
| (16) | A | G | L | H | L | H | H | L |
| (17) | B | Z | L | L | L | L | H | L |
| (18) | B | A | L | L | L | L | H | L |
| (19) | B | B | L | L | L | L | H | H |
| (20) | B | C | L | L | L | L | H | H |
| (21) | B | D | L | H | L | H | H | H |
| (22) | B | E | L | H | L | H | H | H |
| (23) | B | F | L | H | L | H | H | L |
| (24) | B | G | L | H | L | H | H | L |
| (25) | C | Z | L | L | L | L | L | L |
| (26) | C | A | L | L | L | L | L | L |
| (27) | C | B | L | L | L | L | L | H |
| (28) | C | C | L | L | L | L | L | H |
| (29) | C | D | L | H | L | H | L | H |
| (30) | C | E | L | H | L | H | L | H |
| (31) | C | F | L | H | L | H | L | L |
| (32) | C | G | L | H | L | H | L | L |
|  | Read voltage | | DR | DR | DR | DR | AR,CR | BR,FR |

F I G. 108

|      | Vth of memory cells | | Result of read | | | | | |
|------|----|----|----|----|----|----|----|----|
|      | First plane | Second plane | First page | | Second page | | Third page | |
|      |    |    | PL1 | PL2 | PL1 | PL2 | PL1 | PL2 |
| (33) | D | Z | H | L | H | L | L | L |
| (34) | D | A | H | L | H | L | L | L |
| (35) | D | B | H | L | H | L | L | H |
| (36) | D | C | H | L | H | L | L | H |
| (37) | D | D | H | H | H | H | L | H |
| (38) | D | E | H | H | H | H | L | H |
| (39) | D | F | H | H | H | H | L | L |
| (40) | D | G | H | H | H | H | L | L |
| (41) | E | Z | H | L | H | L | L | L |
| (42) | E | A | H | L | H | L | L | L |
| (43) | E | B | H | L | H | L | L | H |
| (44) | E | C | H | L | H | L | L | H |
| (45) | E | D | H | H | H | H | L | H |
| (46) | E | E | H | H | H | H | L | H |
| (47) | E | F | H | H | H | H | L | L |
| (48) | E | G | H | H | H | H | L | L |
| (49) | F | Z | H | L | H | L | L | L |
| (50) | F | A | H | L | H | L | L | L |
| (51) | F | B | H | L | H | L | L | H |
| (52) | F | C | H | L | H | L | L | H |
| (53) | F | D | H | H | H | H | L | H |
| (54) | F | E | H | H | H | H | L | H |
| (55) | F | F | H | H | H | H | L | L |
| (56) | F | G | H | H | H | H | L | L |
| (57) | G | Z | H | L | H | L | L | L |
| (58) | G | A | H | L | H | L | L | L |
| (59) | G | B | H | L | H | L | L | H |
| (60) | G | C | H | L | H | L | L | H |
| (61) | G | D | H | H | H | H | L | H |
| (62) | G | E | H | H | H | H | L | H |
| (63) | G | F | H | H | H | H | L | L |
| (64) | G | G | H | H | H | H | L | L |
| Read voltage | | | DR | DR | DR | DR | AR,CR | BR,FR |

F I G. 109

|     | Vth of memory cells | | Result of read | | | | | |
| --- | --- | --- | --- | --- | --- | --- | --- | --- |
|     | First plane | Second plane | Fourth page | | Fifth page | | Sixth page | |
|     |  |  | PL1 | PL2 | PL1 | PL2 | PL1 | PL2 |
| (1) | Z | Z | L | L | L | L | L | L |
| (2) | Z | A | L | H | L | L | L | L |
| (3) | Z | B | L | H | L | L | L | H |
| (4) | Z | C | L | L | L | L | L | H |
| (5) | Z | D | L | L | L | L | L | H |
| (6) | Z | E | L | L | L | H | L | H |
| (7) | Z | F | L | L | L | H | L | L |
| (8) | Z | G | L | L | L | L | L | L |
| (9) | A | Z | L | L | L | L | L | L |
| (10) | A | A | L | H | L | L | L | L |
| (11) | A | B | L | H | L | L | L | H |
| (12) | A | C | L | L | L | L | L | H |
| (13) | A | D | L | L | L | L | L | H |
| (14) | A | E | L | L | L | H | L | H |
| (15) | A | F | L | L | L | H | L | L |
| (16) | A | G | L | L | L | L | L | L |
| (17) | B | Z | H | L | H | L | L | L |
| (18) | B | A | H | H | H | L | L | L |
| (19) | B | B | H | H | H | L | L | H |
| (20) | B | C | H | L | H | L | L | H |
| (21) | B | D | H | L | H | L | L | H |
| (22) | B | E | H | L | H | H | L | H |
| (23) | B | F | H | L | H | H | L | L |
| (24) | B | G | H | L | H | L | L | L |
| (25) | C | Z | H | L | H | L | L | L |
| (26) | C | A | H | H | H | L | L | L |
| (27) | C | B | H | H | H | L | L | H |
| (28) | C | C | H | L | H | L | L | H |
| (29) | C | D | H | L | H | L | L | H |
| (30) | C | E | H | L | H | H | L | H |
| (31) | C | F | H | L | H | H | L | L |
| (32) | C | G | H | L | H | L | L | L |
|     | Read voltage | | BR,FR | AR,CR | BR,FR | ER,GR | ER,GR | BR,FR |

FIG. 110

| | Vth of memory cells | | Result of read | | | | | |
|---|---|---|---|---|---|---|---|---|
| | First plane | Second plane | Fourth page | | Fifth page | | Sixth page | |
| | | | PL1 | PL2 | PL1 | PL2 | PL1 | PL2 |
| (33) | D | Z | H | L | H | L | L | L |
| (34) | D | A | H | H | H | L | L | L |
| (35) | D | B | H | H | H | L | L | H |
| (36) | D | C | H | L | H | L | L | H |
| (37) | D | D | H | L | H | L | L | H |
| (38) | D | E | H | L | H | H | L | H |
| (39) | D | F | H | L | H | H | L | L |
| (40) | D | G | H | L | H | L | L | L |
| (41) | E | Z | H | L | H | L | H | L |
| (42) | E | A | H | H | H | L | H | L |
| (43) | E | B | H | H | H | L | H | H |
| (44) | E | C | H | L | H | L | H | H |
| (45) | E | D | H | L | H | L | H | H |
| (46) | E | E | H | L | H | H | H | H |
| (47) | E | F | H | L | H | H | H | L |
| (48) | E | G | H | L | H | L | H | L |
| (49) | F | Z | L | L | L | L | H | L |
| (50) | F | A | L | H | L | L | H | L |
| (51) | F | B | L | H | L | L | H | H |
| (52) | F | C | L | L | L | L | H | H |
| (53) | F | D | L | L | L | L | H | H |
| (54) | F | E | L | L | L | H | H | H |
| (55) | F | F | L | L | L | H | H | L |
| (56) | F | G | L | L | L | L | H | L |
| (57) | G | Z | L | L | L | L | L | L |
| (58) | G | A | L | H | L | L | L | L |
| (59) | G | B | L | H | L | L | L | H |
| (60) | G | C | L | L | L | L | L | H |
| (61) | G | D | L | L | L | L | L | H |
| (62) | G | E | L | L | L | H | L | H |
| (63) | G | F | L | L | L | H | L | L |
| (64) | G | G | L | L | L | L | L | L |
| | Read voltage | | BR,FR | AR,CR | BR,FR | ER,GR | ER,GR | BR,FR |

F I G. 111

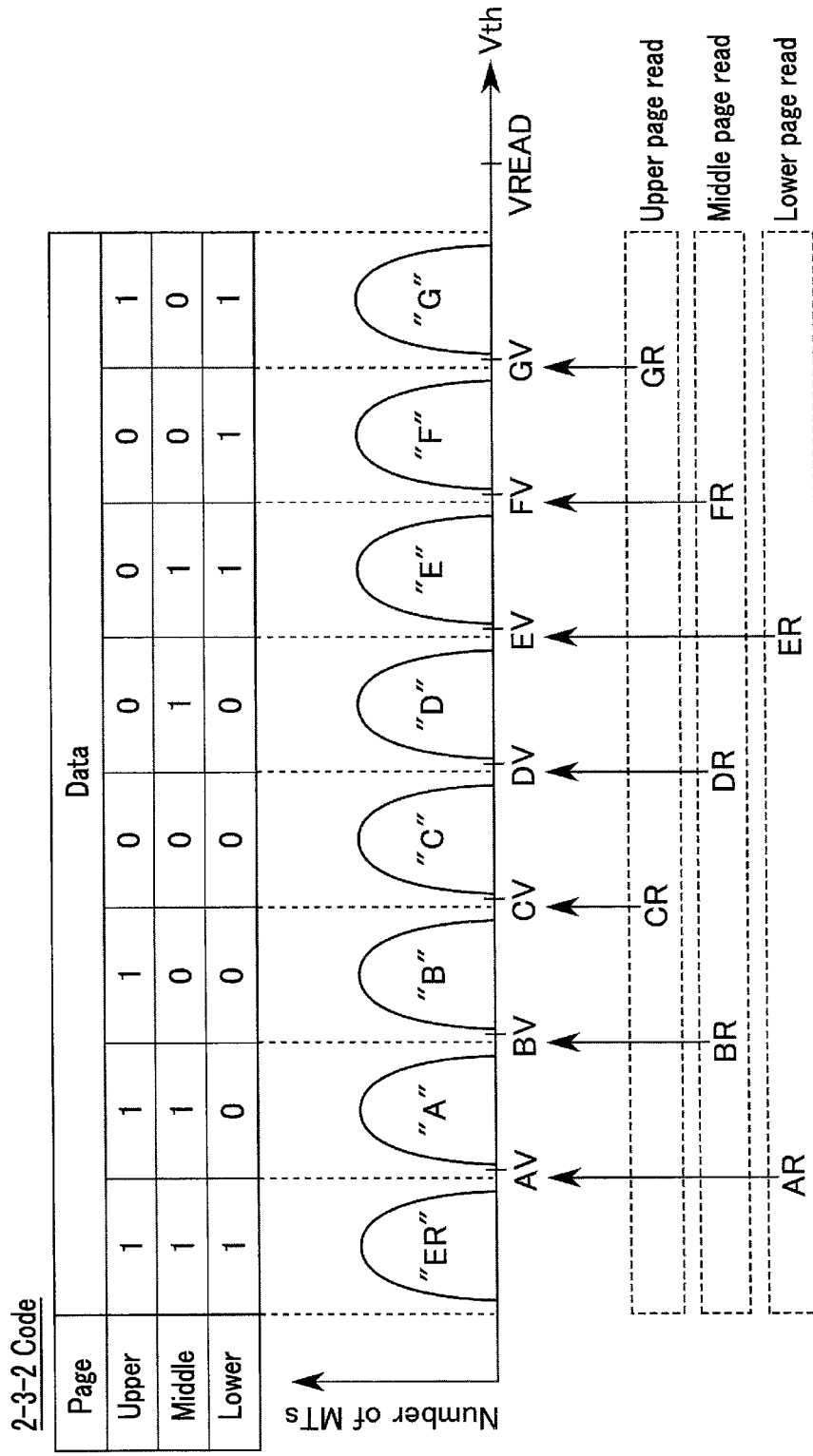
F I G. 119

Data allocation:
first stage write (twelfth embodiment)

|     | Vth of memory cells | | Data | |
| --- | --- | --- | --- | --- |
|     | First plane | Second plane | First page | Second page |
| (1) | Z | Z | 1 | 1 |
| (2) | Z | LM | 1 | 0 |
| (3) | LM | Z | 0 | 1 |
| (4) | LM | LM | 0 | 0 |

F I G. 122

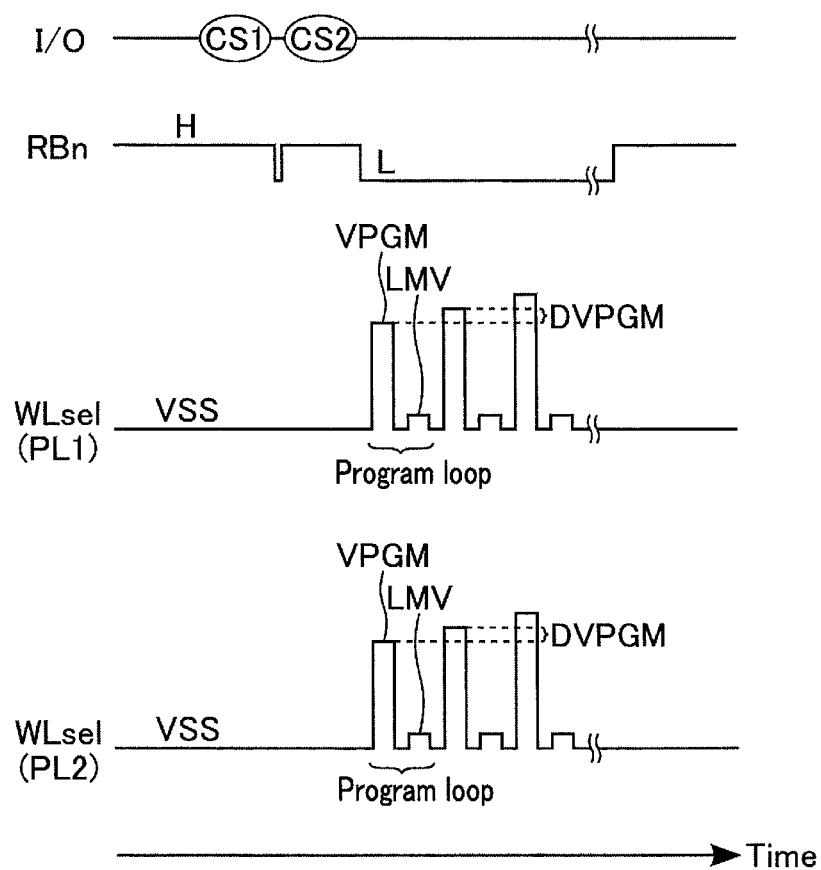
F I G. 123

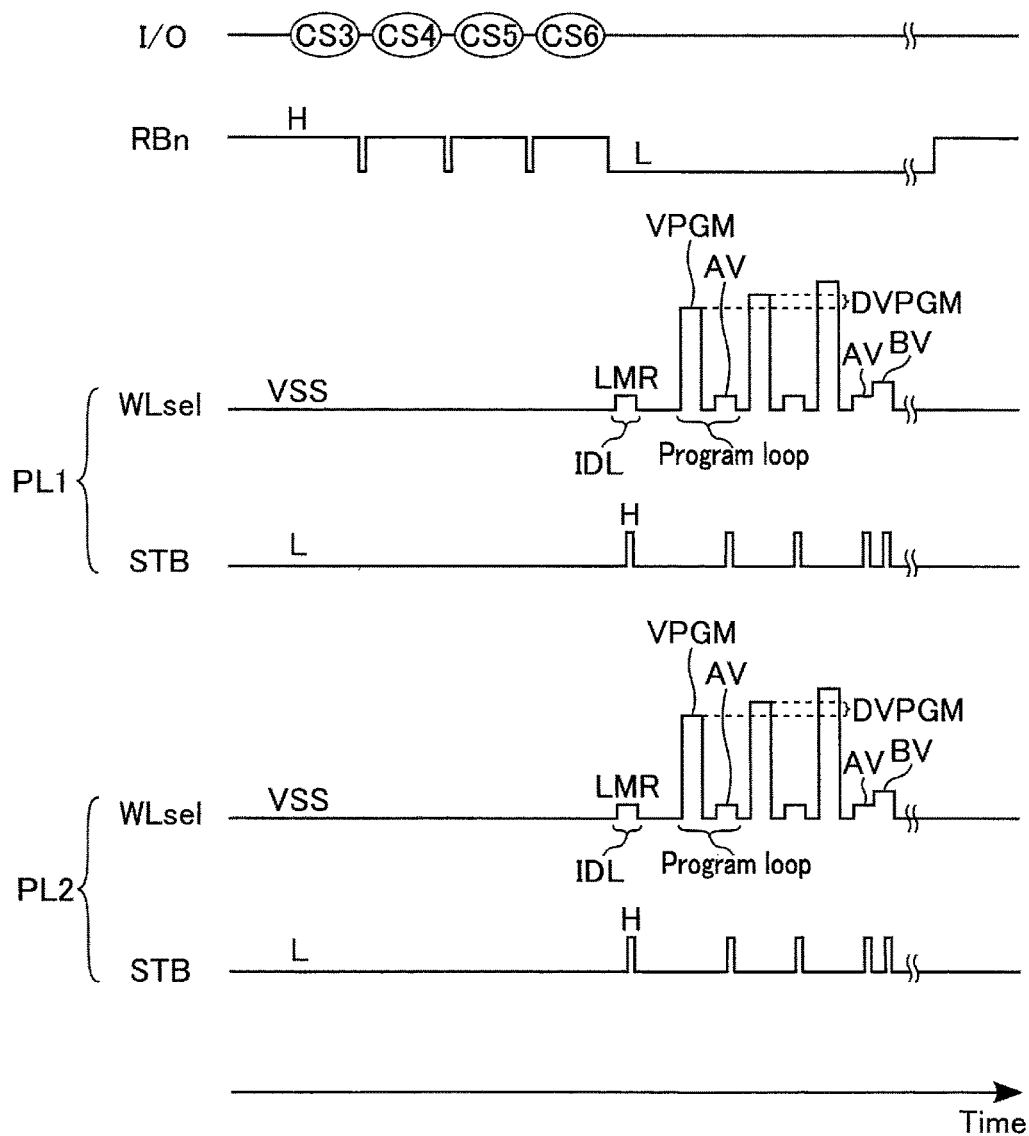
F I G. 124

| Order of read | Selected page | Read voltage | |
|---|---|---|---|
| | | First plane | Second plane |
| 1 | First page | DR | DR |
| 2 | Second page | (DR) | (DR) |
| 3 | Third page | AR,CR | BR,FR |
| 4 | Sixth page | ER,GR | (BR,FR) |
| 5 | Fifth page | BR,FR | ER,GR |
| 6 | Fourth page | (BR,FR) | AR,CR |

( ) Read operation can be omitted

F I G. 126

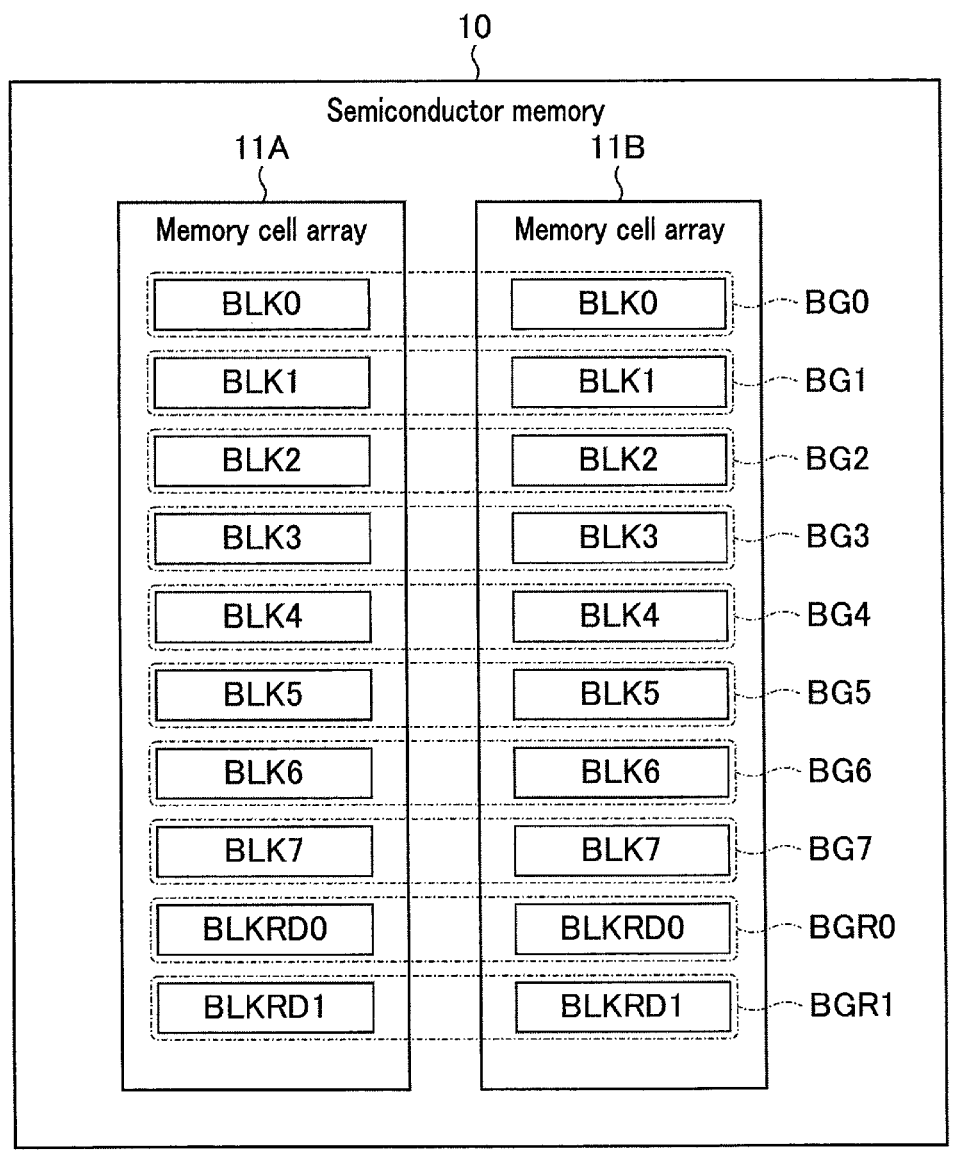
F I G. 127

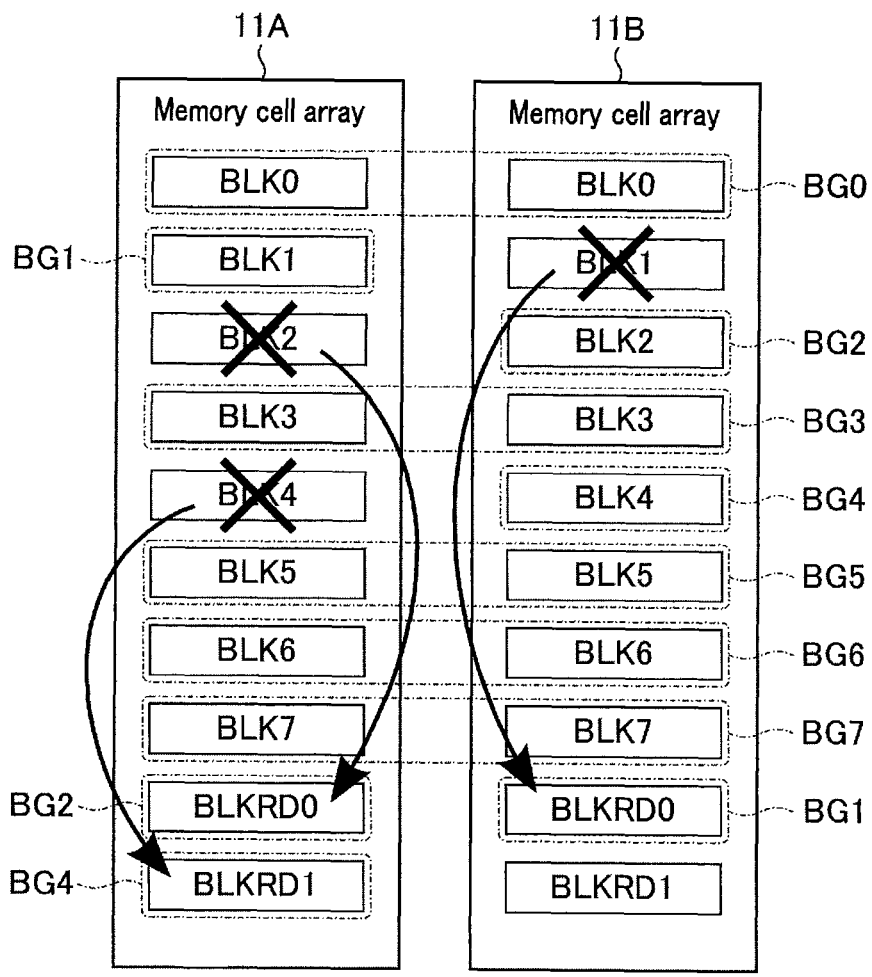
F I G. 129

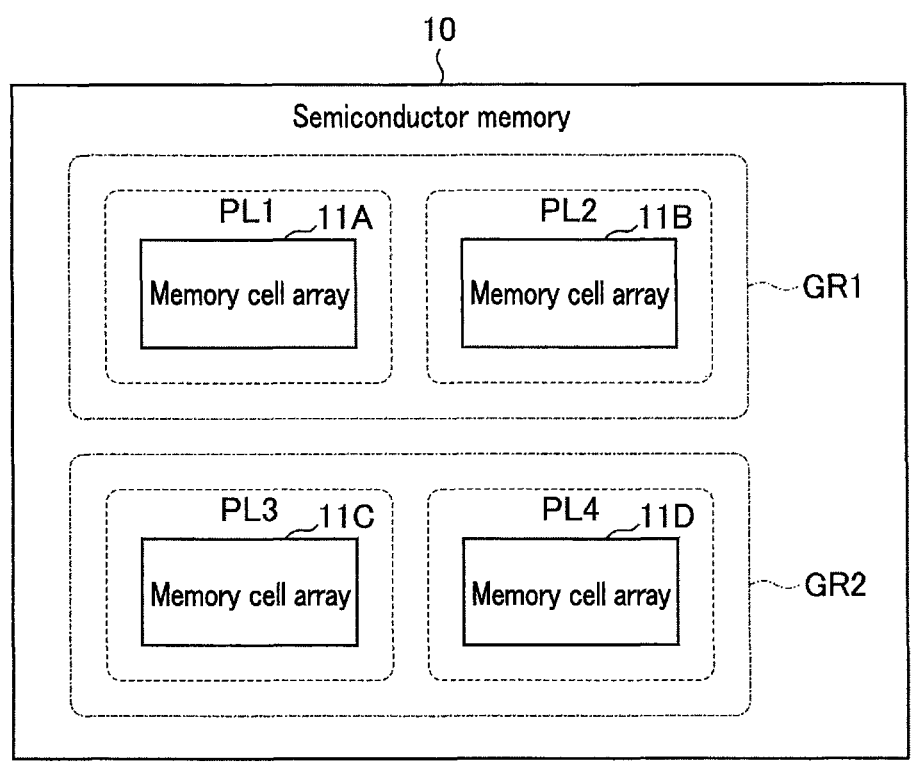
F I G. 130

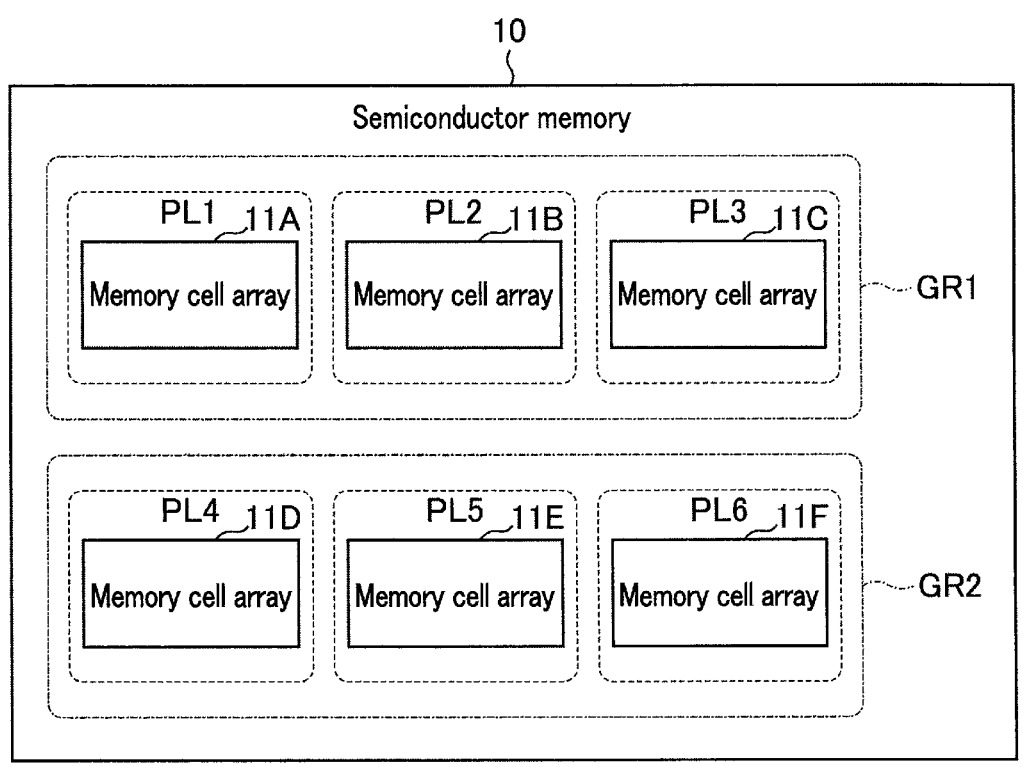
F I G. 131

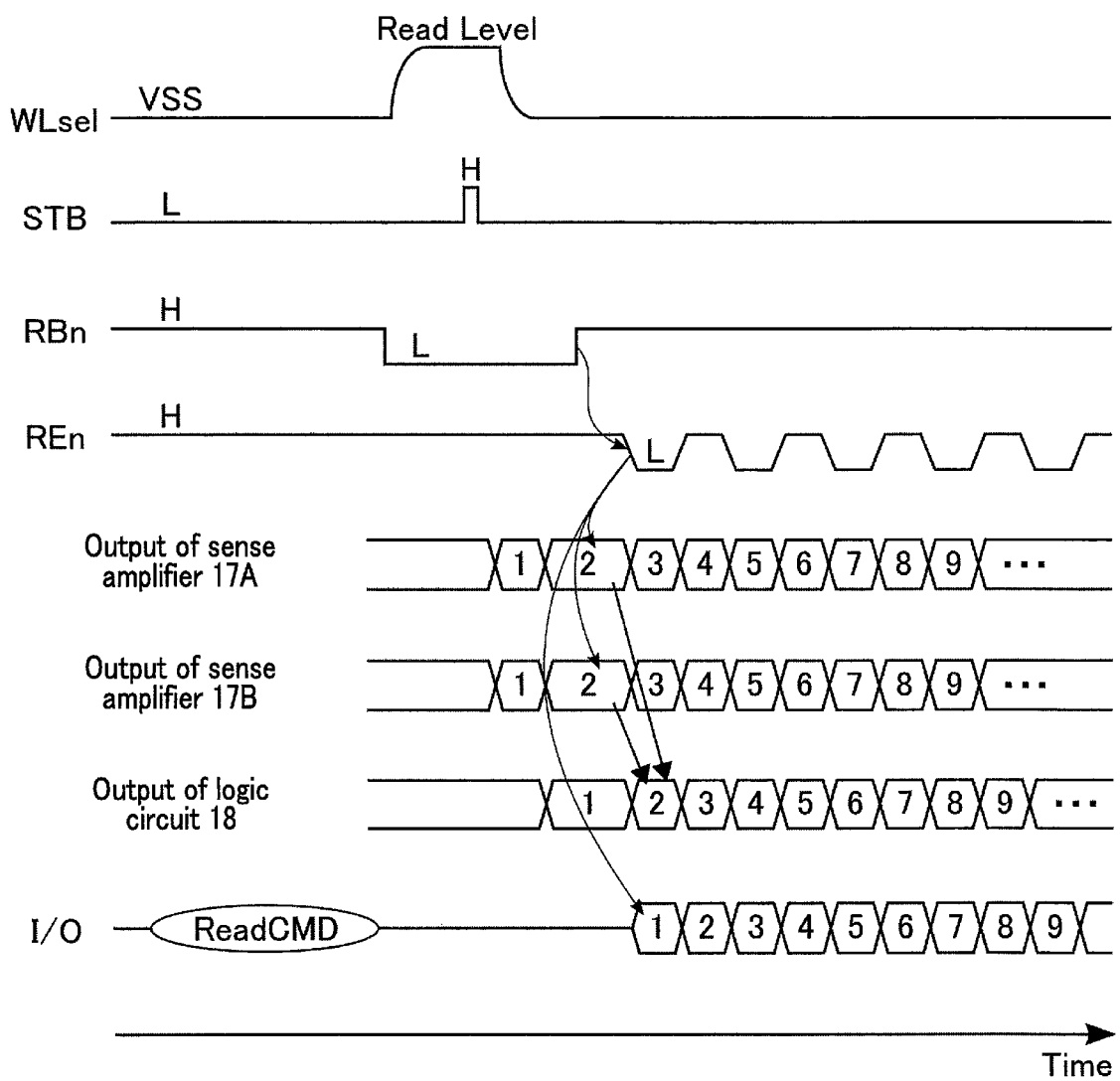
F I G. 132

_US 10,607,707 B2_

SEMICONDUCTOR MEMORY WITH DIFFERENT THRESHOLD VOLTAGES OF MEMORY CELLS

CROSS-REFERENCE TO RELATED APPLICATIONS

This application is based upon and claims the benefit of priority from Japanese Patent Application No. 2018-029437, filed Feb. 22, 2018, the entire contents of which are incorporated herein by reference.

FIELD

Embodiments described herein relate generally to a semiconductor memory.

BACKGROUND

A NAND-type flash memory that is capable of storing data in a non-volatile manner is known.

BRIEF DESCRIPTION OF THE DRAWINGS

FIG. 1 is a block diagram showing a configuration example of a memory system that includes a semiconductor memory according to a first embodiment.

FIG. 2 is a circuit diagram showing a circuit configuration example of a memory cell array of the semiconductor memory according to the first embodiment.

FIG. 3 is a plane view showing an example of a flat layout of memory cell arrays of the semiconductor memory according to the first embodiment.

FIG. 4 is a cross sectional view of an example of a cross sectional structure of the memory cell array of the semiconductor memory according to the first embodiment.

FIG. 5 is a circuit diagram showing an example of a circuit configuration of a row decoder module of the semiconductor memory according to the first embodiment.

FIG. 10 is a table showing definitions of read data for read results in the first embodiment.

FIG. 11 is a table showing read voltages and read results in a read operation in the semiconductor memory according to the first embodiment.

FIG. 13 is a timing chart showing an example of commands, and signals and voltages applied to lines in a first page read in the semiconductor memory according to the first embodiment.

FIG. 16 is a diagram showing an example of a data allocation for the threshold distributions of the memory cell transistors, and voltages used to read each page in a comparative example of the first embodiment.

FIG. 17 is a table showing a data allocation for the threshold voltages of the memory cell transistors in the first modification of the first embodiment.

FIG. 18 is a table showing definitions of read data for read results in the first modification of the first embodiment.

FIG. 19 is a table showing a data allocation for the threshold voltages of the memory cell transistors in the second modification of the first embodiment.

FIG. 20 is a table showing definitions of read data for read results in the second modification of the first embodiment.

FIG. 21 is a table showing a data allocation for the threshold voltages of the memory cell transistors in the third modification of the first embodiment.

FIG. 22 is a table showing definitions of read data for read results in the third modification of the first embodiment.

FIG. 23 is a table showing a data allocation for the threshold voltages of the memory cell transistors in the fourth modification of the first embodiment.

FIG. 24 is a table showing definitions of read data for read results in the fourth modification of the first embodiment.

FIG. 25 shows an example of a data allocation for the threshold voltages of the memory cell transistors in the fifth modification of the first embodiment.

FIG. 26 is a table showing definitions of read data for read results in the fifth modification of the first embodiment.

FIG. 27 shows an example of a data allocation for the threshold voltages of the memory cell transistors in the sixth modification of the first embodiment.

FIG. 28 is a table showing definitions of read data for read results in the sixth modification of the first embodiment.

FIG. 29 shows an example of a data allocation for the threshold voltages of the memory cell transistors in the seventh modification of the first embodiment.

FIG. 30 is a table showing definitions of read data for read results in the seventh modification of the first embodiment.

FIG. 31 shows an example of a data allocation for the threshold voltages of the memory cell transistors in the eighth modification of the first embodiment.

FIG. 32 is a table showing definitions of read data for read results in the eighth modification of the first embodiment.

FIG. 33 shows an example of a data allocation for the threshold voltages of the memory cell transistors in the ninth modification of the first embodiment.

FIG. 34 is a table showing definitions of read data for read results in the ninth modification of the first embodiment.

FIG. 35 shows an example of a data allocation for the threshold voltages of the memory cell transistors in the tenth modification of the first embodiment.

FIG. 36 is a table showing definitions of read data for read results in the tenth modification of the first embodiment.

FIG. 37 shows an example of a data allocation for the threshold voltages of the memory cell transistors in the eleventh modification of the first embodiment.

FIG. 38 is a table showing definitions of read data for read results in the eleventh modification of the first embodiment.

FIG. 39 is a table showing an example of a data allocation in a first page write in a semiconductor memory according to a second embodiment.

FIG. 40 is a table showing an example of a data allocation in a second page write in the semiconductor memory according to the second embodiment.

FIG. 41 is a table showing an example of a data allocation in a third page write in the semiconductor memory according to the second embodiment.

FIG. 44 is a timing chart showing an example of commands, and signals and voltages applied to lines in a third page write in the semiconductor memory according to the second embodiment.

FIG. 46 shows an example of commands, and signals and voltages applied to lines in the second page read before the third page write in the semiconductor memory according to the second embodiment.

FIG. 48 is a timing chart showing an example of commands and signals applied to lines in a read operation in each page in a modification of the second embodiment.

FIG. 49 is a block diagram showing a configuration example of a semiconductor memory according to a third embodiment.

FIG. 51 is a flow chart showing an example of a read operation when a second page is selected in the semiconductor memory according to the third embodiment.

FIG. 53 is a threshold distribution diagram showing an example of distributions of threshold voltages of memory cell transistors according to a fourth embodiment.

FIG. 54 is a table showing an example of a data allocation in a first page write in the semiconductor memory according to the fourth embodiment.

FIG. 55 is a table showing an example of a data allocation in a second page write in the semiconductor memory according to the fourth embodiment.

FIG. 56 is a table showing an example of a data allocation in a third page write in the semiconductor memory according to the fourth embodiment.

FIG. 58 is a timing chart showing an example of commands, and signals and voltages applied to lines in a second page write in the semiconductor memory according to the fourth embodiment.

FIG. 59 is a timing chart showing an example of commands, and signals and voltages applied to lines in a third page write in the semiconductor memory according to the fourth embodiment.

FIG. 61 is a timing chart showing an example of commands, and signals and voltages applied to lines in a first page read after a second page write and before a third page write in the semiconductor memory according to the fourth embodiment.

FIG. 64 is a flow chart showing an example of a read operation when a second page is selected in the semiconductor memory according to the fifth embodiment.

FIG. 66 is a block diagram showing a configuration example of a semiconductor memory according to a sixth embodiment.

FIG. 67 is a threshold distribution diagram showing an example of distributions of threshold voltages of memory cell transistors according to the sixth embodiment.

FIGS. 68 and 69 are tables showing a data allocation for the threshold voltages of the memory cell transistors according to the sixth embodiment.

FIG. 70 is a table showing definitions of read data for read results in the sixth embodiment.

FIGS. 71, 72, 73, and 74 are tables showing read voltages and read results in a read operation in the semiconductor memory according to the sixth embodiment.

FIG. 76 is a timing chart showing an example of commands, and signals and voltages applied to lines in a first page read in the semiconductor memory according to the sixth embodiment.

FIG. 77 is a timing chart showing an example of commands, and signals and voltages applied to lines in a second page read in the semiconductor memory according to the sixth embodiment.

FIG. 79 is a timing chart showing an example of commands, and signals and voltages applied to lines in a fourth page read in the semiconductor memory according to the sixth embodiment.

FIG. 80 is a timing chart showing an example of commands, and signals and voltages applied to lines in a fifth page read in the semiconductor memory according to the sixth embodiment.

FIG. 81 is a timing chart showing an example of commands, and signals and voltages applied to lines in a sixth page read in the semiconductor memory according to the sixth embodiment.

FIG. 83 is a table showing read voltages in a read operation in each page in an eighth embodiment.

FIG. 85 is a timing chart showing an example of commands, and signals and voltages applied to lines in a simplified read in the semiconductor memory according to the eighth embodiment.

FIG. 90 is a block diagram showing a configuration example of a semiconductor memory according to a tenth embodiment.

FIG. 91 is a threshold distribution diagram showing an example of distributions of threshold voltages of memory cell transistors according to the tenth embodiment.

FIG. 92 is a table showing a data allocation for the threshold voltages of the memory cell transistors according to the tenth embodiment.

FIG. 93 is a table showing definitions of read data for read results in the tenth embodiment.

FIG. 94 is a table showing read voltages and read results in a read operation in the semiconductor memory according to the tenth embodiment.

FIG. 95 is a timing chart showing an example of commands, and signals and voltages applied to lines in a write operation in the semiconductor memory according to the tenth embodiment.

FIG. 96 is a table showing an example of changes in data amounts in a write operation in the semiconductor memory according to the tenth embodiment.

FIG. 99 is a timing chart showing an example of commands, and signals and voltages applied to lines in a third page read in the semiconductor memory according to the tenth embodiment.

FIG. 100 is a timing chart showing an example of commands, and signals and voltages applied to lines in a fourth page read in the semiconductor memory according to the tenth embodiment.

FIG. 102 shows an example of a data allocation for threshold voltages of memory cell transistors in the modification of the tenth embodiment.

FIG. 103 is a table showing definitions of read data for read results in the modification of the tenth embodiment.

FIG. 104 is a threshold distribution diagram showing an example of distributions of threshold voltages of memory cell transistors according to an eleventh embodiment.

FIGS. 105 and 106 are tables showing a data allocation for the threshold voltages of the memory cell transistors according to the eleventh embodiment.

FIG. 107 is a table showing definitions of read data for read results in the eleventh embodiment.

FIGS. 108, 109, 110, and 111 are tables showing read voltages and read results in a read operation in the semiconductor memory according to the eleventh embodiment.

FIG. 119 is a diagram showing an example of a data allocation for threshold distributions of memory cell transistors, and voltages used to read each page in a first comparative example of the eleventh embodiment.

FIG. 122 is a table showing an example of a data allocation in a first page write in the semiconductor memory according to the twelfth embodiment.

FIG. 123 is a timing chart showing an example of commands, and signals and voltages applied to lines in a first page write in the semiconductor memory according to the twelfth embodiment.

FIG. 124 is a timing chart showing an example of commands, and signals and voltages applied to lines in a second page write in the semiconductor memory according to the twelfth embodiment.

FIG. 126 is a table showing the order of read operations and read voltages in the semiconductor memory according to a thirteenth embodiment.

FIG. 127 is a block diagram showing a configuration example of a semiconductor memory according to a fourteenth embodiment.

FIGS. 128 and 129 are diagrams showing an example of a method of using redundant blocks in the semiconductor memory according to the fourteenth embodiment.

FIG. 130 is a block diagram of a semiconductor memory according to a modification of the first embodiment;

FIG. 131 is a block diagram showing a semiconductor memory according to a modification of the sixth embodiment.

FIG. 132 is a timing chart showing an example of a data output method in a read operation in a semiconductor memory according to the first embodiment.

DETAILED DESCRIPTION

Figure 6:
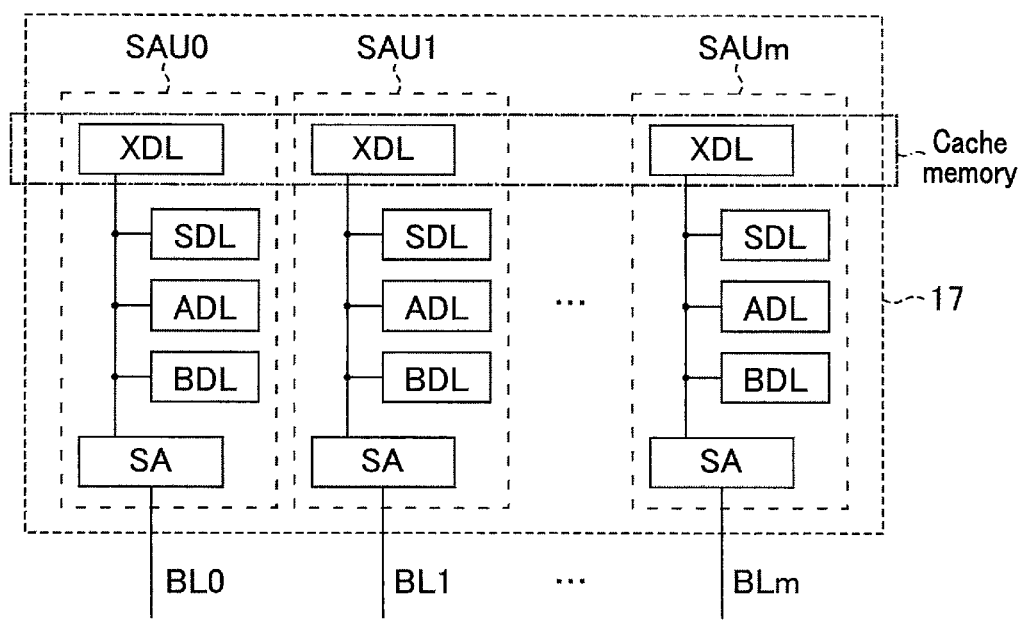
FIG. 6 is a circuit diagram showing an example of a circuit configuration of a sense amplifier module of the semiconductor memory according to the first embodiment.

A semiconductor memory of the embodiments includes a first memory cell array including a plurality of first memory cells; and a second memory cell array including a plurality of second memory cells. Each of threshold voltages of the first memory cells and the second memory cells is set to any of a first threshold voltage, a second threshold voltage higher than the first threshold voltage, and a third threshold voltage higher than the second threshold voltage. Data of three or more bits including a first bit, a second bit, and a third bit is stored using a combination of a threshold voltage of the first memory cell and a threshold voltage of the second memory cell.

Hereinafter, the embodiments will be described with reference to the accompanying drawings. The drawings are schematic. Each of the embodiments is an example of an apparatus and a method to embody a technical idea of the invention.

In the explanation below, structural elements having substantially the same functions and configurations will be denoted by the same reference symbols. The numbers after the letters constituting the reference symbols, and the letters after the numbers constituting the reference symbols are used to discriminate elements which are denoted by the reference symbols including the same letters or the numbers and which have similar configurations. If there is no need of mutually distinguishing the elements which are denoted by the reference symbols that include the same letters, the same elements are denoted by the reference symbols that include only the same letters.

[1] First Embodiment

A semiconductor memory system 1 according to the first embodiment will be described.

[1-1] Configuration

[1-1-1] Overall Configuration of Memory System 1

FIG. 1 shows a configuration example of a memory system 1 that includes a semiconductor memory 10 according to the first embodiment. As shown in FIG. 1, the memory system 1 includes a semiconductor memory 10 and a memory controller 20. In the following, an example of each of the semiconductor memory 10 and the memory controller 20 will be explained in detail.

(Configuration of Semiconductor Memory 10)

The semiconductor memory 10 is a NAND-type flash memory capable of storing data in a non-volatile manner. As shown in FIG. 1, the semiconductor memory 10 includes, for example, memory cell arrays 11A and 11B, a command register 12, an address register 13, a sequencer 14, a driver circuit 15, row decoder modules 16A and 16B, sense amplifier modules 17A and 17B, and a logic circuit 18.

Each of the memory cell arrays 11A and 11B includes a plurality of blocks BLK0 to BLKn (n is an integer greater than 1). A block BLK is a group of non-volatile memory cells, and is, for example, a unit of data erasure. In each of the memory cell arrays 11A and 11B, a plurality of bit lines and a plurality of word lines are provided, and each memory cell is associated with one bit line and one word line.

The command register 12 retains a command CMD received by the semiconductor memory 10 from the memory controller 20. The command CMD includes instructions to cause the sequencer 14 to execute a read operation and a write operation, for example.

The address register 13 retains address information ADD received by the semiconductor memory 10 from the memory controller 20. The address information ADD includes, for example, a block address BA, a page address PA, and a column address CA. A block address BA is used, for example, to select a block BLK that includes a memory cell that is a target for operations. A page address PA is used, for example, to select a word line that is associated with a memory cell that is a target for various operations. Hereinafter, a word line that is selected will be referred to as a selected word line WLsel, and a word line that is not selected will be referred to as a non-selected word line. A column address CA is used, for example, to select a bit line as a target for various operations.

The sequencer 14 controls the operation of the entire semiconductor memory 10 based on a command CMD retained in the command register 12. For example, the sequencer 14 controls the driver circuit 15, the row decoder modules 16A and 16B, and the sense amplifier modules 17A and 17B to perform an operation of writing data DAT received from the memory controller 20 and an operation of reading data DAT stored in the memory cell arrays 11A and 11B.

The driver circuit 15 generates a desired voltage based on the control of the sequencer 14. The driver circuit 15 applies voltages to respective signal lines corresponding to word lines that are selected and not selected in the memory cell arrays 11A and 11B based on a page address PA retained in the address register 13.

The row decoder modules 16A and 16B select one block BLK in each of the memory cell arrays 11A and 11B based on, for example, a block address BA retained in the address register 13. Then, the row decoder modules 16A and 16B apply, for example, a voltage applied to a signal line by the driver circuit 15 to the lines provided in the selected block BLK in each of the memory cell arrays 11A and 11B.

The sense amplifier modules 17A and 17B respectively apply desired voltages to bit lines corresponding to the memory cell arrays 11A and 11B in accordance with, for example, write data DAT received from the memory controller 20. Each of the sense amplifier modules 17A and 17B determines data stored in a memory cell based on a voltage of a corresponding bit line, and transmits the determined read data DAT to the memory controller 20.

The logic circuit 18 is coupled between the input/output circuit of the semiconductor memory 10 and the sense amplifier module 17. When a read operation is performed, the logic circuit 18 determines read data based on read results in the sense amplifier module 17A and read results in the sense amplifier module 17B. The logic circuit 18 is also capable of directly transferring received data between the input/output circuit of the semiconductor memory 10 and the sense amplifier module 17, without changing the data.

For example, a group of the above-described memory cell array 11, row decoder module 16, and sense amplifier module 17 is called a plane. In other words, a plurality of planes are included in the semiconductor memory 10 according to the first embodiment.

Specifically, the semiconductor memory 10 according to the first embodiment includes first plane PL1 that includes the memory cell array 11A, the row decoder module 16A, and the sense amplifier module 17A, and second plane PL2 that includes the memory cell array 11B, the row decoder module 16B, and the sense amplifier module 17B.

In the semiconductor memory 10 according to the first embodiment, block BLK0 through block BLKn in first plane PL1 are respectively associated with block BLK0 through block BLKn in second plane PL2. The sequencer 14 is capable of controlling the plurality of planes independently, and the semiconductor memory 10 according to the first embodiment stores data by a pair of blocks BLK associated with each other between first plane PL1 and second plane PL2. How data is stored will be described later in detail.

(Configuration of Memory Controller 20)

The memory controller 20 instructs the semiconductor memory 10 to read, write, and erase data in response to commands sent from an external host device. As shown in FIG. 1, the memory controller 20 includes, for example, a host interface circuit 21, a central processing unit (CPU) 22, a random access memory (RAM) 23, a buffer memory 24, an error correction code (ECC) circuit 25, and a NAND interface circuit 26.

The host interface circuit 21 is coupled to the external host device, and controls transfer of data, commands, and addresses between the memory controller 20 and the host device. The host interface circuit 21 supports communication interface standards, for example, SATA (Serial Advanced Technology Attachment), SAS (Serial Attached SCSI), PCIe (PCI Express) (registered trademark), etc.

The CPU 22 controls the operation of the entire memory controller 20. For example, the CPU 22 issues a write command in response to a write instruction received from the host device. The CPU 22 executes various types of processing to manage a memory space of the semiconductor memory 10, such as wear leveling, etc.

The RAM 23 is a volatile memory, such as a dynamic random access memory (DRAM), for example. The RAM 23 is used as a working area of the CPU 22. The RAM 23, for example, retains a firmware for managing the semiconductor memory 10, various types of management tables, and count results at the time of various operations, and so on.

The buffer memory 24 temporarily retains read data received by the memory controller 20 from the semiconductor memory 10, and write data received from the host device.

The ECC circuit 25 executes processing related to error correction. Specifically, at the time of a write operation, the ECC circuit 25 generates parity based on write data received from the host device, and adds the generated parity to the write data. At the time of a read operation, the ECC circuit 25 generates a syndrome based on read data received from the semiconductor memory 10, and detects and corrects errors in the read data based on the generated syndrome.

The NAND interface circuit 26 controls transfer of data, commands, addresses between the memory controller 20 and the semiconductor memory 10, and supports the NAND interface standard. For example, the NAND interface circuit 26 receives a command latch enable signal CLE, an address latch enable signal ALE, a write enable signal WEn, and a read enable signal REn, receives a ready busy signal RBn, and transmits and receives an input/output signal I/O.

The command latch enable signal CLE is a signal notifying the semiconductor memory 10 that a received input/output signal I/O is a command CMD. The address latch enable signal ALE is a signal notifying the semiconductor memory 10 that a received input/output signal I/O is address information ADD.

The write enable signal WEn is a signal instructing the semiconductor memory 10 to input an input/output signal I/O. The read enable signal REn is a signal instructing the semiconductor memory 10 to output an input/output signal I/O.

The ready/busy signal RBn is a signal for notifying the memory controller 20 of whether the semiconductor memory 10 is in a ready state in which the semiconductor memory 10 receives a command from the controller 20, or in a busy state in which the semiconductor memory 10 receives an instruction from the controller 20. The input/output signal I/O is, for example, an 8-bit signal, and may include a command CMD, address information ADD, write data DAT, and read data DAT.

The semiconductor memory 10 and the memory controller 20 as explained in the above may constitute one semiconductor device by a combination thereof. Such a semiconductor device may be a memory card, such as an SD™ card, and an SSD (solid state drive), for example.

The memory controller 20 may be provided with a counter. In this case, the memory controller 20 controls the order, etc., of the word lines WL for which a write operation is performed based on, for example, the number of counts retained in the counter.

[1-1-2] Configuration of Memory Cell Array 11

(Circuit Configuration)

FIG. 2 shows a configuration example of the memory cell array 11 that includes the semiconductor memory 10 according to the first embodiment. A circuit configuration of the memory cell array 11 according to the first embodiment will be explained below, focusing on one block BLK.

As shown in FIG. 2, a block BLK includes, for example, four string units SU0 through SU3. Each string unit SU includes a plurality of NAND strings NS that are respectively associated with bit lines BL0 to BLm (m is an integer greater than 1). A NAND string NS includes, for example, eight memory cell transistors MT0 to MT7 and select transistors ST1 and ST2.

Each memory cell transistor MT includes a control gate and a charge storage layer, and stores data in a non-volatile manner. Memory cell transistors MT0 through MT7 included in each NAND string NS are coupled in series between the source of select transistor ST1 and the drain of select transistor ST2. The control gates of memory cell transistors MT0 through MT7 in the same block BLK are respectively coupled to word lines WL0 through WL7.

Each of select transistors ST1 and ST2 is used to select a string unit SU at the time of performing various operations. The gates of select transistors ST1 respectively included in string units SU0 through SU3 in the same block BLK are respectively coupled in common to select gate lines SGD0 through SGD3. The drains of the select transistors ST1 in the same column in each block BLK are coupled in common to the corresponding bit line BL. The gates of select transistors ST2 in the same block BLK are coupled in common to select gate line SGS. The sources of select transistors ST2 in the same block BLK are coupled in common to source line SL between multiple blocks BLK.

In the semiconductor memory 10 according to the first embodiment, 3-bit data is stored by a combination of one memory cell transistor MT in first plane PL1 and one memory cell transistor MT in second plane PL2.

In the following description, a plurality of memory cell transistors MT coupled to a common word line WL in a string unit SU are called a cell unit CU as a whole. In this description, "1-page data" refers to a total amount of data stored in a pair of cell units CU when a pair of the memory cell transistors MT in the pair of cell units CU stores 1-bit data.

As will be described later, in the semiconductor memory 10 according to the first embodiment, a combination of one cell unit CU included in first plane PL1 and one cell unit CU included in second plane PL2 is capable of storing 3-page data.

In the following description, 3-page data stored by a combination of cell units CU in first plane PL1 and second plane PL2 will be referred to as a first page, second page, and third page, in order from lower to higher. A pair of the memory cell transistors MT stores first bit data corresponding to the first page, second bit data corresponding to the second page, and third bit data corresponding to the third page.

(Two-Dimensional Layout)

FIG. 3 shows an example of a two-dimensional layout of the memory cell array 11 according to the first embodiment, and the X-, Y-, and Z-axes. As shown in FIG. 3 as an example, a plurality of string units SU are arranged along the X-axis direction, each extending in the Y-axis direction.

Each of the string units SU includes a plurality of memory pillars MH. A plurality of memory pillars MH are arranged in a staggered manner in the Y-axis direction, for example. Each memory pillar MH is overlain by at least one bit line BL. In each string unit SU, one memory pillar MH is coupled to one bit line EL via a contact plug CP.

A plurality of slits SLT are provided in the memory cell array 11, for example. The slits SLT are arranged in the X-axis direction, each extending in the Y-axis direction, for example. An insulating material, for example, is embedded in each slit SLT. One string unit SU, for example, is provided between neighboring slits SLT. A plurality of string units SU may be provided between neighboring slits SLT.

(Cross-Sectional Structure)

FIG. 4 shows an example of a cross-sectional structure of the memory cell array 11 in the first embodiment, and shows a cross section of the memory cell array 11 and the X-, Y-, Z-axes, but the interlayer insulating films are omitted therein. As shown in FIG. 4, the memory cell array 11 includes a semiconductor substrate 30, conductors 31-42, memory pillars MH, and contact plugs CP.

The surface of the semiconductor substrate 30 is arranged in parallel to the X-Y plane. Conductor 31 is provided above the semiconductor substrate 30, with an insulating film being interposed therebetween. Conductor 31 is formed in a plate-like shape in parallel to the X-Y plane, and functions as a source line SL. Above the conductor 31, a plurality of slits SLT parallel to the Y-Z plane are arranged in the X-axis direction. The structures arranged above conductor 31 and between the neighboring slits SLT constitute one string unit SU.

For example, conductors 32 to 41 are provided on conductor 31 and between the neighboring slits SLT in order from the semiconductor substrate 30 side. The neighboring conductors with respect to the Z-axis direction are stacked, with interlayer insulating films being interposed therebetween. Each of conductors 32 to 41 is formed in a plate-like shape in parallel to the X-Y plane. For example, conductor 32 corresponds to select gate line SGS, conductors 33 to 40 respectively correspond to word lines WL0 to WL7, and conductor 41 corresponds to select gate line SGD.

Each of the memory pillars MH functions as one NAND string NS, for example. Each memory pillar MH is provided through conductors 32 to 41, in such a manner that the memory pillar extending from the upper surface of conductor 41 reaches the upper surface of conductor 31.

The memory pillar MH includes, for example, a block insulating film 43, an insulating film 44, a tunnel oxide film 45, and a semiconductor material 46. The block insulating film 43 is provided on the inner wall of the memory hole formed in a pillar shape as a result of the process of manufacturing the semiconductor memory 10. The insulating film 44 is provided on the inner wall of the block insulating film 43. The insulating film 44 functions as a charge storage layer in the memory cell transistor MT. The tunnel oxide film 45 is provided on the inner wall of the insulating film 44. The semiconductor material 46 is provided in the inner wall of the tunnel oxide film 45. The semiconductor material 46 includes a conductive material, and functions as a current path in the NAND string NS. A different material may be further formed on the inner wall of the semiconductor material 46.

A portion where the memory pillar MH crosses conductor 32 functions as select transistor ST2. Portions where the memory pillar MH crosses respective conductors 33 through 40 respectively function as memory cell transistors MT0 through MT7. A portion where the memory pillar MH crosses conductor 41 functions as select transistor ST1.

Conductor 42 is provided in a layer higher than the upper surface of the memory pillar MH, with an insulating film being interposed therebetween. Conductor 42 is formed in a shape of a line extending in the X-axis direction, and functions as the bit line BL. A plurality of conductors 42 are arranged in the Y-axis direction (not shown). Each of conductors 42 is electrically coupled to one memory pillar MH in every string unit SU.

Specifically, in each string unit SU, a contact plug CP having conductivity is arranged above the semiconductor material 46 of each memory pillar MH, and one conductor 42 is provided above the contact plug CP. The present invention is not limited to this example; for example, the memory pillar MH and the conductor 42 may be coupled by a plurality of contact plugs or interconnects, etc.

The configuration of the memory cell array 11 is not limited to the above-described configuration. For example, the number of string units SU included in each block BLK may be determined as appropriate. The number of the memory cell transistors MT and select transistors ST1 and ST2 included in each NAND string NS may be determined as appropriate.

The number of the word lines WL and select gate lines SGD and SGS may be changed based on the number of the memory cell transistors MT and select transistors ST1 and ST2. A plurality of conductors 32 respectively provided in a plurality of layers may be allocated to select gate line SGS, and a plurality of conductors 41 respectively provided in a plurality of layers may be allocated to select gate line SGD.

[1-1-3] Configuration of Row Decoder Module 16

FIG. 5 shows a configuration example of the row decoder module 16 of the semiconductor memory 10 according to the first embodiment. As shown in FIG. 5, the row decoder module 16 includes row decoders RD0 through RDn.

Row decoders RD0 through RDn are respectively associated with block BLK0 through BLKn. In other words, one row decoder RD is associated with one block BLK. In the following, the circuit configuration of the row decoder RD will be described in detail, taking row decoder RD0 corresponding to block BLK0 as an example.

The row decoder RD includes a block decoder BD and high-voltage n-channel MOS transistors TR1 through TR13.

The block decoder BD decodes a block address BA. The block decoder BD applies a predetermined voltage to a transfer gate line TG based on a result of the decoding. Transfer gate line TG is coupled in common to the gates of transistors TR1 through TR13. Transistors TR1 through TR13 are coupled between signal lines extending from the driver circuit 15 and the lines provided in the associated block BLK.

For example, one end of transistor TR1 is coupled to signal line SGSD, and the other end of transistor TR1 is coupled to select gate line SGS. One ends of transistors TR2 through TR9 are respectively coupled to signal lines CG0 through CG7, and the other ends of transistors TR2 through TR9 are respectively coupled to word lines WL0 through WL7. One ends of transistors TR10 through TR13 are respectively coupled to signal lines SGDD0 through SGDD3, and the other ends of transistors TR10 through TR13 are respectively coupled to select gate lines SGD0 through SGD3.

With the above-described configuration, the row decoder module 16 can select a block BLK for which various operations are performed. Specifically, in various operations, the block decoders BD corresponding to selected and non-selected blocks BLK apply an "H" level voltage and an "L" level voltage respectively to transfer gate lines TG.

For example, if block BLK0 is selected, transistors TR1 through TR13 included in row decoder RD0 are turned on, and transistors TR1 through TR13 included in the other row decoders RD are turned off. In other words, a current path is formed between each of the lines provided in block BLK0 and a corresponding signal line, and a current path between each of the lines in the other blocks BLK and a corresponding signal line is cut off. As a result, voltages respectively applied to the signal lines by the driver circuit 15 are respectively applied via row decoder RD0 to the lines provided in selected block BLK0.

[1-1-4] Configuration of Sense Amplifier Module 17

FIG. 6 shows an example of a configuration of the sense amplifier module 17 according to the first embodiment. As shown in FIG. 6, the sense amplifier module 17 includes, for example, sense amplifier units SAU0 through SAUm.

Sense amplifier units SAU0 through SAUm are respectively associated with bit lines BL0 through BLm. Each sense amplifier unit SAU includes a sense amplifier SA, and latch circuits SDL, ADL, BDL, and XDL. The sense amplifier SA and the latch circuits SDL, ADL, BDL, and XDL are coupled to each other, so that data can be transmitted and received therebetween.

In a read operation, for example, the sense amplifier SA senses data that is read and output to a corresponding bit line BL, and determines whether the read data is "0" or "1". Each of the latch circuits SDL, ADL, BDL, and XDL temporarily stores read data and write data.

The latch circuit XDL is coupled to a not-shown input/output circuit, and is used to input and output data between the sense amplifier unit SAU and the input/output circuit. For example, the semiconductor memory 10 can be in a ready state as long as the latch XDL is available, even when the latch circuits SDL, ADL, and BDL are occupied. In other words, the latch circuit XDL can function as a cache memory of the semiconductor memory 10.

Figure 7:
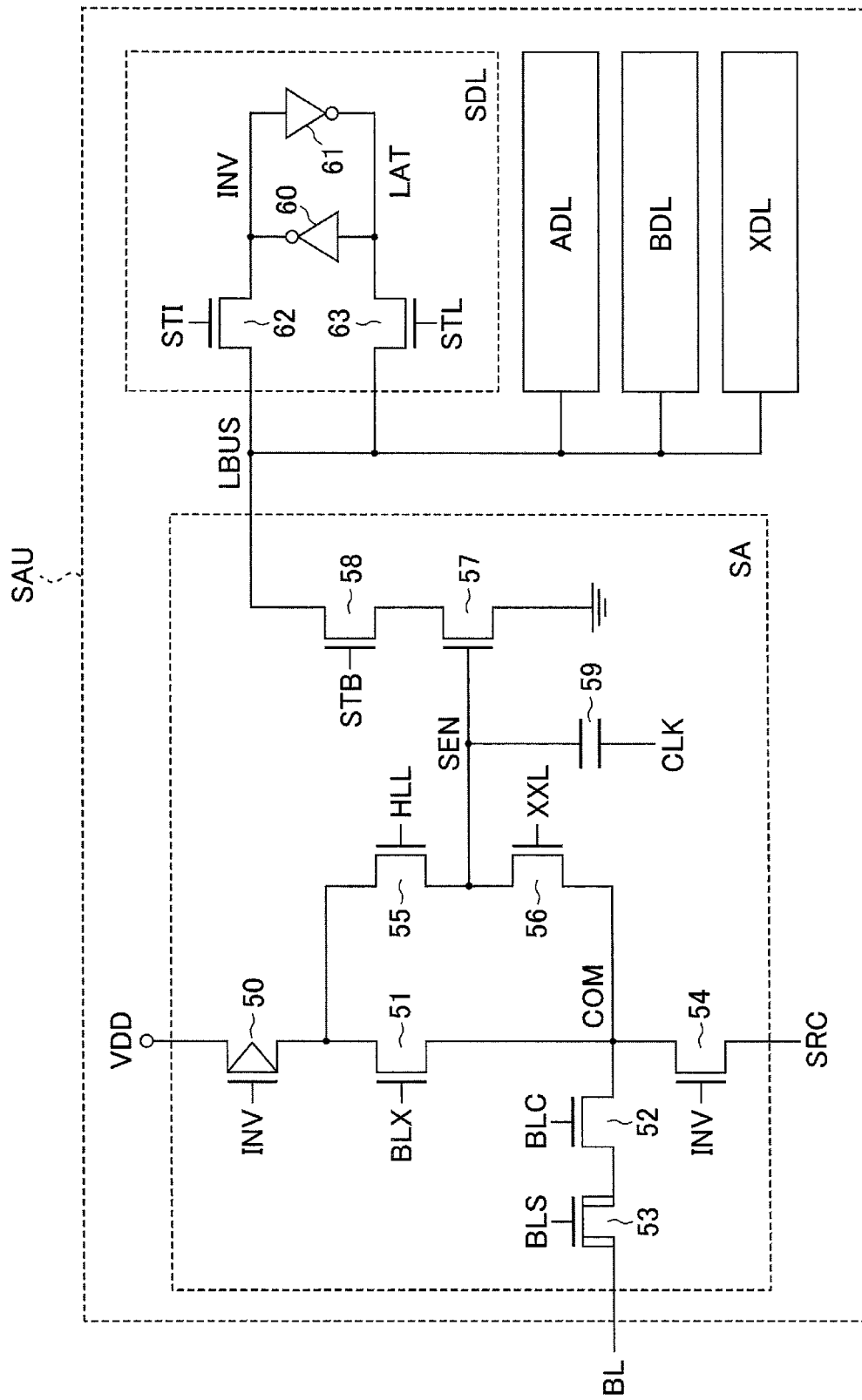
FIG. 7 is a circuit diagram showing an example of a detailed circuit configuration of the sense amplifier module of the semiconductor memory according to the first embodiment.

FIG. 7 shows a circuit configuration of the sense amplifier unit SAU in detail, focusing on one of the sense amplifier units SAU. As shown in FIG. 7, the sense amplifier SA includes a p-channel MOS transistor 50, n-channel MOS transistors 51-58, and a capacitor 59, for example. The latch circuit SDL includes, for example, inverters 60 and 61, and n-channel MOS transistors 62 and 63. Since the circuit configuration of the latch circuits ADL, BDL, and XDL are similar to, for example, the circuit configuration of the latch circuit SDL, an explanation thereof will be omitted.

One end of the transistor 50 is coupled to a power supply line, and the gate of the transistor 50 is coupled to node INV. A voltage VDD for example, which is a power supply voltage of the semiconductor memory 10, is applied to the power supply line that is coupled to one end of the transistor 50. One end of the transistor 51 is coupled to the other end of the transistor 50, the other end of the transistor 51 is coupled to node COM, and a control signal BLX is input to the gate of the transistor 51.

One end of the transistor 52 is coupled to node COM, and a control signal BLC is input to the gate of the transistor 52. The transistor 53 is for example a high-voltage n-channel MOS transistor, one end thereof being coupled to the other end of the transistor 52, the other end being coupled to a corresponding bit line BL, and a control signal BLS is input to the gate of the transistor 53.

One end of the transistor 54 is coupled to node COM, the other end of the transistor 54 is coupled to node SRC, and the gate of the transistor 54 is coupled to node INV. A voltage VSS for example, which is a ground voltage of the semiconductor memory 10, is applied to node SRC. One end of the transistor 55 is coupled to the other end of the transistor 50, the other end of the transistor 55 is coupled to node SEN, and a control signal HLL is input to the gate of the transistor 55.

One end of the transistor 56 is coupled to the other end of node SEN, the other end of the transistor 56 is coupled to node COM, and a control signal XXL is input to the gate of the transistor 56. One end of the transistor 57 is grounded, and the gate of the transistor 57 is coupled to node SEN.

One end of the transistor 58 is coupled to the other end of the transistor 57, the other end of the transistor 58 is coupled to bus LBUS, and a control signal STB is input to the gate of the transistor 58. One end of the capacitor 59 is coupled to node SEN, and a clock CLK is input to the other end of the capacitor 59.

The input node of the inverter 60 is coupled to node LAT, and the output node of the inverter 60 is coupled to node INV. The input node of the inverter 61 is coupled to node INV, and the output node of the inverter 61 is coupled to node LAT.

One end of the transistor 62 is coupled to node INV, the other end of the transistor 62 is coupled to bus LBUS, and a control signal STI is input to the gate of the transistor 62. One end of the transistor 63 is coupled to node LAT, the other end of the transistor 63 is coupled to bus LBUS, and a control signal STL is input to the gate of the transistor 63.

The above-explained control signals BLX, BLC, BLS, HLL, XXL, and STB are generated by, for example, the sequencer 14. A timing for determining data that is read and output to a bit line BL by each sense amplifier SA is based on the timing when the control signal STB is asserted.

In the description hereafter, the expression "to assert the control signal STB" should be construed to mean that the sequencer 14 temporarily changes the control signal STB from an "L" level to an "H" level. Depending on the configuration of the sense amplifier module 17, the operation of asserting the control signal STB may correspond to temporarily changing the control signal STB from an "H" level to an "L" level by the sequencer 14.

The configuration of the sense amplifier module 17 is not limited to the above-described configuration, and may be changed in various ways. For example, the number of latch circuits in the sense amplifier unit SAU can be changed as appropriate based on the number of pages stored in a set of one cell unit CU in first plane PL1 and one cell unit CU in second plane PL2.

[1-1-5] Threshold Distributions of Memory Cell Transistor MT

Figures 8, 9:
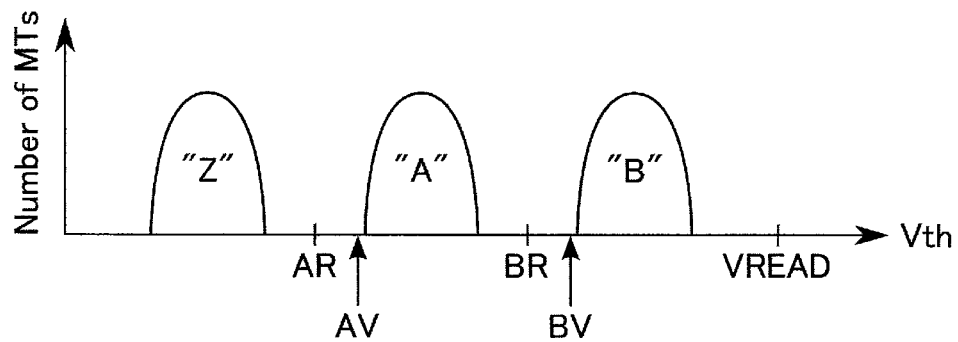
FIG. 8 is a threshold distribution diagram showing an example of distributions of threshold voltages of memory cell transistors according to the first embodiment.
FIG. 9 is a table showing a data allocation for the threshold voltages of the memory cell transistors according to the first embodiment.

FIG. 8 shows an example of threshold distributions of the memory cell transistors MT, read voltages, and verify voltages in the semiconductor memory 10 according to the first embodiment. The vertical axis of the threshold distributions shown in FIG. 8 indicates the number of the memory cell transistors MT, and the horizontal axis indicates threshold voltages Vth of the memory cell transistors MT.

As shown in FIG. 8, a plurality of memory cell transistors MT included in one cell unit CU form three threshold distributions in the first embodiment. For example, these three distributions (write levels) are called "Z" state, "A" state, and "B" state, from lower to higher threshold voltage.

A read voltage used for each read operation is set between neighboring threshold distributions. For example, a read voltage AR is set between the "Z" state and the "A" state, and a read voltage BR is set between the "A" state and the "B" state.

More specifically, the read voltage AR is set between a maximum threshold voltage in the "Z" state and a minimum threshold voltage in the "A" state. When the read voltage AR is applied to a gate, a memory cell transistor MT is turned on if its threshold voltage is distributed in the "Z" state, and turned off if its threshold voltage is distributed in the "A" state or higher.

The read voltage BR is set between a maximum threshold voltage in the "A" state and a minimum threshold voltage in the "B" state. When the read voltage BR is applied to a gate, a memory cell transistor MT is turned on if its threshold voltage is distributed in the "A" state or lower, and turned off if its threshold voltage is distributed in the "B" state.

A read pass voltage VREAD is set to a voltage higher than the voltages in the highest threshold distribution. More specifically, the read pass voltage VREAD is set to a voltage higher than a maximum threshold voltage in the "B" state.

When the read pass voltage VREAD is applied to a gate, a memory cell transistor MT is turned on, regardless of data stored therein.

A verify voltage used for each write operation is set between neighboring threshold distributions. Specifically, verify voltages AV and BV are respectively set in accordance with the "A" state and the "B" state.

More specifically, the verify voltage AV is set between a maximum threshold voltage in the "Z" state and a minimum threshold voltage in the "A" state, and in the vicinity of the "A" state. The verify voltage BV is set between a maximum threshold voltage in the "A" state and a minimum threshold voltage in the "B" state, and in the vicinity of the "B" state. Therefore, the verify voltages AV and BV are set to voltages higher than the read voltages AR and BR, respectively.

[1-1-6] Data Allocation

FIG. 9 shows an example of a data allocation for the threshold distributions of the memory cell transistors MT in the semiconductor memory 10 according to the first embodiment.

As shown in FIG. 9, in the semiconductor memory 10 according to the first embodiment, nine combinations are possible by combining three threshold voltages of the memory cell transistors MT corresponding to first plane PL1 with three threshold voltages of the memory cell transistors MT corresponding to second plane PL2. Furthermore, in the semiconductor memory 10 according to the first embodiment, 3-bit data is allocated to each of the nine combinations of threshold voltages as shown below:

(Example) "threshold voltage of memory cell transistors MT in first plane PL1", "threshold voltage of memory cell transistors MT in second plane PL2": "first bit/second bit/third bit" data (1) "Z" state, "Z" state: "111" data
(2) "Z" state, "A" state: "110" data
(3) "Z" state, "B" state: "100" data
(4) "A" state, "Z" state: "101" data
(5) "A" state, "A" state: "000" data
(6) "A" state, "B" state: "010" data
(7) "B" state, "Z" state: "100" data
(8) "B" state, "A" state: "001" data
(9) "B" state, "B" state: "011" data Thus, in the first embodiment, eight types of 3-bit data are allocated to the nine combinations; accordingly, the same 3-bit data is allocated to the combinations (3) and (7). In the first embodiment, either one of the combinations to which the same 3-bit data is allocated is used.

FIG. 10 shows read voltages that are set for the data allocation and definitions of read data that are applied to results of page read. In the tables shown in the subsequent drawings, "L" indicates that a threshold voltage of a memory cell transistor MT was lower than a read voltage applied in a page read operation, and "H" indicates that a threshold voltage of a memory cell transistor MT was higher than a read voltage applied in a page read operation.

As shown in FIG. 10, in a read operation targeting the first page (hereinafter referred to as a first page read), the read voltage AR is used in first plane PL1 and the read voltage AR is used in second plane PL2. In a read operation targeting the second page (hereinafter referred to as a second page read), the read voltage AR is used in first plane PL1, and the read voltage BR is used in second plane PL2. In a read operation targeting the third page (hereinafter referred to as a third page read), the read voltage BR is used in first plane PL1, and the read voltage AR is used in second plane PL2.

The read data based on results of read operations in first plane PL1 and second plane PL2 is defined as follows:

(Example) Read operation: (result of read in first plane PL1, result of read in second plane PL2, read data)×4 types First page read: (L, L, 1), (L, H, 1), (H, L, 1), (H, H, 0)
Second page read: (L, L, 1), (L, H, 1), (H, L, 1), (H, H, 0)
Third page read: (L, L, 1), (L, H, 1), (H, L, 1), (H, H, 0)

FIG. 11 provides a table summarizing the read voltages that are set in accordance with the data allocation, and a table summarizing the results of the read operations carried out in accordance with the set read voltages. In the semiconductor memory 10 according to the first embodiment, data corresponding to each of (1) to (9) in FIG. 9 is determined by applying the data definitions shown in FIG. 10 to the results of read operation shown in FIG. 11.

[1-2] Operation

[1-2-1] Write Operation

The semiconductor memory 10 according to the first embodiment repeatedly performs a program loop in a write operation. The program loop includes a program operation and a verify operation.

The program operation is an operation for raising a threshold voltages of the memory cell transistors MT. In the program operation in each program loop, if a threshold voltage of the memory cell transistor MT has already reached a desired value, the memory cell transistor MT is set to a write-inhibited state. In the write-inhibited memory cell transistor MT, a rise of the threshold voltage is suppressed by, for example, a self-boost technique.

The verify operation is a read operation to determine whether or not a threshold voltage of the memory cell transistor MT reaches a desired threshold voltage. In the verify operation, a write level at which verification is performed is determined for each sense amplifier unit SAU based on write data. In the verify operation, if a threshold voltage of the memory cell transistor MT has reached a desired threshold voltage, it is determined that the memory cell transistor MT passes verification at the determined level.

Figure 12:
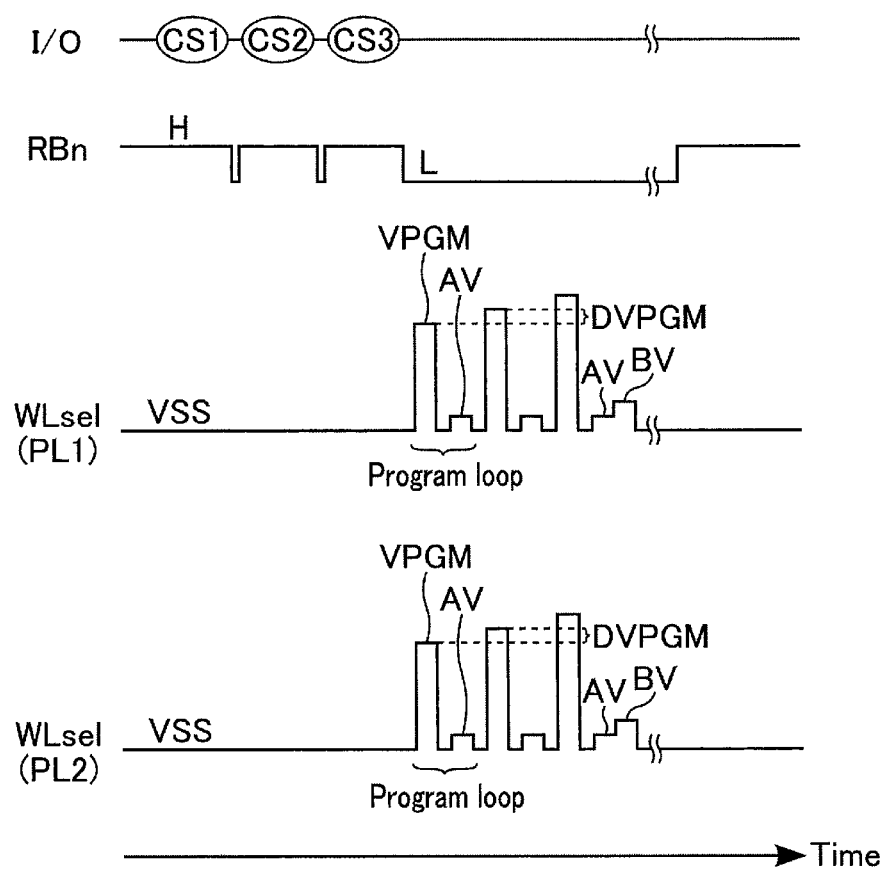
FIG. 12 is a timing chart showing an example of commands, and signals and voltages applied to lines in a write operation in the semiconductor memory according to the first embodiment.

FIG. 12 shows an example of commands, and signals and voltages applied to the lines in a write operation in the semiconductor memory 10 according to the first embodiment.

In the following description, a write-targeted bit line BL refers to a bit line BL coupled to a write-targeted memory cell transistor MT, and a write-inhibited bit line BL refers to a bit line BL coupled to a write-inhibited memory cell transistor MT.

In the following description, a verify operation for determining whether or not a threshold voltage of a memory cell transistor MT exceeds the verify voltage AV will be referred to as "A" verify, and a verify operation for determining whether or not a threshold voltage exceeds the verify voltage BV will be referred to as "B" verify.

As shown in FIG. 12, in an initial state before the semiconductor memory 10 starts a write operation, the ready busy signal RBn is at an "H" level (a ready state), and the voltage of the selected word line WLsel in first plane PL1 and the voltage of the selected word line WLsel in second plane PL2 are at the level of VSS.

First, the memory controller 20 transmits a first command set CS1 to the semiconductor memory 10. The first command set CS1 includes a command for instructing a write operation, an address of a cell unit CU to which data is written, and write data to be written in the first page. The write data to be written to the first page received by the semiconductor memory 10 is retained in the latch circuit XDL of a sense amplifier unit SAU in the sense amplifier module 17A and the latch circuit XDL of a sense amplifier unit SAU in the sense amplifier module 17B.

The semiconductor memory 10 temporarily changes to, for example, a busy state after receiving the first command set CS1, and transfers the received write data to be written in the first page from the latch circuit XDL in the sense amplifier module 17 to, for example, the latch circuit ADL.

Next, the memory controller 20 transmits a second command set CS2 to the semiconductor memory 10. The second command set CS2 includes a command for instructing a write operation, an address of a cell unit CU to which data is written, and write data to be written in the second page. The write data to be written to the second page received by the semiconductor memory 10 is retained in the latch circuit XDL in the sense amplifier module 17A and the latch circuit XDL in the sense amplifier module 17B.

The semiconductor memory 10 temporarily changes to, for example, a busy state after receiving the second command set CS2, and transfers the received write data to be written in the second page from the latch circuit XDL in the sense amplifier module 17 to, for example, the latch circuit BDL.

Next, the memory controller 20 transmits a third command set CS3 to the semiconductor memory 10. The third command set CS3 includes a command for instructing a write operation, an address of a cell unit CU to which data is written, and write data to be written in the third page. The write data to be written to the third page received by the semiconductor memory 10 is retained in the latch circuit XDL in the sense amplifier module 17A and the latch circuit XDL in the sense amplifier module 17B.

The semiconductor memory 10 changes to a busy state after receiving the third command set CS3, and the sequencer 14, for example, performs a write operation based on the write data for the first to third pages retained in the latch circuits ADL, BDL, and XDL in the sense amplifier modules 17A and 17B.

In the write operation in the first embodiment, the sequencer 14 simultaneously performs a first write operation for first plane PL1 and a second write operation for second plane PL2 in parallel.

In the first write operation, the sequencer 14 first executes a program operation.

In the program operation, the row decoder module 16A applies the program voltage VPGM to the selected word line WLsel in first plane PL1. The program voltage VPGM is a sufficiently high voltage to raise the threshold voltages of the memory cell transistors MT.

When the program voltage VPGM is applied to the selected word line WLsel, electrons are injected into the charge storage layer of the memory cell transistor MT, which is included in a NAND string NS coupled to a write-targeted bit line BL and is coupled to the selected word line WLsel, and the threshold voltage of the memory cell transistor MT rises.

At this time, a rise of the threshold voltage of a memory cell transistor MT included in a NAND string NS coupled to a write-inhibited bit line BL and coupled to the selected word line WLsel is suppressed by, for example, a self-boost technique.

Then, when the row decoder module 16A lowers the voltage of the selected word line WLsel to VSS, the sequencer 14 proceeds to a verify operation from a program operation.

In the verify operation, the row decoder module 16A applies the verify voltage AV to the selected word line WLsel, for example. Then, each sense amplifier unit SAU in the sense amplifier module 17A determines based on a voltage of a corresponding bit line BL, whether or not the threshold voltage of the memory cell transistor MT coupled to the selected word line WLsel exceeds the verify voltage AV ("A" verify).

A set of the above-explained program operation and verify operation corresponds to one time of a program loop. Then, the sequencer 14 steps up the program voltage VPGM, and executes the program loop once again. The voltage DVPGM, which is a step-up width of the program voltage VPGM, is set at a value as appropriate.

In the verify operation, the level of verification to be performed is not limited by the example described herein, and may be changed as appropriate. For example, a type and the number of verify voltages to be applied may be changed as the program loop progresses. For example, in the example shown in FIG. 12, the sequencer 14 performs only the "A" verify in the verify operation in the first and second program loops, and continuously performs the "A" verify and "B" verify in the third program loop.

If the sequencer 14 detects that the number of the memory cell transistors MT that have passed verification at a certain level exceeds a predetermined number, it is assumed that the data write at the certain level is completed, and for example, a verify operation at the certain level is omitted in the next program loop and thereafter. Then, if the sequencer 14 detects that the memory cell transistors MT have passed verification at, for example, all levels, the sequencer 14 determines finishing the first write operation.

Since the details of the second write operation are the same as the above-described first write operation, except that the target of the operation is second plane PL2, the description of the second write operation will be omitted.

Then, the sequencer 14 finishes the write operation when detecting the completion of each of the first and second write operations, and changes the semiconductor memory 10 to a ready state.

[1-2-2] Read Operation

The semiconductor memory 10 according to the first embodiment is capable of performing a read operation for each page. In the following, a read operation performed by the semiconductor memory 10 according to the first embodiment for each of the first, second, and third pages will be explained in order. In the explanation below, read operations for which the first, second, and third pages are respectively selected will be referred tows first page read, second page read, third page read, respectively.

(First Page Read)

FIG. 13 shows an example of commands, and signals and voltages applied to the lines in the first page read in the semiconductor memory 10 according to the first embodiment.

As shown in FIG. 13, in an initial state before the semiconductor memory 10 starts a read operation, the ready busy signal RBn is in an "H" level (a ready state), and the voltage of the selected word line WLsel in first plane PL1 and the voltage of the selected word line WLsel in second plane PL2 are at the level of VSS.

First, the memory controller 20 sequentially transmits, for example, a command "01h", a command "00h", address information ADD, and a command "30h" to the semiconductor memory 10.

The command "01h" is a command for instructing performing an operation for the first page. The command "00h" is a command for instructing a read operation. The command "30h" is a command for instructing the semiconductor memory 10 to start a read operation based on a received command and address. Upon reception of the command "30h", the semiconductor memory 10 changes to a busy state, and starts the first page read.

In the first page read in the first embodiment, the sequencer 14 simultaneously performs a first read operation for first plane PL1 and a second read operation for second plane PL2 in parallel.

In the first read operation of the first page read, the row decoder module 16A applies the read voltage AR to the selected word line WLsel in first plane PL1. Then, the sequencer 14 asserts the control signal STB corresponding to first plane PL1 while the read voltage AR is being applied to the selected word line WLsel in first plane PL1.

Then, each sense amplifier unit SAU in the sense amplifier module 17A determines whether or not the threshold voltage of a corresponding memory cell transistor MT exceeds the read voltage AR or not based on a voltage of a corresponding bit line BL. The result of this read is retained in any of the latch circuits in each sense amplifier unit SAU in the sense amplifier module 17A, and the sequencer 14 then finishes the first read operation.

In the second read operation of the first page read, the row decoder module 16B applies the read voltage AR to the selected word line WLsel in second plane PL2. Then, the sequencer 14 asserts the control signal STB corresponding to second plane PL2 while the read voltage AR is being applied to the selected word line WLsel in second plane PL2.

Then, each sense amplifier unit SAU in the sense amplifier module 17B determines whether or not the threshold voltage of a corresponding memory cell transistor MT exceeds the read voltage AR based on the voltage of a corresponding bit line BL. The result of this read is retained in any of the latch circuits in each sense amplifier unit SAU in the sense amplifier module 17B, and the sequencer 14 then finishes the second read operation.

When the first and second read operations are finished, the sequencer 14 causes the latch circuit XDL in the corresponding sense amplifier unit SAU in first plane PL1 and second plane PL2 to retain the results of the first and second read operations, respectively. The read data is not necessarily retained in the latch circuit XDL; the read data may be retained in the other latch circuits in each sense amplifier unit SAU.

Thereafter, the sequencer 14 changes the semiconductor memory 10 to a ready state. When the memory controller 20 detects that, for example, the semiconductor memory 10 changes from a busy state to a ready state, the memory controller 20 causes the semiconductor memory 10 to output the read data DAT by toggling the read enable signal REn.

At this time, each of the data output from first plane PL1 and second plane PL2 are transferred to the logic circuit 18. Then, the logic circuit 18 determines the read data of the first page based on the definitions of the data shown in FIG. 10, and outputs the determined read data DAT to the memory controller 20.

In order to prepare for data output, it is also possible to transfer the initial data of a cell unit CU to the vicinity of an output circuit by using a pipeline before the semiconductor memory 10 changes to a ready state.

(Second Page Read)

Figure 14:
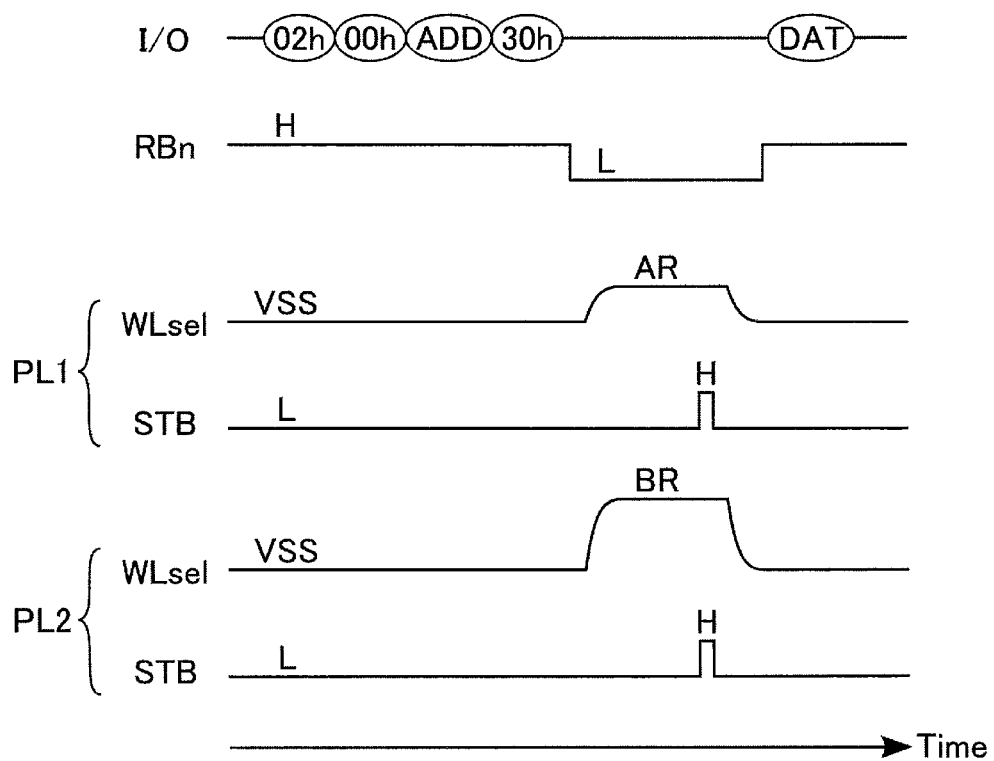
FIG. 14 is a timing chart showing an example of commands, and signals and voltages applied to lines in a second page read in the semiconductor memory according to the first embodiment.

FIG. 14 shows an example of commands, and signals and voltages applied to the lines in the second page read in the semiconductor memory 10 according to the first embodiment.

As shown in FIG. 14, first, the memory controller 20 sequentially transmits, for example, a command "02h", a command "00h", address information ADD, and a command "30h" to the semiconductor memory 10.

The command "02h" is a command for instructing performing an operation for the second page. Upon reception of the command "30h", the semiconductor memory 10 changes to a busy state, and starts the second page read.

In the second page read of the first embodiment, the sequencer 14 simultaneously performs a first read operation for first plane PL1 and a second read operation for second plane PL2 in parallel.

In the first read operation of the second page read, a read operation using, for example, the read voltage AR is performed, and the result of this read is retained in any of the latch circuits in each sense amplifier unit SAU in the sense amplifier module 17A.

In the second read operation of the second page read, a read operation using, for example, the read voltage BR is performed, and the result of this read is retained in any of the latch circuits in each sense amplifier unit SAU in the sense amplifier module 17B.

When the first and second read operations are finished, the sequencer 14 causes the latch circuit XDL in the corresponding sense amplifier unit SAU in first plane PL1 and second plane PL2 to retain the read results of the first and second read operations, respectively. The read data is not necessarily retained in the latch circuit XDL; the read data may be retained in the other latch circuits in each sense amplifier unit SAU.

Thereafter, the sequencer 14 changes the semiconductor memory 10 to a ready state. When the memory controller 20 detects that, for example, the semiconductor memory 10 changes from a busy state to a ready state, the memory controller 20 causes the semiconductor memory 10 to output the read data DAT by toggling the read enable signal REn.

At this time, each of the data output from first plane PL1 and second plane PL2 are transferred to the logic circuit 18. Then, the logic circuit 18 determines the read data of the second page based on the definitions of the data shown in FIG. 10, and outputs the determined read data DAT to the memory controller 20. Since the other operations in the second page read are the same as those in the first page read described with reference to FIG. 13, a detailed description of the operations is omitted.

(Third Page Read)

Figure 15:
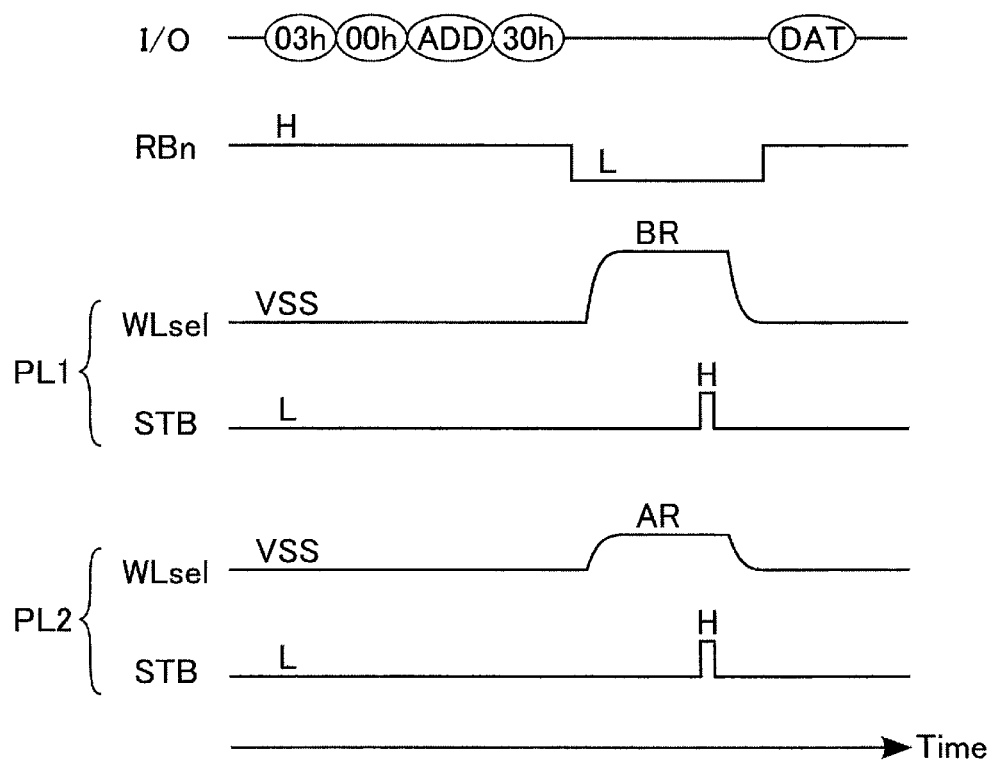
FIG. 15 is a timing chart showing an example of commands, and signals and voltages applied to lines in a third page read in the semiconductor memory according to the first embodiment.

FIG. 15 shows an example of commands, and signals and voltages applied to the lines in the third page read in the semiconductor memory 10 according to the first embodiment.

As shown in FIG. 15, first, the memory controller 20 sequentially transmits, for example, a command "03h", a command "00h", address information ADD, and a command "30h" to the semiconductor memory 10.

The command "03h" is a command for instructing performing an operation for the third page. Upon reception of the command "30h", the semiconductor memory 10 changes to a busy state, and starts the third page read.

In the third page read in the first embodiment, the sequencer 14 simultaneously performs a first read operation for first plane PL1 and a second read operation for second plane PL2 in parallel.

In the first read operation of the third page read, a read operation using, for example, the read voltage BR is performed, and a result of this read is retained in any of the latch circuits in each sense amplifier unit SAU in the sense amplifier module 17A.

In the second read operation of the third page read, a read operation using, for example, the read voltage AR is performed, and the result of this read is retained in any of the latch circuits in each sense amplifier unit SAU in the sense amplifier module 17B.

When the first and second read operations are finished, the sequencer 14 causes the latch circuit XDL in the corresponding sense amplifier unit SAU in first plane PL1 and second plane PL2 to retain the read results of the first and second read operations, respectively. The read data is not necessarily retained in the latch circuit XDL; the read data may be retained in the other latch circuits in each sense amplifier unit SAU.

Thereafter, the sequencer 14 changes the semiconductor memory 10 to a ready state. When the memory controller 20 detects that, for example, the semiconductor memory 10 changes from a busy state to a ready state, the memory controller 20 causes the semiconductor memory 10 to output the read data DAT by toggling the read enable signal REn.

At this time, each of the data output from first plane PL1 and second plane PL2 are transferred to the logic circuit 18. Then, the logic circuit 18 determines the read data of the third page based on the definitions of the data shown in FIG. 10, and outputs the determined read data DAT to the memory controller 20. Since the other operations in the third page read are the same as those in the first page read described with reference to FIG. 13, a detailed description of the operations is omitted.

[1-3] Advantageous Effects of First Embodiment

According to the above-described semiconductor memory 1 in the first embodiment, the speed of reading multiple-bit data stored in the memory cells can be enhanced. Advantageous effects of the semiconductor memory 1 according to the first embodiment will be described in detail below.

As a comparative example of the first embodiment, an example where 2-bit data is stored per memory cell transistor MT will be explained. FIG. 16 shows an example of a data allocation for the threshold distributions of the memory cell transistors MT and the voltages used for reading each page in the comparative example of the first embodiment.

As shown in FIG. 16, for the memory cell transistors MT in the comparative example in the first embodiment, "11 (upper bit/lower bit)" data, "01" data, "00" data, and "10" data are respectively allocated to the threshold distributions of "ER" state, "A" state," "B" state, and "C" state.

In the comparative example of the first embodiment, similarly to the explanation of FIG. 8, a read voltage and a verify voltage are set to each of the "A" state, "B" state, and "C" state. In the comparative example of the first embodiment, data in the upper page is determined by a result of the read using each of the read voltages AR and CR, and data in the lower page is determined by a result of the read using the read voltages BR.

In other words, if 2-bit data is stored in one memory cell transistor MT as in the comparative example of the first embodiment, it is necessary to perform a read operation using a plurality of read voltages in order to read data in, for example, an upper page.

On the other hand, the semiconductor memory 10 according to the first embodiment includes two independently-controllable planes, and stores 3-bit data using a set of memory cell transistors MT included in different planes.

Furthermore, in the semiconductor memory 10 of the first embodiment, read data of the first page, read data of the second page, and read data of the third page are determined by a read operation using one read voltage for each plane.

Thus, in the semiconductor memory 10 according to the first embodiment, similarly to the comparative example of the first embodiment, it is possible to store data larger than 1 bit in one memory cell transistor MT, and to determine read data of one page only by applying one read voltage for each plane.

Accordingly, the semiconductor memory 10 of the first embodiment can increase the speed of reading multiple-bit data stored in the memory cells.

[1-4] Modifications of First Embodiment

In the first embodiment, the data allocation shown in FIG. 9 is explained as an example; however, a different data allocation may be applied to the threshold distributions of the memory cell transistors MT. First to eleventh modifications of the first embodiment will be explained below. In the first embodiment and all of the modifications, the order of the first, second, and third pages may be changed. Furthermore, the definitions of "1" and "0" are interchangeable for each of the first embodiment and all of the modifications.

(First Modification of First Embodiment)

FIG. 17 shows an example of a data allocation for the threshold distributions of the memory cell transistors MT in the first modification of the first embodiment. As shown below and in FIG. 17, 3-bit data is allocated to each of the nine combinations of threshold voltages in the first modification of the first embodiment:

(1) "Z" state, "Z" state: "111" data
(2) "Z" state, "A" state: "110" data
(3) "Z" state, "B" state: "110" data
(4) "A" state, "Z" state: "101" data
(5) "A" state, "A" state: "000" data
(6) "A" state, "B" state: "010" data
(7) "B" state, "Z" state: "100" data
(8) "B" state, "A" state: "001" data
(9) "B" state, "B" state: "011" data As shown above, the same data is allocated to the combinations (2) and (3) in the first modification of the first embodiment. FIG. 18 shows read voltages that are set for the data allocation and definitions of read data that are applied to each of the results of reading the pages.

As shown in FIG. 18, a read voltage used in a read operation to each page in the first modification of the first embodiment is the same as the read voltage used in the read operation to each page in the first embodiment as explained with reference to FIG. 10. In the first modification of the first embodiment, the read data based on results of a read operation in each of first plane PL1 and second plane PL2 is defined as follows:

First page read: (L, L, 1), (L, H, 1), (H, L, 1), (H, H, 0)
Second page read: (L, L, 1), (L, H, 1), (H, L, (H, H, 1)
Third page read: (L, L, 1), (L, H, (H, L, 0), (H, H, 1)

By setting the read voltages and the data definitions as shown above, the semiconductor memory 10 according to the first modification of the first embodiment can operate in the same manner as the first embodiment, and can achieve advantageous effects similar to those of the first embodiment.

(Second Modification of First Embodiment)

FIG. 19 shows an example of a data allocation for the threshold distributions of the memory cell transistors MT in the second modification of the first embodiment. As shown below and in FIG. 19, 3-bit data is allocated to each of the nine combinations of threshold voltages in the second modification of the first embodiment:

(1) "Z" state, "Z" state: "111" data
(2) "Z" state, "A" state: "110" data
(3) "Z" state, "B" state: "100" data
(4) "A" state, "Z" state: "101" data
(5) "A" state, "A" state: "000" data
(6) "A" state, "B" state: "010" data
(7) "B" state, "Z" state: "101" data
(8) "B" state, "A" state: "001" data
(9) "B" state, "B" state: "011" data As shown above, the same data is allocated to the combinations (4) and (7) in the second modification of the first embodiment. FIG. 20 shows read voltages that are set for the data allocation and definitions of read data that are applied to each of the results of reading the pages.

As shown in FIG. 20, a read voltage used in a read operation to each page in the second modification of the first embodiment is the same as the read voltage used in the read operation to each page in the first embodiment as explained with reference to FIG. 10. In the second modification of the first embodiment, the read data based on results of a read operation in each of first plane PL1 and second plane PL2 is defined as follows:

First page read: (L, L, 1), (L, H, 1), (H, L, 1), (H, H, 0)
Second page read: (L, L, 1), (L, H, 0), (H, L, 0), (H, H, 1)
Third page read: (L, L, 1), (L, H, 0), (H, L, 1), (H, H, 1)

By setting the read voltages and the data definitions as shown above, the semiconductor memory 10 according to the second modification of the first embodiment can operate in the same manner as the first embodiment, and can achieve advantageous effects similar to those of the first embodiment.

(Third Modification of First Embodiment)

FIG. 21 shows an example of a data allocation for the threshold distributions of the memory cell transistors MT in the third modification of the first embodiment. As shown below and in FIG. 21, 3-bit data is allocated to each of the nine combinations of threshold voltages in the third modification of the first embodiment:

(1) "Z" state, "Z" state: "111" data
(2) "Z" state, "A" state: "111" data
(3) "Z" state, "B" state: "110" data
(4) "A" state, "ZA" state: "101" data
(5) "A" state, "A" state: "001" data
(6) "A" state, "B" state: "010" data
(7) "B" state, "Z" state: "100" data
(8) "B" state, "A" state: "000" data
(9) "B" state, "B" state: "011" data As shown above, the same data is allocated to the combinations (1) and (2) in the third modification of the first embodiment. FIG. 22 shows read voltages that are set for the data allocation and definitions of read data that are applied to each of the results of reading the pages.

As shown in FIG. 22, the read voltage AR is used for the first page read in first plane PL1 and second plane PL2. In the second page read, the read voltage AR is used in first plane PL1, and the read voltage BR is used in second plane PL2. In the third page read, the read voltage BR is used in first plane PL1 and in second plane PL2. In the third modification of the first embodiment, the read data based on results of a read operation in each of first plane PL1 and second plane PL2 is defined as follows:

First page read: (L, L, 1), (L, H, 1), (H, L, 1), (H, H, 0)
Second page read: (L, L, 1), (L, H, 1), (H, L, 0), (H, H, 1)
Third page read: (L, L, 1), (L, H, 0), (H, L, 0), (H, H, 1)

By setting the read voltages and the data definitions as shown above, the semiconductor memory 10 according to the third modification of the first embodiment can operate in the same manner as the first embodiment, and can achieve advantageous effects similar to those of the first embodiment.

(Fourth Modification of First Embodiment)

FIG. 23 shows an example of a data allocation for the threshold distributions of the memory cell transistors MT in the fourth modification of the first embodiment. As shown below and in FIG. 23, 3-bit data is allocated to each of the nine combinations of threshold voltages in the fourth modification of the first embodiment:

(1) "Z" state, "Z" state: "111" data
(2) "Z" state, "A" state: "011" data
(3) "Z" state, "B" state: "010" data
(4) "A" state, "Z" state: "001" data
(5) "A" state, "A" state: "101" data
(6) "A" state, "B" state: "110" data
(7) "B" state, "Z" state: "000" data
(8) "B" state, "A" state: "100" data
(9) "B" state, "B" state: "111" data As shown above, the same data is allocated to the combinations (1) and (9) in the fourth modification of the first embodiment. FIG. 24 shows read voltages that are set for the data allocation and definitions of read data that are applied to each of the results of reading the pages.

As shown in FIG. 24, a read voltage used in a read operation to each page in the fourth modification of the first embodiment is the same as the read voltage used in the read operation to each page in the third modification of the first embodiment as explained with reference to FIG. 22. In the fourth modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 1), (H, L, 0), (H, H, 1)
Third page read: (L, L, 1), (L, H, 0), (H, L, 0), (H, H, 1)

By setting the read voltages and the data definitions as shown above, the semiconductor memory 10 according to the fourth modification of the first embodiment can operate in the same manner as the first embodiment, and can achieve advantageous effects similar to those of the first embodiment.

(Fifth Modification of First Embodiment)

FIG. 25 shows an example of a data allocation for the threshold distributions of the memory cell transistors MT in the fifth modification of the first embodiment. As shown below and in FIG. 25, 3-bit data is allocated to each of the nine combinations of threshold voltages in the fifth modification of the first embodiment:

(1) "Z" state, "Z" state: "111" data
(2) "Z" state, "A" state: "011" data
(3) "Z" state, "B" state: "010" data
(4) "A" state, "Z" state: "001" data
(5) "A" state, "A" state: "101" data
(6) "A" state, "B" state: "110" data
(7) "B" state, "Z" state: "000" data
(8) "B" state, "A" state: "100" data
(9) "B" state, "B" state: "110" data As shown above, the same data is allocated to the combinations (6) and (9) in the fifth modification of the first embodiment. FIG. 26 shows read voltages that are set for the data allocation and definitions of read data that are applied to each of the results of reading the pages.

As shown in FIG. 26, a read voltage used in a read operation to each page in the fifth modification of the first embodiment is the same as the read voltage used in the read operation to each page in the third modification of the first embodiment as explained with reference to FIG. 22. In the fifth modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 1), (H, L, (H, H, 1)
Third page read: (L, L, 1), (L, H, 0), (H, L, 0), (H, H, 0)

By setting the read voltages and the data definitions as shown above, the semiconductor memory 10 according to the fifth modification of the first embodiment can operate in the same manner as the first embodiment, and can achieve advantageous effects similar to those of the first embodiment.

(Sixth Modification of First Embodiment)

FIG. 27 shows an example of a data allocation for the threshold distributions of the memory cell transistors MT in the sixth modification of the first embodiment. As shown below and in FIG. 27, 3-bit data is allocated to each of the nine combinations of threshold voltages in the sixth modification of the first embodiment:

(1) "Z" state, "Z" state: "111" data
(2) "Z" state, "A" state: "101" data
(3) "Z" state, "B" state: "100" data
(4) "A" state, "Z" state: "111" data
(5) "A" state, "A" state: "001" data
(6) "A" state, "B" state: "000" data
(7) "B" state, "Z" state: "110" data
(8) "B" state, "A" state: "010" data
(9) "B" state, "B" state: "011" data As shown above, the same data is allocated to the combinations (1) and (4) in the sixth modification of the first embodiment. FIG. 28 shows read voltages that are set for the data allocation and definitions of read data that are applied to each of the results of reading the pages.

As shown in FIG. 28, the read voltage AR is used for the first page read in first plane PL1 and second plane PL2. In the second page read, the read voltage BR is used in first plane PL1, and the read voltage AR is used in second plane PL2. In the third page read, the read voltage BR is used in first plane PL1 and in second plane PL2. In the sixth modification of the first embodiment, the read data based on results of a read operation in each of first plane PL1 and second plane PL2 is defined as follows:

First page read: (L, L, 1), (L, H, 1), (H, L, 1), (H, H, 0)
Second page read: (L, L, 1), (L, H, 0), (H, L, 1), (H, H, 1)
Third page read: (L, L, 1), (L, H, 0), (H, L, 0), (H, H, 1)

By setting the read voltages and the data definitions as shown above, the semiconductor memory 10 according to the sixth modification of the first embodiment can operate in the same manner as the first embodiment, and can achieve advantageous effects similar to those of the first embodiment.

(Seventh Modification of First Embodiment)

FIG. 29 shows an example of a data allocation for the threshold distributions of the memory cell transistors MT in the seventh modification of the first embodiment. As shown below and in FIG. 29, 3-bit data is allocated to each of the nine combinations of threshold voltages in the seventh modification of the first embodiment:

(1) "Z" state, "Z" state: "111" data
(2) "Z" state, "A" state: "001" data
(3) "Z" state, "B" state: "000" data
(4) "A" state, "Z" state: "011" data
(5) "A" state, "A" state: "101" data
(6) "A" state, "B" state: "100" data
(7) "B" state, "Z" state: "010" data
(8) "B" state, "A" state: "110" data
(9) "B" state, "B" state: "111" data As shown above, the same data is allocated to the combinations (1) and (9) in the seventh modification of the first embodiment. FIG. 30 shows read voltages that are set for the data allocation and definitions of read data that are applied to each of the results of reading the pages.

As shown in FIG. 30, a read voltage used in a read operation to each page in the seventh modification of the first embodiment is the same as the read voltage used in the read operation to each page in the sixth modification of the first embodiment as explained with reference to FIG. 28. In the seventh modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 0), (H, L, 1), (H, H, 1)
Third page read: (L, L, 1), (L, H, 0), (H, L, 0), (H, H, 1)

By setting the read voltages and the data definitions as shown above, the semiconductor memory 10 according to the seventh modification of the first embodiment can operate in the same manner as the first embodiment, and can achieve advantageous effects similar to those of the first embodiment.

(Eighth Modification of First Embodiment)

FIG. 31 shows an example of a data allocation for the threshold distributions of the memory cell transistors MT in the eighth modification of the first embodiment. As shown below and in FIG. 31, 3-bit data is allocated to each of the nine combinations of threshold voltages in the eighth modification of the first embodiment:

(1) "Z" state, "Z" state: "111" data
(2) "Z" state, "A" state: "001" data
(3) "Z" state, "B" state: "000" data
(4) "A" state, "Z" state: "011" data
(5) "A" state, "A" state: "101" data
(6) "A" state, "B" state: "100" data
(7) "B" state, "Z" state: "010" data
(8) "B" state, "A" state: "110" data
(9) "B" state, "B" state: "110" data As shown above, the same data is allocated to the combinations (8) and (9) in the eighth modification of the first embodiment. FIG. 32 shows read voltages that are set for the data allocation and definitions of read data that are applied to each of the results of reading the pages.

As shown in FIG. 32, a read voltage used in a read operation to each page in the eighth modification of the first embodiment is the same as the read voltage used in the read operation to each page in the sixth modification of the first embodiment as explained with reference to FIG. 28. In the eighth modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 0), (H, L, 1), (H, H, 1)
Third page read: (L, L, 1), (L, H, 0), (H, L, 0), (H, H, 0)

By setting the read voltages and the data definitions as shown above, the semiconductor memory 10 according to the eighth modification of the first embodiment can operate in the same manner as the first embodiment, and can achieve advantageous effects similar to those of the first embodiment.

(Ninth Modification of First Embodiment)

FIG. 33 shows an example of a data allocation for the threshold distributions of the memory cell transistors MT in the ninth modification of the first embodiment. As shown below and in FIG. 33, 3-bit data is allocated to each of the nine combinations of threshold voltages in the ninth modification of the first embodiment:

(1) "Z" state, "Z" state: "111" data
(2) "Z" state, "A" state: "101" data
(3) "Z" state, "B" state: "100" data
(4) "A" state, "Z" state: "011" data
(5) "A" state, "A" state: "001" data
(6) "A" state, "B" state: "100" data
(7) "B" state, "Z" state: "000" data
(8) "B" state, "A" state: "010" data
(9) "B" state, "B" state: "110" data As shown above, the same data is allocated to the combinations (3) and (6) in the ninth modification of the first embodiment. FIG. 34 shows read voltages that are set for the data allocation and definitions of read data that are applied to each of the results of reading the pages.

As shown in FIG. 34, in the first page read, the read voltage AR is used in first plane PL1, and the read voltage BR is used in second plane PL2. In the second page read, the read voltage BR is used in first plane PL1, and the read voltage AR is used in second plane PL2. In the third page read, the read voltage BR is used in first plane PL1 and in second plane PL2. In the ninth modification of the first embodiment, the read data based on results of a read operation in each of first plane PL1 and second plane PL2 is defined as follows:

First page read: (L, L, 1), (L, H, 1), (H, L, 0), (H, H, 1)
Second page read: (L, L, 1), (L, H, 0), (H, L, 0), (H, H, 1)
Third page read: (L, L, 1), (L, H, (H, L, 0), (H, H, 0)

By setting the read voltages and the data definitions as shown above, the semiconductor memory 10 according to the ninth modification of the first embodiment can operate in the same manner as the first embodiment, and can achieve advantageous effects similar to those of the first embodiment.

(Tenth Modification of First Embodiment)

FIG. 35 shows an example of a data allocation for the threshold distributions of the memory cell transistors MT in the tenth modification of the first embodiment. As shown below and in FIG. 35, 3-bit data is allocated to each of the nine combinations of threshold voltages in the tenth modification of the first embodiment:

(1) "Z" state, "Z" state: "111" data
(2) "Z" state, "A" state: "101" data
(3) "Z" state, "B" state: "000" data
(4) "A" state, "Z" state: "011" data
(5) "A" state, "A" state: "001" data
(6) "A" state, "B" state: "100" data
(7) "B" state, "Z" state: "010" data
(8) "B" state, "A" state: "010" data
(9) "B" state, "B" state: "110" data As shown above, the same data is allocated to the combinations (7) and (8) in the tenth modification of the first embodiment. FIG. 36 shows read voltages that are set for the data allocation and definitions of read data that are applied to each of the results of reading the pages.

As shown in FIG. 36, a read voltage used in a read operation to each page in the tenth modification of the first embodiment is the same as the read voltage used in the read operation to each page in the ninth modification of the first embodiment as explained with reference to FIG. 34. In the tenth modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 0), (H, L, 1), (H, H, 1)
Third page read: (L, L, 1), (L, H, 0), (H, L, 0), (H, H, 0)

By setting the read voltages and the data definitions as shown above, the semiconductor memory 10 according to the tenth modification of the first embodiment can operate in the same manner as the first embodiment, and can achieve advantageous effects similar to those of the first embodiment.

(Eleventh Modification of First Embodiment)

FIG. 37 shows an example of a data allocation for the threshold distributions of the memory cell transistors MT in the eleventh modification of the first embodiment. As shown below and in FIG. 27, 3-bit data is allocated to each of the nine combinations of threshold voltages in the eleventh modification of the first embodiment:

(1) "Z" state, "Z" state: "111" data
(2) "Z" state, "A" state: "101" data
(3) "Z" state, "B" state: "000" data
(4) "A" state, "Z" state: "011" data
(5) "A" state, "A" state: "001" data
(6) "A" state, "B" state: "100" data
(7) "B" state, "Z" state: "000" data
(8) "B" state, "A" state: "010" data
(9) "B" state, "B" state: "110" data As shown above, the same data is allocated to the combinations (3) and (7) in the eleventh modification of the first embodiment. FIG. 38 shows read voltages that are set for the data allocation and definitions of read data that are applied to each of the results of reading the pages.

As shown in FIG. 38, a read voltage used in a read operation to each page in the eleventh modification of the first embodiment is the same as the read voltage used in the read operation to each page in the ninth modification of the first embodiment as explained with reference to FIG. 34. In the eleventh modification of the first embodiment, the read data based on results of a read operation in each of first plane PL1 and second plane PL2 is defined as follows:

First page read: (L, L, 1), (L, H, 0), (H, L, 0), (H, H, 1)
Second page read: (L, L, 1), (L, H, 0), (H, L, 0), (H, H, 1)
Third page read: (L, L, 1), (L, H, (H, L, 0), (H, H, 0)

By setting the read voltages and the data definitions as shown above, the semiconductor memory 10 according to the eleventh modification of the first embodiment can operate in the same manner as the first embodiment, and can achieve advantageous effects similar to those of the first embodiment.

[2] Second Embodiment

A semiconductor memory 10 according to the second embodiment performs a write operation in units of pages similar to the first embodiment. In the following, differences of the semiconductor memory 10 according to the second embodiment from the first embodiment will be described.

[2-1] Data Allocation

In the semiconductor memory 10 according to the second embodiment, a write operation for the first page (hereinafter, the first page write), a write operation for the second page (hereinafter, the second page write), and a write operation for the third page (hereinafter, the third page write) are performed.

In the second embodiment, a data allocation applied to write data to be written in each of the first page and second page is different from a data allocation applied to write data to be written in the third page.

In the following, a case where the data allocation explained with reference to FIG. 9 in the first embodiment is adopted as the data allocation for the 3-page data write in the second embodiment will be explained as an example.

FIG. 39 shows an example of a data allocation for the first page write of the second embodiment. In the first page write in the second embodiment, as shown in FIG. 39 and thereafter, 1-bit data is allocated to each of two combinations, each consisting of one threshold voltage of the memory cell transistors MT in first plane PL1 and one of two threshold voltages of the memory cell transistors MT in second plane PL2.

(Example) "threshold voltage of memory cell transistors MT in first plane PL1", "threshold voltage of memory cell transistors MT in second plane PL2": "first bit" data (1) "Z" state, "Z" state: "1" data
(2) "Z" state, "A" state: "0" data FIG. 40 shows an example of a data allocation for the second page write in the second embodiment. In the second page write of the second embodiment, as shown in FIG. 40 and thereafter, 2-bit data is allocated to each of four combinations, each consisting of one of two threshold voltages of the memory cell transistors MT in first plane PL1 and one of two threshold voltages of the memory cell transistors MT in second plane PL2.

(Example) "threshold voltage of memory cell transistors MT in first plane PL1", "threshold voltage of memory cell transistors MT in second plane PL2": "first bit/second bit" data (1) "Z" state, "Z" state: "11" data
(2) "Z" state, "A" state: "01" data
(3) "A" state, "Z" state: "10" data
(4) "A" state, "A" state: "00" data FIG. 41 shows an example of a data allocation for the third page write in the second embodiment, and indicates the combination that is not used among the combinations shown in FIG. 9 as explained in the first embodiment. Specifically, in the data allocation shown in FIG. 41, the combination (7) is used but the combination (3) is not used in the second embodiment, although the same 3-bit data is allocated to the combinations (3) and (7).

Since the other configurations in the semiconductor memory 10 according to the second embodiment are the same as those in the semiconductor memory 10 according to the first embodiment, detailed descriptions of the configurations are omitted.

[2-2] Operation

[2-2-1] Write Operation

In the following, a write operation performed by the semiconductor memory 10 according to the second embodiment for each of the first, second, and third pages will be explained in order.

(First Page Write)

Figure 42:
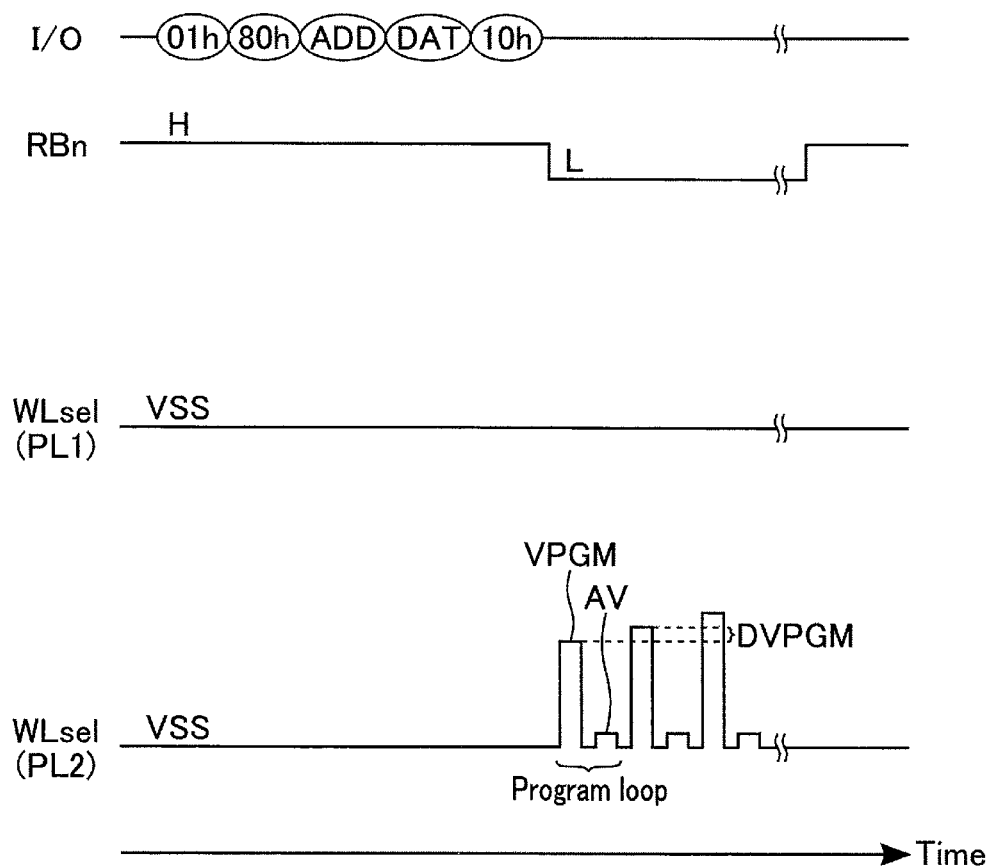
FIG. 42 is a timing chart showing an example of commands, and signals and voltages applied to lines in a first page write in the semiconductor memory according to the second embodiment.

FIG. 42 shows an example of commands, and signals and voltages applied to the lines in the page write in the semiconductor memory 10 according to the second embodiment. In the first page write of the second embodiment, commands and a plane for which a write operation is performed are different from those in the write operation in the first embodiment explained with reference to FIG. 12.

Specifically, as shown in FIG. 42, first, the memory controller 20 sequentially transmits, for example, a command "01h", a command "80h", address information ADD, write data DAT, and a command "10h" to the semiconductor memory 10.

The command "80h" is a command for instructing a write operation. The command "10h" is a command for instructing the semiconductor memory 10 to start a write operation based on a received command, address, and data.

When the semiconductor memory 10 receives the write data DAT to be written in the first page, the received data is retained in each of the latch circuits XDL of the sense amplifier units SAU in the sense amplifier module 17B. Upon reception of the command "10h", the semiconductor memory 10 changes to a busy state, and starts the first page write.

In the first page write of the second embodiment, the sequencer 14 performs a second write operation for second plane PL2 but does not perform a first write operation for first plane PL1.

In the second write operation of the first page write, write-targeted and write-inhibited memory cell transistors MT are set based on the data allocation shown in FIG. 39, and the sequencer 14 performs a program loop.

When the second write operation is finished, if the write data DAT retained in the latch circuit of the sense amplifier unit SAU corresponding to the memory cell transistor MT is "1 (first bit)" data, the threshold voltage of the memory cell transistor MT is maintained at the "Z" state ((1) in FIG. 39).

If the write data DAT retained in the latch circuit of the sense amplifier unit SALT corresponding to the memory cell transistor MT is "0" data, the threshold voltage of the memory cell transistor MT is raised from the "Z" state to the "A" state ((2) in FIG. 39).

Since the other operations in the first write operation in the second embodiment are the same as those in the write operation in the first embodiment explained with reference to FIG. 12, detailed descriptions of the operations are omitted.

(Second Page Write)

Figure 43:
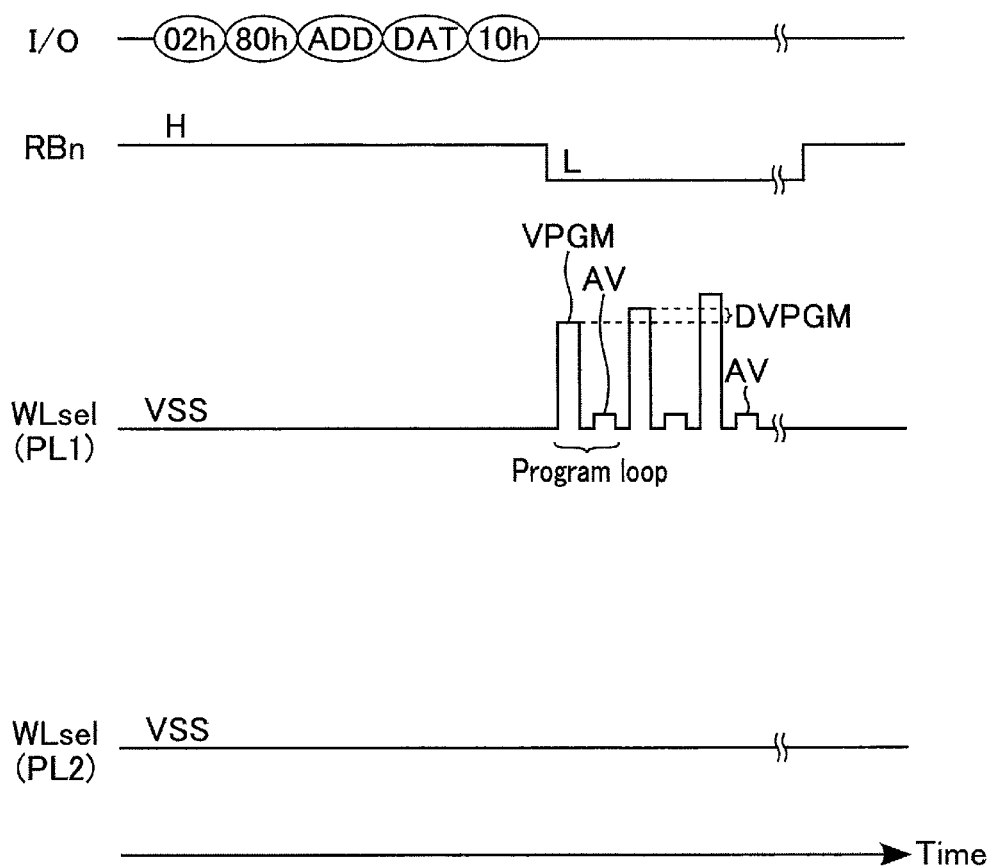
FIG. 43 is a timing chart showing an example of commands, and signals and voltages applied to lines in a second page write in the semiconductor memory according to the second embodiment.

FIG. 43 shows an example of commands, and signals and voltages applied to the lines in the second page write in the semiconductor memory 10 according to the second embodiment.

As shown in FIG. 43, first, the memory controller 20 sequentially transmits, for example, a command "02h", command "80h", address information ADD, write data DAT, and a command "10h" to the semiconductor memory 10.

When the semiconductor memory 10 receives the write data DAT to be written in the second page, the received data is retained in each of the latch circuits XDL of the sense amplifier units SAU in the sense amplifier module 17A. Upon reception of the command "10h", the semiconductor memory 10 changes to a busy state, and starts the second page write.

In the second page write in the second embodiment, the sequencer 14 performs a first write operation for first plane PL1, but does not perform a second write operation for second plane PL2.

In the first write operation in the second page write, write-targeted and write-inhibited memory cell transistors MT are set based on the data allocation shown in FIG. 40, and the sequencer 14 performs a program loop.

When the first write operation is finished, if the write data DAT retained in the latch circuit of the corresponding sense amplifier unit SAU corresponding to the memory cell transistor MT is "1 (second bit)" data, the threshold voltage of the memory cell transistor MT is maintained at the "Z" state ((1) and (2) in FIG. 40).

If the write data DAT retained in the latch circuit of the sense amplifier unit SAU corresponding to the memory cell transistor MT is "0" data, the threshold voltage of the memory cell transistor MT is raised from the "Z" state to the "A" state ((3) and (4) in FIG. 40).

Since the other operations in the second write operation in the second embodiment are the same as those in the write operation in the first embodiment explained with reference to FIG. 12, detailed descriptions of the operations are omitted.

(Third Page Write)

FIG. 44 shows an example of commands, and signals and voltages applied to the lines in the third page write in the semiconductor memory 10 according to the second embodiment.

As shown in FIG. 44, first, the memory controller 20 sequentially transmits, for example, a command "03h", a command "80h", address information ADD, write data DAT, and a command "10h" to the semiconductor memory 10.

When the semiconductor memory 10 receives the write data DAT to be written in the third page, the received data is retained in each of the latch circuits XDL of the sense amplifier units SAU in the sense amplifier module 17A and the latch circuits XDL of the sense amplifier units SAU in the sense amplifier module 17B. Upon reception of the command "10h", the semiconductor memory 10 changes to a busy state, and starts the third page write.

First, in the third page write, the write data DAT retained in the latch circuit XDL in each of the sense amplifier units SAU of the sense amplifier modules 17A and 17B is transferred to, for example, the latch circuit ADL in the same sense amplifier unit SAU.

Then, in the third page write in the second embodiment, the sequencer 14 simultaneously performs internal data load (IDL) to first plane PL1 and second plane PL2 in parallel. The IDL is a read operation for restoring data, which has already been written in a selected cell unit CU, in a latch circuit in a corresponding sense amplifier unit SAU.

In the IDL to first plane PL1, a read operation using the read voltage AR is performed, and a result of reading the write data in the second page is restored in, for example, the latch circuit BDL in each of the sense amplifier units SAU in the sense amplifier module 17A. Then, the restored write data of the second page is transferred to the latch circuit XDL in the sense amplifier unit SAU in the sense amplifier module 17B, and the sequencer 14 finishes the IDL to first plane PL1.

In the second embodiment, suppose the data remains in a transfer origin latch circuit even after the data is transferred from the transfer origin to a transfer destination latch circuit. In other words, "transfer of data" in the second embodiment corresponds to copying data between latch circuits.

In the IDL to second plane PL2, a read operation using the read voltage AR is performed, and a result of reading the write data in the first page is restored in, for example, the latch circuit BDL in each of the sense amplifier units SAU in the sense amplifier module 17B. Then, the restored write data of the first page is transferred to the latch circuit XDL in the sense amplifier unit SAU in the sense amplifier module 17A, and the sequencer 14 finishes the IDL to second plane PL2.

When the IDL to first plane PL1 and the IDL to second plane PL2 are finished, the first through third page data are retained in the sense amplifier units SAU in the sense amplifier module 17A and the sense amplifier units SAU in the sense amplifier module 17B, respectively.

Subsequently, the sequencer 14 simultaneously performs a first write operation for first plane PL1 and a second write operation for second plane PL2 in parallel. In each of the first write operation and the second write operation in the third page write, write-targeted, and write-inhibited memory cell transistors MT are set based on the data allocation shown in FIG. 41, and the sequencer 14 performs a program loop.

When the first write operation in first plane PL1 and the second write operation in second plane PL2 are finished, if the write data DAT retained in the latch circuit of the sense amplifier unit SAU corresponding to the memory cell transistor MT is "111 (first bit/second bit/third bit)" data, the threshold voltage of the memory cell transistor MT is maintained at the "Z" state ((1) in FIG. 41).

If the write data DAT retained in the latch circuit of the sense amplifier unit SAU corresponding to the memory cell transistor MT is "110" data, the threshold voltage of the memory cell transistor MT corresponding to first plane PL1 is maintained at the "Z" state, and the threshold voltage of the memory cell transistor MT corresponding to second plane PL2 is raised from the "Z" state to the "A" state ((2) in FIG. 41).

If the write data DAT retained in the latch circuit of the sense amplifier unit SAU corresponding to the memory cell transistor MT is "101" data, the threshold voltage of the memory cell transistor MT corresponding to first plane PL1 is maintained at the "A" state, and the threshold voltage of the memory cell transistor MT corresponding to second plane PL2 is maintained at the "Z" state ((4) in FIG. 41).

If the write data DAT retained in the latch circuit of the sense amplifier unit SAU corresponding to the memory cell transistor MT is "000" data, the threshold voltage of the memory cell transistor MT is maintained at the "A" state ((5) in FIG. 41).

If the write data DAT retained in the latch circuit of the sense amplifier unit SAU corresponding to the memory cell transistor MT is "010" data, the threshold voltage of the memory cell transistor MT corresponding to first plane PL1 is raised from the "Z" state to the "A" state, and the threshold voltage of the memory cell transistor MT corresponding to second plane PL2 is raised from the "A" state to the "B" state ((6) in FIG. 41).

If the write data DAT retained in the latch circuit of the sense amplifier unit SAU corresponding to the memory cell transistor MT is "100" data, the threshold voltage of the memory cell transistor MT corresponding to first plane PL1 is raised from the "A" state to the "B" state, and the threshold voltage of the memory cell transistor MT corresponding to second plane PL2 is maintained at the "Z" state ((7) in FIG. 41).

If the write data DAT retained in the latch circuit of the sense amplifier unit SAU corresponding to the memory cell transistor MT is "001" data, the threshold voltage of the memory cell transistor MT corresponding to first plane PL1 is raised from the "A" state to the "B" state, and the threshold voltage of the memory cell transistor MT corresponding to second plane PL2 is maintained at the "A" state ((8) in FIG. 41).

If the write data DAT retained in the latch circuit of the sense amplifier unit SAU corresponding to the memory cell transistor MT is "011" data, the threshold voltage of the memory cell transistor MT corresponding to first plane PL1 is raised from the "Z" state to the "B" state, and the threshold voltage of the memory cell transistor MT corresponding to second plane PL2 is raised from the "A" state to the "B" state ((9) in FIG. 41).

Since the other operations in the third page write in the second embodiment are the same as those in the write operation in the first embodiment explained with reference to FIG. 12, detailed descriptions of the operations are omitted.

In the above description, if data is written in the "A" state and the "B" state in the page write before the third page write, and data is then written in the same states in the third page write, the memory cell transistors MT are set to write-inhibited in order to maintain the threshold voltages thereof; however, additional write operations may be performed in the same states. In this case, a verify operation may be performed before a write operation, and a write operation may be once again performed to the memory cell transistors MT of which threshold voltages are lower than a corresponding verify voltage.

[2-2-2] Read Operation

A read operation performed by the semiconductor memory 10 according to the second embodiment is different between before and after the third page data is written in a selected cell unit CU.

For example, after the third page data is written, an operation of reading each page in the second embodiment is the same as the read operation explained in the first embodiment. On the other hand, before the third page data is written, an operation of reading each page is different from the operation of reading each page explained in the first embodiment because the data allocation is different between the first embodiment and the second embodiment.

(First Page Read Before Third Page Write)

Figure 45:
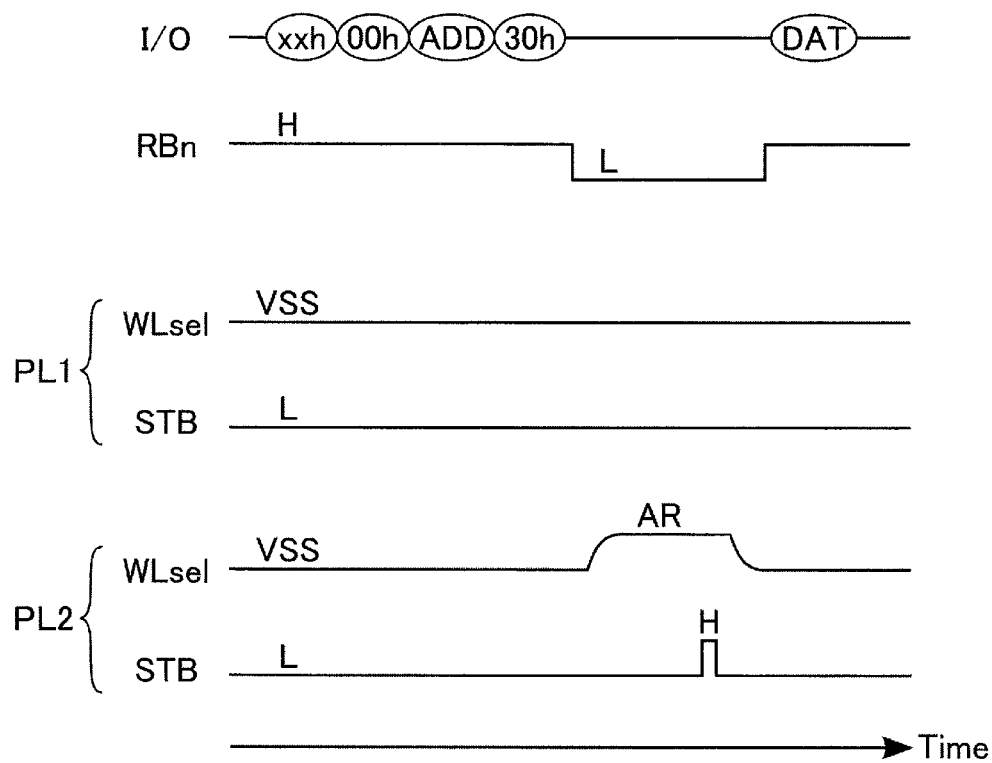
FIG. 45 is a timing chart showing an example of commands, and signals and voltages applied to lines in the first page read before the third page write in the semiconductor memory according to the second embodiment.

FIG. 45 shows an example of commands, and signals and voltages applied to the lines in the first page read before the third page write in the semiconductor memory 10 according to the second embodiment. The first page read before the third page write in the second embodiment is the same as the first page read in the first embodiment explained with reference to FIG. 13, but the commands and the used read voltage are different.

Specifically, as shown in FIG. 45, first, the memory controller 20 sequentially transmits, for example, a command "xxh", a command "00h", address information ADD, and a command "30h" to the semiconductor memory 10.

The command "xxh" is a command for instructing the first page read in a cell unit CU before the third page write is performed thereon. Upon reception of the command "30h", the semiconductor memory 10 changes to a busy state, and starts the first page read.

In the first page read before the third page write in the second embodiment, the sequencer 14 performs a second read operation for second plane PL2 but does not perform, for example, a first read operation for first plane PL1.

In the second read operation in the first page read before the third page write, a read operation using, for example, the read voltage AR is performed, and a result of this read is retained in any of the latch circuits in each sense amplifier unit SAU in the sense amplifier module 17B. In a cell unit CU before the third page write in the second embodiment, the result of this read corresponds to the read data of the first page in the cell unit CU.

Then, the read data of the first page is transferred to the latch circuit XDL in the sense amplifier unit SAU in the sense amplifier module 17B, and the sequencer 14 finishes the second read operation. When the second read operation is finished, the sequencer 14 changes the semiconductor memory 10 to a ready state.

Then, if the memory controller 20 detects, for example, a change from a busy state to a ready state in the semiconductor memory 10, the memory controller 20 causes the semiconductor memory 10 to output the read data DAT retained in the latch circuit XDL in the sense amplifier unit SAU in the sense amplifier module 17B.

In the first embodiment, the read data DAT is transferred to the logic circuit 18, and the logic circuit 18 determines the read data of the first page based on the data definitions shown in FIG. 10; however, in the first page read before the third page write in the second embodiment, the data conversion by the logic circuit 18 is not performed.

Since the other operations in the first page read before the third page write in the second embodiment are the same as the first page read in the first embodiment explained with reference to FIG. 13, descriptions of the operations will be omitted.

(Second Page Read Before Third Page Write)

FIG. 46 shows an example of commands, and signals and voltages applied to the lines in the second page read before the third page write in the semiconductor memory 10 according to the second embodiment.

As shown in FIG. 46, first, the memory controller 20 sequentially transmits, for example, a command "yyh", a command "00h", address information ADD, and a command "30h" to the semiconductor memory 10.

The command "yyh" is a command for instructing the second page read in a cell unit CU before the third page write is performed thereon. Upon reception of the command "30h", the semiconductor memory 10 changes to a busy state, and starts the second page read.

In the second page read before the third page write in the second embodiment, the sequencer 14 performs a first read operation for first plane PL1, but does not perform a second read operation for second plane PL2.

In the first read operation in the second page read before the third page write, a read operation using, for example, the read voltage AR is performed, and a result of this read is retained in any of the latch circuits in each sense amplifier unit SAU in the sense amplifier module 17A. In a cell unit CU before the third page write in the second embodiment, a result of this read corresponds to the read data of the second page in the cell unit CU.

Then, the read data of the second page is transferred to the latch circuit XDL in the sense amplifier unit SAU in the sense amplifier module 17A, and the sequencer 14 finishes the first read operation. When the first read operation is finished, the sequencer 14 changes the semiconductor memory 10 to a ready state.

Then, if the memory controller 20 detects, for example, a change from a busy state to a ready state in the semiconductor memory 10, the memory controller 20 causes the semiconductor memory 10 to output the read data DAT retained in the latch circuit XDL in the sense amplifier unit SAU in the sense amplifier module 17A.

In the first embodiment, the read data DAT is transferred to the logic circuit 18, and the logic circuit 18 determines the read data of the second page based on the data definitions shown in FIG. 10; however, in the second page read before the third page write in the second embodiment, the data conversion by the logic circuit 18 is not performed.

Since the other operations in the second page read before the third page write in the second embodiment are the same as the first page read in the first embodiment explained with reference to FIG. 13, descriptions of the operations will be omitted.

(Third Page Read)

Figure 47:
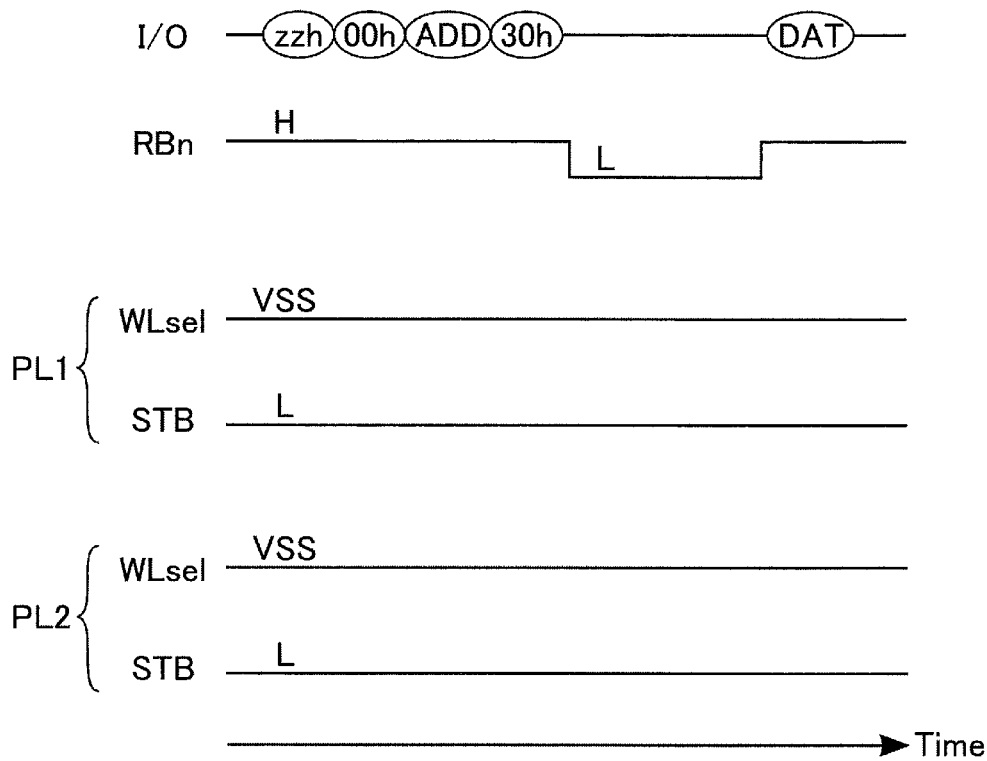
FIG. 47 is a timing chart showing an example of commands, and signals and voltages applied to lines in the third page read before the third page write in the semiconductor memory according to the second embodiment.

FIG. 47 shows an example of commands, and signals and voltages applied to the lines in the third page read before the third page write in the semiconductor memory 10 according to the second embodiment. The present example corresponds to a case of performing an operation of reading a page to which no data is written in a selected cell unit CU.

As shown in FIG. 47, first, the memory controller 20 sequentially transmits, for example, a command "zzh", a command "00h", address information ADD, and a command "30h" to the semiconductor memory 10.

The command "zzh" is a command for instructing the third page read in a cell unit CU before the third page write is performed thereon. Upon reception of the command "30h", the semiconductor memory 10 changes to a busy state, and starts the third page read.

If a page to which no data is written is selected, the sequencer 14 does not perform a read operation for each of first plane PL1 and second plane PL2. Then, the sequencer 14 brings the semiconductor memory 10 to a ready state after, for example, a certain length of time elapses.

Subsequently, the memory controller 20 detects a change of the semiconductor memory 10 from a busy state to a ready state, for example, the memory controller 20 causes the semiconductor memory 10 to output the read data of the third page by toggling the read enable signal REn.

At this time, the read data of the third page that is output from the semiconductor memory 10 is fixed to "1" data, for example. The read data is not limited to this example; for example, "0" data may be output by the semiconductor memory 10 as read data of a page to which no data is written.

[2-3] Advantageous Effects of Second Embodiment

According to the above-described semiconductor memory 10 in the second embodiment, a write operation can be performed in units of pages, using the method for storing data, which is explained in the first embodiment.

The semiconductor memory 10 according to the second embodiment can perform a read operation in units of pages even when write operations for three pages are not completed in a selected cell unit CU.

In the second embodiment, an example in which special commands respectively dedicated for the first page read, second page read, and third page read (e.g., the command "xxh") are used in a read operation before the third page write is explained; however, the second embodiment is not limited to this example.

FIG. 48 shows an example of commands and signals used in each page read in a modification of the second embodiment. In the modification of the second embodiment as shown in FIG. 48, the memory controller 20 first transmits, for example, the command "xyh" to the semiconductor memory 10 in each of the first page read, the second page read, and the third page read.

The command "xyh" is a command for specifying whether a read operation is the one performed before the third page write or after the third page write. Thereafter, the memory controller 20 transmits to the semiconductor memory 10 the command "01h" in the first page read, the command "02h" in the second page read, and the command "03h" in the third page read, for example.

Then, the sequencer 14 refers to the command "xyh" to distinguish the read before the third page write from the read after the third page write. The other operations are the same as the read operation explained in the first embodiment and the second embodiment. Thus, the same command may be used to select a read operation performed by the sequencer 14, regardless of a page selected.

[3] Third Embodiment

In the foregoing second embodiment, whether the third page write has been already performed or not is confirmed on the memory controller 20 side, and a command for instructing a read operation is changed in accordance with a result of the determination. In contrast, in a semiconductor memory 10 according to the third embodiment, when data has been written by the method described in the second embodiment, it is the semiconductor memory 10 side that confirms whether the third page write has already been performed or not by referring to the data retained in a flag cell, and appropriate read data is output without changing a read command. In the following, differences of the semiconductor memory 10 according to the third embodiment from the first and second embodiments will be described.

[3-1] Configuration of Semiconductor Memory 10

FIG. 49 shows a configuration example of the semiconductor memory 10 according to the third embodiment. As shown in FIG. 49, the semiconductor memory 10 according to the third embodiment includes the configuration of the semiconductor memory 10 according to the first embodiment explained with reference to FIG. 1, and a flag check circuit 70. The logic circuit 18 is omitted in FIG. 49.

The flag check circuit 70 is controlled by the sequencer 14, for example, and is coupled to a data bus that serves as a communication path for write data DAT, etc. In other words, the flag check circuit 70 is indirectly coupled to the sense amplifier modules 17A and 17B. In a read operation, the flag check circuit 70 retains a flag included in read data DAT that is output from the sense amplifier module 17A or 17B.

A flag is data indicating whether or not the third page write has been performed in a cell unit CU that includes the flag, in other words, whether or not the third page data is written in the cell unit CU. The flag is written in a specific memory cell transistors MT (flag cell) among the memory cell transistors MT included in the cell unit CU.

For example, if the data written in the flag cell is "1" data (flag not written), this indicates that the third page write has not been yet performed in the cell unit CU, and if the data is "0" data (flag written), this indicates that the third page write has already been performed in the cell unit CU.

If the flag is stored in only one of a cell unit CU in first plane PL1 or a cell unit CU in second plane PL2, the flag cell is written in, for example, the "B" state or higher by the third page write. In this case, a result of reading the flag cell at the read voltage AR or BR is used to confirm a state of the flag.

If the flag is to be stored in both of a cell unit CU in first plane PL1 and a cell unit CU in second plane PL2, the flag cell is written in, for example, the "A" state or higher by the third page write. In this case, a result of reading the flag cell at the read voltage AR is used as the flag.

The above-explained flag is referred to by the sequencer 14 in a read operation. Then, the sequencer 14 checks a writing state of the cell unit CU based on the flag, and changes read data DAT that is output to the memory controller 20 as appropriate.

As a flag cell, one or a plurality of memory cell transistors MT may be used in each cell unit CU. For example, if a plurality of memory cell transistors MT are used as flag cells, the semiconductor memory 10 may improve reliability of the flags through a majority vote or error correction performed on a result of reading the flag cells by the flag check circuit 70. A flag cell may be arranged at the beginning part of a page, so that a flag can be confirmed at the beginning of a serial transfer in a pipeline at the time of outputting data.

[3-2] Read Operation (First Page Read)

Figure 50:
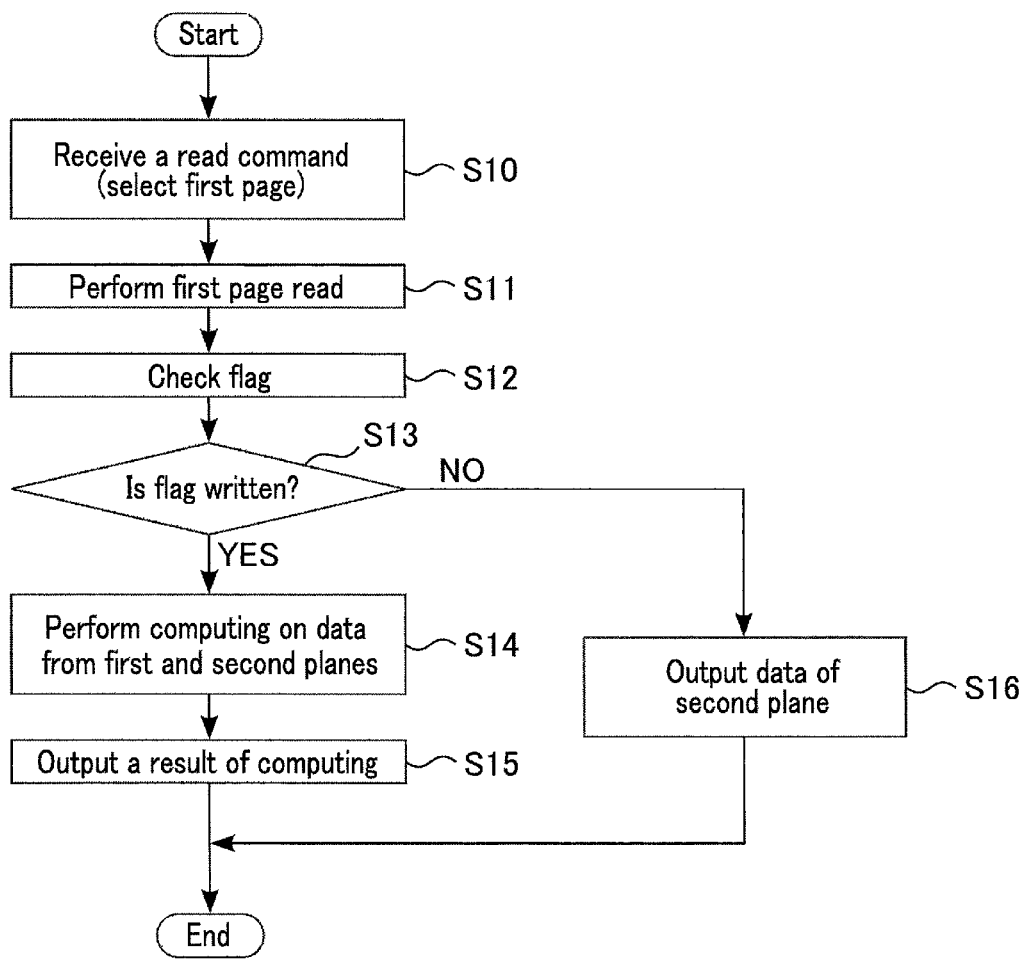
FIG. 50 is a flow chart showing an example of a read operation when a first page is selected in the semiconductor memory according to the third embodiment.

FIG. 50 shows an example of a flow chart of the first page read in the semiconductor memory 10 according to the third embodiment. In the following, a method of the first page read in the third embodiment will be explained with reference to FIG. 50.

The semiconductor memory 10 receives a command for instructing to perform an operation of reading a selected first page, and address information (step S10). Upon reception of the command and the address information, the semiconductor memory 10 changes to a busy state, and performs the first page read (step S11). A waveform of the word line WL in the first page read is similar to the one shown in FIG. 13 described in the first embodiment, and the read voltage of first plane PL1 is AR, and the read voltage of second plane PL2 is AR.

When the first page read is finished, the semiconductor memory 10 changes to a ready state, and outputs data of the first page read to the memory controller 20 based on the control of the memory controller 20.

Specifically, when the memory controller 20 detects, for example, a change of the semiconductor memory 10 from a busy state to a ready state, the memory controller 20 causes the semiconductor memory 10 to output the read data DAT by toggling the read enable signal REn. At this time, the flag included in the read data is transferred to the flag check circuit 70, and the sequencer 14 checks the flag retained in the flag check circuit 70 (step S12).

If the flag has already been written (Yes in step S13), the sequencer 14 confirms that the third page write has already been finished, and the logic circuit 18 determines the first page read data from the data that is output from first plane PL1 and second plane PL2 based on the data definitions shown in FIG. 10, for example (step S14). Then, the determined read data is output to the memory controller 20 (step S15).

If the flag has not yet been written (No in step S13), the sequencer 14 confirms that the third page has not yet been written, and causes the memory controller 20 to output the read data DAT retained in the latch circuits XDL of the sense amplifiers unit SAU in the sense amplifier module 17B in second plane PL2 (step S16). In this case, the logic circuit 18 does not perform data conversion.

The semiconductor memory 10 finishes the read operation when the above-described processing in step S15 or step S16 is completed.

In order to output data in units of cell units CU, after the first page read is finished and before the semiconductor memory 10 changes to a ready state, the NAND-type flash memory may transfer initial data of a cell unit CU to the vicinity of an output circuit using a pipeline as preparation for data output. In this case, a flag cell is arranged at the beginning part of a unit of a cell unit CU so as to confirm a flag while the semiconductor memory 10 is being in a busy state.

Specifically, if a flag has already been written, the sequencer 14 confirms that the third page has already been written, and the data that is output from first plane PL1 and second plane PL2 is transferred to the logic circuit 18. Then, the logic circuit 18 prepares to determine the read data of the first page based on the definitions of the data shown in FIG. 10, and the semiconductor memory 10 changes to a ready state. Then, the semiconductor memory 10 outputs the read data DAT when the memory controller 20 toggles the read enable signal REn.

If a flag has not yet been written, the sequencer 14 confirms that the third page has not yet been written, and prepares for outputting the read data DAT retained in each of the latch circuits XDL of the sense amplifier units SAU in the sense amplifier module 17B in second plane PL2, and then, the semiconductor memory 10 changes to a ready state. Then, the semiconductor memory 10 outputs the read data DAT when the memory controller 20 toggles the read enable signal REn.

(Second Page Read)

FIG. 51 shows an example of a flow chart of the second page read in the semiconductor memory 10 according to the third embodiment. In the following, the method of the second page read in the third embodiment will be explained with reference to FIG. 51.

The semiconductor memory 10 receives a command for instructing to perform an operation of reading a selected second page, and address information (step S20). Upon reception of the command and the address information, the semiconductor memory 10 changes to a busy state, and performs the second page read (step S21). A waveform of the word line WL in the second page read is similar to the one shown in FIG. 14 described in the first embodiment, and the read voltage of first plane PL1 is AR, and the read voltage of second plane PL2 is BR.

When the second page read is finished, the semiconductor memory 10 changes to a ready state, and outputs data of the second page read to the memory controller 20 based on the control of the memory controller 20.

Specifically, when the memory controller 20 detects, for example, a change of the semiconductor memory 10 from a busy state to a ready state, the memory controller 20 causes the semiconductor memory 10 to output the read data DAT by toggling the read enable signal REn. At this time, the flag included in the read data is transferred to the flag check circuit 70, and the sequencer 14 checks the flag retained in the flag check circuit 70 (step S12).

If the flag has already been written (Yes in step S13), the sequencer 14 confirms that the third page has already been written, and the logic circuit 18 determines the second page read data in the data that is output from first plane PL1 and second plane PL2 based on, for example, the data definitions shown in FIG. 10 (step S22). Then, the determined read data is output to the memory controller 20 (step S23).

If the flag has not yet been written (No in step S13), the sequencer 14 confirms that the third page has not yet been written, and causes the memory controller 20 to output the read data DAT retained in the latch circuits XDL of the sense amplifiers unit SAU in the sense amplifier module 17A in first plane PL1 (step S24).

The semiconductor memory 10 finishes the read operation when the above-described processing in step S23 or step S24 is completed.

In order to output data in units of cell units CU, after the second page read is finished and before the semiconductor memory 10 changes to a ready state, the NAND-type flash memory may transfer initial data of a cell unit CU to the vicinity of an output circuit using a pipeline as preparation for data output. Since the details of this operation are the same as those of the first page read, the description thereof is omitted.

(Third Page Read)

Figure 52:
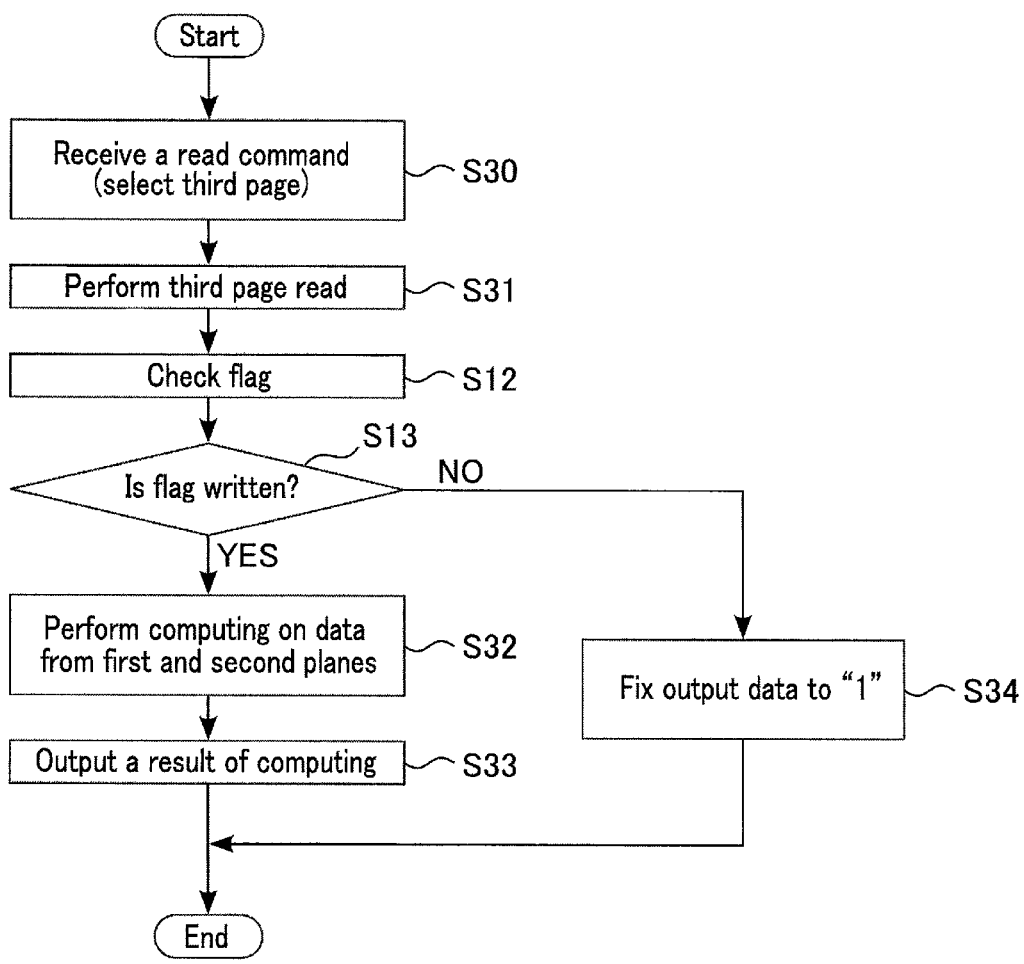
FIG. 52 is a flow chart showing an example of a read operation when a third page is selected in the semiconductor memory according to the third embodiment.

FIG. 52 shows an example of a flow chart of the third page read in the semiconductor memory 10 according to the third embodiment. In the following, the method of the third page read of the third embodiment will be explained with reference to FIG. 52.

The semiconductor memory 10 receives a command for instructing to perform an operation of reading a selected third page, and address information (step S30). Upon reception of the command and the address information, the semiconductor memory 10 changes to a busy state, and performs the third page read (step S31). A waveform of the word line WL in the third page read is similar to the one shown in FIG. 15 described in the first embodiment, and the read voltage of first plane PL1 is BR, and the read voltage of second plane PL2 is AR.

When the third page read is finished, the semiconductor memory 10 changes to a ready state, and outputs data of the third page read to the memory controller 20 based on the control of the memory controller 20.

Subsequently, the memory controller 20 detects a change of the semiconductor memory 10 from a busy state to a ready state, for example, the memory controller 20 causes the semiconductor memory 10 to output the read data DAT by toggling the read enable signal REn. At this time, the flag included in the read data is transferred to the flag check circuit 70, and the sequencer 14 checks the flag retained in the flag check circuit 70 (step S12).

If the flag has already been written (Yes in step S13), the sequencer 14 confirms that the third page has already been written, and the logic circuit 18 determines the third page read data in the data that is output from first plane PL1 and second plane PL2 based on, for example, the data definitions shown in FIG. 10 (step S32). Then, the determined read data is output to the memory controller 20 (step S33).

If the flag has not yet been written (No in step S13), the sequencer 14 confirms that the third page has not yet been written. Then, the semiconductor memory 10 outputs, for example, data fixed to "1" to the memory controller 20 based on the control of the memory controller 20 (step S34). In this case, data fixed by the logic circuit 18 may be output. Or, the data retained in the latch circuit XDL in a sense amplifier unit SAU may be fixed data, so that data conversion is not performed by the logic circuit 18.

The semiconductor memory 10 finishes the read operation when the above-described processing in step S33 or step S34 is completed.

In order to output data in units of cell units CU, after the third page read is finished and before the semiconductor memory 10 changes to a ready state, the NAND-type flash memory may transfer initial data of a cell unit CU to the vicinity of an output circuit using a pipeline as preparation for data output. Since the details of this operation are the same as those of the first page read, the description thereof is omitted.

[3-3] Advantageous Effects of Third Embodiment

As described above, the semiconductor memory 10 according to the third embodiment uses a flag indicating whether or not the third page write has been completed in a selected cell unit CU if a write operation in units of pages as described in the second embodiment is adopted.

The semiconductor memory 10 according to the third embodiment refers to the flag in a read operation, performs computing on a result of reading as needed and outputs appropriate read data to the memory controller 20. In other words, the semiconductor memory 10 according to the third embodiment can output appropriate read data, regardless of instructions from the memory controller 20, unlike the second embodiment.

Thus, the memory system 1 adopting the semiconductor memory 10 according to the third embodiment can simplify the control of the memory controller 20.

In the semiconductor memory 10 according to the third embodiment, a flag cell is preferably arranged at the beginning part of the page of each cell unit CU. In this case, it is possible for the flag check circuit 70 to check a flag using the data at the beginning of the serial transfer of read data, and thus, the semiconductor memory 10 according to the third embodiment can suppress reduction in speed of a read operation due to the check of a flag.

[4] Fourth Embodiment

A semiconductor memory 10 according to the fourth embodiment performs a write operation in units of pages similar to the second embodiment, and data transfer between the planes is omitted in the fourth embodiment. In the following, differences of the semiconductor memory 10 according to the fourth embodiment from the first to third embodiments will be described.

[4-1] Configuration

[4-1-1] Threshold Distributions of Memory Cell Transistor MT

FIG. 53 shows an example of threshold distributions of the memory cell transistors MT, read voltages, and verify voltages in the semiconductor memory 10 according to the fourth embodiment. As shown in FIG. 53, in the threshold distributions in the fourth embodiment, the "Y" state, which is higher than the "Z" state and lower than the "A" state, is added to the threshold distributions explained with reference to FIG. 8 in the first embodiment.

Furthermore, in the threshold distributions in the fourth embodiment, the read voltage YR is set between the "Z" state and "Y" state, and the verify voltage YV is set in accordance with the "Y" state. Specifically, the read voltage YR is set between a maximum threshold voltage in the "Z" state and a minimum threshold voltage in the "Y" state. The verify voltage YV is set between a maximum threshold voltage in the "Z" state and a minimum threshold voltage in the "Y" state, and in the vicinity of the "Y" state. In the fourth embodiment, each of the read voltages AR and AV is set higher than a maximum threshold voltage in the "Y" state.

[4-1-2] Data Allocation

In the fourth embodiment, similar to the second embodiment, a data allocation applied to write data to be written in each of the first page and second page is different from a data allocation applied to write data to be written in the third page.

In the following, a case where the data allocation explained with reference to FIG. 21 in the third modification of the first embodiment is adopted as the data allocation for the 3-page data write in the fourth embodiment will be explained as an example.

FIG. 54 shows an example of a data allocation for the first page write in the fourth embodiment. In the first page write in the fourth embodiment, as shown FIG. 54 and thereafter, 1-bit data is allocated to each of two combinations, each consisting of one of two threshold voltages of the memory cell transistors MT in first plane PL1, and one of two threshold voltages of the memory cell transistors MT in second plane PL2.

(Example) "threshold voltage of memory cell transistors MT in first plane PL1", "threshold voltage of memory cell transistors MT in second plane PL2": "first bit" data
(1) "Z" state, "Z" state: "1" data
(2) "Y" state, "A" state: "0" data FIG. 55 shows an example of a data allocation for the second page write in the fourth embodiment. In the second page write in the fourth embodiment, as shown in FIG. 55 and thereafter, 2-bit data is allocated to each of four combinations, each consisting of one of three threshold voltages of the memory cell transistors MT in first plane PL1 and one of four threshold voltages of the memory cell transistors MT in second plane PL2.

(Example) "threshold voltage of memory cell transistors MT in first plane PL1", "threshold voltage of memory cell transistors MT in second plane PL2": "first bit/second bit" data
(1) "Z" state, "Y" state: "11" data
(2) "A" state, "Z" state: "10" data
(3) "A" state, "A" state: "00" data
(4) "Y" state, "B" state: "01" data FIG. 56 shows an example of a data allocation for the third page write in the fourth embodiment, and indicates the combination that is not used among the combinations shown in FIG. 21 as explained in the third modification of the first embodiment. Specifically, in the data allocation shown in FIG. 56, the combination (2) is used and the combination (1) is not used in the fourth embodiment, although the same 3-bit data is allocated to the combinations (1) and (2).

Since the other configurations in the semiconductor memory 10 according to the fourth embodiment are the same as those in the semiconductor memory 10 according to the first embodiment, detailed descriptions of the configurations are omitted.

[4-2] Operation
[4-2-1] Write Operation
(First Page Write)

Figure 57:
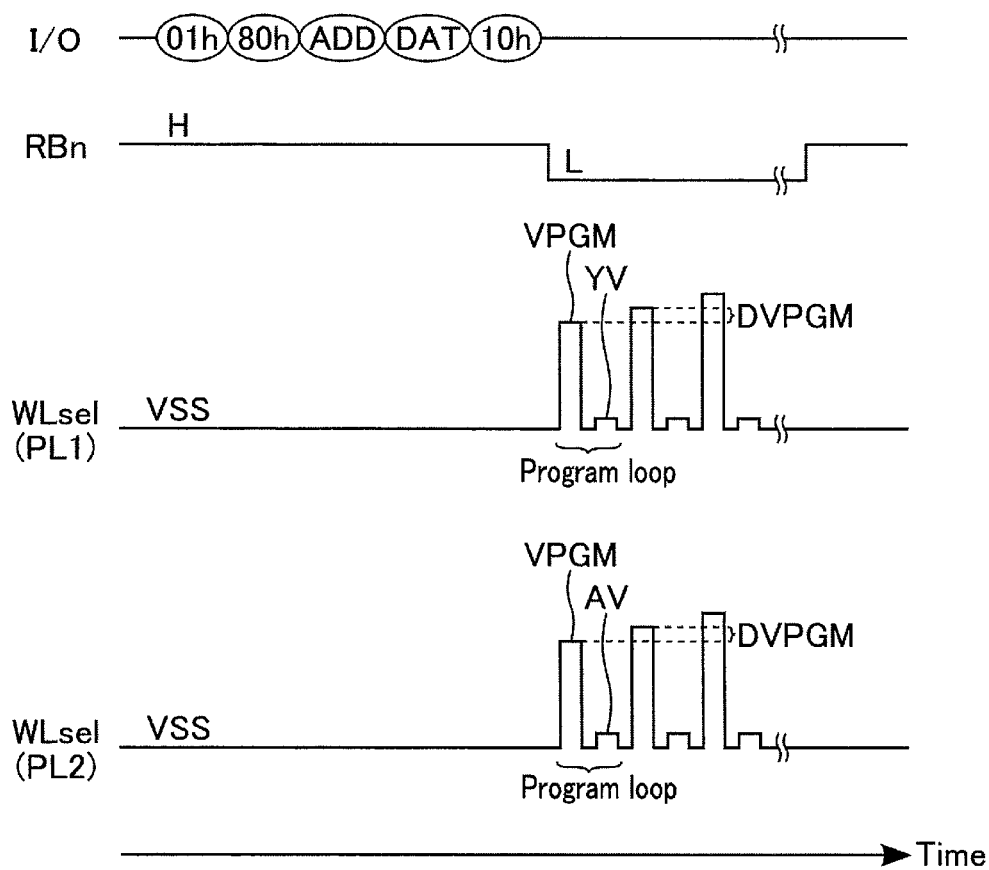
FIG. 57 is a timing chart showing an example of commands, and signals and voltages applied to lines in a first page write in the semiconductor memory according to the fourth embodiment.

FIG. 57 shows an example of commands, and signals and voltages applied to the lines in the first page write in the semiconductor memory 10 according to the fourth embodiment. In the first page write in the fourth embodiment, a command, which is similar to a command for the first page write explained with reference to, for example FIG. 42, is used, and a write operation is performed in each of first plane PL1 and second plane PL2.

Specifically, as shown in FIG. 57, first, the memory controller 20 sequentially transmits, for example, a command "01h", a command "80h", address information ADD, write data DAT, and a command "10h" to the semiconductor memory 10.

When the semiconductor memory 10 receives the write data DAT to be written in the first page, the received data is retained in each of the latch circuits XDL of the sense amplifier units SAU in the sense amplifier module 17A and each of the latch circuits XDL of the sense amplifier units SAU in the sense amplifier module 17B.

Upon reception of the command "10h", the semiconductor memory 10 changes to a busy state, and starts the first page write. In the first page write in the fourth embodiment, the sequencer 14 simultaneously performs a first write operation for first plane PL1 and a second write operation for second plane PL2 in parallel.

In each of the first write operation and the second write operation in the first page write, write-targeted and write-inhibited memory cell transistors MT are set based on the data allocation shown in FIG. 54, and the sequencer 14 performs a program loop.

In the example shown in FIG. 57, since the first write operation is performed in the "Y" state, which is lower than the "A" state, the verify voltage YV is applied to a selected word line WLsel in the verify operation in the first program loop.

When the first and second write operations are finished, if the write data DAT retained in the latch circuit of the sense amplifier unit SAU corresponding to the memory cell transistor MT is "1 (first bit)" data, the threshold voltage of the memory cell transistor MT is maintained at the "Z" state ((1) in FIG. 54).

If the write data DAT retained in the latch circuit of the sense amplifier unit SAU corresponding to the memory cell transistor MT is "0" data, the threshold voltage of the memory cell transistor MT corresponding to first plane PL1 is raised from the "Z" state to the "Y" state, and the threshold voltage of the memory cell transistor MT corresponding to second plane PL2 is raised from the "Z" state to the "A" state ((2) in FIG. 54).

The program voltage VPGM used in each of the first page write and the second page write including the write in the "Y" state may be the same as or different from the program voltage VPGM used in the third page write.

For example, the program voltage VPGM in a write operation including the write in the "Y" state is set lower than the program voltage VPGM in a write operation that does not include the write in the "Y" state. Furthermore, the sequencer 14 may only perform a verify operation in the "Y" state at the beginning of the program loop shown in FIG. 57, and may perform a verify operation in the "Y" state and "A" state halfway through the repetition of the program loop. Since the other operations in the first page write in the fourth embodiment are the same as the write operation in the first embodiment, detailed descriptions of the operations are omitted.

(Second Page Write)

FIG. 58 shows an example of commands, and signals and voltages applied to the lines in the second page write in the semiconductor memory 10 according to the fourth embodiment. In the second page write in the fourth embodiment, a command, which is similar to a command for the second page write explained with reference to, for example FIG. 43, is used, and a write operation is performed in each of first plane PL1 and second plane PL2.

Specifically, as shown in FIG. 58, first, the memory controller 20 sequentially transmits, for example, a command "02h", a command "80h", address information ADD, write data DAT, and a command "10h" to the semiconductor memory 10.

When the semiconductor memory 10 receives the write data DAT to be written in the second page, the received data is retained in each of the latch circuits XDL of the sense amplifier units SAU in the sense amplifier module 17A and each of the latch circuits XDL of the sense amplifier units SAU in the sense amplifier module 17B.

Upon reception of the command "10h", the semiconductor memory 10 changes to a busy state, and starts the second page write. In the second page write in the fourth embodiment, the sequencer 14 simultaneously performs internal data load (IDL) to first plane PL1 and second plane PL2 in parallel.

In the IDL to first plane PL1, a read operation using the read voltage YR is performed, and a result of reading the write data in the first page is restored in, for example, the latch circuit BDL in each of the sense amplifier units SAU in the sense amplifier module 17A. When the write data of the first page is restored, the sequencer 14 finishes the IDL in first plane PL1.

In the IDL to second plane PL2, a read operation using the read voltage AR is performed, and a result of reading the write data in the first page is restored in, for example, the latch circuit BDL in each of the sense amplifier units SAU in the sense amplifier module 17B. When the write data in the first page is restored, the sequencer 14 finishes the IDL in second plane PL2.

When the IDL to first plane PL1 and the IDL to second plane PL2 are finished, the first page data and the second page data are retained in the sense amplifier units SAU in the sense amplifier module 17A and the sense amplifier units SAU in the sense amplifier module 17B, respectively.

Subsequently, the sequencer 14 simultaneously performs a first write operation for first plane PL1 and a second write operation for second plane PL2 in parallel. In each of the first write operation and the second write operation in the second page write, write-targeted and write-inhibited memory cell transistors MT are set based on the data allocation shown in FIG. 55, and the sequencer 14 performs a program loop.

In the example shown in FIG. 58, since the second write operation is performed in the "Y" state, which is lower than the "A" state, the verify voltage YV is applied to a selected word line WLsel in the verify operation in the first program loop. Furthermore, the sequencer 14 may only perform a verify operation in the "Y" state at the beginning of the program loop shown in FIG. 58, and may perform a verify operation in the "Y" state and "A" state halfway through the repetition of the program loop.

When the first and second write operations are finished, if the write data DAT retained in the latch circuit of the sense amplifier unit SAU corresponding to the memory cell transistor MT is "11 (first bit/second bit)" data, the threshold voltage of the memory cell transistor MT corresponding to first plane PL1 is maintained at the "Z" state, and the threshold voltage of the memory cell transistor MT corresponding to second plane PL2 is raised from the "Z" state to the "Y" state ((1) in FIG. 55).

If the write data DAT retained in the latch circuit of the sense amplifier unit SAU corresponding to the memory cell transistor MT is "10" data, the threshold voltage of the memory cell transistor MT corresponding to first plane PL1 is raised from the "Z" state to the "A" state, and the threshold voltage of the memory cell transistor MT corresponding to second plane PL2 is maintained at the "Z" state ((2) in FIG. 55).

If the write data DAT retained in the latch circuit of the sense amplifier unit SAU corresponding to the memory cell transistor MT is "00" data, the threshold voltage of the memory cell transistor MT corresponding to first plane PL1 is raised from the "Y" state to the "A" state, and the threshold voltage of the memory cell transistor MT corresponding to second plane PL2 is maintained at the "A" state ((3) in FIG. 55).

If the write data DAT retained in the latch circuit of the sense amplifier unit SAU corresponding to the memory cell transistor MT is "01" data, the threshold voltage of the memory cell transistor MT corresponding to first plane PL1 is maintained at the "Y" state, and the threshold voltage of the memory cell transistor MT corresponding to second plane PL2 is raised from the "A" state to the "B" state ((4) in FIG. 55).

Since the other operations of the second page write in the fourth embodiment are the same as the write operation in the first embodiment, detailed descriptions of the operations are omitted.

(Third Page Write)

FIG. 59 shows an example of commands, and signals and voltages applied to the lines in the third page write in the semiconductor memory 10 according to the fourth embodiment. In the third page write in the fourth embodiment, a command, which is similar to a command for the third page write explained with reference to for example FIG. 44, is used, and a write operation is performed in each of first plane PL1 and second plane PL2.

Specifically, as shown in FIG. 59, first, the memory controller 20 sequentially transmits, for example, a command "03h", a command "80h", address information ADD, write data DAT, and a command "10h" to the semiconductor memory 10.

When the semiconductor memory 10 receives the write data DAT to be written in the third page, the received data is retained in each of the latch circuits XDL of the sense amplifier units SAU in the sense amplifier module 17A and each of the latch circuits XDL of the sense amplifier units SAU in the sense amplifier module 17B.

Upon reception of the command "10h", the semiconductor memory 10 changes to a busy state, and starts the third page write. In the third page write in the fourth embodiment, the sequencer 14 simultaneously performs internal data load (IDL) to first plane PL1 and second plane PL2 in parallel.

In the IDL to first plane PL1, read operations using the read voltages YR and AR are performed, and results of reading the write data in the first page and in the second page are restored in, for example, the latch circuits ADL and BDL in each of the sense amplifier units SAU in the sense amplifier module 17A.

In the IDL to first plane PL1, since the "10 (first bit/second bit)" data corresponding to (2) in FIG. 55 and "00" data corresponding to (3) in FIG. 55 cannot be distinguished from each other, the sense amplifier module 17A determines that the result of reading is either the "10" data or the "00" data. When the write data in the first page and in the second page are restored, the sequencer 14 finishes the IDL in first plane PL1.

In the IDL to second plane PL2, the read operations using the read voltages YR, AR, and BR are performed, and results of reading the write data in the first page and in the second page are restored in, for example, the latch circuits ADL and BDL in each of the sense amplifier units SAU in the sense amplifier module 17A. When the write data in the first page and in the second page are restored, the sequencer 14 finishes the IDL in second plane PL2.

When the IDL to first plane PL1 and the IDL to second plane PL2 are finished, the data written in the corresponding memory cell transistors MT by the second write operation is retained in the sense amplifier units SAU in the sense amplifier module 17A and the sense amplifier units SAU in the sense amplifier module 17B.

Subsequently, the sequencer 14 simultaneously performs a first write operation for first plane PL1 and a second write operation for second plane PL2 in parallel. In each of the first write operation and the second write operation in the third page write, write-targeted and write-inhibited memory cell transistors MT are set based on the data allocation shown in FIG. 56, and the sequencer 14 performs a program loop.

When the first and second write operations are finished, if the write data DAT retained in the latch circuit of the sense amplifier unit SAU corresponding to the memory cell transistor MT is "111 (first bit/second bit/third bit)" data, the threshold voltage of the memory cell transistor MT corresponding to first plane PL1 is maintained at the "Z" state, and the threshold voltage of the memory cell transistor MT corresponding to second plane PL2 is raised from the "Y" state to the "A" state ((2) in FIG. 56).

If the write data DAT retained in the latch circuit of the sense amplifier unit corresponding to the memory cell transistor MT SAU is "110" data, the threshold voltage of the memory cell transistor MT corresponding to first plane PL1 is maintained at the "Z" state, and the threshold voltage of the memory cell transistor MT corresponding to second plane PL2 is raised from the "Y" state to the "B" state ((3) in FIG. 56).

If the write data DAT retained in the latch circuit of the sense amplifier unit SAU corresponding to the memory cell transistor MT is "101" data or "001" data, the threshold voltage of the memory cell transistor MT corresponding to first plane PL1 is maintained at the "A" state ((4) or (5) in FIG. 56).

If the write data DAT retained in the latch circuit of the sense amplifier unit SAU corresponding to the memory cell transistor MT is "101" data, the threshold voltage of the memory cell transistor MT corresponding to second plane PL2 is maintained at the "Z" state ((4) in FIG. 56).

If the write data DAT retained in the latch circuit of the sense amplifier unit SAU corresponding to the memory cell transistor MT is "001" data, the threshold voltage of the memory cell transistor MT corresponding to second plane PL2 is maintained at the "A" state ((5) in FIG. 56).

If the write data DAT retained in the latch circuit of the sense amplifier unit SAU corresponding to the memory cell transistor MT is "010" data, the threshold voltage of the memory cell transistor MT corresponding to first plane PL1 is raised from the "Y" state to the "A" state, and the threshold voltage of the memory cell transistor MT corresponding to second plane PL2 is maintained at the "B" state ((6) in FIG. 56).

If the write data DAT retained in the latch circuit of the sense amplifier unit SAU corresponding to the memory cell transistor MT is "100" data or "000" data, the threshold voltage of the memory cell transistor MT corresponding to first plane PL1 is raised from the "A" state to the "B" state ((7) or (8) in FIG. 56).

If the write data DAT retained in the latch circuit of the sense amplifier unit SAU corresponding to the memory cell transistor MT is "100" data, the threshold voltage of the memory cell transistor MT corresponding to second plane PL2 is maintained at the "Z" state ((7) in FIG. 56).

If the write data DAT retained in the latch circuit of the sense amplifier unit SAU corresponding to the memory cell transistor MT is "000" data, the threshold voltage of the memory cell transistor MT corresponding to second plane PL2 is maintained at the "A" state ((8) in FIG. 56).

If the write data DAT retained in the latch circuit of the sense amplifier unit SAU corresponding to the memory cell transistor MT is "011" data, the threshold voltage of the memory cell transistor MT corresponding to second plane PL2 is maintained at the "B" state ((9) in FIG. 56).

A result of the above-described third page write in the fourth embodiment will be the same result even if a result of reading in the IDL performed to first plane PL1 is determined to be "00 (first bit/second bit)". Since the other operations of the third page write in the fourth embodiment are the same as the write operation in the first embodiment, detailed descriptions of the operations are omitted.

In the IDL to first plane PL2 in the third page write in the fourth embodiment, a read operation using the read voltage BR may be omitted. In this case, the "00 (first bit/second bit)" data corresponding to (3) in FIG. 55 and the "01" data corresponding to (4) in FIG. 55 cannot be distinguished from each other. However, if the write data DAT is "00 (first bit/second bit)" data, the threshold voltage of the memory cell transistor MT is in the "A" state, and if the write data DAT is "01" data, the threshold voltage of the memory cell transistor MT is in the "B" state. In both cases, data is written at the time of the second page write; accordingly, it is desirable that the memory cell transistors MT retaining the data are set to write-inhibited at the time of the third page write. Thus, a result similar to that of the above-described third page write of the fourth embodiment can be obtained.

In the above-described first page write, second page write, and third page write, the threshold voltages of the memory cell transistors MT retaining "0" data may be raised to the "A" state, not to the "Y" state in the second write operation in the first page write. Even in this case, the semiconductor memory 10 can subsequently perform the second page write and the third page write as described above.

In the above description, if data is written in the "A" state and the "B" state in page write prior to the third page write, and data is then written in the same states in the third page write, the memory cell transistors MT are set to write-inhibited in order to maintain the threshold voltages thereof; however, additional write may be performed in the same states. In this case, a verify operation may be performed during a write operation, and a write operation may be once again performed to memory cell transistors MT in which threshold voltages are lower than a corresponding verify voltage.

[4-2-2] Read Operation

The semiconductor memory 10 according to the fourth embodiment performs different read operations in a selected cell unit CU depending on a timing: before second page data is written; after the second page data is written and before the third page data is written; and after the third page data is written. For example, a read operation in each page after the third page data is written in the fourth embodiment, is the same as the read operation explained in the first embodiment.

On the other hand, the first page read operation before the second page data is written, and the first page read operation after the second page data is written and before the third page data is written, and the second page read operation before the third page data is written, are different from the read operation in each page described in the first embodiment.

(First Page Read Before Second Page Write)

Figure 60:
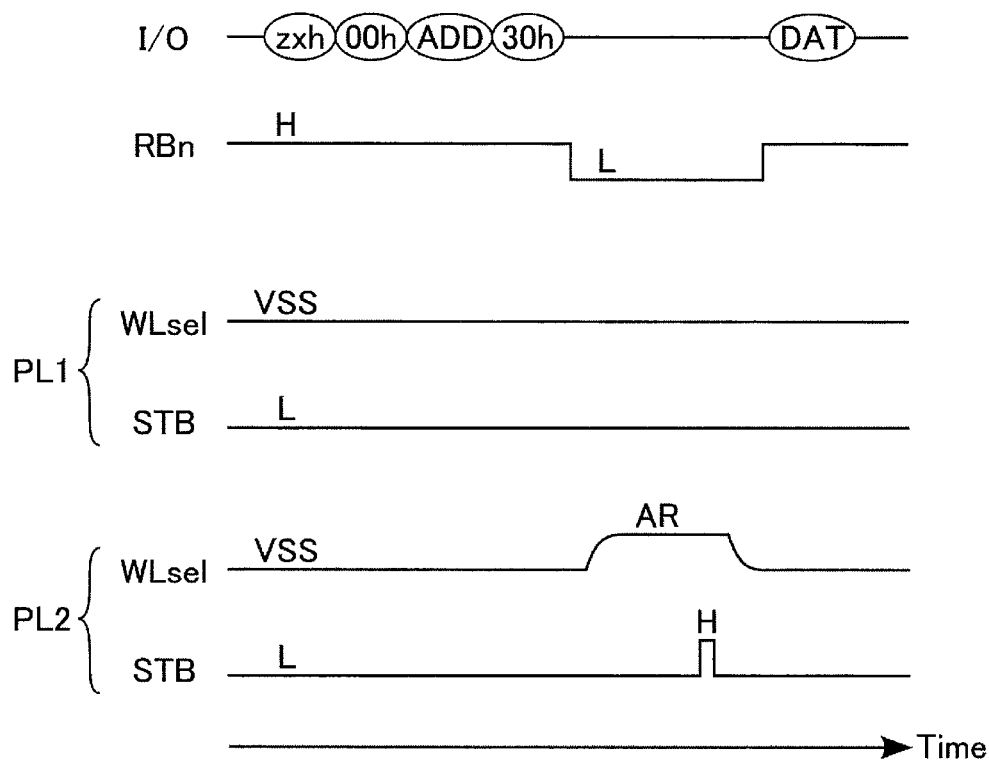
FIG. 60 is a timing chart showing an example of commands, and signals and voltages applied to lines in a first page read before a second page write in the semiconductor memory according to the fourth embodiment.

FIG. 60 shows an example of commands, and signals and voltages applied to the lines in the first page read before the second page write in the semiconductor memory 10 according to the fourth embodiment. The first page read before the second page write in the fourth embodiment is the same as the first page read in the first embodiment explained with reference to FIG. 13, but the commands and the read voltage used are changed.

Specifically, as shown in FIG. 60, first, the memory controller 20 sequentially transmits, for example, a command "zxh", a command "00h", address information ADD, and a command "30h" to the semiconductor memory 10.

The command "zxh" is a command for instructing a first page read in a cell unit CU before a second page write is performed thereon. Upon reception of the command "30h", the semiconductor memory 10 changes to a busy state, and starts the read operation.

In the first page read before the second page write in the fourth embodiment, the sequencer 14 performs a second read operation for second plane PL2, but does not perform a first read operation for first plane PL1.

In the second read operation in the first page read before the second page write, a read operation using, for example, the read voltage AR is performed, and a result of this read is retained in any of the latch circuits in each sense amplifier unit SAU in the sense amplifier module 17B. In a cell unit CU before the second page write in the fourth embodiment, the result of this read corresponds to the read data of the first page in the cell unit CU.

Then, the read data of the first page is transferred to the latch circuit XDL in the sense amplifier unit SAU in the sense amplifier module 17B, and the sequencer 14 finishes the second read operation. When the second read operation is finished, the sequencer 14 changes the semiconductor memory 10 to a ready state.

Then, if the memory controller 20 detects, for example, a change from a busy state to a ready state in the semiconductor memory 10, the memory controller 20 causes the semiconductor memory 10 to output the read data DAT retained in the latch circuit XDL in the sense amplifier unit SAU in the sense amplifier module 17B. The other operations in the first page read before the second page write in the fourth embodiment are the same as the first page read in the first embodiment explained with reference to FIG. 13; thus descriptions of the operations will be omitted.

In the semiconductor memory 10 according to the fourth embodiment, the first page data before the second page write is stored in first plane PL1 and second plane PL2, respectively. Accordingly, in the first page read before the second page write, a read operation should be performed in at least one of the planes. For example, the first page read before the second page write in the fourth embodiment may be the same as the first page read explained with reference to FIG. 45 in the second embodiment.

(First Page Read after Second Page Write and Before Third Page Write)

FIG. 61 shows an example of commands, and signals and voltages applied to the lines in the first page read after the second page write and before the third page write in the semiconductor memory 10 according to the fourth embodiment.

As shown in FIG. 61, first, the memory controller 20 sequentially transmits, for example, a command "xzh", a command "00h", address information ADD, and a command "30h" to the semiconductor memory 10.

The command "xzh" is a command for instructing a first page read in a cell unit CU after a second page write and before a third page write. Upon reception of the command "30h", the semiconductor memory 10 changes to a busy state, and starts a read operation.

In the first page read after the second page write before the third page write in the fourth embodiment, the sequencer 14 performs a second read operation for second plane PL2 but does not perform a first read operation for first plane PL1.

In the second read operation in the first page read after the second page write and before the third page write, a read operation using, for example, the read voltage AR is performed, and a result of this read is retained in any of the latch circuits in each sense amplifier unit SAU in the sense amplifier module 17B. In a cell unit CU after the second page write and before the third page write in the fourth embodiment, the result of this read corresponds to the read data in the first page in the cell unit CU.

Then, the read data of the first page is transferred to the latch circuit XDL in the sense amplifier unit SAU in the sense amplifier module 17B, and the sequencer 14 finishes the second read operation. When the second read operation is finished, the sequencer 14 changes the semiconductor memory 10 to a ready state.

Then, if the memory controller 20 detects, for example, a change from a busy state to a ready state in the semiconductor memory 10, the memory controller 20 causes the semiconductor memory 10 to output the read data DAT retained in the latch circuit XDL in the sense amplifier unit SAU in the sense amplifier module 17B. Since the other operations in the first page read after the second page write and before the third page write in the fourth embodiment are the same as the first page read in the first embodiment explained with reference to FIG. 13, descriptions of the operations will be omitted.

(Second Page Read after Second Page Write and Before Third Page Write)

Figure 62:
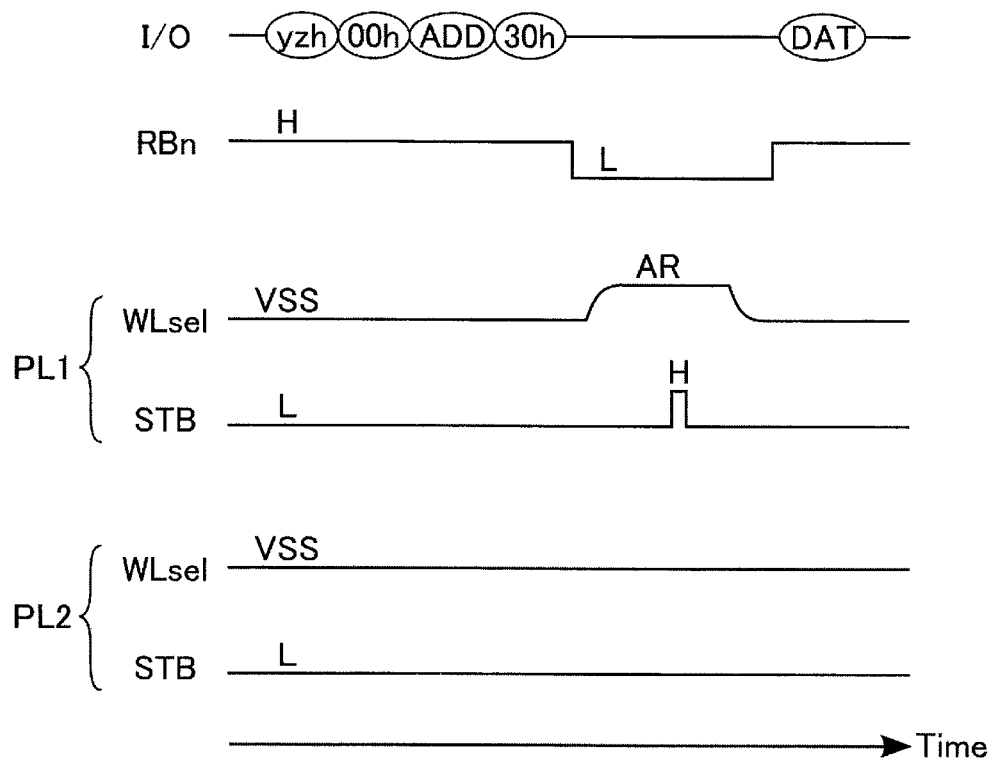
FIG. 62 is a timing chart showing an example of commands and signals and voltages applied to lines in a second page read after a second page write and before a third page write in the semiconductor memory according to the fourth embodiment.

FIG. 62 shows an example of commands, and signals and voltages applied to the lines in the second page read after the second page write and before the third page write in the semiconductor memory 10 according to the fourth embodiment.

As shown in FIG. 62, first, the memory controller 20 sequentially transmits, for example, a command "yzh", a command "00h", address information ADD, and a command "30h" to the semiconductor memory 10.

The command "yzh" is a command for instructing a second page read in a cell unit CU after a second page write and before a third page write. Upon reception of the command "30h", the semiconductor memory 10 changes to a busy state, and starts a read operation.

In the second page read after the second page write and before the third page write in the fourth embodiment, the sequencer 14 performs a first read operation for first plane PL1 but does not perform a second read operation for second plane PL2.

In the first read operation in the first page read after the second page write and before the third page write, a read operation using, for example, the read voltage AR is performed, and a result of this read is retained in any of the latch circuits in each sense amplifier unit SAU in the sense amplifier module 17A. In a cell unit CU after the second page write and before the third page write in the fourth embodiment, the result of this read corresponds to the read data in the second page in the cell unit CU.

Then, the read data of the second page is transferred to the latch circuit XDL in the sense amplifier unit SAU in the sense amplifier module 17A, and the sequencer 14 finishes the first read operation. When the first read operation is finished, the sequencer 14 changes the semiconductor memory 10 to a ready state.

Then, if the memory controller 20 detects, for example, a change from a busy state to a ready state in the semiconductor memory 10, the memory controller 20 causes the semiconductor memory 10 to output the read data DAT retained in the latch circuit XDL in the sense amplifier unit SAU in the sense amplifier module 17A. Since the other operations in the second page read after the second page write and after the third page write in the fourth embodiment are the same as the first page read in the first embodiment explained with reference to FIG. 13, descriptions of the operations will be omitted.

[4-3] Advantageous Effects of Fourth Embodiment

With the above-described semiconductor memory 10 according to the fourth embodiment, it is possible to reduce data transfer between planes in a write operation in units of pages, which is described in the second embodiment, and it is possible to increase the speed of a write operation more than in the second embodiment.

The semiconductor memory 10 according to the fourth embodiment can, similar to the second embodiment, perform a read operation in units of pages even when write operations for three pages are not completed in a selected cell unit CU.

[5] Fifth Embodiment

If data is written by a method similar to the one described in the fourth embodiment, a semiconductor memory 10 according to the fifth embodiment changes output data based on data retained in a flag cell. In the following, differences of the semiconductor memory 10 according to the fifth embodiment from the first to fourth embodiments will be described.

[5-1] Configuration of Semiconductor Memory 10

Compared to the configuration of the semiconductor memory 10 according to the third embodiment, the configuration of the semiconductor memory 10 according to the fifth embodiment has a plurality of flags. Specifically, the semiconductor memory 10 according to the fifth embodiment uses a first flag and a second flag.

A first flag is data indicating whether or not the second page write has been performed, in other words, whether or not the second page data has been written in a cell unit CU.

If the first flag is "1" data (flag not written), this indicates that the second page write has not been yet performed to the cell unit CU, and if the first flag is "0" data (flag written), this indicates that the second page write has already been performed to the cell unit CU.

The second flag is the same as the flag explained in the third embodiment; namely, the second flag indicates whether or not the third page write has been performed, in other words, whether or not the third page data has been written in the cell unit CU.

If the data allocation described in the fourth embodiment is adopted, the first flag is stored in a flag cell of a cell unit CU in second plane PL2, and the second flag is stored in a flag cell of a cell unit CU in first plane PL1, for example.

In this case, the first flag cell is written in, for example, the "B" state or higher by the second page write, and the second flag cell is written in, for example, the "B" state or higher by the third page write. To confirm a state of each of the first flag and the second flag, a result of reading a flag cell using the read voltage AR or BR is used.

In the above description, the first flag is arranged in a cell unit CU in second plane PL2 and the second flag is arranged in a cell unit CU in first plane PL1; however, the arrangement of the flags is not limited to this example. As another example, both of the first and second flags may be arranged in each of first plane PL1 and second plane PL2.

In this case, the first flag cell is written in, for example, the "A" state by the second page write, and the second flag cell is written at, for example, the second flag cell is written in, for example, the "A" state by the third page write. It is possible to use a result of reading a flag cell using the read voltage AR to confirm the states of the first flag and the second flag.

In each cell unit CU, one or a plurality of memory cell transistors MT may be used as a flag cell retaining the first flag and a flag cell retaining the second flag. For example, if a plurality of memory cell transistors MT are used as flag cells, the semiconductor memory 10 may improve reliability of the flags through a majority vote or error correction performed on a result of reading the flag cells by the flag check circuit 70, similar to the third embodiment.

[5-2] Read Operation (First Page Read)

Figure 63:
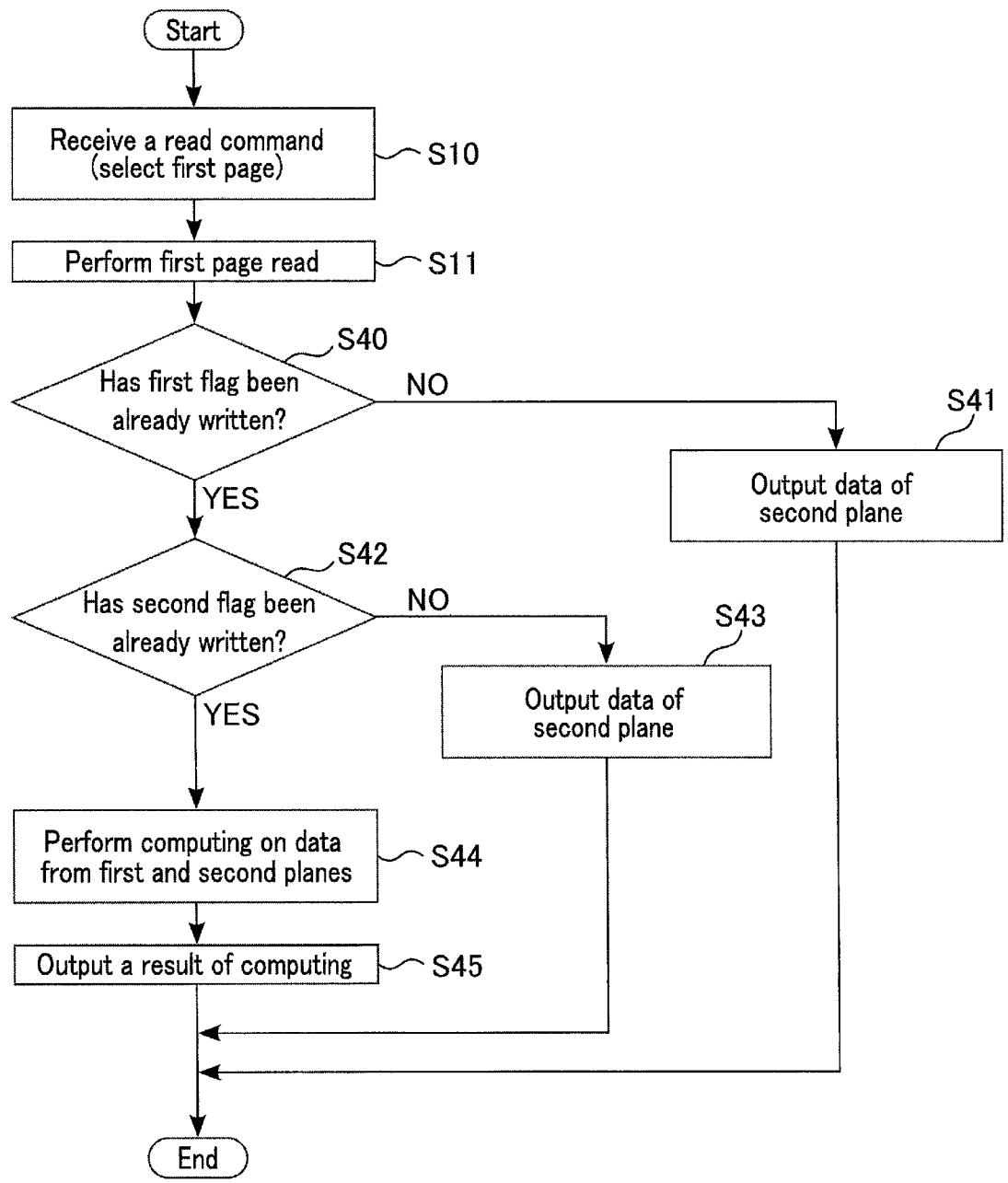
FIG. 63 is a flow chart showing an example of a read operation when a first page is selected in the semiconductor memory according to a fifth embodiment.

FIG. 63 shows an example of a flow chart of the first page read in the semiconductor memory 10 according to the fifth embodiment. In the following, the method of the first page read in the fifth embodiment will be explained with reference to FIG. 63.

First, the processing in step S10 and S11, which was explained in the third embodiment with reference to FIG. 50, is sequentially performed. In step S11 of the fifth embodiment, if the data allocation in the third modification of the first embodiment explained with reference to FIG. 21 is adopted, for example, a read operation is performed using the read voltages shown in FIG. 22, which are also used in the first page read of the first embodiment.

When the first page read is finished, the first flag and the second flag included in the read data are transferred to the flag check circuit 70. First, the sequencer 14 confirms the first flag retained in the flag check circuit 70.

If the first flag has not yet been written (No in step S40), since a result of this read in second plane PL2 corresponds to the read data of the first page, the sequencer 14 changes to a ready state, without performing, for example, computing. Subsequently, the semiconductor memory 10 outputs the first page read data retained in the sense amplifier module 17B of second plane PL2 to the memory controller 20 based on the control of the memory controller 20 (step S41).

If the first flag has already been written (Yes in step S40), the sequencer 14 subsequently confirms the second flag retained in the flag check circuit 70.

If the second flag has not yet been written (No in step S42), since a result of this read in second plane PL2 corresponds to the read data of the first page, the sequencer 14 changes to a ready state, without performing, for example, computing. Subsequently, the semiconductor memory 10 outputs the first page read data retained in the sense amplifier module 17B of second plane PL2 to the memory controller 20 based on the control of the memory controller 20 (step S43).

If the second flag has already been written (Yes in step S42), the sequencer 14 performs computing on the read data of first plane PL1 and the read data of second plane PL2 based on, for example, the data definitions shown in FIG. 22 (step S44), and outputs a result of this computing (first page read data) to the memory controller 20 (step S45).

The semiconductor memory 10 finishes the read operation when the above-described processing in step S41, S43, or S45 is completed.

(Second Page Read)

FIG. 64 shows an example of a flow chart of the second page read in the semiconductor memory 10 according to the fifth embodiment. In the following, the method of the second page read in the fifth embodiment will be explained with reference to FIG. 64.

First, the sequencer 14 performs the processing in step S20 and step S21 in order, which was explained in the third embodiment with reference to FIG. 51. In step S21 of the fifth embodiment, if the data allocation in the third modification of the first embodiment explained with reference to FIG. 21 is adopted, for example, a read operation is performed using the read voltages shown in FIG. 22, which are also used in the second page read of the first embodiment.

When the second page read is finished, the first flag and the second flag included in the read data are transferred to the flag check circuit 70. First, the sequencer 14 confirms the first flag retained in the flag check circuit 70.

If the first flag has not yet been written (No in step S40), since the second page data is not written in the selected cell unit CU, the sequencer 14 changes to a ready state, without performing, for example, computing. Then, the semiconductor memory 10 outputs, for example, data fixed to "1" to the memory controller 20 based on the control of the memory controller 20 (step S50).

If the first flag has already been written (Yes in step S40), the sequencer 14 subsequently confirms the second flag retained in the flag check circuit 70.

If the second flag has not yet been written (No in step S42), since a result of this read in first plane PL1 corresponds to the read data of the second page, the sequencer 14 changes to a ready state, without performing, for example, computing. Subsequently, the semiconductor memory 10 outputs the second page read data retained in the sense amplifier module 17A of first plane PL1 to the memory controller 20 based on the control of the memory controller 20 (step S51).

Returning to FIG. 64, if the second flag has already been written (Yes in step S42), the sequencer 14 subsequently performs the processing in step S22 and S23 in order, which was explained in the third embodiment with reference to FIG. 51, and outputs the second page read data to the memory controller 20.

The semiconductor memory 10 finishes the read operation when the above-described processing in step S50, S51, or S23 is completed.

(Third Page Read)

Figure 65:
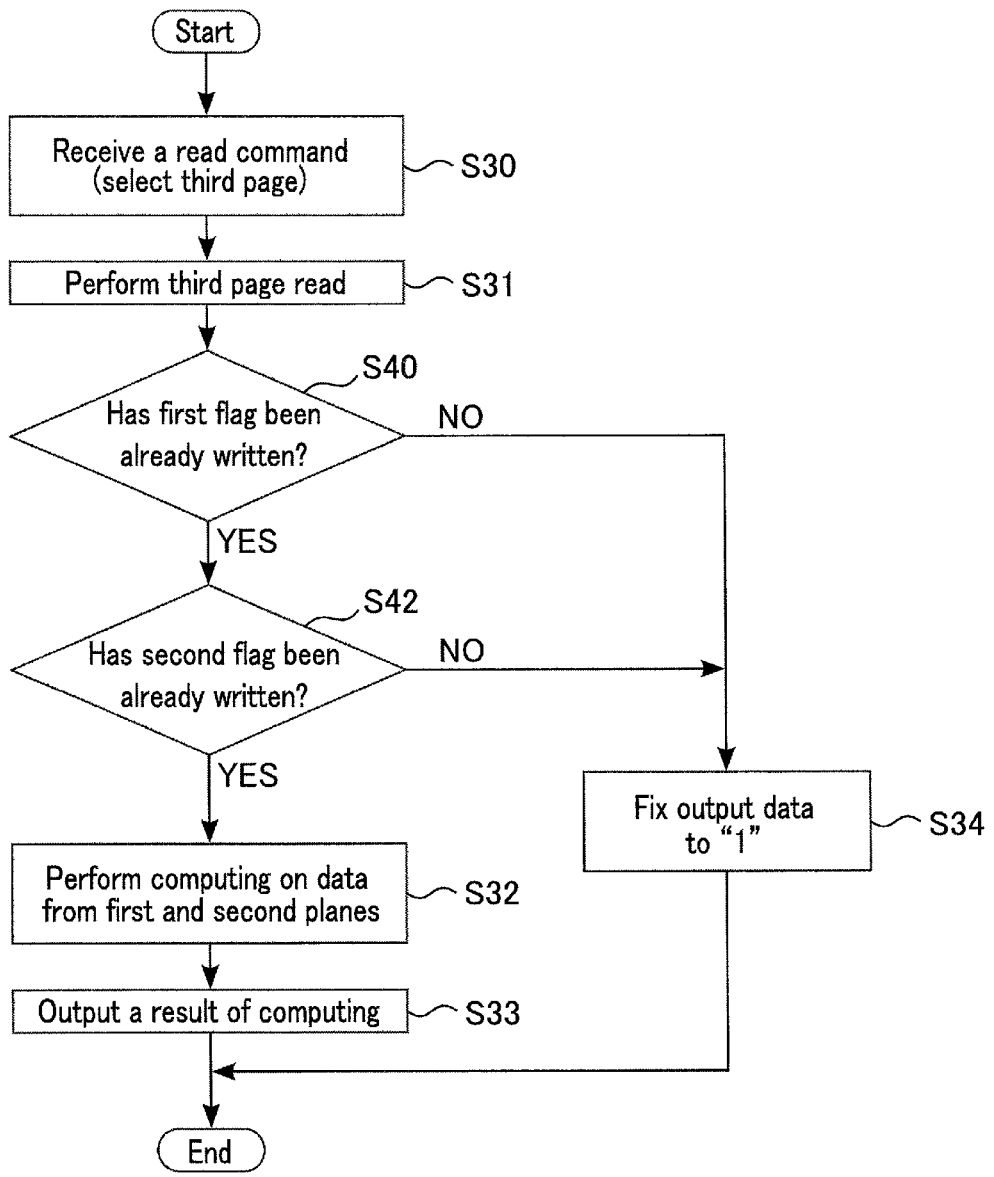
FIG. 65 is a flow chart showing an example of a read operation when a third page is selected in the semiconductor memory according to the fifth embodiment.

FIG. 65 shows an example of a flow chart of the third page read in the semiconductor memory 10 according to the fifth embodiment. In the following, the method of the third page read in the fifth embodiment will be explained with reference to FIG. 65.

First, the sequencer 14 performs the processing in step S30 and step S31 in order, which was explained in the third embodiment with reference to FIG. 52. In step S31 of the fifth embodiment, if the data allocation in the third modification of the first embodiment explained with reference to FIG. 21 is adopted, for example, a read operation is performed using the read voltages shown in FIG. 22, which are also used in the third page read of the first embodiment.

When the third page read is finished, the first flag and the second flag included in the read data are transferred to the flag check circuit 70. First, the sequencer 14 confirms the first flag retained in the flag check circuit 70.

If the first flag has not yet been written (No in step S40), since the third page data is not written in the selected cell unit CU, the sequencer 14 performs the processing in step S34, which was explained in the third embodiment with reference to FIG. 52, and the semiconductor memory 10 outputs, for example, the data fixed to "1" to the memory controller 20.

If the first flag has already been written (Yes in step S40), the sequencer 14 subsequently confirms the second flag retained in the flag check circuit 70.

If the second flag has not yet been written (No in step S42), since the third page data is not written in the selected cell unit CU, the sequencer 14 performs the processing in step S34, which was explained in the third embodiment with reference to FIG. 52, and the semiconductor memory 10 outputs, for example, the data fixed to "1" to the memory controller 20.

If the second flag has already been written (Yes in step S42), the sequencer 14 subsequently performs the processing in step S32 and step S33, which was explained in the third embodiment with reference to FIG. 52, and outputs the third page read data to the memory controller 20.

The semiconductor memory 10 finishes the read operation when the above-described processing in step S34 or step S33 is completed.

[5-3] Advantageous Effects of Fifth Embodiment

As described above, if a write operation in units of pages like the one described in the fourth embodiment is adopted, the semiconductor memory 10 according to the fifth embodiment uses a first flag indicating whether the second page write has been completed or not in a selected cell unit CU, and a second flag indicating the third page write has been completed or not in the selected cell unit CU.

Furthermore, by referring to each of the first flag and the second flag in a read operation, the semiconductor memory 10 according to the fifth embodiment performs additional read operations and computing on a result of reading as needed to output appropriate read data to the memory controller 20. In other words, the semiconductor memory 10 according to the fifth embodiment can select an appropriate read operation, without needing an instruction from the memory controller 20, unlike the fourth embodiment.

If output data is fixed to "1" as in step S50 of FIG. 64 or step S34 of FIG. 65, data fixed by the logic circuit 18 may be output, as described in the third embodiment. Or, the data retained in the latch circuit XDL in a sense amplifier unit SAU may be fixed data, so that data conversion is not performed by the logic circuit 18.

Thus, the memory system 1 adopting the semiconductor memory 10 according to the fifth embodiment can simplify the control of the memory controller 20.

[6] Sixth Embodiment

A semiconductor memory 10 according to the sixth embodiment stores 6-bit data by a combination of three memory cell transistors MT. In the following, differences of the semiconductor memory 10 according to the sixth embodiment from the first to fifth embodiments will be described.

[6-1] Configuration

[6-1-1] Configuration of Semiconductor Memory 10

FIG. 66 shows a configuration example of a memory system 1 that includes a semiconductor memory 10 according to the sixth embodiment. As shown in FIG. 66, the semiconductor memory 10 according to the sixth embodiment has the same configuration as the semiconductor memory 10 according to the first embodiment explained with reference to FIG. 1, and includes a memory cell array 11C, a row decoder module 16C, and a sense amplifier module 17C.

The memory cell array 11C, the row decoder module 16C, and the sense amplifier module 17C have the same configurations as the memory cell array 11A, the row decoder module 16A, and the sense amplifier module 17A, respectively. A set of the memory cell array 11C, the row decoder module 16C, and the sense amplifier module 17C corresponds to third plane PL3. Thus, the semiconductor memory 10 according to the first embodiment has three planes.

In the semiconductor memory 10 according to the sixth embodiment, block BLK0 through block BLKn in first plane PL1 are respectively associated with block BLK0 through block BLKn in second plane PL2 and block BLK0 through BLKn in third plane PL3. The semiconductor memory 10 according to the sixth embodiment stores data in a group of the associated blocks BLK in first plane PL1, second plane PL2, and third plane PL3.

Specifically, the semiconductor memory 10 according to the sixth embodiment stores 6-page data in a group consisting of one cell unit CU included in first plane PL1, one cell unit CU included in second plane PL2, and one cell unit CU included in third plane PL3.

[6-1-2] Threshold Distributions of Memory Cell Transistor MT

FIG. 67 shows an example of threshold distributions of the memory cell transistors MT, read voltages, and verify voltages in the semiconductor memory 10 according to the sixth embodiment. As shown in FIG. 67, in the threshold distributions in the sixth embodiment, a "C" state, which is higher than the "B" state, is added to the threshold distributions explained with reference to FIG. 8 in the first embodiment.

Furthermore, in the threshold distributions in the sixth embodiment, a read voltage CR is set between the "B" state and "C" state, and the verify voltage CV is set in accordance with the "C" state. Specifically, the read voltage CR is set between a maximum threshold voltage in the "B" state and a minimum threshold voltage in the "C" state. The verify voltage CV is set between a maximum threshold voltage in the "B" state and a minimum threshold voltage in the "C" state, and in the vicinity of the "C" state. The read pass voltage VREAD in the sixth embodiment is set to a voltage higher than a maximum threshold voltage in the "C" state.

[6-1-3] Data Allocation

FIG. 68 and FIG. 69 show an example of a data allocation for the threshold distributions of the memory cell transistors MT in the semiconductor memory 10 according to the sixth embodiment.

As shown in FIGS. 68 and 69, in the semiconductor memory 10 according to the sixth embodiment, 64 combinations are possible by combining four threshold voltages in the memory cell transistors MT corresponding to first plane PL1, four threshold voltages in the memory cell transistors MT corresponding to second plane PL2, and four threshold voltages in the memory cell transistors MT corresponding to third plane PL3. Furthermore, in the semiconductor memory 10 according to the sixth embodiment, different 6-bit data is allocated to each of the 64 combinations of threshold voltages as shown below:

(Example) "threshold voltage of memory cell transistor MT in first plane PL1", "threshold voltage of memory cell transistor MT in second plane PL2", "threshold voltage of memory cell transistor MT in third plane PL3": "first bit/second bit/third bit/fourth bit/fifth bit/sixth bit" data (1) "Z" state, "Z" state, "Z" state: "111111" data
(2) "Z" state, "Z" state, "A" state: "111001" data
(3) "Z" state, "Z" state, "B" state: "011001" data
(4) "Z" state, "Z" state, "C" state: "010000" data
(5) "Z" state, "A" state, "Z" state: "111011" data
(6) "Z" state, "A" state, "A" state: "111101" data
(7) "Z" state, "A" state, "B" state: "011101" data
(8) "Z" state, "A" state, "C" state: "010100" data
(9) "Z" state, "B" state, "Z" state: "110010" data
(10) "Z" state, "B" state, "A" state: "110100" data
(11) "Z" state, "B" state, "B" state: "000100" data
(12) "Z" state, "B" state, "C" state: "001101" data
(13) "Z" state, "C" state, "Z" state: "110000" data
(14) "Z" state, "C" state, "A" state: "110110" data
(15) "Z" state, "C" state, "B" state: "000110" data
(16) "Z" state, "C" state, "C" state: "001111" data
(17) "A" state, "Z" state, "Z" state: "110111" data
(18) "A" state, "Z" state, "A" state: "110001" data
(19) "A" state, "Z" state, "B" state: "010001" data
(20) "A" state, "Z" state, "C" state: "011000" data
(21) "A" state, "A" state, "Z" state: "110011" data
(22) "A" state, "A" state, "A" state: "110101" data
(23) "A" state, "A" state, "B" state: "010101" data
(24) "A" state, "A" state, "C" state: "011100" data
(25) "A" state, "B" state, "Z" state: "111010" data

(26) "A" state, "B" state, "A" state: "111100" data
(27) "A" state, "B" state, "B" state: "001100" data
(28) "A" state, "B" state, "C" state: "000101" data
(29) "A" state, "C" state, "Z" state: "111000" data
(30) "A" state, "C" state, "A" state: "111110" data
(31) "A" state, "C" state, "B" state: "001110" data
(32) "A" state, "C" state, "C" state: "000111" data
(33) "B" state, "Z" state, "Z" state: "100001" data
(34) "B" state, "Z" state, "A" state: "100111" data
(35) "B" state, "Z" state, "B" state: "010111" data
(36) "B" state, "Z" state, "C" state: "011110" data
(37) "B" state, "A" state, "Z" state: "100101" data
(38) "B" state, "A" state, "A" state: "100011" data
(39) "B" state, "A" state, "B" state: "010011" data
(40) "B" state, "A" state, "C" state: "011010" data
(41) "B" state, "B" state, "Z" state: "101100" data
(42) "B" state, "B" state, "A" state: "101010" data
(43) "B" state, "B" state, "B" state: "001010" data
(44) "B" state, "B" state, "C" state: "000011" data
(45) "B" state, "C" state, "Z" state: "101110" data
(46) "B" state, "C" state, "A" state: "101000" data
(47) "B" state, "C" state, "B" state: "001000" data
(48) "B" state, "C" state, "C" state: "000001" data
(49) "C" state, "Z" state, "Z" state: "100000" data
(50) "C" state, "Z" state, "A" state: "100110" data
(51) "C" state, "Z" state, "B" state: "010110" data
(52) "C" state, "Z" state, "C" state: "011111" data
(53) "C" state, "A" state, "Z" state: "100100" data
(54) "C" state, "A" state, "A" state: "100010" data
(55) "C" state, "A" state, "B" state: "010010" data
(56) "C" state, "A" state, "C" state: "011011" data
(57) "C" state, "B" state, "Z" state: "101101" data
(58) "C" state, "B" state, "A" state: "101011" data
(59) "C" state, "B" state, "B" state: "001011" data
(60) "C" state, "B" state, "C" state: "000010" data
(61) "C" state, "C" state, "Z" state: "101111" data
(62) "C" state, "C" state, "A" state: "101001" data
(63) "C" state, "C" state, "B" state: "001001" data
(64) "C" state, "C" state, "C" state: "000000" data Thus, different data is allocated to each of the 64 combinations in the sixth embodiment. FIG. 70 shows read voltages that are set for the data allocation and definitions of read data that are applied to each of the results of reading the pages.

As shown in FIG. 70, in the first page read, the read voltages AR, AR, and BR are respectively used in first plane PL1, second plane PL2, and third plane PL3. In the second page read, the read voltages BR, BR, and BR are respectively used in first plane PL1, second plane PL2, and third plane PL3. In the third page read, the read voltages AR, BR, and CR are respectively used in first plane PL1, second plane PL2, and third plane PL3.

In a read operation targeting the fourth page (hereinafter referred to as fourth page read), the read voltages BR, AR, and AR are used in first plane PL1, second plane PL2, and third plane PL3 are used, respectively. In a read operation targeting the fifth page (hereinafter referred to as fifth page read), the read voltages BR, CR, and AR are used in first plane PL1, second plane PL2, and third plane PL3 are used, respectively. In a read operation targeting the sixth page (hereinafter referred to as sixth page read), the read voltages CR, BR, and CR are used in first plane PL1, second plane PL2, and third plane PL3 are used, respectively.

The read data based on results of the read operations in each of first plane PL1, second plane PL2, and third plane PL3 is defined as follows:

(Example) Read operation: (result of read in first plane PL1, result of read in second plane PL2, result of read in third plane PL3, read data)×8 types First page read: (L, L, L, 1), (L, L, H, 0), (L, H, L, 1), (L, H, H, 0), (H, L, L, 1), (H, L, H, 0), (H, H, L, 1), (H, H, H, 0)

Second page read: (L, L, L, 1), (L, L, H, 1), (L, H, L, 1), (L, H, H, 0), (H, L, L, 0), (H, L, H, 1), (H, H, L, 0), (H, H, H, 0)

Third page read: (L, L, L, 1), (L, L, H, 0), (L, H, L, 0), (L, H, H, 1), (H, L, L, 0), (H, L, H, 1), (H, H, L, 1), (H, H, H, 0)

Fourth page read: (L, L, L, 1), (L, L, H, 0), (L, H, L, 0), (L, H, H, 1), (H, L, L, 0), (H, L, H, 1), (H, H, L, 1), (H, H, H, 0)

Fifth page read: (L, L, L, 1), (L, L, H, 0), (L, H, L, 0), (L, H, H, 1), (H, L, L, 0), (H, L, H, 1), (H, H, L, 1), (H, H, H, 0)

Sixth page read: (L, L, L, 1), (L, L, H, 0), (L, H, L, 0), (L, H, H, 1), (H, L, L, 0), (H, L, H, 1), (H, H, L, 1), (H, H, H, 0)

FIG. 71 through FIG. 74 provide tables summarizing the read voltages that are set in accordance with the data allocation, and a table summarizing the results of the read operations carried out in accordance with the set read voltages. In the semiconductor memory 10 according to the sixth embodiment, data corresponding to each of (1) to (64) in FIGS. 68 and 69 is determined by applying the data definitions shown in FIG. 70 to the results of the read operations shown in FIGS. 71 through 74.

Since the other configurations in the semiconductor memory 10 according to the sixth embodiment are the same as those in the semiconductor memory 10 according to the first embodiment, detailed descriptions of the configurations are omitted.

[6-2] Operation

[6-2-1] Write Operation

Figure 75:
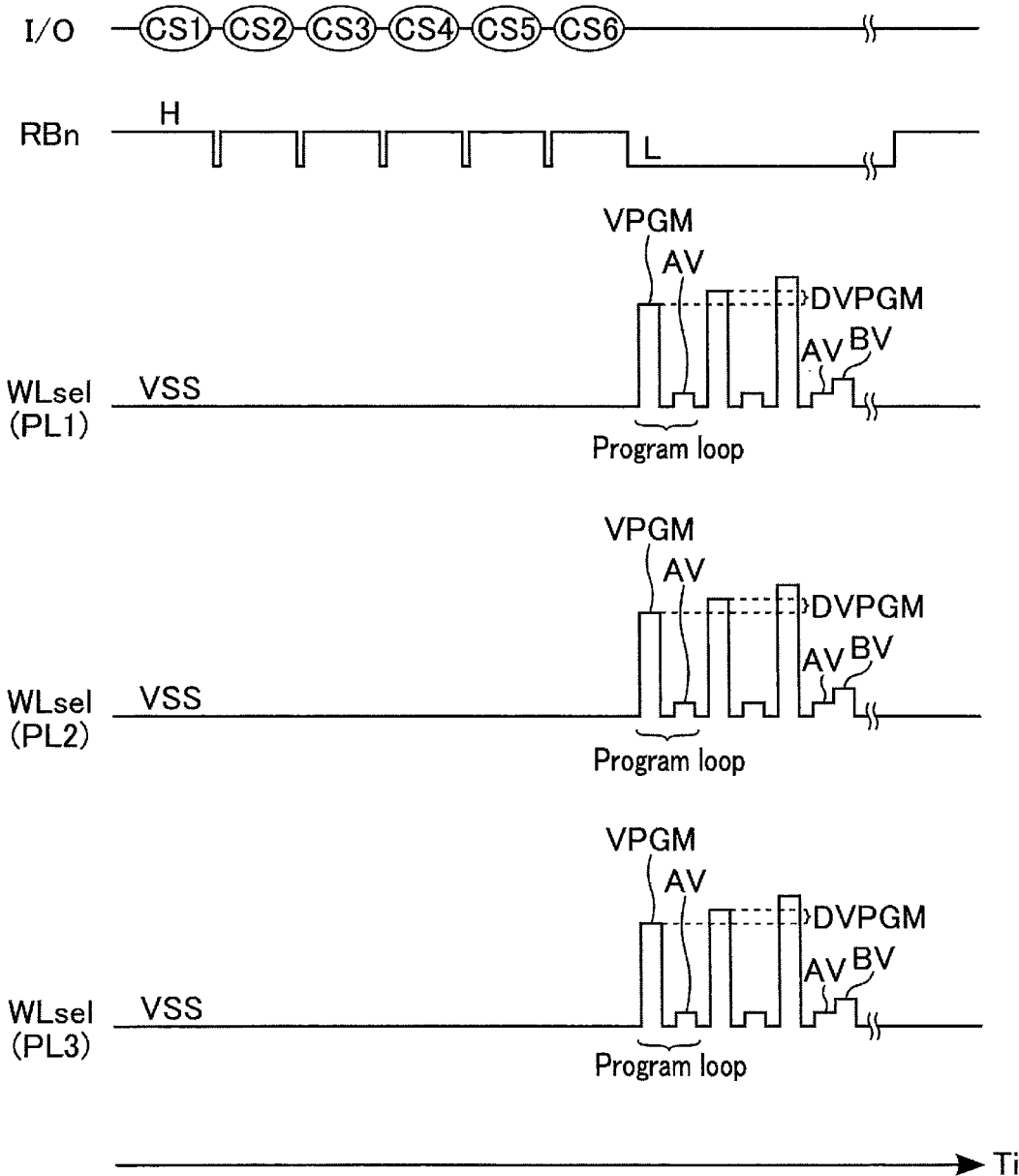
FIG. 75 is a timing chart showing an example of commands, and signals and voltages applied to lines in a write operation in the semiconductor memory according to the sixth embodiment.

FIG. 75 shows an example of commands, and signals and voltages applied to the lines in a write operation in the semiconductor memory 10 according to the sixth embodiment. A write operation in the sixth embodiment is the same as the write operation explained with reference to FIG. 11, except for commands and an operation for third plane PL3.

Specifically, as shown in FIG. 75, the memory controller 20 transmits a first command set CS1, a second command set CS2, a third command set CS3, a fourth command set CS4, a fifth command set CS5, and a sixth command set CS6 to the semiconductor memory 10, in order.

The command sets CS1 through CS6 include commands for instructing an operation for the first to sixth pages respectively, and include write data DAT to be written in the first to sixth pages respectively. After each of the command sets CS1 through CS5 is received, the semiconductor memory 10 temporarily changes to a busy state, and transfers received write data DAT to each of the latch circuits in the sense amplifier modules 17A, 17B, and 17C.

The semiconductor memory 10 changes to a busy state after receiving the sixth command set CS6, and the sequencer 14 performs a write operation based on the write data for the first to sixth pages retained in the latch circuits in the sense amplifier modules 17A, 17B, and 17C.

Specifically, the sequencer 14 simultaneously performs a first write operation for first plane PL1, a second write operation for second plane PL2, and a third write operation for third plane PL3 in parallel based on the write data of the first to sixth pages.

In the first to third write operations, write-targeted and write-inhibited memory cell transistors MT are set based on the data allocation shown in FIGS. 68 and 69, and the sequencer 14 performs a program loop. Since the details of the first to third write operations are the same as the first write operation of the first embodiment described with reference to FIG. 11, detailed descriptions are omitted.

When the first to third write operations are finished, the threshold voltages of the memory cell transistors MT in a cell unit CU selected in first plane PL1, the threshold voltages of the memory cell transistors MT in a cell unit CU selected in second plane PL2, and the threshold voltages of the memory cell transistors MT in a cell unit CU selected in third plane PL3 form four threshold distributions like those shown in FIG. 67. Then, the sequencer 14 finishes the write operation when detecting the completion of each of the first to third write operations, and changes the semiconductor memory 10 to a ready state.

[6-2-2] Read Operation (First Page Read)

FIG. 76 shows an example of commands, and signals and voltages applied to the lines in the first page read in the semiconductor memory 10 according to the sixth embodiment. The first page read in the sixth embodiment is the same as the first page read in the first embodiment explained with reference to FIG. 13, except that an operation for third plane PL3 is added, and different read voltages are used.

Specifically, as shown in FIG. 76, first, the memory controller 20 sequentially transmits, for example, a command "01h", a command "00h", address information ADD, and a command "30h" to the semiconductor memory 10. Upon reception of the command "30h", the semiconductor memory 10 changes to a busy state, and starts the first page read.

In the first page read in the sixth embodiment, the sequencer 14 simultaneously performs a first read operation for first plane PL1, a second read operation for second plane PL2, and a third read operation for third plane PL3 in parallel.

The first read operation in the first page read of the sixth embodiment is the same as the first read operation in the first page read of the first embodiment, for example. The second read operation in the second page read of the sixth embodiment is the same as the second read operation in the first page read of the first embodiment, for example.

In the third read operation in the first page read of the sixth embodiment, the row decoder module 16C applies the read voltage BR to a selected word line WLsel in third plane PL3. Then, the sequencer 14 asserts the control signal STB corresponding to third plane PL3 while the read voltage BR is being applied to the selected word line WLsel in third plane PL3.

Then, each sense amplifier unit SAU in the sense amplifier module 17C determines whether or not the threshold voltage of a corresponding memory cell transistor MT exceeds the read voltage BR based on the voltage of a corresponding bit line BL. When a result of this read is retained in any of the latch circuits in each sense amplifier unit SAU in the sense amplifier module 17C, the sequencer 14 finishes the third read operation.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the read data of the first page based on the definitions of the data shown in FIG. 70, and outputs the determined read data DAT to the memory controller 20.

In order to prepare for data output, it is also possible to transfer the initial data of a cell unit CU to the vicinity of an output circuit by using a pipeline before the semiconductor memory 10 changes to a ready state.

(Second Page Read)

FIG. 77 shows an example of commands, and signals and voltages applied to the lines in the second page read in the semiconductor memory 10 according to the sixth embodiment.

As shown in FIG. 77, first, the memory controller 20 sequentially transmits, for example, a command "02h", a command "00h", address information ADD, and a command "30h" to the semiconductor memory 10. Upon reception of the command "30h", the semiconductor memory 10 changes to a busy state, and starts the second page read.

In the second page read in the sixth embodiment, the sequencer 14 simultaneously performs a first read operation for first plane PL1, a second read operation for second plane PL2, and a third read operation for third plane PL3 in parallel.

In the first read operation in the second page read, a read operation using, for example, the read voltage BR is performed, and a result of this read is retained in any of the latch circuits in each sense amplifier unit SAU in the sense amplifier module 17A.

In the second read operation in the second page read, a read operation using, for example, the read voltage BR is performed, and a result of this read is retained in any of the latch circuits in each sense amplifier unit SAU in the sense amplifier module 17B.

In the third read operation in the second page read, a read operation using, for example, the read voltage BR is performed, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the second page read data based on results of each of the first to third read operations and the data definitions shown in FIG. 70. Since the other operations in the second page read in the sixth embodiment are the same as those in the first read operation explained with reference to FIG. 76, detailed descriptions of the operations are omitted.

(Third Page Read)

Figure 78:
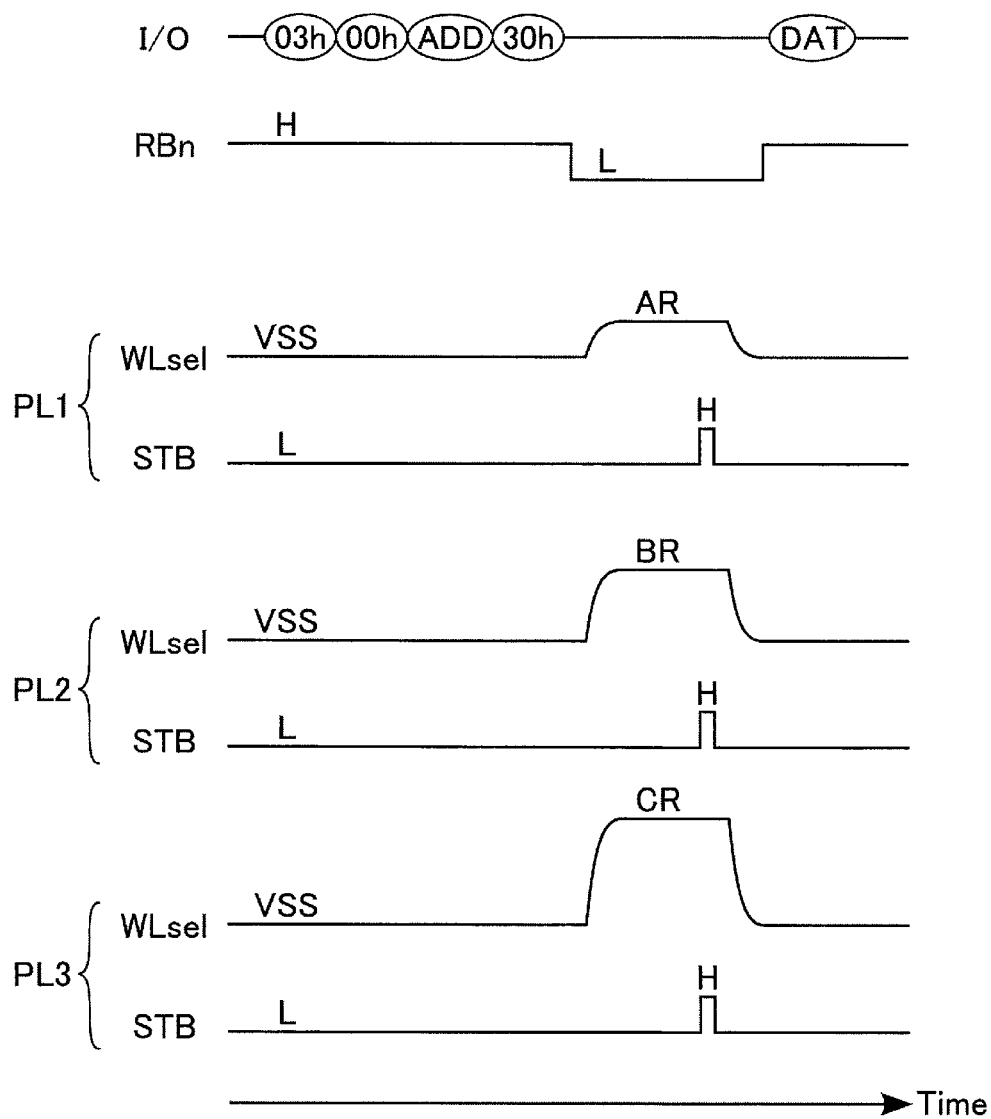
FIG. 78 is a timing chart showing an example of commands, and signals and voltages applied to lines in a third page read in the semiconductor memory according to the sixth embodiment.

FIG. 78 shows an example of commands, and signals and voltages applied to the lines in the third page read in the semiconductor memory 10 according to the sixth embodiment.

As shown in FIG. 78, first, the memory controller 20 sequentially transmits, for example, a command "03h", a command "00h", address information ADD, and a command "30h" to the semiconductor memory 10. Upon reception of the command "30h", the semiconductor memory 10 changes to a busy state, and starts the third page read.

In the third page read of the sixth embodiment, the sequencer 14 simultaneously performs a first read operation for first plane PL1, a second read operation for second plane PL2, and a third read operation for third plane PL3 in parallel.

In the first read operation in the third page read, a read operation using, for example, the read voltage AR is performed, and a result of this read is retained in any of the latch circuits in each sense amplifier unit SAU in the sense amplifier module 17A.

In the second read operation in the third page read, a read operation using, for example, the read voltage BR is performed, and a result of this read is retained in any of the latch circuits in each sense amplifier unit SAU in the sense amplifier module 17B.

In the third read operation in the third page read, a read operation using, for example, the read voltage CR is performed, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the third page read data based on results of each of the first to third read operations and the data definitions shown in FIG. 70. Since the other operations in the third page read in the sixth embodiment are the same as those in the first read operation explained with reference to FIG. 76, detailed descriptions of the operations are omitted.

(Fourth Page Read)

FIG. 79 shows an example of commands, and signals and voltages applied to the lines in the fourth page read in the semiconductor memory 10 according to the sixth embodiment.

As shown in FIG. 79, first, the memory controller 20 sequentially transmits, for example, a command "04h", a command "00h", address information ADD, and a command "30h" to the semiconductor memory 10. The command "04h" is a command for instructing performing an operation for the fourth page. Upon reception of the command "30h", the semiconductor memory 10 changes to a busy state, and starts the fifth page read.

In the fourth page read in the sixth embodiment, the sequencer 14 simultaneously performs a first read operation for first plane PL1, a second read operation for second plane PL2, and a third read operation for third plane PL3 in parallel.

In the first read operation in the fourth page read, a read operation using, for example, the read voltage BR is performed, and a result of this read is retained in any of the latch circuits in each sense amplifier unit SAU in the sense amplifier module 17A.

In the second read operation in the fourth page read, a read operation using, for example, the read voltage CR is performed, and a result of this read is retained in any of the latch circuits in each sense amplifier unit SAU in the sense amplifier module 17B.

In the third read operation in the fourth page read, a read operation using, for example, the read voltage AR is performed, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the fourth page read data based on results of each of the first to third read operations and the data definitions shown in FIG. 70. Since the other operations in the fourth page read in the sixth embodiment are the same as those in the first read operation explained with reference to FIG. 76, detailed descriptions of the operations are omitted.

(Fifth Page Read)

FIG. 80 shows an example of commands, and signals and voltages applied to the lines in the fifth page read in the semiconductor memory 10 according to the sixth embodiment.

As shown in FIG. 80, first, the memory controller 20 sequentially transmits, for example, a command "05h", a command "00h", address information ADD, and a command "30h" to the semiconductor memory 10. The command "05h" is a command for instructing performing an operation for the fifth page. Upon reception of the command "30h", the semiconductor memory 10 changes to a busy state, and starts the fourth page read.

In the fifth page read in the sixth embodiment, the sequencer 14 simultaneously performs a first read operation for first plane PL1, a second read operation for second plane PL2, and a third read operation for third plane PL3 in parallel.

In the first read operation in the fifth page read, a read operation using, for example, the read voltage BR is performed, and a result of this read is retained in any of the latch circuits in each sense amplifier unit SAU in the sense amplifier module 17A.

In the second read operation in the fifth page read, a read operation using, for example, the read voltage CR is performed, and a result of this read is retained in any of the latch circuits in each sense amplifier unit SAU in the sense amplifier module 17B.

In the third read operation in the fifth page read, a read operation using, for example, the read voltage AR is performed, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the fifth page read data based on results of each of the first to third read operations and the data definitions shown in FIG. 70. Since the other operations in the fifth page read in the sixth embodiment are the same as those in the first read operation explained with reference to FIG. 76, detailed descriptions of the operations are omitted.

(Sixth Page Read)

FIG. 81 shows an example of commands, and signals and voltages applied to the lines in the sixth page read in the semiconductor memory 10 according to the sixth embodiment.

As shown in FIG. 81, first, the memory controller 20 sequentially transmits, for example, a command "06h", a command "00h", address information ADD, and a command "30h" to the semiconductor memory 10. The command "06h" is a command for instructing performing an operation for the sixth page. Upon reception of the command "30h", the semiconductor memory 10 changes to a busy state, and starts the fourth page read.

In the sixth page read in the sixth embodiment, the sequencer 14 simultaneously performs a first read operation for first plane PL1, a second read operation for second plane PL2, and a third read operation for third plane PL3 in parallel.

In the first read operation in the sixth page read, a read operation using, for example, the read voltage CR is performed, and a result of this read is retained in any of the latch circuits in each sense amplifier unit SAU in the sense amplifier module 17A.

In the second read operation in the sixth page read, a read operation using, for example, the read voltage BR is performed, and a result of this read is retained in any of the latch circuits in each sense amplifier unit SAU in the sense amplifier module 17B.

In the third read operation in the sixth page read, a read operation using, for example, the read voltage CR is performed, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state for example, the memory controller 20 causes the semiconductor memory 10 to output the read data DAT by toggling the read enable signal REn.

At this time, the data output from each of first plane PL1, second plane PL2, and third plane PL3 is transferred to the logic circuit 18. Then, the logic circuit 18 determines the sixth page read data based on results of each of the first to third read operations and the data definitions shown in FIG. 70. Since the other operations in the sixth page read in the sixth embodiment are the same as those in the first read operation explained with reference to FIG. 76, detailed descriptions of the operations are omitted.

[6-3] Advantageous Effects of Sixth Embodiment

As described above, the semiconductor memory 10 according to the sixth embodiment includes three independently-controllable planes, and stores 6-bit data using a set of three memory cell transistors MT respectively included in different planes.

Furthermore, in the semiconductor memory 10 of the sixth embodiment, the first page read data, the second page read data, the third page read data, the fourth page read data, the fifth page read data, and the sixth page read data are determined by a read operation using one read voltage per plane.

Thus, in the semiconductor memory 10 according to the sixth embodiment, it is possible to store data larger than data stored in one memory cell transistor MT in the first embodiment, and to determine read data of one page only by applying one read voltage per plane.

Therefore, the semiconductor memory 10 according to the sixth embodiment can increase the speed of the read operations, and can increase capacity for storage in each plane compared to the first embodiment.

[6-4] Modifications of Sixth Embodiment

The sixth embodiment is explained using the data allocation shown in FIGS. 68 and 69 as an example; however, different data allocations may be applied to the threshold distributions of the memory cell transistors MT in the sixth embodiment.

Combinations of read voltages and data definitions in the modifications of the sixth embodiment are listed below. Data allocation and a write level for each of the following combinations is set as appropriate, based on a combination of read voltages and data definitions.

(Example) Read Voltage: [first page read ((x) read voltage of PL1, (y) read voltage of PL2, (z) read voltage of PL3), second page read ((x), (y), (z)), third page read ((x), (y), (z)), fourth page read ((x), (y), (z)), fifth page read ((x), (y), (z)), sixth page read ((x), (y), (z))]; Data Definition: [first page read [(a) read data if H, H, H=result of reading PL1, result of reading PL2, result of reading PL3, (b) read data if L, H, H, (c) read data if H, L, H, (d) read data if L, L, H, (e) read data if H, H, L, (f) read data if L, H, L, (g) read data if H, L, L, (h) read data if L, L, L], second page read [(a), (b), (c), (d) (e), (f), (g), (h)], third page read [(a), (b), (c), (d) (e), (f), (g), (h)], fourth page read [(a), (b), (c), (d) (e), (f), (g), (h)], fifth page read [(a), (b), (c), (d) (e), (f), (g), (h)], sixth page read [(a), (b), (c), (d) (e), (f), (g), (h)]]

(First Modification of Sixth Embodiment)

Read voltage: [(AR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Second Modification of Sixth Embodiment)

Read voltage: [(BR, BR, BR), (BR, AR, AR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Third Modification of Sixth Embodiment)

Read voltage: [(BR, BR, BR), (BR, AR, BR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Fourth Modification of Sixth Embodiment)

Read voltage: [(BR, BR, BR), (BR, AR, CR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Fifth Modification of Sixth Embodiment)

Read voltage: [(BR, BR, BR), (BR, BR, AR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Sixth Modification of Sixth Embodiment)

Read voltage: [(BR, BR, BR), (BR, BR, BR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Seventh Modification of Sixth Embodiment)
Read voltage: [(BR, BR, BR), (BR, BR, CR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Eighth Modification of Sixth Embodiment)
Read voltage: [(BR, BR, BR), (BR, CR, AR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(Ninth Modification of Sixth Embodiment)
Read voltage: [(BR, BR, BR), (BR, CR, BR), (AR, AR, BR), (AR, CR, BR), (CR, BR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(10th Modification of Sixth Embodiment)
Read voltage: [(BR, BR, BR), (BR, CR, CR), (AR, AR, BR), (AR, CR, BR), (CR, BR, AR), (CR, BR, CR)]; Definition of data: [[0, 0, 1, 0, 0, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(11th Modification of Sixth Embodiment)
Read voltage: [(BR, BR, BR), (AR, AR, BR), (AR, CR, BR), (CR, BR, AR), (CR, BR, CR), (BR, BR, BR)]; Definition of data: [[0, 0, 1, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(12th Modification of Sixth Embodiment)
Read voltage: [(AR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(13th Modification of Sixth Embodiment)
Read voltage: [(AR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(14th Modification of Sixth Embodiment)
Read voltage: [(AR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(15th Modification of Sixth Embodiment)
Read voltage: [(BR, AR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(16th Modification of Sixth Embodiment)
Read voltage: [(BR, AR, BR), (BR, BR, BR), (AR, BR, CR), (BR, AR, CR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(17th Modification of Sixth Embodiment)
Read voltage: [(BR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(18th Modification of Sixth Embodiment)
Read voltage: [(BR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(19th Modification of Sixth Embodiment)
Read voltage: [(BR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(20th Modification of Sixth Embodiment)
Read voltage: [(BR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(21st Modification of Sixth Embodiment)
Read voltage: [(BR, BR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(22nd Modification of Sixth Embodiment)
Read voltage: [(BR, BR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(23rd Modification of Sixth Embodiment)
Read voltage: [(BR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(24th Modification of Sixth Embodiment)
Read voltage: [(BR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(25th Modification of Sixth Embodiment)
Read voltage: [(BR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(26th Modification of Sixth Embodiment)
Read voltage: [(BR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(27th Modification of Sixth Embodiment)
Read voltage: [(CR, AR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(28th Modification of Sixth Embodiment)
Read voltage: [(CR, AR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(29th Modification of Sixth Embodiment)
Read voltage: [(CR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(30th Modification of Sixth Embodiment)
Read voltage: [(CR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(31st Modification of Sixth Embodiment)
Read voltage: [(CR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(32nd Modification of Sixth Embodiment)
Read voltage: [(CR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(33rd Modification of Sixth Embodiment)
Read voltage: [(CR, BR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(34th Modification of Sixth Embodiment)
Read voltage: [(CR, BR, BR), (BR, BR, BR), (AR, BR, AR) (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(35th Modification of Sixth Embodiment)
Read voltage: [(CR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(36th Modification of Sixth Embodiment)
Read voltage: [(CR, CR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(37th Modification of Sixth Embodiment)
Read voltage: [(CR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(38th Modification of Sixth Embodiment)
Read voltage: [(CR, CR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(39th Modification of Sixth Embodiment)
Read voltage: [(AR, AR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(40th Modification of Sixth Embodiment)
Read voltage: [(AR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(41st Modification of Sixth Embodiment)
Read voltage: [(AR, AR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(42nd Modification of Sixth Embodiment)
Read voltage: [(BR, BR, BR), (BR, BR, BR), (AR, BR, AR), (AR, BR, CR), (CR, AR, BR), (CR, CR, BR)]; Definition of data: [[0, 0, 0, 1, 1, 0, 1, 1], [0, 1, 0, 0, 1, 1, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(43rd Modification of Sixth Embodiment)
Read voltage: [(BR, BR, BR), (BR, AR, AR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(44th Modification of Sixth Embodiment)
Read voltage: [(BR, BR, BR), (BR, AR, BR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(45th Modification of Sixth Embodiment)
Read voltage: [(BR, BR, BR), (BR, AR, CR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(46th Modification of Sixth Embodiment)
Read voltage: [(BR, BR, BR), (BR, BR, AR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(47th Modification of Sixth Embodiment)
Read voltage: [(BR, BR, BR), (BR, BR, BR), (AR, BR, AR), (AR, BR, CR), (CR, AR, BR), (CR, CR, BR)]; Definition of data: [[0, 0, 0, 1, 1, 1, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(48th Modification of Sixth Embodiment)
Read voltage: [(BR, BR, BR), (BR, BR, CR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(49th Modification of Sixth Embodiment)
Read voltage: [(BR, BR, BR), (BR, CR, AR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(50th Modification of Sixth Embodiment)
Read voltage: [(BR, BR, BR), (BR, CR, BR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(51st Modification of Sixth Embodiment)
Read voltage: [(BR, BR, BR), (BR, CR, CR), (AR, BR, AR), (AR, BR, CR), (CR, AR, BR), (CR, CR, BR)]; Definition of data: [[0, 0, 0, 1, 1, 0, 1, 1], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(52nd Modification of Sixth Embodiment)
Read voltage: [(AR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(53rd Modification of Sixth Embodiment)
Read voltage: [(AR, BR, BR), (BR, BR, BR), (AR, BR, CR), (BR, AR, AR), (BR, CR, AR), (CR, BR, CR)]; Definition of data: [[0, 0, 0, 0, 1, 1, 1, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(54th Modification of Sixth Embodiment)
Read voltage: [(BR, BR, BR), (BR, BR, BR), (AR, CR, BR), (BR, AR, AR), (BR, AR, CR), (CR, CR, BR)]; Definition of data: [[0, 0, 0, 1, 1, 1, 0, 1], [0, 0, 1, 0, 1, 1, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(55th Modification of Sixth Embodiment)
Read voltage: [(BR, BR, BR), (AR, BR, AR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(56th Modification of Sixth Embodiment)
Read voltage: [(BR, BR, BR), (AR, BR, BR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(57th Modification of Sixth Embodiment)
Read voltage: [(BR, BR, BR), (AR, BR, CR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(58th Modification of Sixth Embodiment)
Read voltage: [(BR, BR, BR), (BR, BR, AR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(59th Modification of Sixth Embodiment)
Read voltage: [(BR, BR, BR), (BR, BR, BR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(60th Modification of Sixth Embodiment)
Read voltage: [(BR, BR, BR), (BR, BR, CR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(61st Modification of Sixth Embodiment)
Read voltage: [(BR, BR, BR), (CR, BR, AR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(62nd Modification of Sixth Embodiment)
Read voltage: [(BR, BR, BR), (CR, BR, BR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(63rd Modification of Sixth Embodiment)
Read voltage: [(BR, BR, BR), (CR, BR, CR), (AR, CR, BR), (BR, AR, AR), (BR, AR, CR), (CR, CR, BR)]; Definition of data: [[0, 0, 0, 1, 1, 1, 0, 1], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(64th Modification of Sixth Embodiment)
Read voltage: [(AR, BR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 0, 1, 1, 0, 1, 0, 1], [0, 1, 0, 1, 0, 0, 1, 1], [0, 1, 1, 0, 1, 0, 0, 1], [0, 1, 1, 0, 1, 0, 0, 1], [0, 1, 1, 0, 1, 0, 0, 1]]

(65th Modification of Sixth Embodiment)
Read voltage: [(AR, BR, BR), (BR, BR, BR), (AR, BR, AR), (BR, AR, CR), (BR, CR, CR), (CR, BR, AR)]; Definition of data: [[0, 0, 0, 0, 1, 1, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(66th Modification of Sixth Embodiment)
Read voltage: [(BR, BR, BR), (AR, BR, AR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(67th Modification of Sixth Embodiment)
Read voltage: [(BR, BR, BR), (AR, BR, BR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(68th Modification of Sixth Embodiment)
Read voltage: [(BR, BR, BR), (AR, BR, CR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(69th Modification of Sixth Embodiment)
Read voltage: [(BR, BR, BR), (BR, BR, AR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(70th Modification of Sixth Embodiment)
Read voltage: [(BR, BR, BR), (BR, BR, BR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(71st Modification of Sixth Embodiment)
Read voltage: [(BR, BR, BR), (BR, BR, CR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(72nd Modification of Sixth Embodiment)
Read voltage: [(BR, BR, BR), (CR, BR, AR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(73rd Modification of Sixth Embodiment)
Read voltage: [(BR, BR, BR), (CR, BR, BR), (AR, CR, BR), (BR, AR, AR), (BR, AR, AR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(74th Modification of Sixth Embodiment)
Read voltage: [(BR, BR, BR), (CR, BR, CR), (AR, CR, BR), (BR, AR, AR), (BR, AR, CR), (CR, CR, BR)]; Definition of data: [[0, 0, 1, 0, 1, 1, 1, 0], [0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(75th Modification of Sixth Embodiment)
Read voltage: [(AR, BR, AR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(76th Modification of Sixth Embodiment)
Read voltage: [(AR, BR, AR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 0, 0]]

(77th Modification of Sixth Embodiment)
Read voltage: [(AR, BR, BR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(78th Modification of Sixth Embodiment)
Read voltage: [(AR, BR, BR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(79th Modification of Sixth Embodiment)
Read voltage: [(AR, BR, CR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(80th Modification of Sixth Embodiment)
Read voltage: [(AR, BR, CR), (AR, AR, BR), (BR, CR, AR), (BR, CR, CR), (CR, AR, BR), (BR, BR, BR)]; Definition of data: [[0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(81st Modification of Sixth Embodiment)
Read voltage: [(BR, BR, AR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(82nd Modification of Sixth Embodiment)
Read voltage: [(BR, BR, AR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(83rd Modification of Sixth Embodiment)
Read voltage: [(BR, BR, BR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(84th Modification of Sixth Embodiment)
Read voltage: [(BR, BR, BR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(85th Modification of Sixth Embodiment)
Read voltage: [(BR, BR, CR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(86th Modification of Sixth Embodiment)
Read voltage: [(BR, BR, CR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(87th Modification of Sixth Embodiment)
Read voltage: [(CR, BR, AR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 0, 1, 0, 0, 1, 1], [0, 1, 1, 0, 1, 0, 0, 1]]

(88th Modification of Sixth Embodiment)
Read voltage: [(CR, BR, AR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(89th Modification of Sixth Embodiment)
Read voltage: [(CR, BR, BR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(90th Modification of Sixth Embodiment)
Read voltage: [(CR, BR, BR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(91st Modification of Sixth Embodiment)
Read voltage: [(CR, BR, CR), (BR, BR, BR), (AR, AR, BR), (BR, CR, AR), (BR, CR, CR), (CR, AR, BR)]; Definition of data: [[0, 0, 1, 1, 0, 0, 1, 1], [0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(92nd Modification of Sixth Embodiment)
Read voltage: [(CR, BR, CR), (AR, AR, BR), (BR, CR, AR), (BR, CR, CR), (CR, AR, BR), (BR, BR, BR)]; Definition of data: [[0, 0, 1, 1, 0, 0, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(93rd Modification of Sixth Embodiment)
Read voltage: [(BR, BR, BR), (BR, BR, BR), (AR, BR, CR), (BR, AR, AR), (BR, CR, AR), (CR, BR, CR)]; Definition of data: [[0, 0, 1, 1, 0, 1, 0, 1], [0, 0, 1, 1, 1, 0, 1, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(94th Modification of Sixth Embodiment)
Read voltage: [(BR, BR, BR), (AR, AR, BR), (BR, CR, AR), (BR, CR, CR), (CR, AR, BR), (BR, BR, BR)]; Definition of data: [[0, 1, 0, 0, 0, 1, 1, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 1, 0, 0]]

(95th Modification of Sixth Embodiment)
Read voltage: [(BR, BR, BR), (BR, AR, AR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(96th Modification of Sixth Embodiment)
Read voltage: [(BR, BR, BR), (BR, AR, BR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(97th Modification of Sixth Embodiment)
Read voltage: [(BR, BR, BR), (BR, AR, CR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(98th Modification of Sixth Embodiment)
Read voltage: [(BR, BR, BR), (BR, BR, AR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(99th Modification of Sixth Embodiment)
Read voltage: [(BR, BR, BR), (BR, BR, BR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(100th Modification of Sixth Embodiment)
Read voltage: [(BR, BR, BR), (BR, BR, CR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(101st Modification of Sixth Embodiment)
Read voltage: [(BR, BR, BR), (BR, CR, AR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(102nd Modification of Sixth Embodiment)
Read voltage: [(BR, BR, BR), (BR, CR, BR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(103rd Modification of Sixth Embodiment)
Read voltage: [(BR, BR, BR), (BR, CR, CR), (AR, BR, AR), (AR, BR, CR), (CR, AR, BR), (CR, CR, BR)]; Definition of data: [[0, 1, 0, 0, 1, 1, 1, 0], [0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(104th Modification of Sixth Embodiment)
Read voltage: [(BR, BR, BR), (BR, BR, BR), (AR, BR, AR), (BR, AR, CR), (BR, CR, CR), (CR, BR, AR)]; Definition of data: [[0, 1, 0, 1, 0, 0, 1, 1], [0, 1, 0, 1, 1, 1, 0, 0], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1]]

(105th Modification of Sixth Embodiment)
Read voltage: [(BR, AR, AR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(106th Modification of Sixth Embodiment)
Read voltage: [(BR, AR, BR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(107th Modification of Sixth Embodiment)
Read voltage: [(BR, AR, CR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(108th Modification of Sixth Embodiment)
Read voltage: [(BR, BR, AR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(109th Modification of Sixth Embodiment)
Read voltage: [(BR, BR, BR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(110th Modification of Sixth Embodiment)
Read voltage: [(BR, BR, CR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(111th Modification of Sixth Embodiment)
Read voltage: [(BR, CR, AR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(112th Modification of Sixth Embodiment)
Read voltage: [(BR, CR, BR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

(113th Modification of Sixth Embodiment)
Read voltage: [(BR, CR, CR), (AR, AR, BR), (AR, CR, BR), (CR, BR, AR), (CR, BR, CR), (BR, BR, BR)]; Definition of data: [[0, 1, 0, 1, 0, 1, 0, 1], [0, 1, 1, 0, 1, 0, 0, 1], [0, 1, 1, 0, 1, 0, 0, 1], [0, 1, 1, 0, 1, 0, 0, 1], [0, 1, 1, 0, 1, 0, 0, 1], [0, 1, 1, 1, 0, 0, 1, 0]]

The semiconductor memory 10 of each of the above-described modifications of the sixth embodiment is capable of performing the same operation as the sixth embodiment, and can achieve similar advantageous effects.

In the sixth embodiment, the write operations are simultaneously performed for the first to sixth pages after the data for the first through sixth pages is transferred to the sense amplifier module 17A of first plane PL1, the sense amplifier module 17B of second plane PL2, and the sense amplifier module 17C of third plane PL3; however, a write operation may be performed page by page, as in the second through fifth embodiments. In the following, an example where the method described in the second embodiment is adopted in the semiconductor memory 10 storing 6-bit data in three memory cell transistors MT will be briefly explained.

For example, similar to the second embodiment, in the semiconductor memory 10 according to the sixth embodiment, the sequencer 14 performs a first write operation in the memory cell transistors MT in first plane PL1 during the first page write, thereby storing 1-bit data corresponding to the first page data in the memory cell transistors MT.

The sequencer 14 performs a second write operation in the memory cell transistors MT in second plane PL2 during the second page write, thereby storing 1-bit data corresponding to the second page data in the memory cell transistors MT.

The sequencer 14 performs a third write operation in the memory cell transistors MT in third plane PL3 during the third page write, thereby storing 1-bit data corresponding to the third page data in the memory cell transistors MT.

In the above example, the write data for the first to third pages is written after the data is input page by page; however, the present embodiment is not limited to this example. For example, the sequencer 14 may simultaneously perform a first write operation in first plane PL1, a second write operation in second plane PL2, and a third write operation in third plane PL3 in parallel, after the first page write data is transferred to the sense amplifier module 17A, and the second page write data is transferred to the sense amplifier module 17B, and the third page write data is transferred to the sense amplifier module 17C.

Thereafter, the semiconductor memory 10 transfers the write data for the fourth to sixth pages received from the memory controller 20 to the sense amplifier module 17A of first plane PL1, the sense amplifier module 17B of second plane PL2, and the sense amplifier module 17C of third plane PL3.

Then, the sequencer 14 performs IDL to first plane PL1 to restore the data written by the first page write in the sense amplifier module 17A, and transfers the data to each of the sense amplifier module 17B and the sense amplifier module 17C.

Then, the sequencer 14 performs IDL to second plane PL2 to restore the data written by the second page write in the sense amplifier module 17B, and transfers the data to each of the sense amplifier module 17A and the sense amplifier module 17C.

The sequencer 14 further performs IDL to third plane PL3 to restore the data written by the third page write in the sense amplifier module 17C, and transfers the data to each of the sense amplifier module 17A and the sense amplifier module 17B.

Then, each of the sense amplifier modules 17A, 17B, and 17C retains the first to sixth page data, and the sequencer 14 performs a write operation for the 6-page data based on the data allocation.

Thus, in a case where 6-bit data is stored in three memory cell transistors MT, the semiconductor memory 10 can perform the operations similar to those in the second embodiment, and can achieve advantageous effects similar to those in the second embodiment. The semiconductor memory 10 can even perform operations similar to the operations explained in each of the third to fifth embodiments to store 6-bit a data in three memory cell transistors MT.

An example of writing the write data for the fourth to sixth pages by one write operation is explained above; however, a page-by-page write operation may be performed for each of the fourth to sixth pages. In this case, the semiconductor memory 10 reads data that has already been written in a lower page by performing IDL after receiving one-page write data, and restores the data of the lower page in the latch circuit of each of the sense amplifier modules 17A, 17B, and 17C, and then performs a write operation for the page.

Furthermore, the semiconductor memory 10 according to the sixth embodiment may distinguish a state of write for each page by using flag cells, similar to the third embodiment and the fifth embodiment. In this case, the semiconductor memory 10 according to the sixth embodiment can achieve the same advantageous effects as the third embodiment and the fifth embodiment.

[7] Seventh Embodiment

The seventh embodiment relates to a method of using a latch circuit when the threshold voltages of the memory cell transistors MT form the distributions as explained in the sixth embodiment. In the following, differences of the semiconductor memory 10 according to the seventh embodiment from the first to sixth embodiments will be described.

[7-1] Write Operation

For example, when four threshold distributions are formed as shown in FIG. 67, it is desirable that the threshold distributions of the "A" state and the "B" state which are provided between the "Z" state the memory cell transistors MT are in an erasure state and the "C" state that is set at a maximum threshold voltage, should be narrow.

Accordingly, in the semiconductor memory 10 according to the seventh embodiment, two types of verify operations are performed when data is written in, for example, the "A" state and the "B" state. Of these verify operations, one is a verify read using a normal verify voltage (e.g., a verify voltage AV) (hereinafter "V" verify), and the other is a verify read using a verify voltage lower than the normal verify voltage (hereinafter "VL" verify).

In a program loop, the sequencer 14 successively perform the "VL" verify and the "V" verify, for example. Then, in a program operation, while a program voltage is being applied to a selected word line WLsel, a ground voltage VSS is applied to a bit line BL corresponding to a sense amplifier module 17 that has not yet passed the "VL" verify, a voltage VQPW higher than the ground voltage VSS is applied to a bit line BL corresponding to the sense amplifier module 17 that has passed the "VL" verify, and a voltage VBL higher than the voltage VQPW is applied to a bit line BL corresponding to the sense amplifier module 17 that has passed the "V" verify, for example.

In the program operation, a rise of a threshold voltage of a memory cell transistor MT when the voltage VQPW is applied to the corresponding bit line BL is smaller than a rise of a threshold voltage of a memory cell transistor MT when the voltage VSS is applied to the corresponding bit line BL.

The semiconductor memory 10 can thereby make the threshold distribution of a memory cell transistors MT that has passed the "V" verify narrower than the threshold distribution of a memory cell transistor MT when the "VL" verify is not used. Furthermore, when such a write operation is performed, flag information indicating whether or not a memory cell transistor MT has passed the "VL" verify, is allocated to the latch circuit.

Figure 82:
FIG. 82 is a timing chart showing an example of an operation of latch circuits in a write operation of a semiconductor memory according to a seventh embodiment.

FIG. 82 shows an example of changes in the data retained in the latch circuits ADL, BDL, and XDL when, for example, four threshold distributions are formed as shown in FIG. 67 in a write operation in the semiconductor memory 10 according to the seventh embodiment. In this example, if the latch circuit ADL retains "0", this indicates that a write-targeted memory cell transistor MT has not passed the "VL" verify, and if the latch circuit ADL retains "1", this indicates that a write-targeted memory cell transistor MT has not yet passed the "VL" verify.

As shown in the top table in FIG. 82, if the "A"-level write has not completed, for example, the latch circuit ADL retains flag information indicating whether or not a memory cell transistor has passed the "VL" verify, and the latch circuits BDL and XDL retain 2-bit data allocated to each write level.

When the program loop is repeated and the "A"-level write has completed, the sequencer 14 changes the allocation of the latch circuits to the allocation in which the completed "A" level is not distinguished from the other levels, as shown in the bottom table in FIG. 82.

Specifically, for example, in the top table in FIG. 82, the allocation of the latch circuits corresponding to the "Z" state is set to "111 (ADL/BDL/XDL)", the allocation of the latch circuits corresponding to the "A" state is set to "010" or "110", the allocation of the latch circuits corresponding to the "B" state is set to "000" or "100", and the allocation of the latch circuits corresponding to the "C" state is set to "001".

In contrast, for example, in the bottom table in FIG. 82, the allocation of the latch circuits corresponding to the "Z" state is set to "11 (ADL/BDL)", no allocation of the latch circuits for the "A" state is set, the allocation of the latch circuits corresponding to the "B" state is set to "00" or "10", and the allocation of the latch circuits corresponding to the "C" state is set to "01".

In the example shown in FIG. 82, in the allocation of data after the "A"-level write is completed, the data retained in the latch circuits of the sense amplifier unit SAU corresponding to the "C" state is changed. Specifically, "0" data retained in the latch circuit BDL of the sense amplifier unit SAU corresponding to the "C" state before the "A"-level write is completed, is changed to "1" data after the "A"-level write is completed.

As described above, by changing the data allocation after the "A"-level write is completed, the sequencer 14 can release the latch circuit XDL, and use it as a write buffer for receiving write data for the next page.

[7-2] Advantageous Effects of Seventh Embodiment

As described above, the semiconductor memory 10 according to the seventh embodiment can use the latch circuit XDL as a write buffer by omitting and distinguishing a level for which writing has completed, as a program loop progresses. Thus, the semiconductor memory 10 according to the seventh embodiment can enhance the speed of the data transfer from the memory controller 20 to the semiconductor memory 10, and the speed of a write operation.

The allocation of the latch circuits explained in the seventh embodiment is merely an example, and the seventh embodiment is not limited to this allocation. For example, the operation explained in the seventh embodiment is applicable to a case where the sense amplifier unit SAU includes four or more latch circuits, and to a case where a plurality of threshold distributions other than the four distributions in the seventh embodiment. Even in this case, the semiconductor memory 10 can enhance the speed of a write operation by applying an appropriate allocation of latch circuits and changing the allocation as appropriate, as a program loop progresses.

[8] Eighth Embodiment

The semiconductor memory 10 according to the eighth embodiment has a configuration similar to that of the semiconductor memory 10 according to the sixth embodiment. In the semiconductor memory 10 according to the eighth embodiment, if data is written by using a method like the one described in the sixth embodiment, a read voltage applied during a read operation is omitted as appropriate. In the following, differences of the semiconductor memory 10 according to the eighth embodiment from the first to seventh embodiments will be described.

[8-1] Read Voltages

FIG. 83 shows read voltages used in the read operations in the 21st modification of the sixth embodiment. In the combinations of the read voltages shown in FIG. 83, the same voltage may be used in read operations for consecutive pages.

For example, in the first page read and the second page read, the same read voltage is used in each of first plane PL1, second plane PL2, and third plane PL3. In the second page read and the third page read, the same read voltage is used in second plane PL2. In the fourth page read and the fifth page read, the same read voltage is used in each of first plane PL1 and third plane PL3.

[8-2] Read Operation

The semiconductor memory 10 according to the eighth embodiment retains data in the latch circuits in the sense amplifier module 17 even after data that is read from each page is output to the memory controller 20. In a read operation for a subsequent page, the semiconductor memory 10 according to the eighth embodiment uses a result of a read operation for an immediately-preceding page.

Figure 84:
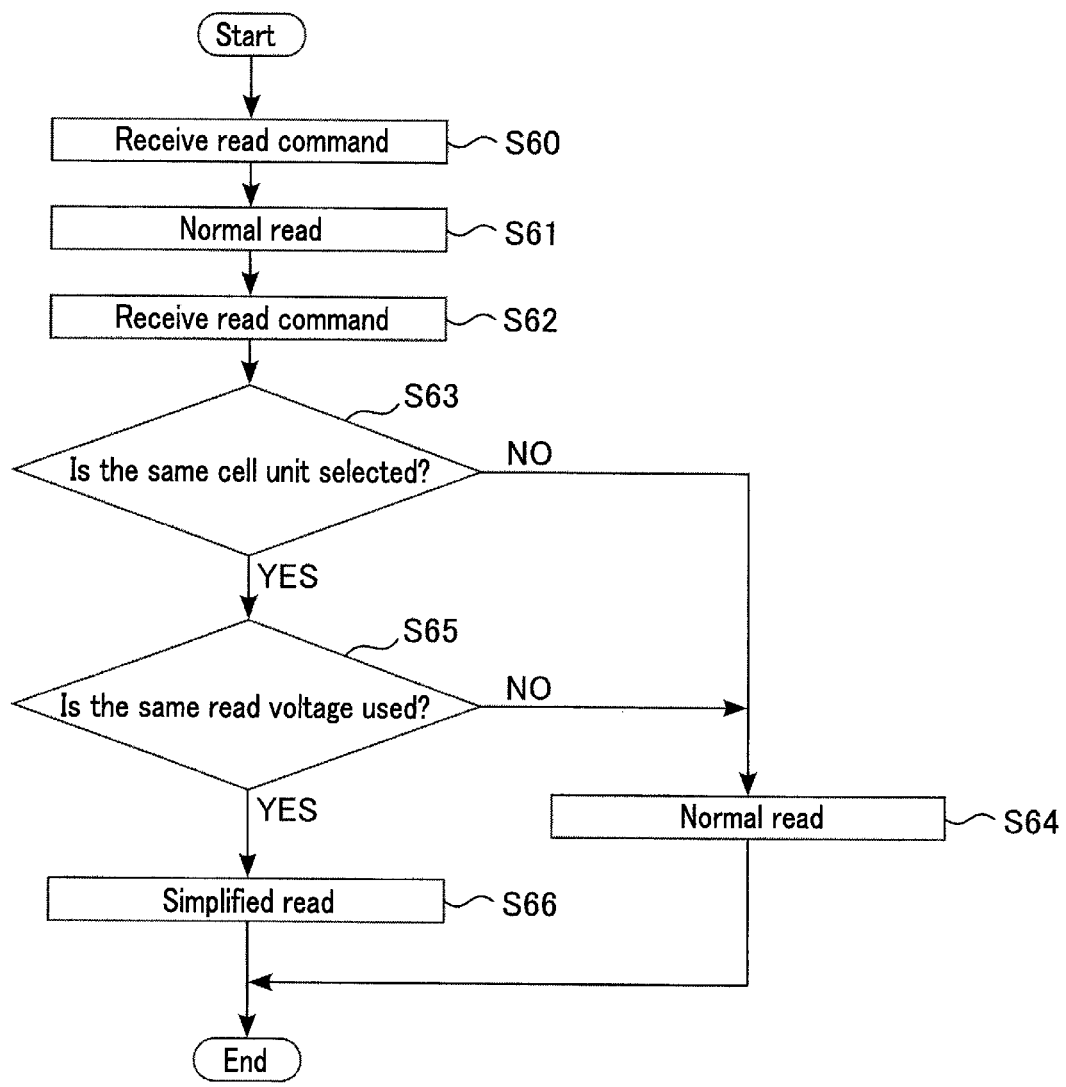
FIG. 84 is a flowchart showing an example of a read operation in the semiconductor memory according to the eighth embodiment.

FIG. 84 is a flowchart showing an example of a read operation in the semiconductor memory 10 according to the eighth embodiment. The details of the read operation in the semiconductor memory 10 according to the eighth embodiment will be explained below with reference to FIG. 84.

The semiconductor memory 10 receives commands for instructing a read operation, and address information (step S60). Upon reception of the command and address information, the semiconductor memory 10 changes to a busy state, and performs a normal read (step S61).

This normal read corresponds to, for example, the read operation performed in units of pages in the sixth embodiment. In the first read operation in the eighth embodiment, a result of the read is transferred to the latch circuit XDL of each sense amplifier unit SAU, and is retained in, for example, the latch circuit BDL.

When the normal read is finished and the semiconductor memory 10 changes from a busy state to a ready state, the semiconductor memory 10 subsequently receives a command of a read operation and address information (step S62). Then, the sequencer 14 refers to the address information, and confirms whether or not the selected cell unit CU is the same as the cell unit CU selected in the immediately-preceding read operation.

If the selected cell units CU are not the same (No in step S63), the sequencer 14 performs normal read (step S64). If the selected cell units CU are the same (Yes in step S63), the sequencer 14 checks whether or not there is a plane in which the same read voltage is used in the current read operation and in the immediately-preceding read operation.

If there is no such plane (No in step S65), the sequencer 14 performs a normal read (step S64). If there is such a plane (Yes in step S65), the sequencer 14 performs a simplified read (step S66).

This simplified read corresponds to the read operation performed in units of pages, which uses a result of an immediately-preceding read. In the following, the details of the simplified read in the semiconductor memory 10 according to the eighth embodiment will be explained with reference to FIG. 85.

FIG. 85 shows an example of commands, and signals and voltages applied to each line, in a case where the data allocation in the 21st modification of the sixth embodiment is applied and third page read is performed immediately after the second page read in the same cell unit CU.

In this example, the read voltage used in the second page read and the read voltage used in the third page read are the same in second plane PL2, and the data is retained in the sense amplifier unit SAU of second plane PL2.

The command used in this example is the same as the command in the third page read described with reference to FIG. 78 in the sixth embodiment. Upon reception of the command "30h", the semiconductor memory 10 according to the eighth embodiment changes to a busy state, and starts a third page read.

In the third page read of this example, the sequencer 14 simultaneously performs a first read operation for first plane PL1, a third read operation for third plane PL3 in parallel, and a second read operation for second plane PL2 is omitted.

When the first read operation is finished, a result of the read using the read voltage AR is transferred to the latch circuits XDL and BDL. When the third read operation is finished, a result of the read using the read voltage AR is transferred to the latch circuits XDL and BDL. In second plane PL2 in which the second read operation is omitted, the result of the read using the read voltage BR in the second page read, which is retained in the latch circuit BDL, is transferred to the latch circuit XDL, but the result of the read remains in the latch circuit BDL.

When these operations are finished, the sequencer 14 determines third page read data based on the result of the read retained in the latch circuit XDL of the sense amplifier unit SAU in each of first plane PL1, second plane PL2, and third plane PL3, and the data definitions shown in the 21st modification of the sixth embodiment.

When the read data is determined, the semiconductor memory 10 changes from a busy state to a ready state, and outputs the determined read data DAT to the memory controller 20 based on the control of the memory controller 20, similar to the sixth embodiment.

A series of the above-described operations corresponds to a simplified read. In subsequent read operations, after each of step S64 and step S66, the sequencer 14 returns to the processing in step S62 and repeats the above-described operation.

[8-3] Advantageous Effects of Eighth Embodiment

As described above, in successive page read operations, the semiconductor memory 10 according to the eighth embodiment can omit a read operation in which the same read voltage is used. Accordingly, the semiconductor memory 10 according to the eighth embodiment can omit a read operation in units of planes as needed, and can reduce consumption power in a read operation.

In the eighth embodiment, an example of omitting a read operation using the same read voltage in successive page read operations is explained; however, the eighth embodiment is not limited thereto. For example, instead of omitting a read operation, a read operation using a read voltage corresponding to a subsequent page may be performed. After reading data in a cell unit CU, the data may be retained in any of the latch circuits. In this case, the semiconductor memory 10 can output data in a previously-selected cell unit CU by transferring the data retained in the latch circuit to the latch circuit XDL after reading data in a different cell unit CU.

Figure 86:
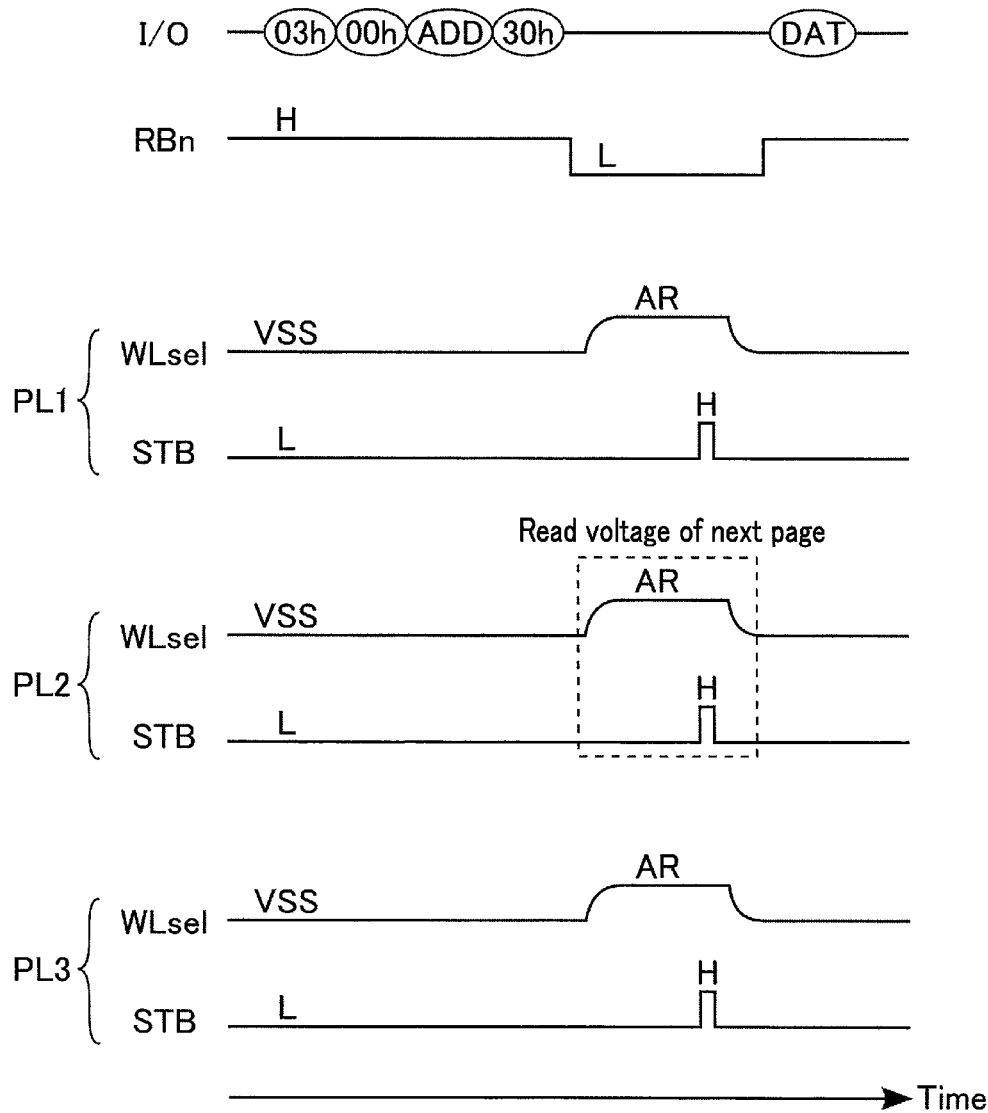
FIG. 86 is a timing chart showing an example of commands, and signals and voltages applied to lines in a simplified read in the semiconductor memory according to the eighth embodiment.

FIG. 86 shows an example of a simplified read in the semiconductor memory 10 according to a modification of the eighth embodiment, and in this example, a read operation for a subsequent page is performed in advance of the simplified read in the eighth embodiment explained with reference to FIG. 85.

Specifically, in the example shown in FIG. 86, without omitting the second read operation for second plane PL2, a read operation using the read voltage AR corresponding to a subsequent page (e.g., the fourth page) is performed.

The semiconductor memory 10 according to the modification of the eighth embodiment can thereby omit a second read operation for second plane PL2 if a read operation performed the next time a command and address information are received is the fourth page read in the same cell unit CU.

The semiconductor memory 10 in each of the above-described eighth embodiment and the modification thereof may keep retaining in different latch circuits a result of a read performed when the selected cell unit CU are the same. In this case, when all data in the cell units CU are successively read, the semiconductor memory 10 can reduce the number of times of applying different read voltages to one time, thereby further reducing power consumption. The operation in the eighth embodiment may be applied to the modifications of the sixth embodiment other than the 21st modification.

[9] Ninth Embodiment

A semiconductor memory 10 according to the ninth embodiment has a configuration similar to that of the semiconductor memory 10 according to the sixth embodiment. In the semiconductor memory 10 according to the ninth embodiment, if data is written by a method like the one described in the sixth embodiment, data of a plurality of pages is read by a read operation of one time. In the following, differences of the semiconductor memory 10 according to the ninth embodiment from the first to eighth embodiments will be described.

[9-1] Read Operation

In some of the various data allocations explained in the sixth embodiment, the same read voltage may be set for read operations in different pages, as explained in the eighth embodiment. For example, in the combinations of the read voltages shown in FIG. 83, the same read voltage is used in the first page read and in the second page read in each of the planes.

In such a case, the semiconductor memory 10 according to the ninth embodiment, read operations using the same read voltage for a plurality of pages may be performed in a batch. In the following, such read operations will be referred to as a batch read, and the details of the batch read will be explained with reference to FIG. 87.

Figure 87:
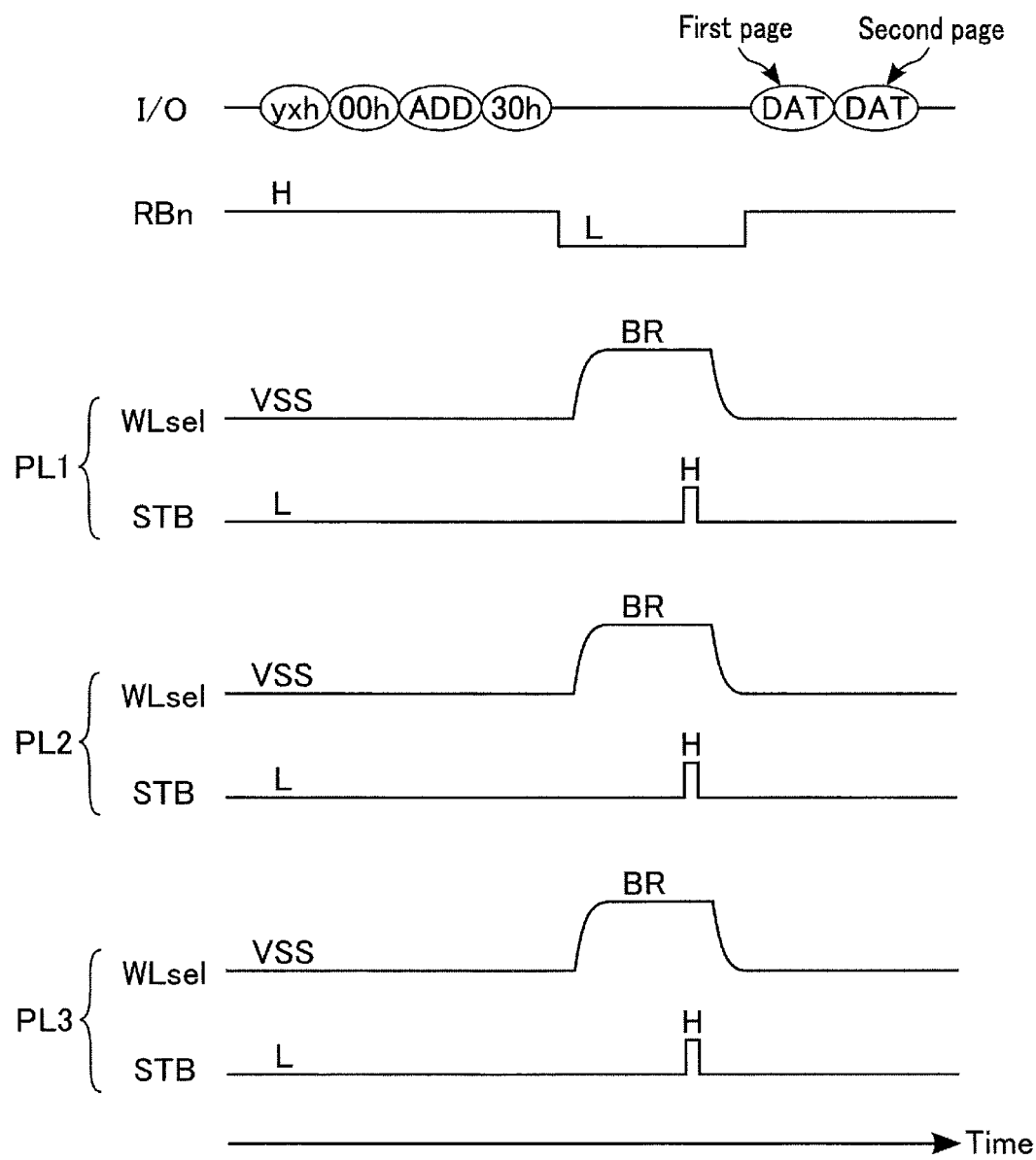
FIG. 87 shows an example of commands, and signals and voltages applied to lines in a batch read in a semiconductor memory according to a ninth embodiment.

FIG. 87 shows an example of commands, and signals and voltages applied to each line in a case where the data allocation in the 21st modification of the sixth embodiment is applied and a batch read that includes the first page read and the second page read is performed.

First, the memory controller 20 sequentially transmits, for example, a command "yxh", a command "00h", address information ADD, and a command "30h" to the semiconductor memory 10.

The command "yxh" is a command instructing to perform a batch read for, for example, the first page and the second page. Upon reception of the command "30h", the semiconductor memory 10 changes to a busy state, and starts a batch read for the first page and the second page.

In the batch read in the eighth embodiment, the sequencer 14 simultaneously performs a first read operation for first plane PL1, a second read operation for second plane PL2, and a third read operation for third plane PL3 in parallel.

In the first read operation in the batch read, a read operation is performed using, for example, the read voltage BR as a read voltage for each of the first and the second pages, and a result of this read is retained in any of the latch circuits in each sense amplifier unit SAU in the sense amplifier module 17A.

In the second read operation in the batch read, a read operation is performed using, for example, the read voltage BR as a read voltage for each of the first and the second pages, and a result of this read is retained in any of the latch circuits in each sense amplifier unit SAU in the sense amplifier module 17B.

In the third read operation in the batch read, a read operation is performed using, for example, the read voltage BR as a read voltage for each of the first and the second pages, and a result of this read is retained in any of the latch circuits in each sense amplifier unit SAU in the sense amplifier module 17C.

Thereafter, the sequencer 14 changes the semiconductor memory 10 to a ready state. Subsequently, the memory controller 20 detects, for example, a change of the semiconductor memory 10 from a busy state to a ready state, and causes the semiconductor memory 10 to output the read data DAT by toggling the read enable signal REn.

At this time, each of the data output from first plane PL1, second plane PL2, and third plane PL3 are transferred to the logic circuit 18. Then, the logic circuit 18 determines the read data of the first page based on the definitions of the data in the 21st modification of the sixth embodiment and outputs the determined read data DAT to the memory controller 20.

Subsequently, when the second page read data is output, the data that is output from each of first plane PL1, second plane PL2, and third plane PL3 is the same as the first page read data; accordingly, the data is transferred to the logic circuit 18. Then, the logic circuit 18 determines the read data of the second page based on the definitions of the data in the 21st modification of the sixth embodiment and outputs the determined read data DAT to the memory controller 20.

FIG. 87 shows the case where the ready/busy signal RBn is not turned into a busy state between the timing of outputting first page data and the timing of outputting the second page data; however, the present embodiment is not limited to this case. For example, the sequencer 14 may temporarily change the semiconductor memory 10 to a busy state between the output of the first page data and the output of the second page data, so that a change of a page can be identified.

In order to prepare for data output, it is also possible to transfer the initial data of a cell unit CU to the vicinity of an output circuit by using a pipeline before the semiconductor memory 10 changes to a ready state. Since the only difference between the first page and the second page is the data definitions of the logic circuit 18, the first and second pages may be treated as data of one page.

The above-described operations in the ninth embodiment is applicable to the 19th, 20th, 22nd, 54th, and 59th modifications of the sixth embodiment, where the read voltages are the same in the first page read and the second page read.

[9-2] Advantageous Effects of Ninth Embodiment

As described above, in a read operation of one time, the semiconductor memory 10 of the ninth embodiment can output data of a plurality of pages by changing computing in the sequencer 14. Accordingly, the semiconductor memory 10 according to the ninth embodiment can omit a read operation as needed, and can reduce consumption power in a read operation.

[9-3] Modifications of Ninth Embodiment

In the ninth embodiment, an example of performing the read operation for two pages in a batch is explained; on the other hand, a combination of the ninth embodiment with the eighth embodiment enables the semiconductor memory 10 to obtain six pages of read data by performing read operations a minimum number of times.

(First Modification of Ninth Embodiment)

Figure 88:
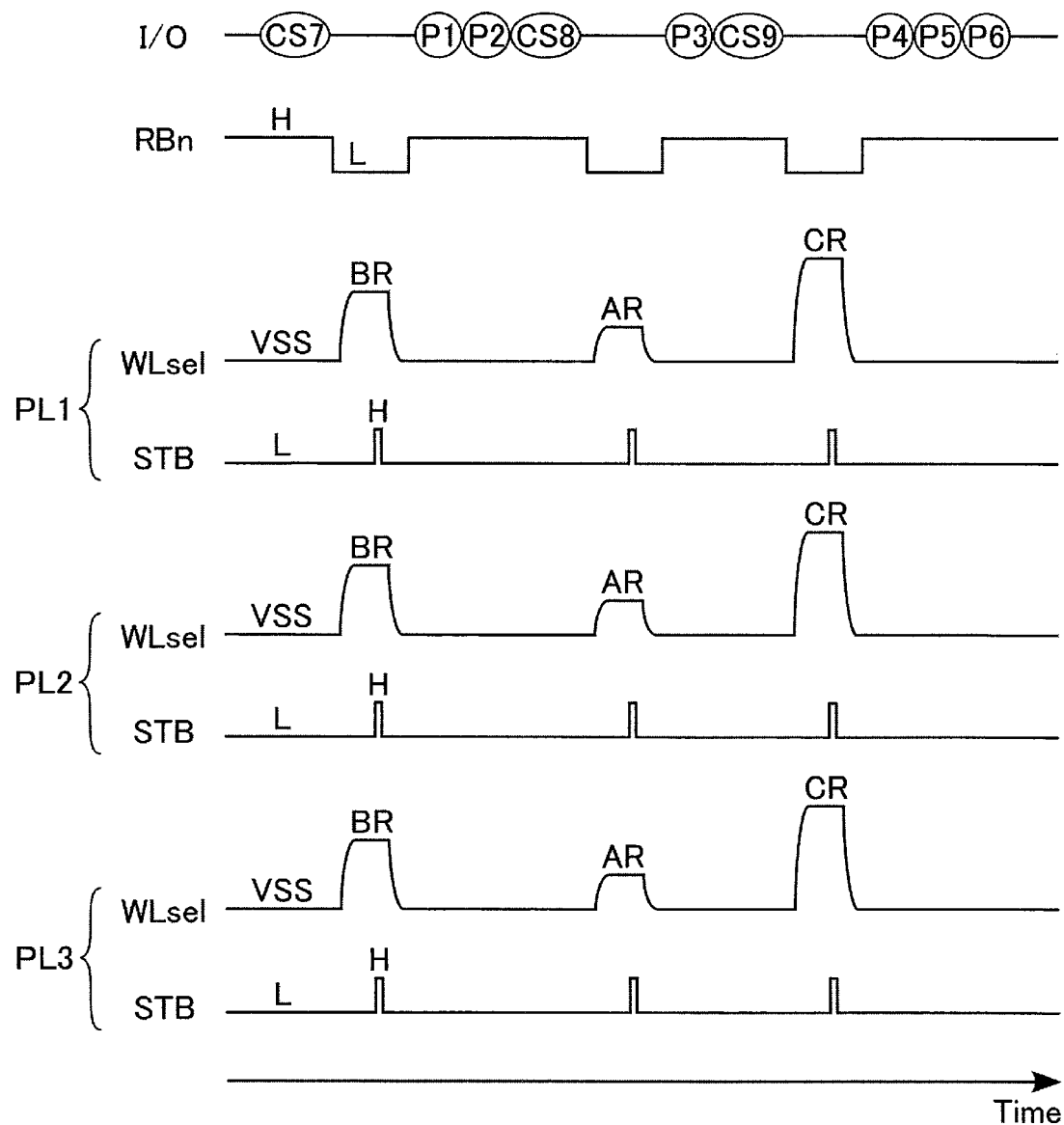
FIG. 88 is a timing chart showing an example of commands, and signals and voltages applied to lines in a batch read in the semiconductor memory according to the first modification of the ninth embodiment.

An example of the batch read in the semiconductor memory 10 according to the first modification of the ninth embodiment will be explained with reference to FIG. 88. FIG. 88 shows an example of commands, and signals and voltages applied to each line in a case where the data allocation in the 21st modification of the sixth embodiment is applied and 6-page data is successively read in a combination of the eighth embodiment and the ninth embodiment.

First, the memory controller 20 transmits a seventh command set CS7 to the semiconductor memory 10. The seventh command set CS7 includes a command instructing a batch read and address information, for example.

Upon reception of the seventh command set CS7, the semiconductor memory 10 changes to a busy state, and starts a batch read. This batch read is the same as the batch read explained with reference to FIG. 87 in the ninth embodiment, for example.

Specifically, a read operation is performed using, for example, the read voltage BR in each of first plane PL1, second plane PL2, and third plane PL3, and results of the read are retained in the latch circuit BDL of each sense amplifier unit SAU. These results of the read are also transferred to the latch circuit XDL in each sense amplifier unit SAU.

Then, the sequencer 14 outputs first page read data P1 and second page read data P2 based on the results of the read retained in the latch circuit XDL of the sense amplifier unit SAU in each of first plane PL1, second plane PL2, and third plane PL3, and the data definitions shown in, for example, the 21st modification of the sixth embodiment.

Next, the memory controller 20 transmits an eighth command set CS8 to the semiconductor memory 10. The eighth command set CS8 includes a command instructing a simplified read, and address information designating the same cell unit CU as an immediately-preceding read operation, for example.

Upon reception of the eighth command set CS8, the semiconductor memory 10 changes to a busy state, and starts a simplified read. This simplified read is the same as the simplified read explained with reference to FIG. 86 in the eighth embodiment, for example.

Specifically, a read operation using, for example, the read voltage AR is performed in each of first plane PL1, second plane PL2, and third plane PL3, and results of the read are retained in, for example, the latch circuit ADL of each sense amplifier unit SAU.

Then, the sequencer 14 causes the sense amplifier units in first plane PL1 to transfer the results of the read using the read voltage AR retained in the latch circuit ADL to the latch circuit XDL, causes the sense amplifier units in second plane PL2 to transfer the results of the read using the read voltage BR retained in the latch circuit BDL to the latch circuit XDL, and causes the sense amplifier units in third plane PL3 to transfer the results of the read using the read voltage AR retained in the latch circuit ADL to the latch circuit XDL, For the sense amplifier units SAU in second plane PL2, the operation of the transfer from the latch circuit BDL to the latch circuit XDL may be omitted, since the results of the read using the read voltage BR read remain in the latch circuit XDL after the first page read or the second page read.

Then, the sequencer 14 outputs third page read data P3 based on the result of the read retained in the latch circuit XDL of the sense amplifier unit SAU in each of first plane PL1, second plane PL2, and third plane PL3, and the data definitions shown in, for example, the 21st modification of the sixth embodiment.

Next, the memory controller 20 transmits a ninth command set CS9 to the semiconductor memory 10. The ninth command set CS9 includes a command instructing a simplified read, and address information designating the same cell unit CU as an immediately-preceding read operation, for example.

Upon reception of the ninth command set CS9, the semiconductor memory 10 changes to a busy state, and starts a simplified read. This simplified read is the same as the operation in which the read voltage is changed in the simplified read explained with reference to FIG. 86 in the eighth embodiment, for example.

Specifically, a read operation is performed using, for example, the read voltage CR in each of first plane PL1, second plane PL2, and third plane PL3, and results of the read are retained in, for example, the latch circuit SDL of each sense amplifier unit SAU.

Then, the sequencer 14 causes the sense amplifier units SAU in first plane PL1 to output the results of the read using the read voltage BR retained in, for example, the latch circuit BDL to the latch circuit XDL, causes the sense amplifier units in second plane PL2 to transfer the results of the read using the read voltage AR retained in the latch circuit ADL to the latch circuit XDL, and causes the sense amplifier units in third plane PL3 to transfer the results of the read using the read voltage CR retained in the latch circuit SDL to the latch circuit XDL.

Thereafter, the sequencer 14 outputs fourth page read data P4 based on the results of the read retained in the latch circuit XDL of the sense amplifier unit SAU in each of first plane PL1, second plane PL2, and third plane PL3, and the data definitions shown in, for example, the 21st modification of the sixth embodiment.

Next, the sequencer 14 causes the sense amplifier units SAU in first plane PL1 to output the results of the read using the read voltage BR retained in, for example, the latch circuit BDL to the latch circuit XDL, causes the sense amplifier units in second plane PL2 to transfer the results of the read using the read voltage CR retained in the latch circuit SDL to the latch circuit XDL, and causes the sense amplifier units in third plane PL3 to transfer the results of the read using the read voltage CR retained in the latch circuit SDL to the latch circuit XDL.

Thereafter, the sequencer 14 outputs fifth page read data P5 based on the results of the read retained in the latch circuit XDL of the sense amplifier unit SAU in each of first plane PL1, second plane PL2, and third plane PL3, and the data definitions shown in, for example, the 21st modification of the sixth embodiment.

Next, the sequencer 14 causes the sense amplifier units in first plane PL1 to transfer the results of the read using the read voltage CR retained in the latch circuit SDL to the latch circuit XDL, causes the sense amplifier units in second plane PL2 to transfer the results of the read using the read voltage BR retained in the latch circuit BDL to the latch circuit XDL, and causes the sense amplifier units in third plane PL3 to transfer the results of the read using the read voltage AR retained in the latch circuit ADL to the latch circuit XDL.

Thus, the sequencer 14 outputs sixth page read data P6 based on the result of the read retained in the latch circuit XDL of the sense amplifier unit SAU in each of first plane PL1, second plane PL2, and third plane PL3, and the data definitions shown in, for example, the 21st modification of the sixth embodiment.

After the data is transferred from the latch circuits XDL of the sense amplifier units SAU in first plane PL1, second plane PL2, and third plane PL3, the fourth page read data P4, the fifth page read data P5, and the sixth page read data P6 are ready to be output; accordingly, the sequencer 14 changes the semiconductor memory 10 from a busy state to a ready state. Thereafter, the fourth page read data P4, the fifth page read data P5, and the sixth page read data P6 are output in order to the memory controller 20 based on the data definitions shown in, for example, the 21st modification of the sixth embodiment.

As explained above, the semiconductor memory 10 according to the first modification of the ninth embodiment can reduce the number of times of read operations when consecutive pages are selected in the same cell unit CU. Accordingly, the semiconductor memory 10 according to the first modification of the ninth embodiment can reduce consumption power in a read operation, and can increase the speed of the read operation.

The example where each of the fourth page read data P4, the fifth page read data P5, and the sixth page read data P6 are retained in a buffer region provided in the semiconductor memory 10 is explained in the above; however, the present embodiment is not limited to this example.

The above operation in the first modification of the ninth embodiment may be applied to the 22nd modification of the sixth embodiment. The operation in the first modification of the ninth embodiment is applicable to each of the 19th, 20th, 54th, and 59th modifications if the order of applied read voltages is changed.

(Second Modification of Ninth Embodiment)

Figure 89:
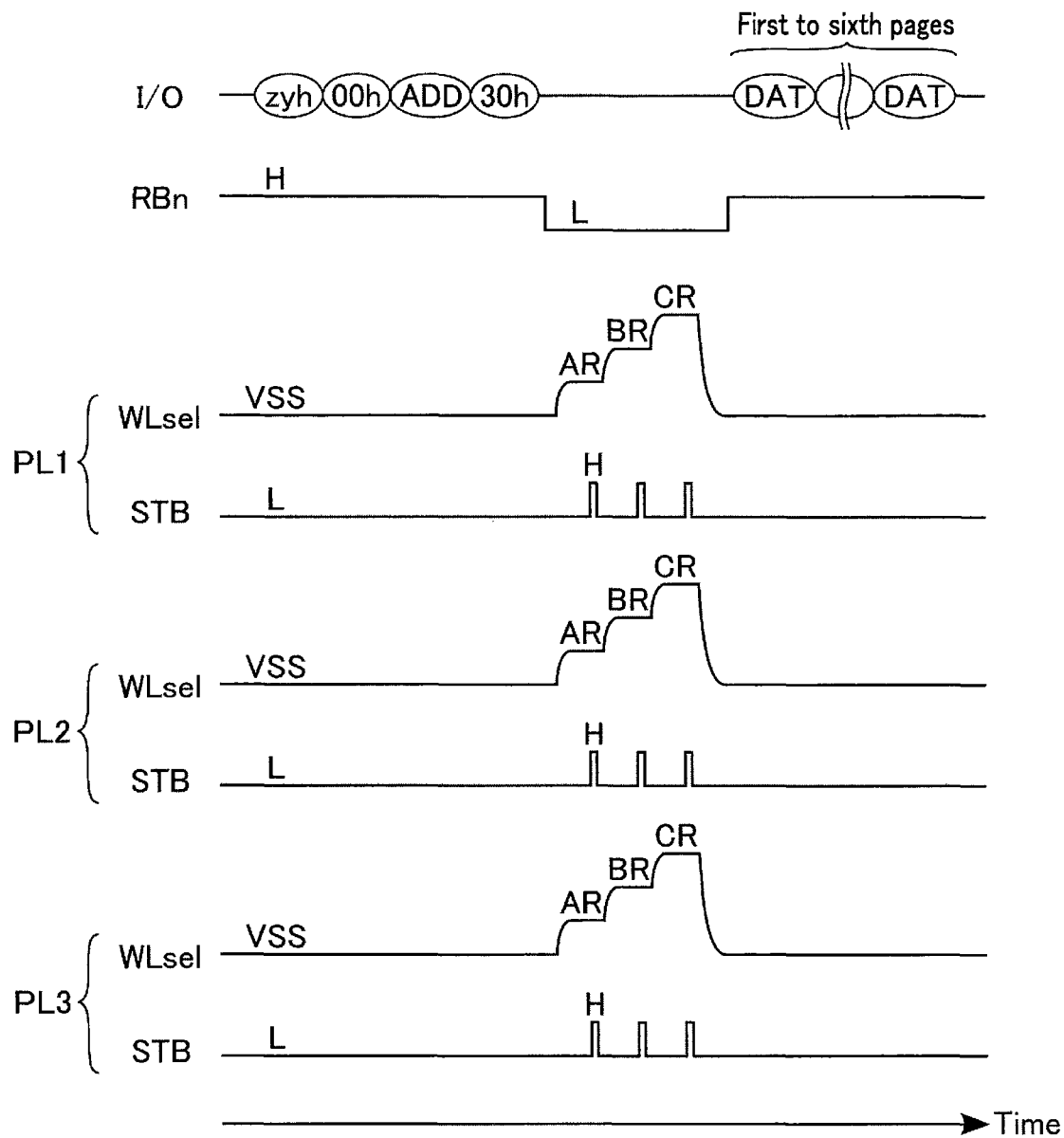
FIG. 89 is a timing chart showing an example of commands, and signals and voltages applied to lines in a batch read in the semiconductor memory according to the second modification of the ninth embodiment.

Next, an example of the batch read in the semiconductor memory 10 according to the second modification of the ninth embodiment will be explained with reference to FIG. 89. FIG. 89 shows an example of commands, and signals and voltages applied to each line in a case where the data allocation in the 21st modification of the sixth embodiment is applied and 6-page data is read in a batch.

First, the memory controller 20 sequentially transmits, for example, a command "zyh", a command "00h", address information ADD, and a command "30h" to the semiconductor memory 10. The command "zyh" is a command instructing to perform a batch read for, for example, the first page through the sixth page. Upon reception of the command "30h", the semiconductor memory 10 changes to a busy state, and starts a batch read.

In the batch read in the second modification of the ninth embodiment, the sequencer 14 simultaneously performs a first read operation for first plane PL1, a second read operation for second plane PL2, and a third read operation for third plane PL3 in parallel.

In the first read operation of the batch read, read operations respectively using, for example, the read voltages AR, BR, and CR are performed in order. For example, results of the read using the read voltages AR, BR, and CR are respectively retained in the latch circuits ADL, BDL, and SDL of the sense amplifier units SAU in the sense amplifier modules 17A.

In the second read operation of the batch read, read operations respectively using, for example, the read voltages AR, BR, and CR are performed in order. For example, results of the read using the read voltages AR, BR, and CR are respectively retained in the latch circuits ADL, BDL, and SDL of the sense amplifier units SAU in the sense amplifier modules 17B.

In the third read operation of the batch read, read operations respectively using, for example, the read voltages AR, BR, and CR are performed in order. For example, results of the read using the read voltages AR, BR, and CR are respectively retained in the latch circuits ADL, BDL, and SDL of the sense amplifier units SAU in the sense amplifier modules 17C.

Then, similar to the first modification of the ninth embodiment, the semiconductor memory 10 determines the first page read data, the second page read data, the third page read data, the fourth page read data, the fifth page read data, and the sixth page read data, and the data are retained in the buffer region provided in the semiconductor memory 10. Thereafter, the semiconductor memory 10 outputs the data of six pages to the memory controller 20 in order based on the control of the memory controller 20.

In the second modification of the ninth embodiment, as a method of outputting read data of six pages, the semiconductor memory 10 may output determined page data to the memory controller 20 one by one, as described in the first modification of the ninth embodiment.

[10] Tenth Embodiment

A semiconductor memory 10 according to the tenth embodiment stores 4-bit data using a combination of two memory cell transistors MT. In the following, differences of the semiconductor memory 10 according to the tenth embodiment from the first to ninth embodiments will be described.

[10-1] Configuration

[10-1-1] Configuration of Semiconductor Memory 10

FIG. 90 shows a configuration example of the semiconductor memory 10 according to the tenth embodiment. As shown in FIG. 90, the semiconductor memory 10 according to the tenth embodiment includes the configuration of the semiconductor memory 10 according to the first embodiment explained with reference to FIG. 1, and a data conversion circuit 80.

The data conversion circuit 80 is controlled by the sequencer 14, and is coupled to a data bus that serves as a communication path for write data DAT, etc. In other words, the data conversion circuit 80 is indirectly coupled to the sense amplifier modules 17A and 17B.

In a write operation, the data conversion circuit 80 converts write data DAT received from the memory controller 20 from 16 states into 15 states. This conversion process will be described later in detail. The data conversion circuit 80 may have a function as a buffer circuit capable of storing data of at least one page.

[10-1-2] Threshold Distributions of Memory Cell Transistor MT

FIG. 91 shows an example of threshold distributions of the memory cell transistors MT, read voltages, and verify voltages in the semiconductor memory 10 according to the tenth embodiment. As shown in FIG. 91, in the threshold distributions in the tenth embodiment, a "D" state, which is higher than the "C" state, is added to the threshold distributions explained with reference to FIG. 67 in the sixth embodiment.

Furthermore, in the threshold distributions in the tenth embodiment, a read voltage DR is set between the "C" state and "D" state, and a verify voltage DV is set in accordance with the "D" state. Specifically, the read voltage DR is set between a maximum threshold voltage in the "C" state and a minimum threshold voltage in the "D" state. The verify voltage DV is set between a maximum threshold voltage in the "C" state and a minimum threshold voltage in the "D" state, and in the vicinity of the "D" state. The read pass voltage VREAD in the tenth embodiment is set to a voltage higher than a maximum threshold voltage in the "D" state.

[10-1-3] Data Allocation

FIG. 92 shows an example of a data allocation for the threshold distributions of the memory cell transistors MT in the semiconductor memory 10 according to the tenth embodiment.

As shown in FIG. 92, in the semiconductor memory 10 according to the tenth embodiment, 25 combinations are possible by combining five threshold voltages in the memory cell transistors MT corresponding to first plane PL1 with five threshold voltages in the memory cell transistors MT corresponding to second plane PL2. Furthermore, in the semiconductor memory 10 according to the tenth embodiment, 4-bit data is allocated to each of the 25 combinations of threshold voltages as shown below:

(Example) "threshold voltage of memory cell transistors MT in first plane PL1", "threshold voltage of memory cell transistors MT in second plane PL2": "first bit/second bit/third bit/fourth bit" data (1) "Z" state, "Z" state: "1111" data
(2) "Z" state, "A" state: "1101" data
(3) "Z" state, "B" state: "0101" data
(4) "Z" state, "C" state: "0100" data
(5) "Z" state, "D" state: "0000" data
(6) "A" state, "Z" state: "0111" data
(7) "A" state, "A" state: "0101" data
(8) "A" state, "B" state: "1101" data
(9) "A" state, "C" state: "1100" data
(10) "A" state, "D" state: "1000" data
(11) "B" state, "Z" state: "0011" data
(12) "B" state, "A" state: "0001" data
(13) "B" state, "B" state: "1001" data
(14) "B" state, "C" state: "1000" data
(15) "B" state, "D" state: "1100" data
(16) "C" state, "Z" state: "0001" data
(17) "C" state, "A" state: "0011" data
(18) "C" state, "B" state: "1011" data
(19) "C" state, "C" state: "1010" data
(20) "C" state, "D" state: "1110" data
(21) "D" state, "Z" state: "0000" data
(22) "ID" state, "A" state: "0010" data
(23) "D" state, "B" state: "1010" data
(24) "D" state, "C" state: "1011" data
(25) "D" state, "D" state: "1111" data
(26) Null combination: "0110" data As shown above, 15 types of 4-bit data are allocated to the 25 combinations of the threshold voltages in the tenth embodiment. Specifically, 10 different types of 4-bit data are redundantly allocated to the following sets of combinations: (1) and (25); (2) and (8); (3) and (7); (5) and (21); (9) and (15); (10) and (14); (11) and (17); (12) and (16); (18) and (24); and (19) and (23). Five types of 4-bit data are uniquely allocated to the combinations (4), (6), (13), (20), and (22).

Thus, it is possible to store 15 types (10 types+5 types) of 4-bit data with the data allocation in the tenth embodiment, whereas there is 4-bit data (for example "0110" in the above list) that cannot be allocated to a combination of threshold distributions in first plane PL1 and second plane PL2.

Accordingly, in the semiconductor memory 10 according to the tenth embodiment, 16 types of 4-bit data (16 states) that are externally obtained are stored as 15 types of 4-bit data (15 states) by making a page longer. In the tenth embodiment, the details of this method will be described.

FIG. 93 shows read voltages that are set for the above-described data allocation, and definitions of read data that are applied to results of reading each page.

As shown in FIG. 93, the read voltages AR and BR are used for the first page read in first plane PL1 and in second plane PL2. In the second page read, the read voltages BR and DR are used in first plane PL1 and in second plane PL2. In the third page read, the read voltages CR and AR are used in first plane PL1 and in second plane PL2. In the fourth page read, the read voltages DR and CR are used in first plane PL1 and in second plane PL2.

The read data based on results of the read operations in first plane PL1 and in second plane PL2 is defined as follows:

(Example) Read operation: (result of reading first plane PL1, result of reading second plane PL2, read data)×4 types First page read: (L, L, 1), (L, H, 0), (H, L, 0), (H, H, 1)
Second page read: (L, L, 1), (L, H, 0), (H, L, 0), (H, H, 1)
Third page read: (L, L, 1), (L, H, 0), (H, L, 0), (H, H, 1)
Fourth page read: (L, L, 1), (L, H, 0), (H, L, 0), (H, H, 1)

FIG. 94 provides a table summarizing the read voltages that are set in accordance with the data allocation, and a table summarizing the results of the read operations carried out in accordance with the set read voltages. In the semiconductor memory 10 according to the tenth embodiment, data corresponding to each of (1) to (25) in FIG. 92 is determined by applying the data definitions shown in FIG. 93 to the results of read operation shown in FIG. 94.

[10-2] Operation
[10-2-1] Write Operation

FIG. 95 shows an example of commands, and signals and voltages applied to the lines in a write operation in the semiconductor memory 10 according to the tenth embodiment. The write operation in the tenth embodiment is the same as the write operation in the first embodiment explained with respect to FIG. 11, except for the commands and the process of converting 16 states to 15 states.

Specifically, as shown in FIG. 95, the memory controller 20 transmits a first command set CS1, a second command set CS2, a third command set CS3, and a fourth command set CS4, in order.

The command sets CS1 through CS4 include commands for instructing an operation for the first to fourth pages respectively, and include write data DAT to be written in the first to fourth pages respectively. Upon reception of the command sets CS1 to CS3, the semiconductor memory 10 first transfers the received write data DAT to the data conversion circuit 80.

Then, the data conversion circuit 80 performs conversion on the transferred write data DAT from 16 states into 15 states. Herein, the details of the conversion process in the write operation in the tenth embodiment will be described.

The data allocation applied to the write data DAT transmitted from the memory controller 20 to the semiconductor memory 10 has 16 types of 4-bit data (16 states). In the semiconductor memory 10 according to the tenth embodiment on the other hand, as explained in the above with reference to FIG. 92, only 15 types of 4-bit data (15 states) can be distinguished. In other words, if the write data DAT received from the memory controller 20 is used without converting, the semiconductor memory 10 cannot store, for example, 4-bit data corresponding to "0110" data.

To avoid this, the data conversion circuit 80 converts the 16 states into 15 states in a write operation, so that the 16 states can be stored in 15 states. The data conversion circuit 80 in the conversion process increases an amount of data in a page, and allocates, as increased data, data obtained by randomizing the 4-bit data corresponding to "0110" to the page. In other words, the "0110" data included in the write data is randomized and allocated to other data allocation shown in FIG. 92, thereby storing the "0110" data in the memory cell transistors MT. An example of changes in an amount of data as a result of the conversion process is shown in FIG. 96.

For example, as shown in FIG. 96, the data conversion circuit 80 converts the data of 1024 bytes (1 kB) and outputs data of 1093 bytes having an increase of 69 bytes.

Specifically, 64 bytes of the 1024-byte data, for example, may correspond to the "0110" data; accordingly, an addition of 64 bytes is first required. For example, 4 bytes of the 64 bytes may correspond to the "0110" data; accordingly, a further addition of 4 bytes is required. For example, 2 bits of the 4 bytes (32 bits) may correspond to the "0110" data; accordingly, an addition of 1 byte is required (herein, 2 bits are rounded up to 1 byte). As a result, an increased amount of the data by the conversion process is, for example, 64 bytes+4 bytes+1 byte=69 bytes in total.

Similarly, if the conversion is performed on, for example, data of 2048 bytes (2 kB), the data conversion circuit 80 outputs 2185 bytes having an increase of 137 bytes; if the conversion is performed on, for example, data of 4096 bytes (4 kB), the data conversion circuit 80 outputs 4370 bytes having an increase of 274 bytes; if the conversion is performed on, for example, data of 8192 bytes (8 kB), the data conversion circuit 80 outputs 8739 bytes having an increase of 547 bytes; if the conversion is performed on, for example, data of 16384 bytes (16 kB), the data conversion circuit 80 outputs 17477 bytes having an increase of 1093 bytes.

The data converted by the data conversion circuit 80, in other words the write data having an increased amount, is transferred to the latch circuit XDL of the sense amplifier units SAU in each of the sense amplifier module 17A and the sense amplifier module 17B.

At this time, a cycle of transferring converted write data from the data conversion circuit 80 to the latch circuit XDL of each of the sense amplifier modules 17A and 17B is controlled at a higher rate than the cycle of transferring the write data DAT received from the memory controller 20 from the input/output circuit of the semiconductor memory 10 to the data conversion circuit 80.

The explanation above corresponds to an operation that starts with the conversion performed by the data conversion circuit 80 on the write data DAT included in one command set CS received by the semiconductor memory 10, and finishes with the transfer of the converted write data to the latch circuit XDL of a sense amplifier unit SAU of each sense amplifier module 17.

Thereafter, when the converted write data is transferred to the latch circuit XDL of the sense amplifier unit SAU of each sense amplifier module 17, the semiconductor memory 10 temporarily changes to, for example, a busy state, and transfers the converted write data to the other latch circuits in the sense amplifier unit SAU.

Returning to FIG. 95, upon reception of the fourth command set CS4, the semiconductor memory 10 transfers the received write data DAT to the data conversion circuit 80.

Thereafter, the sequencer 14 transfers the write data DAT to the latch circuit XDL of the sense amplifier unit SAU in each of the sense amplifier modules 17A and 17B through the conversion process of the data conversion circuit 80. Then, the semiconductor memory 14 changes to a busy state, and performs a write operation based on the write data of the first to fourth pages retained in the latch circuits in the sense amplifier modules 17A and 17B.

Specifically, the sequencer 14 simultaneously performs a first write operation for first plane PL1, and a second write operation for second plane PL2 in parallel based on the write data of the first to fourth pages.

In the first and second write operations, write-targeted and write-inhibited memory cell transistors MT are set based on the data allocation shown in FIG. 92, and the sequencer 14 performs a program loop. Since the details of the first and second write operations are the same as the first write operation of the first embodiment described with reference to FIG. 11, detailed descriptions are omitted.

When the first and second write operations are finished, each of the threshold voltages of the memory cell transistors MT in a cell unit CU selected in first plane PL1 and the threshold voltages of the memory cell transistors MT in a cell unit CU selected in second plane PL2 form five threshold distributions like those shown in FIG. 91. Then, the sequencer 14 finishes the write operation when detecting the completion of each of the first and second write operations, and changes the semiconductor memory 10 to the ready state.

[10-2-2] Read Operation (First Page Read)

Figure 97:
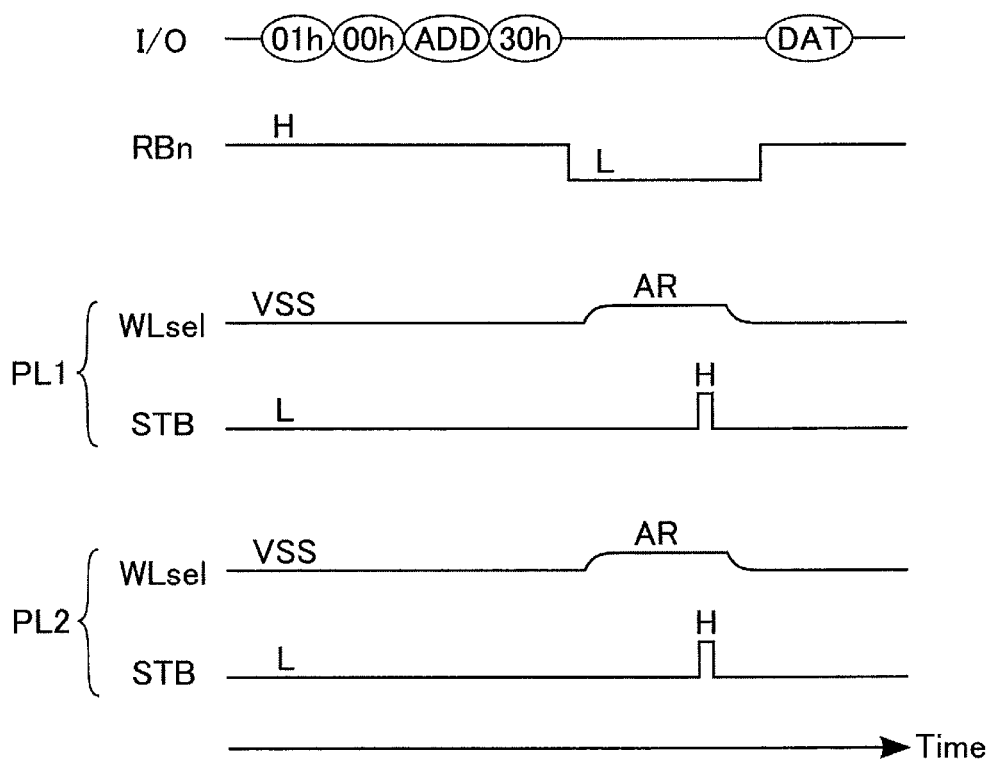
FIG. 97 is a timing chart showing an example of commands, and signals and voltages applied to lines in a first page read in the semiconductor memory according to the tenth embodiment.

FIG. 97 shows an example of commands, and signals and voltages applied to the lines in the first page read in the semiconductor memory 10 according to the tenth embodiment.

As shown in FIG. 97, first, the memory controller 20 sequentially transmits, for example, a command "01h", a command "00h", address information ADD, and a command "30h" to the semiconductor memory 10. Upon reception of the command "30h", the semiconductor memory 10 changes to a busy state, and starts the first page read.

In the first page read in the tenth embodiment, the sequencer 14 simultaneously performs a first read operation for first plane PL1 and a second read operation for second plane PL2 in parallel.

In the first read operation in the first page read, a read operation using, for example, the read voltage AR is performed, and a result of this read is retained in any of the latch circuits in each sense amplifier unit SAU in the sense amplifier module 17A.

In the second read operation in the first page read, a read operation using, for example, the read voltage AR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects, for example, a change of the semiconductor memory 10 from a busy state to a ready state the memory controller 20 causes the semiconductor memory 10 to output the read data DAT by toggling the read enable signal REn.

At this time, the data output from first plane PL1 and second plane PL2 are transferred to the logic circuit 18. Then, the logic circuit 18 determines the read data of the first page based on the definitions of the data shown in FIG. 93, and transfers the determined read data DAT to the data conversion circuit 80.

The data conversion circuit 80 performs conversion on the read data received from 15 states into 16 states. In other words, the conversion process in this read operation is opposite to the conversion process performed in the write operation.

Specifically, in the tenth embodiment, if, for example, the read data has 1093 bytes, 69 bytes of the 1093 bytes, in other words, data corresponding to "0110" data, is set as invalid data.

Accordingly, in the read operation, the data conversion circuit 80 performs conversion to exclude these invalid 69 bytes from the 1093 bytes, for example. Then, the data conversion circuit 80 outputs the read data having 1024 bytes as a result of the conversion to the outside of the circuit.

The sequencer 14 may control the cycle of transferring the converted read data DAT from the data conversion circuit 80 to the input/output circuit of the semiconductor memory 10 at a rate lower than the cycle of transferring the determined read data from the sequencer 14 to the data conversion circuit 80.

(Second Page Read)

Figure 98:
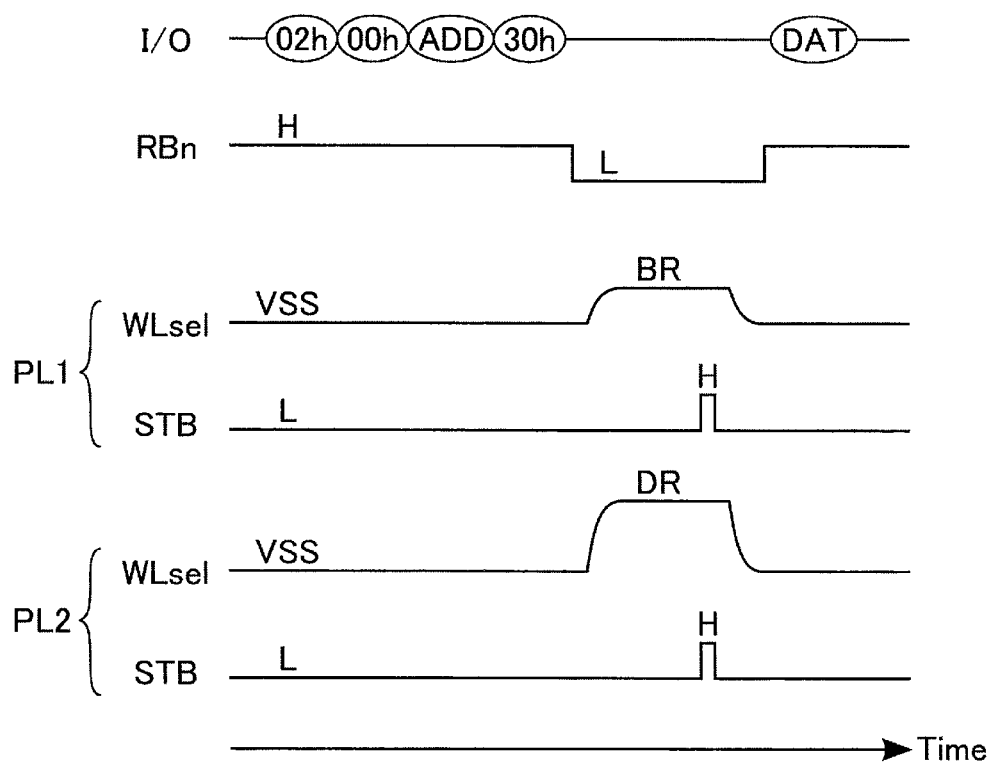
FIG. 98 is a timing chart showing an example of commands, and signals and voltages applied to lines in a second page read in the semiconductor memory according to the tenth embodiment.

FIG. 98 shows an example of commands, and signals and voltages applied to the lines in the second page read in the semiconductor memory 10 according to the tenth embodiment.

As shown in FIG. 98, first, the memory controller 20 sequentially transmits, for example, a command "02h", a command "00h", address information ADD, and a command "30h" to the semiconductor memory 10. Upon reception of the command "30h", the semiconductor memory 10 changes to a busy state, and starts the second page read.

In the second page read in the tenth embodiment, the sequencer 14 simultaneously performs a first read operation for first plane PL1 and a second read operation for second plane PL2 in parallel.

In the first read operation in the second page read, a read operation using, for example, the read voltage BR is performed, and a result of this read is retained in any of the latch circuits in each sense amplifier unit SAU in the sense amplifier module 17A.

In the second read operation in the second page read, a read operation using, for example, the read voltage DR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects, for example, a change of the semiconductor memory 10 from a busy state to a ready state, and the memory controller 20 causes the semiconductor memory 10 to output the read data DAT by toggling the read enable signal REn.

At this time, the data output from first plane PL1 and second plane PL2 are transferred to the logic circuit 18. Then, the logic circuit 18 determines the second page read data based on results of each of the first and second read operations and the data definitions shown in FIG. 93. Since the other operations in the second page read in the tenth embodiment are the same as those in the first read operation explained with reference to FIG. 97, detailed descriptions of the operations are omitted.

(Third Page Read)

FIG. 99 shows an example of commands, and signals and voltages applied to the lines in the third page read in the semiconductor memory 10 according to the tenth embodiment.

As shown in FIG. 99, first, the memory controller 20 sequentially transmits, for example, a command "03h", a command "00h", address information ADD, and a command "30h" to the semiconductor memory 10. Upon reception of the command "30h", the semiconductor memory 10 changes to a busy state, and starts the third page read.

In the third page read in the tenth embodiment, the sequencer 14 simultaneously performs a first read operation for first plane PL1 and a second read operation for second plane PL2 in parallel.

In the first read operation in the third page read, a read operation using, for example, the read voltage CR is performed, and a result of this read is retained in any of the latch circuits in each sense amplifier unit SAU in the sense amplifier module 17A.

In the second read operation in the third page read, a read operation using, for example, the read voltage AR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects, for example, a change of the semiconductor memory 10 from a busy state to a ready state the memory controller 20 causes the semiconductor memory 10 to output the read data DAT by toggling the read enable signal REn.

At this time, the data output from first plane PL1 and second plane PL2 are transferred to the logic circuit 18. Then, the logic circuit 18 determines the third page read data based on results of each of the first and second read operations and the data definitions shown in FIG. 93. Since the other operations in the third page read in the tenth embodiment are the same as those in the first read operation explained with reference to FIG. 97, detailed descriptions of the operations are omitted.

(Fourth Page Read)

FIG. 100 shows an example of commands, and signals and voltages applied to the lines in the fourth page read in the semiconductor memory 10 according to the tenth embodiment.

As shown in FIG. 100, first, the memory controller 20 sequentially transmits, for example, a command "03h", a command "00h", address information ADD, and a command "30h" to the semiconductor memory 10. Upon reception of the command "30h", the semiconductor memory 10 changes to a busy state, and starts the fourth page read.

In the fourth page read in the tenth embodiment, the sequencer 14 simultaneously performs a first read operation for first plane PL1 and a second read operation for second plane PL2 in parallel.

In the first read operation in the fourth page read, a read operation using, for example, the read voltage DR is performed, and a result of this read is retained in any of the latch circuits in each sense amplifier unit SAU in the sense amplifier module 17A.

In the second read operation in the fourth page read, a read operation using, for example, the read voltage CR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects, for example, a change of the semiconductor memory 10 from a busy state to a ready state the memory controller 20 causes the semiconductor memory 10 to output the read data DAT by toggling the read enable signal REn.

At this time, the data output from first plane PL1 and second plane PL2 are transferred to the logic circuit 18. Then, the logic circuit 18 determines the fourth page read data based on results of each of the first and second read operations and the data definitions shown in FIG. 93. Since the other operations in the fourth page read in the tenth embodiment are the same as those in the first read operation explained with reference to FIG. 97, detailed descriptions of the operations are omitted.

[10-3] Advantageous Effects of Tenth Embodiment

As described above, the semiconductor memory 10 according to the tenth embodiment includes two independently-controllable planes, and stores 4-bit data using a set of two memory cell transistors MT respectively included in different planes.

Furthermore, in the semiconductor memory 10 of the tenth embodiment, the first page read data, the second page read data, the third page read data, and the fourth page read data are determined by a read operation using one read voltage for each plane.

Thus, in the semiconductor memory 10 according to the tenth embodiment, it is possible to store data larger than data stored in one memory cell transistor MT in the first embodiment, and to determine read data only by applying one read voltage per plane.

Therefore, the semiconductor memory 10 according to the tenth embodiment can increase capacity for storage in each plane compared to the first embodiment.

Each of the conversion from the 16 states into the 15 states and the conversion from the 15 states into the 16 states as explained in the tenth embodiment may be performed using a different method. For example, the data conversion circuit 80 may have a table for converting between the 16 states and the 15 states, and the data conversion circuit 80 may perform conversion based on this table.

An example where the conversion of the write data in the write operation and the conversion of the read data in the read operation are performed by the data conversion circuit 80 is explained in the above; however, the semiconductor memory 10 according to the tenth embodiment is not limited to this example. For example, a circuit corresponding to the data conversion circuit 80 may be provided in the memory controller 20, or the CPU 22 may have a function similar to the data conversion circuit 80 to perform the conversion process explained in the tenth embodiment.

In this case, the memory controller 20 in the write operation converts the write data received from an external host device based on the data allocation shown in FIG. 92, for example, and the CPU 22 performs the conversion. Then, the memory controller 20 transmits the write data converted by the CPU 22, that is, the increased data, which is larger than the write data received from the host device, to the semiconductor memory 10.

In the read operation, the read data that is output from the semiconductor memory 10 includes invalid data. Accordingly, the CPU 22 performs, on the read data received from the semiconductor memory 10, a conversion process similar to the conversion performed by the data conversion circuit

80 explained in the tenth embodiment. The memory controller 20 thereby obtains read data from which invalid data is excluded.

[10-4] Modification of Tenth Embodiment

In the above description, the externally-received 16 types of 4-bit data (16 states) are stored as 15 types of 4-bit data (15 states) by making a page longer; however, the tenth embodiment is not limited thereto.

For example, in the data allocation shown in FIG. 92, the threshold voltages of the memory cell transistors MT in both of first plane PL1 and second plane PL2 are in the "Z" state in (1), and the threshold voltages of the memory cell transistors MT in both of first plane PL1 and second plane PL2 are in the "D" state in (25).

Accordingly, the semiconductor memory 10 according to a modification of the tenth embodiment allocates "0110 (first bit/second bit/third bit/fourth bit)" data to either the threshold voltage combination (1) or (25). For example, "0110" data is allocated to the combination (1), and "1111" data is allocated to the combination (25).

In this case, in the combination (1), the output data from each of the second page read and the third page read is "1"; accordingly, no problem will arise. On the other hand, in the combination (1), the output data from each of the first page read and the fourth page read is correctly "0", but is determined to be "1".

However, the threshold voltages of the memory cell transistors MT written in the "Z" state are lower than the other threshold voltages. In other words, a cell current at which the memory cell transistors MT that are written in the "Z" state are turned on is larger than a cell current at which the memory cell transistors MT in the other states are turned on. An example of this operation will be explained with reference to FIG. 101.

Figure 101:
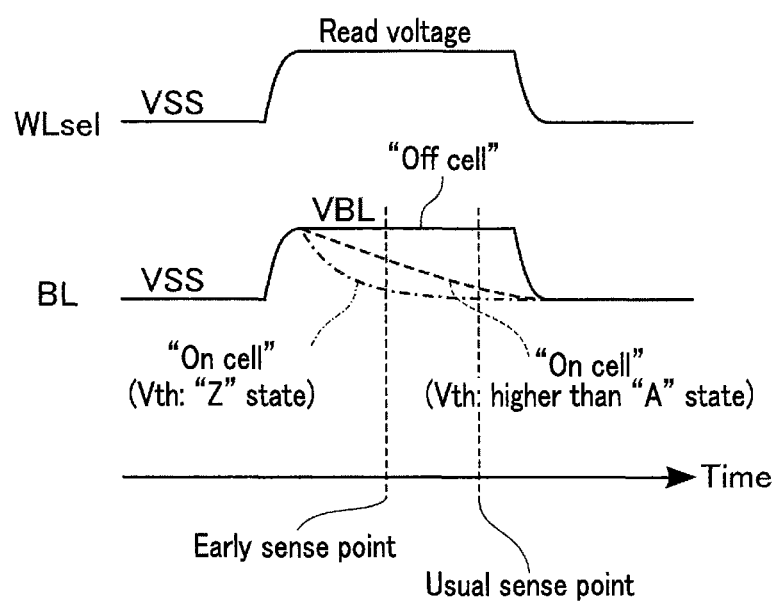
FIG. 101 is a timing chart showing an example of a voltage of a selected word line and a voltage of a bit line in a read operation in the semiconductor memory according to a modification of the tenth embodiment.

FIG. 101 indicates each of a voltage of a selected word line WLsel to which a read voltage is applied, and a voltage of a corresponding bit line BL. As shown in FIG. 101, a read voltage is applied to the selected word line WLsel, and the voltage VBL is applied to the bit line BL. The voltage VBL is a voltage applied by the sense amplifier module 19 to a bit line BL in a read operation. When the read voltage is applied to the selected word line WLsel, the voltage of the bit line BL may be changed in accordance with the threshold voltage of the memory cell transistor MT coupled to the selected word line WLsel.

For example, the voltage of the bit line BL which is coupled to the memory cell transistor MT in an off state is maintained at the voltage VBL. The voltage of the bit line BL that is coupled to the memory cell transistor in an on state drops down from the voltage VBL. The speed of this voltage drop is higher in a bit line BL corresponding to an "A"-state memory cell transistor MT than in a bit line BL corresponding to a "Z"-state memory cell transistor MT. Furthermore, the voltage of the bit line BL corresponding to the "Z"-state memory cell transistor drops down to the voltage VSS ("L" level) more rapidly than the voltage of the other bit lines BL.

Accordingly, the semiconductor memory 10 according to the modification of the tenth embodiment determines a result of each of the first page read and the fourth page read to be "0" if the memory cell transistors MT in both of first plane PL1 and second plane PL2 are in the "Z" state. Since the bit line BL corresponding to the "Z"-state memory cell transistors MT drops down to the "L" level early, the semiconductor memory 10 may determine, at a sense point provided earlier than a usual sense point, whether or not the threshold voltages of the memory cell transistors MT are in the "Z" state.

Thus, the semiconductor memory 10 distinguishes the memory cell transistors MT that turn to "1" among the memory cell transistors MT in an on state, and if both of first plane PL1 and second plane PL2 become "1" in the first page read and the fourth page read, the logic circuit 90 determines a result is "0".

If the above-explained method is adopted, it is preferable that a combination using the "Z" state is not used among the combinations of the threshold voltage of the memory cell transistors MT in first plane PL1 and the threshold voltage of the memory cell transistors MT in second plane PL2.

For example, "1101" data is allocated to the combinations (2) ("Z" state and "A" state) and to the combination (8) ("A" state and "B" state) in FIG. 92; however, since the combination (2) includes the "Z" state, using the combination (8) is preferable. Similarly, except for the combination (1) to which "0110" data is allocated, a combination using the "Z" state should be avoided as much as possible, so that an error operation in the determination method described with reference to FIG. 101 can be prevented.

Even when the above-described data allocation is used, the semiconductor memory 10 is capable of storing 4-bit data in a set of two memory cell transistors MT.

In the tenth embodiment, the data allocation shown in FIG. 93 is explained as an example; however, a different data allocation may be applied to the threshold distributions of the memory cell transistors MT. The data allocation according to the tenth embodiment will be described below.

FIG. 102 shows an example of a data allocation for the threshold distributions of the memory cell transistors MT in a modification of the tenth embodiment. As shown below and in FIG. 102, 4-bit data is allocated to each of the 25 combinations of threshold voltages in the modification of the tenth embodiment:

(1) "Z" state, "Z" state: "1110" data
(2) "Z" state, "A" state: "1100" data
(3) "Z" state, "B" state: "1100" data
(4) "Z" state, "C" state: "1101" data
(5) "Z" state, "D" state: "1101" data
(6) "A" state, "Z" state: "1110" data
(7) "A" state, "A" state: "1100" data
(8) "A" state, "B" state: "0100" data
(9) "A" state, "C" state: "0101" data
(10) "A" state, "D" state: "0101" data
(11) "B" state, "Z" state: "1010" data
(12) "B" state, "A" state: "1000" data
(13) "B" state, "B" state: "0000" data
(14) "B" state, "C" state: "0001" data
(15) "B" state, "D" state: "0101" data
(16) "C" state, "Z" state: "1000" data
(17) "C" state, "A" state: "1010" data
(18) "C" state, "B" state: "0010" data
(19) "C" state, "C" state: "0011" data
(20) "C" state, "D" state: "0111" data
(21) "D" state, "Z" state: "1001" data
(22) "D" state, "A" state: "1011" data
(23) "D" state, "B" state: "0011" data
(24) "D" state, "C" state: "0010" data
(25) "D" state, "D" state: "0110" data
(26) Null combination: "1111" data As shown above, 15 types of 4-bit data are allocated to 25 combinations of the threshold voltages in the modification of the tenth embodiment. Specifically, 10 different types of 4-bit data are redundantly allocated to the following sets of combinations: (1) and (6); (2), (3), and (7); (4) and (5); (9), (10), and (15); (11) and (17); (12) and (16); (18) and (24); and (19) and (23). Seven types of 4-bit data are uniquely allocated to the combinations (8), (13), (14), (20), (21), (22), and (25).

Thus, it is possible to store 15 types (7 types+8 types) of 4-bit data with the data allocation in the modification of the tenth embodiment, whereas there is 4-bit data (for example "1111" in the above list) that cannot be allocated to a combination of threshold distributions in first plane PL1 and second plane PL2.

FIG. 103 shows read voltages that are set for the data allocation and definitions of read data that are applied to each of the results of the page read processes.

As shown in FIG. 103, a read voltage used in a read operation to each page in the modification of the tenth embodiment is the same as the read voltage used in the read operation to each page in the tenth embodiment as explained with reference to FIG. 94. In the modification of the tenth embodiment, the read data based on results of a read operation in each of first plane PL1 and second plane PL2 is defined as follows:

First page read: (L, L, 1), (L, H, 1), (H, L, 1), (H, H, 0)
Second page read: (L, L, 1), (L, H, 1), (H, L, 0), (H, H, 1)
Third page read: (L, L, 0), (L, H, 1), (H, L, 1), (H, H, 0)
Fourth page read: (L, L, 0), (L, H, 1), (H, L, 1), (H, H, 0)

By setting the read voltages and the data definitions as shown above, the semiconductor memory 10 according to modification of the tenth embodiment can operate in a similar manner as the tenth embodiment, and can achieve advantageous effects similar to those of the tenth embodiment.

[11] Eleventh Embodiment

A semiconductor memory 10 according to the eleventh embodiment has a configuration similar to, for example, the semiconductor memory 10 according to the first embodiment, and stores 6-bit data using a combination of two memory cell transistors MT. In the following, differences of the semiconductor memory 10 according to the eleventh embodiment from the first to tenth embodiments will be described.

[11-1] Configuration

[11-1-1] Threshold Distributions of Memory Cell Transistor MT

FIG. 104 shows an example of threshold distributions of the memory cell transistors MT, read voltages, and verify voltages in the semiconductor memory 10 according to the eleventh embodiment. As shown in FIG. 104, in the threshold distributions in the eleventh embodiment, the "E" state, "F" state, and "G" state, which are higher than the "D" state, are added to the threshold distributions explained with reference to FIG. 91 in the tenth embodiment. The "F" state is higher than the "E" state, and the "G" state is higher than the "F" state.

Furthermore, in the threshold distributions in the eleventh embodiment, the read voltage ER is set between the "D" state and "E" state, and the verify voltage EV is set in accordance with the "E" state. Specifically, the read voltage ER is set between a maximum threshold voltage in the "D" state and a minimum threshold voltage in the "E" state. The verify voltage EV is set between a maximum threshold voltage in the "D" state and a minimum threshold voltage in the "E" state, and in the vicinity of the "E" state.

Similarly, the read voltage FR is set between the "E" state and the "F" state, and the verify voltage FV is set in accordance with the "F" state. The read voltage GR is set between the "F" state and the "G" state, and the verify voltage GV is set in accordance with the "G" state. The read pass voltage VREAD in the eleventh embodiment is set to a voltage higher than a maximum threshold voltage in the "G" state.

[11-1-2] Data Allocation

FIGS. 105 and 106 show an example of a data allocation for the threshold distributions of the memory cell transistors MT in the semiconductor memory 10 according to the eleventh embodiment.

As shown in FIGS. 105 and 106, in the semiconductor memory 10 according to the eleventh embodiment, 64 combinations are possible by combining eight threshold voltages in the memory cell transistors MT corresponding to first plane PL1 with eight threshold voltages in the memory cell transistors MT corresponding to second plane PL2. Furthermore, in the semiconductor memory 10 according to the eleventh embodiment, 6-bit data is allocated to each of the 64 combinations of threshold voltages as shown below:

(Example) "threshold voltage of memory cell transistors MT in first plane PL1", "threshold voltage of memory cell transistors MT in second plane PL2": "first bit/second bit/third bit/fourth bit/fifth bit/sixth bit" data (1) "Z" state, "Z" state: "100000" data
(2) "Z" state, "A" state: "100100" data
(3) "Z" state, "B" state: "101101" data
(4) "Z" state, "C" state: "101001" data
(5) "Z" state, "D" state: "111001" data
(6) "Z" state, "E" state: "111011" data
(7) "Z" state, "F" state: "110010" data
(8) "Z" state, "G" state: "110000" data
(9) "A" state, "Z" state: "101000" data
(10) "A" state, "A" state: "101100" data
(11) "A" state, "B" state: "100101" data
(12) "A" state, "C" state: "100001" data
(13) "A" state, "D" state: "110001" data
(14) "A" state, "E" state: "110011" data
(15) "A" state, "F" state: "111010" data
(16) "A" state, "G" state: "111000" data
(17) "B" state, "Z" state: "101110" data
(18) "B" state, "A" state: "101010" data
(19) "B" state, "B" state: "100011" data
(20) "B" state, "C" state: "100111" data
(21) "B" state, "D" state: "110111" data
(22) "B" state, "E" state: "110101" data
(23) "B" state, "F" state: "111100" data
(24) "B" state, "G" state: "111110" data
(25) "C" state, "Z" state: "100110" data
(26) "C" state, "A" state: "100010" data
(27) "C" state, "B" state: "101011" data
(28) "C" state, "C" state: "101111" data
(29) "C" state, "D" state: "111111" data
(30) "C" state, "E" state: "111101" data
(31) "C" state, "F" state: "110100" data
(32) "C" state, "G" state: "110110" data
(33) "D" state, "Z" state: "010110" data
(34) "D" state, "A" state: "010010" data
(35) "D" state, "B" state: "011011" data
(36) "D" state, "C" state: "011111" data
(37) "D" state, "D" state: "001111" data
(38) "D" state, "E" state: "001101" data
(39) "D" state, "F" state: "000100" data
(40) "D" state, "G" state: "000110" data
(41) "E" state, "Z" state: "010111" data

(42) "E" state, "A" state: "010011" data
(43) "E" state, "B" state: "011010" data
(44) "E" state, "C" state: "011110" data
(45) "E" state, "D" state: "001110" data
(46) "E" state, "E" state: "001100" data
(47) "E" state, "F" state: "000101" data
(48) "E" state, "G" state: "000111" data
(49) "F" state, "Z" state: "010001" data
(50) "F" state, "A" state: "010101" data
(51) "F" state, "B" state: "011100" data
(52) "F" state, "C" state: "011000" data
(53) "F" state, "D" state: "001000" data
(54) "F" state, "E" state: "001010" data
(55) "F" state, "F" state: "000011" data
(56) "F" state, "G" state: "000001" data
(57) "G" state, "Z" state: "010000" data
(58) "G" state, "A" state: "010100" data
(59) "G" state, "B" state: "011101" data
(60) "G" state, "C" state: "011001" data
(61) "G" state, "D" state: "001001" data
(62) "G" state, "E" state: "001011" data
(63) "G" state, "F" state: "000010" data
(64) "G" state, "G" state: "000000" data Thus, different data is allocated to each of the 64 combinations in the sixth embodiment. FIG. 107 shows read voltages that are set for the data allocation and definitions of read data that are applied to each of the results of reading the pages.

As shown in FIG. 107, the read voltage DR is used for the first page read in first plane PL1 and second plane PL2. In the second page read, the read voltage DR is used in first plane PL1 and in second plane PL2. In the third page read, the read voltages AR and CR are used in first plane PL1, and the read voltages BR and FR are used in second plane PL2. In the fourth page read, the read voltages BR and FR are used in first plane PL1, and the read voltages AR and CR are used in second plane PL2. In the fifth page read, the read voltages BR and FR are used in first plane PL1, and the read voltages ER and GR are used in second plane PL2. In the sixth page read, the read voltages ER and GR are used in first plane PL1, and the read voltages BR and FR are used in second plane PL2.

In the following explanation, suppose, when a read operation using each of two different read voltages is performed, the sense amplifier module 17 computes a result of the read as "H" level (for example, "0" data) if the threshold voltage of the memory cell transistor MT is higher than a lower one of the two read voltages and is lower than a higher one of the two read voltages, and the sense amplifier module 17 computes a result of the read as "L" level (for example, "1" data) if the threshold voltage of the memory cell transistor MT is lower than a lower one of the two read voltages, or higher than a higher one of the two read voltages.

The read data based on results of a read operation in each of first plane PL1 and second plane PL2 is defined as follows:

(Example) Read operation: (result of reading first plane PL1, result of reading second plane PL2, read data)×4 types
First page read: (L, L, 1), (L, H, 1), (H, L, 0), (H, H, 0)
Second page read: (L, L, 0), (L, H, 1), (H, L, 1), (H, H, 0)
Third page read: (L, L, 0), (L, H, 1), (H, L, 1), (H, H, 0)
Fourth page read: (L, L, 0), (L, H, 1), (H, L, 1), (H, H, 0)
Fifth page read: (L, L, 0), (L, H, 1), (H, L, 1), (H, H, 0)
Sixth page read: (L, L, 0), (L, H, 1), (H, L, 1), (H, H, 0)
FIG. 108 through FIG. 111 provide tables summarizing the read voltages that are set in accordance with the data allocation, and tables summarizing the results of the read operations carried out in accordance with the set read voltages. In the semiconductor memory 10 according to the eleventh embodiment, data corresponding to each of (1) to (64) in FIGS. 105 and 106 is determined by applying the data definitions shown in FIG. 107 to the results of read operation shown in FIGS. 108 through 111.

Since the other configurations in the semiconductor memory 10 according to the eleventh embodiment are the same as those in the semiconductor memory 10 according to the first embodiment, detailed descriptions of the configurations are omitted.

[11-2] Operation

[11-2-1] Write Operation

Figure 112:
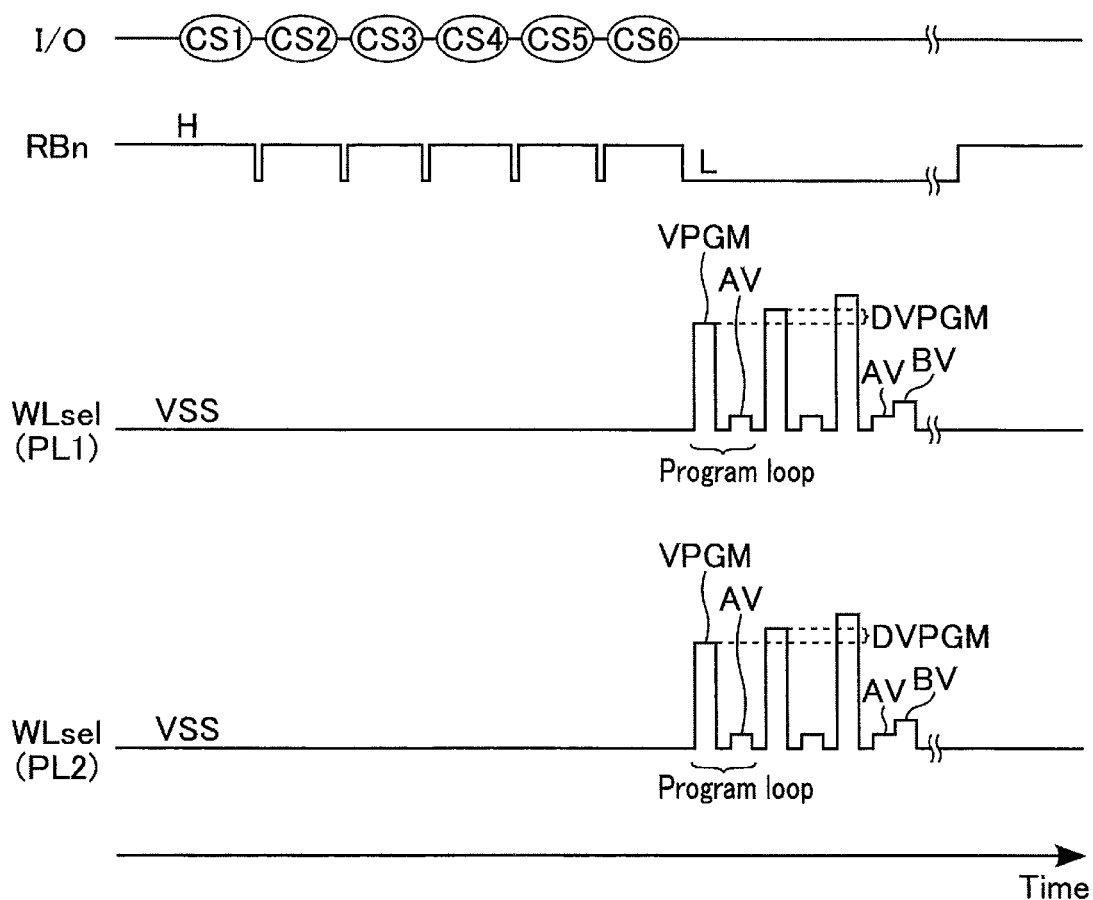
FIG. 112 is a timing chart showing an example of commands, and signals and voltages applied to lines in a write operation in the semiconductor memory according to the eleventh embodiment.

FIG. 112 shows an example of commands, and signals and voltages applied to the lines in a write operation in the semiconductor memory 10 according to the eleventh embodiment. A write operation in the eleventh embodiment is the same as the write operation explained with reference to FIG. 12, except for the commands.

Specifically, as shown in FIG. 112, the memory controller 20 transmits a first command set CS1, a second command set CS2, a third command set CS3, a fourth command set CS4, a fifth command set CS5, and a sixth command set CS6, in order.

The command sets CS1 through CS6 include commands for instructing an operation for the first to sixth pages respectively, and include write data DAT to be written in the first to sixth pages respectively. After each of the command sets CS1 through CS5 is received, the semiconductor memory 10 temporarily changes to a busy state, and transfers the received write data DAT to each of the latch circuits in the sense amplifier modules 17A and 17B.

The semiconductor memory 10 changes to a busy state after receiving the sixth command set CS6, and the sequencer 14 performs a write operation based on the write data for the first to sixth pages retained in the latch circuits in the sense amplifier modules 17A and 17B.

Specifically, the sequencer 14 simultaneously performs a first write operation for first plane PL1 and a second write operation for second plane PL2 in parallel based on the write data of the first to sixth pages.

In the first and second write operations, write-targeted and write-inhibited memory cell transistors MT are set based on the data allocation shown in FIGS. 105 and 106, and the sequencer 14 performs a program loop. Since the details of the first and second write operations are the same as the first write operation of the first embodiment described with reference to FIG. 11, detailed descriptions are omitted.

When the first to second write operations are finished, the threshold voltages of the memory cell transistors MT in a cell unit CU selected in first plane PL1 and the threshold voltages of the memory cell transistors MT in a cell unit CU selected in second plane PL2 form eight threshold distributions like those shown in FIG. 104. Then, the sequencer 14 finishes the write operation when detecting the completion of each of the first and second write operations, and changes the semiconductor memory 10 to a ready state.

[11-2-2] Read Operation (First Page Read)

Figure 113:
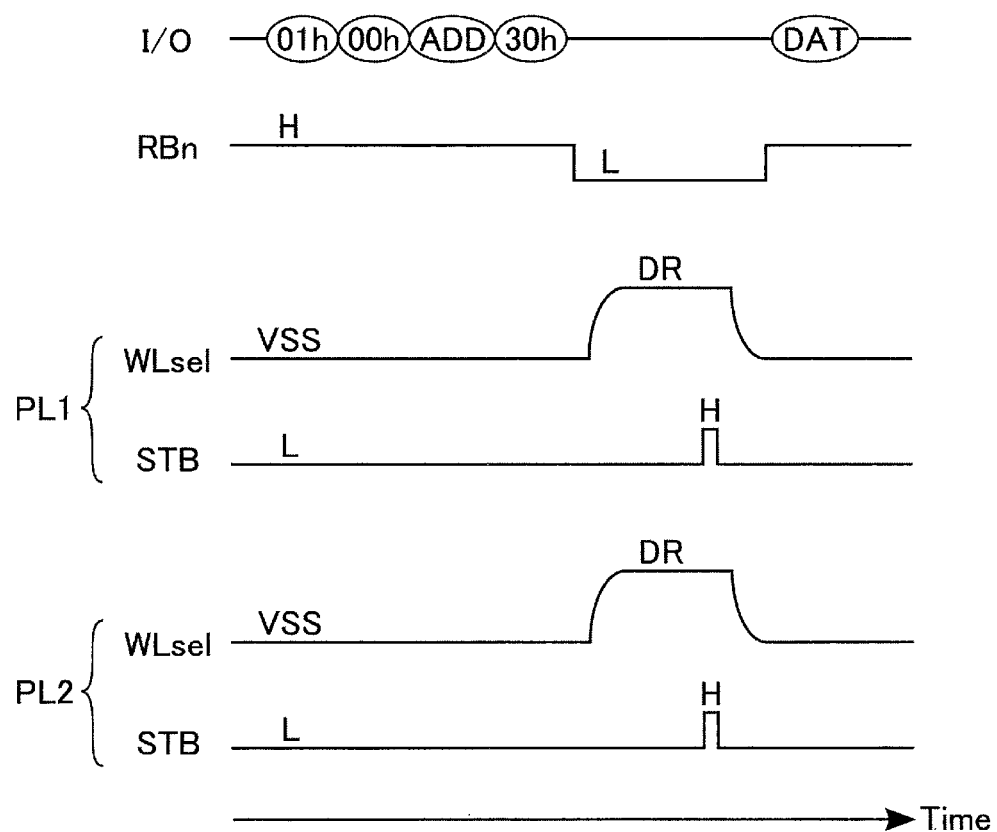
FIG. 113 is a timing chart showing an example of commands, and signals and voltages applied to lines in a first page read in the semiconductor memory according to the eleventh embodiment.

FIG. 113 shows an example of commands, and signals and voltages applied to the lines in the first page read in the semiconductor memory 10 according to the eleventh embodiment.

As shown in FIG. 113, first, the memory controller 20 sequentially transmits, for example, a command "01h", a command "00h", address information ADD, and a command "30h" to the semiconductor memory 10. Upon reception of the command "30h", the semiconductor memory 10 changes to a busy state, and starts the first page read.

In the first page read in the eleventh embodiment, the sequencer 14 simultaneously performs a first read operation for first plane PL1 and a second read operation for second plane PL2 in parallel.

In the first read operation in the first page read, a read operation using, for example, the read voltage DR is performed, and a result of this read is retained in any of the latch circuits in each sense amplifier unit SAU in the sense amplifier module 17A.

In the second read operation in the first page read, a read operation using, for example, the read voltage DR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the first page based on the definitions of the data shown in FIG. 107, and transfers the determined read data DAT to the data conversion circuit 80. Since the other operations in the first page read in the eleventh embodiment are the same as those in the first read operation explained with reference to FIG. 13 in the first embodiment, detailed descriptions of the operations are omitted.

(Second Page Read)

Figure 114:
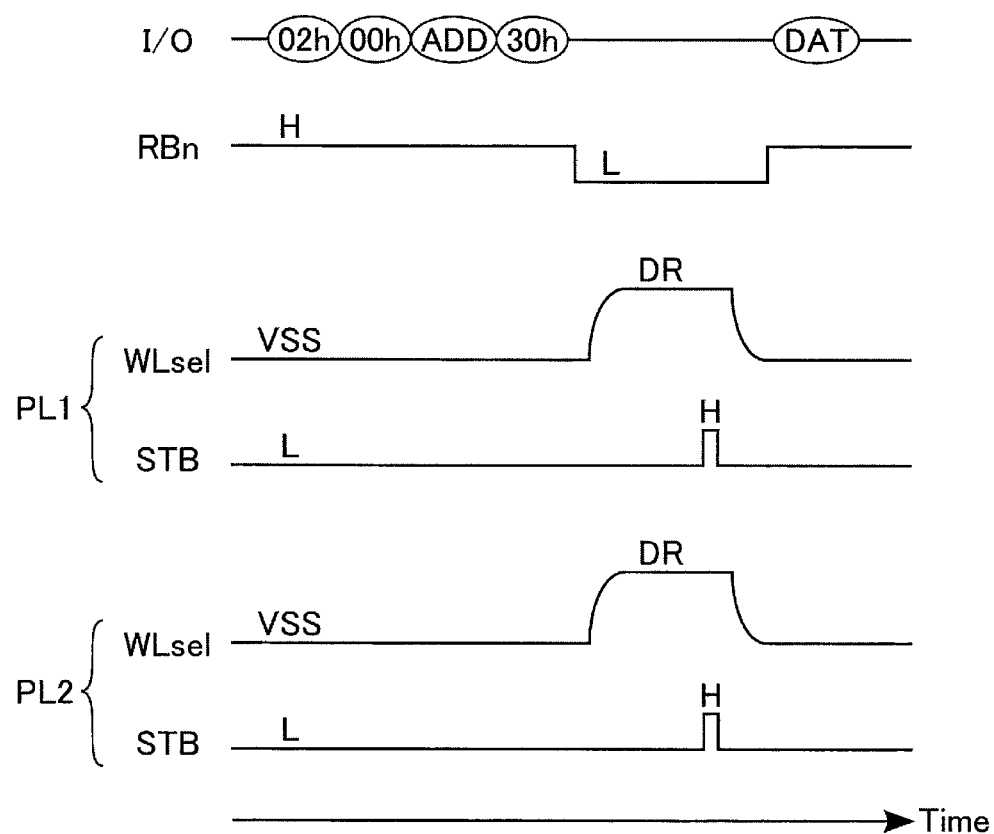
FIG. 114 is a timing chart showing an example of commands, and signals and voltages applied to lines in a second page read in the semiconductor memory according to the eleventh embodiment.

FIG. 114 shows an example of commands, and signals and voltages applied to the lines in the second page read in the semiconductor memory 10 according to the eleventh embodiment.

As shown in FIG. 114, first, the memory controller 20 sequentially transmits, for example, a command "02h", a command "00h", address information ADD, and a command "30h" to the semiconductor memory 10. Upon reception of the command "30h", the semiconductor memory 10 changes to a busy state, and starts the second page read.

In the second page read in the eleventh embodiment, the sequencer 14 simultaneously performs a first read operation for first plane PL1 and a second read operation for second plane PL2 in parallel.

In the first read operation in the second page read, a read operation using, for example, the read voltage DR is performed, and a result of this read is retained in any of the latch circuits in each sense amplifier unit SAU in the sense amplifier module 17A.

In the second read operation in the second page read, a read operation using, for example, the read voltage DR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the second page based on the definitions of the data shown in FIG. 107, and transfers the determined read data DAT to the data conversion circuit 80. Since the other operations in the second page read in the eleventh embodiment are the same as those in the first read operation explained with reference to FIG. 113, detailed descriptions of the operations are omitted.

(Third Page Read)

Figure 115:
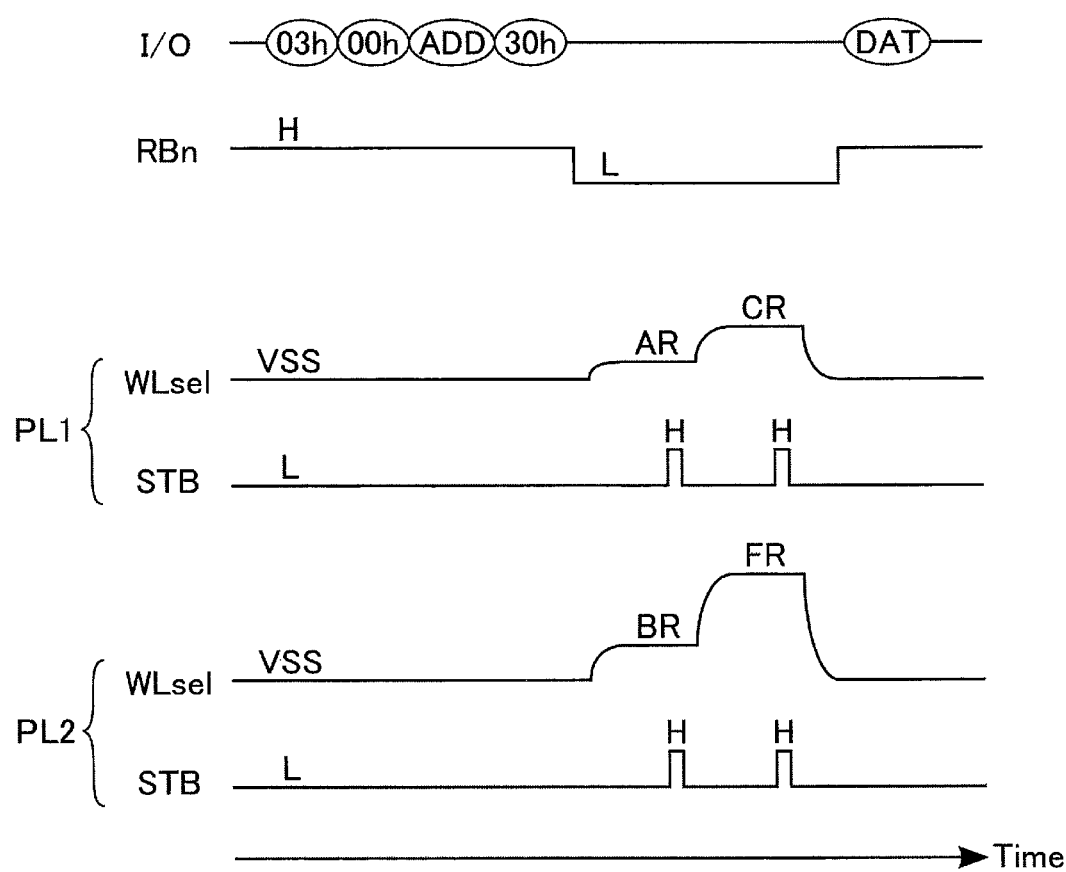
FIG. 115 is a timing chart showing an example of commands, and signals and voltages applied to lines in a third page read in the semiconductor memory according to the eleventh embodiment.

FIG. 115 shows an example of commands, and signals and voltages applied to the lines in the third page read in the semiconductor memory 10 according to the eleventh embodiment.

As shown in FIG. 115, first, the memory controller 20 sequentially transmits, for example, a command "03h", a command "00h", address information ADD, and a command "30h" to the semiconductor memory 10. Upon reception of the command "30h", the semiconductor memory 10 changes to a busy state, and starts the third page read.

In the third page read in the eleventh embodiment, the sequencer 14 simultaneously performs a first read operation for first plane PL1 and a second read operation for second plane PL2 in parallel.

In the first read operation in the third page read, a read operation using each of, for example, the read voltages AR and CR is performed, and a result of this read is retained in any of the latch circuits in each sense amplifier unit SAU in the sense amplifier module 17A.

In the second read operation in the third page read, a read operation using, for example, the read voltages BR and FR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the third page based on the definitions of the data shown in FIG. 107, and transfers the determined read data DAT to the data conversion circuit 80. Since the other operations in the third page read in the eleventh embodiment are the same as those in the first read operation explained with reference to FIG. 113, detailed descriptions of the operations are omitted.

(Fourth Page Read)

Figure 116:
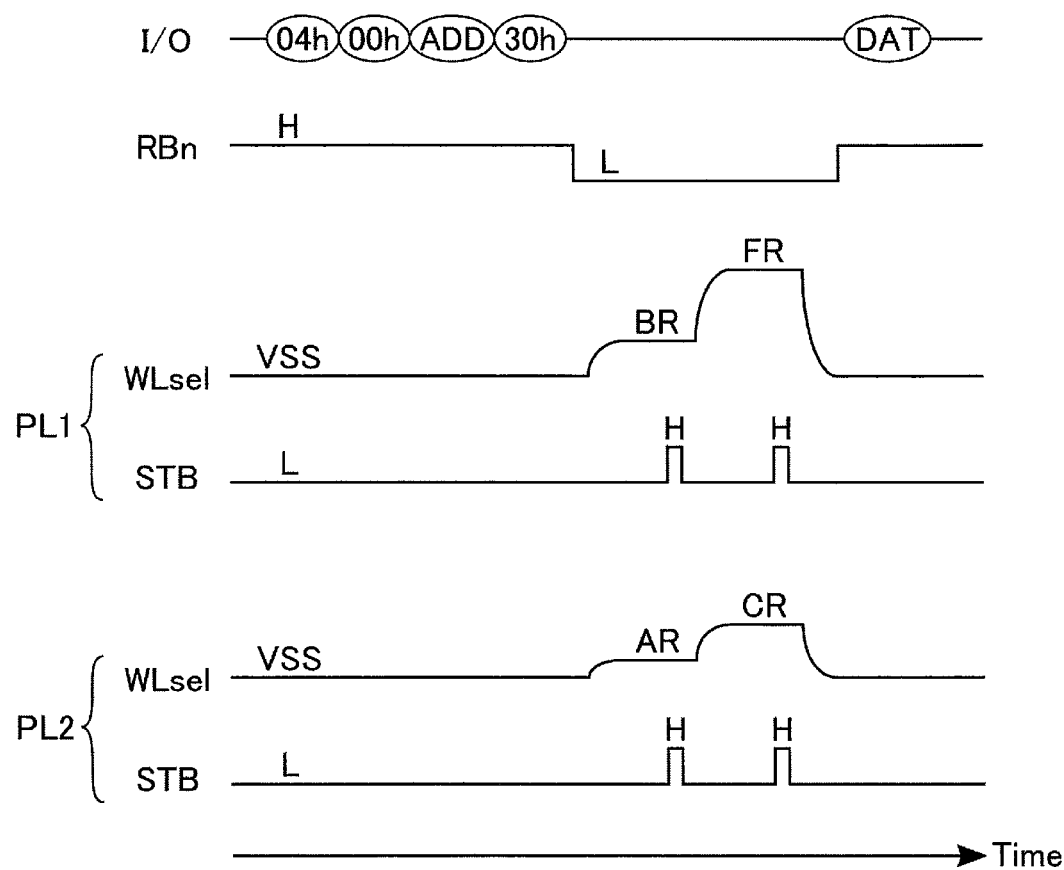
FIG. 116 is a timing chart showing an example of commands, and signals and voltages applied to lines in a fourth page read in the semiconductor memory according to the eleventh embodiment.

FIG. 116 shows an example of commands, and signals and voltages applied to the lines in the fourth page read in the semiconductor memory 10 according to the eleventh embodiment.

As shown in FIG. 116, first, the memory controller 20 sequentially transmits, for example, a command "04h", a command "00h", address information ADD, and a command "30h" to the semiconductor memory 10. Upon reception of the command "30h", the semiconductor memory 10 changes to a busy state, and starts the fourth page read.

In the fourth page read in the eleventh embodiment, the sequencer 14 simultaneously performs a first read operation for first plane PL1 and a second read operation for second plane PL2 in parallel.

In the first read operation in the fourth page read, a read operation using each of, for example, the read voltages BR and FR is performed, and a result of this read is retained in any of the latch circuits in each sense amplifier unit SAU in the sense amplifier module 17A.

In the second read operation in the fourth page read, a read operation using each of, for example, the read voltages AR and CR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the fourth page based on the definitions of the data shown in FIG. 107, and transfers the determined read data DAT to the data conversion circuit 80. Since the other operations in the fourth page read in the eleventh embodiment are the same as those in the first read operation explained with reference to FIG. 113, detailed descriptions of the operations are omitted.

(Fifth Page Read)

Figure 117:
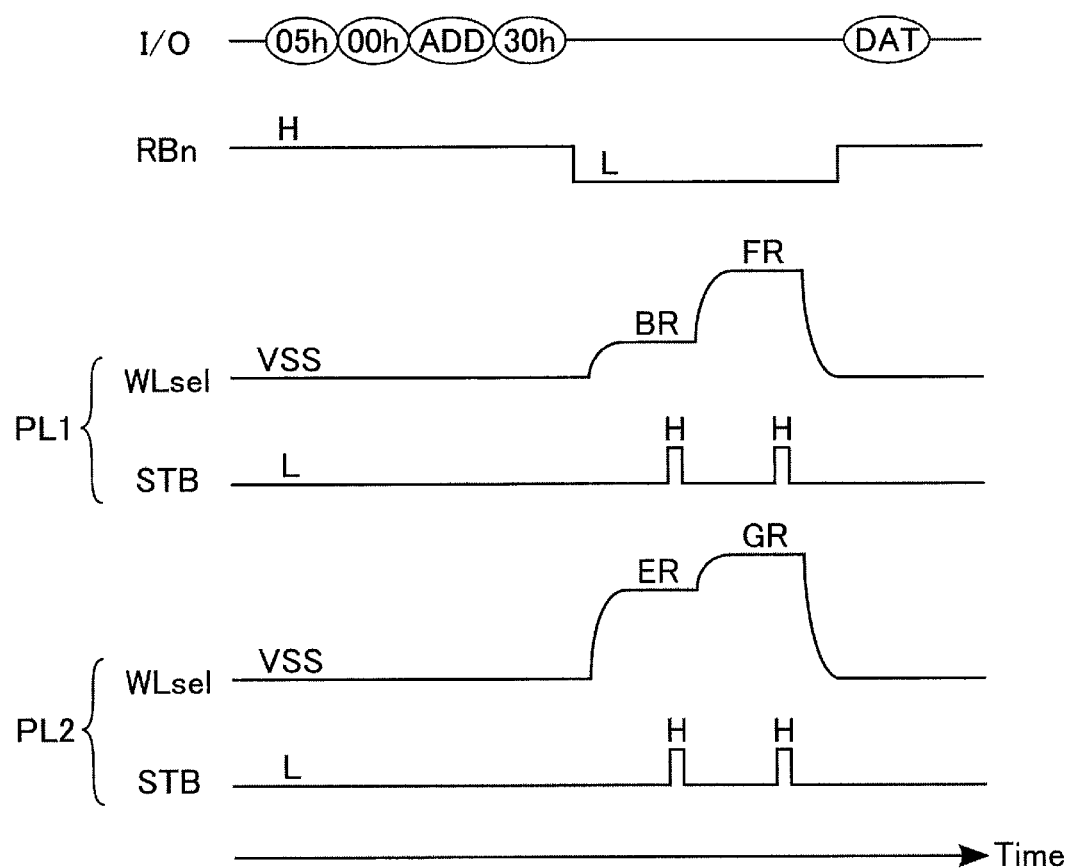
FIG. 117 is a timing chart showing an example of commands, and signals and voltages applied to lines in a fifth page read in the semiconductor memory according to the eleventh embodiment.

FIG. 117 shows an example of commands, and signals and voltages applied to the lines in the fifth page read in the semiconductor memory 10 according to the eleventh embodiment.

As shown in FIG. 117, first, the memory controller 20 sequentially transmits, for example, a command "05h", a command "00h", address information ADD, and a command "30h" to the semiconductor memory 10. Upon reception of the command "30h", the semiconductor memory 10 changes to a busy state, and starts the fifth page read.

In the fifth page read in the eleventh embodiment, the sequencer 14 simultaneously performs a first read operation for first plane PL1 and a second read operation for second plane PL2 in parallel.

In the first read operation in the fifth page read, a read operation using each of, for example, the read voltages BR and FR is performed, and a result of this read is retained in any of the latch circuits in each sense amplifier unit SAU in the sense amplifier module 17A.

In the second read operation in the fifth page read, a read operation using each of, for example, the read voltages ER and GR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the fifth page based on the definitions of the data shown in FIG. 107, and outputs the determined read data DAT to the data conversion circuit 80. Since the other operations in the fifth page read in the eleventh embodiment are the same as those in the first read operation explained with reference to FIG. 113, detailed descriptions of the operations are omitted.

(Sixth Page Read)

Figure 118:
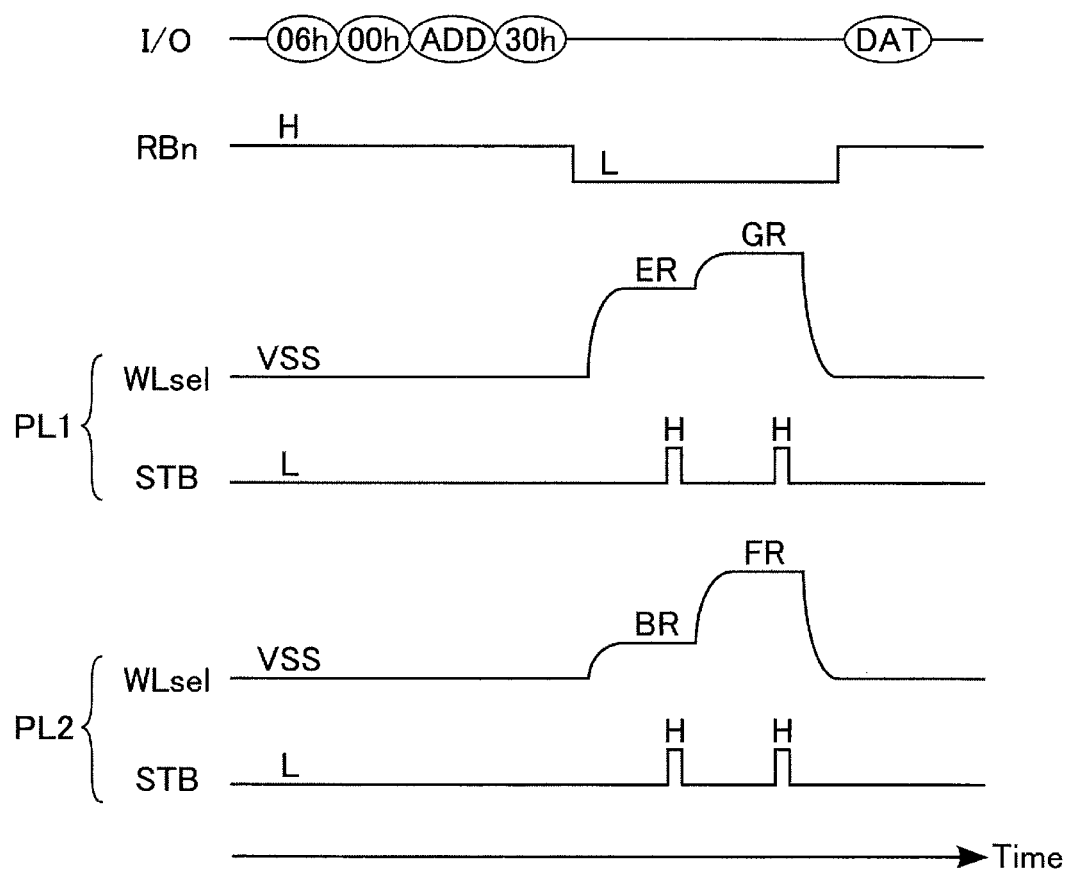
FIG. 118 is a timing chart showing an example of commands, and signals and voltages applied to lines in a sixth page read in the semiconductor memory according to the eleventh embodiment.

FIG. 118 shows an example of commands, and signals and voltages applied to the lines in the sixth page read in the semiconductor memory 10 according to the eleventh embodiment.

As shown in FIG. 118, first, the memory controller 20 sequentially transmits, for example, a command "06h", a command "00h", address information ADD, and a command "30h" to the semiconductor memory 10. Upon reception of the command "30h", the semiconductor memory 10 changes to a busy state, and starts the sixth page read.

In the sixth page read in the eleventh embodiment, the sequencer 14 simultaneously performs a first read operation for first plane PL1 and a second read operation for second plane PL2 in parallel.

In the first read operation in the sixth page read, a read operation using each of, for example, the read voltages ER and GR is performed, and a result of this read is retained in any of the latch circuits in each sense amplifier unit SAU in the sense amplifier module 17A.

In the second read operation in the sixth page read, a read operation using each of, for example, the read voltages BR and FR is performed, and a result of this read is retained in any of the latch circuits in each sense amplifier unit SAU in the sense amplifier module 17B.

Thereafter, the sequencer 14 changes the semiconductor memory 10 to a ready state. Subsequently, the memory controller 20 detects a change of the semiconductor memory 10 from, for example, a busy state to a ready state, and causes the semiconductor memory 10 to output the read data DAT by toggling the read enable signal REn.

At this time, the data output from each of first plane PL1 and second plane PL2 is transferred to the logic circuit 18. Then, the logic circuit 18 determines the read data of the sixth page based on the definitions of the data shown in FIG. 107, and transfers the determined read data DAT to the data conversion circuit 80. Since the other operations in the sixth page read in the eleventh embodiment are the same as those in the first read operation explained with reference to FIG. 113, detailed descriptions of the operations are omitted.

[11-3] Advantageous Effects of Eleventh Embodiment

According to the above-described semiconductor memory 1 in the eleventh embodiment, the speed of operations for reading data, which is stored in the memory cells in a 3-bit-per memory cell basis, can be enhanced. Advantageous effects of the semiconductor memory 1 according to the eleventh embodiment will be described in detail below.

Figure 120:
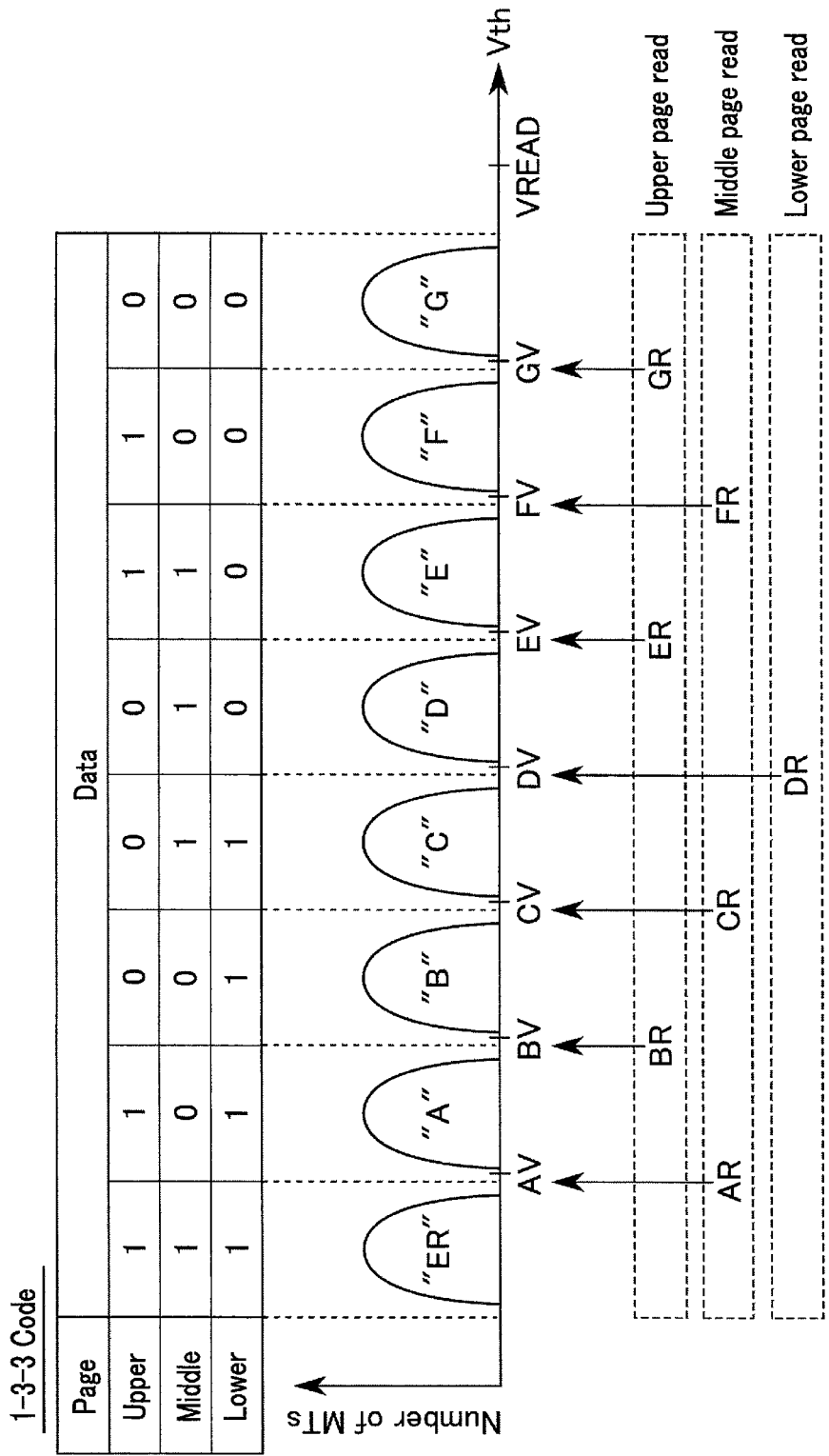
FIG. 120 is a diagram showing an example of a data allocation for threshold distributions of memory cell transistors, and voltages used to read each page in a second comparative example of the eleventh embodiment.

As comparative examples of the eleventh embodiment, examples where 3-bit data is stored per memory cell transistor MT will be explained. FIGS. 119 and 120 show examples of data allocation for the threshold distributions of the memory cell transistors MT and the voltages used for reading each page in the comparative example of the eleventh embodiment.

In the memory cell transistors MT in the first comparative example of the eleventh embodiment, as shown in FIG. 119, "111 (upper bit/middle bit/lower bit)" data, "110" data, "100" data, "000" data, "010" data, "011" data, "001" data, and "101" data are respectively allocated to the threshold distributions in the "ER" state, the "A" state, the "B" state, the "C" state" the "D" state, the "E" state, the "F" state, and the "G" state.

In the first comparative example of the eleventh embodiment, similar to the explanation of FIG. 8, a read voltage and a verify voltage are set to each of the "A" state through "G" state. In the first comparative example of the eleventh embodiment, data of an upper page is determined based on results of reading using each of the read voltages CR and GR; data of a middle page is determined based on results of reading using each of the read voltages BR, DR, and FR; data of a lower page is determined based on results of reading using each of the read voltages AR and ER (2-3-2 code).

In the memory cell transistors MT in the second comparative example of the eleventh embodiment, as shown in FIG. 120, "111" data, "101" data, "001" data, "011" data, "010" data, "110" data, "100" data, and "000" data are respectively allocated to the threshold distributions in the "ER" state, the "A" state, the "B" state, the "C" state the "D" state, the "E" state, the "F" state, and the "G" state.

In the second comparative example of the eleventh embodiment, similar to the explanation of FIG. 8, a read voltage and a verify voltage are set to each of the "A" state through "G" state. In the second comparative example of the eleventh embodiment, data of an upper page is determined based on results of reading using each of the read voltages BR, ER, and GR; data of a middle page is determined based on results of reading using each of the read voltages AR, CR, and FR; data of a lower page is determined based on results of reading using the read voltage DR (1-3-3 code).

Thus, the number of times of reading per page is (2+3+2)/3=2.33 times in the first comparative example of the eleventh embodiment, and (1+3+3)/3=2.33 times in the second comparative example.

In contrast, in the semiconductor memory 10 according to the eleventh embodiment, the number of times of reading per page is (1+1+2+2+2+2)/6=1.67 times, which is less than the first and second comparative examples.

Furthermore, the semiconductor memory 10 according to the eleventh embodiment can store 6-bit data in a set of two memory cell transistors MT. In other words, the semiconductor memory 10 according to the eleventh embodiment can store 3-bit data per memory cell transistor MT, similar to the first and second comparative examples of the eleventh embodiment.

Thus, the semiconductor memory 10 according to the eleventh embodiment can achieve the same storage capacity as the semiconductor memory 10 in the comparative examples of the eleventh embodiment, and can reduce the number of times of reading in read operations, which are performed in units of pages. Therefore, the semiconductor memory 10 according to the eleventh embodiment can enhance the speed of read operations without reducing storage capacity, compared to the comparative examples of the eleventh embodiment.

[11-4] Modifications of Eleventh Embodiment

The eleventh embodiment is explained using the data allocation shown in FIGS. 105 and 106 as an example; however, different data allocations may be applied to the threshold distributions of the memory cell transistors MT in the eleventh embodiment.

For example, the semiconductor memory 10 may use the same data, allocation as shown in FIGS. 105 and 106 but with the data corresponding to the second through sixth pages being inverted. The data definitions for such a data allocation would be the same as shown in FIG. 107 but with all the definitions of the data of the second through sixth pages being inverted. Even if such a data allocation and data definitions are used, the semiconductor memory 10 can perform each of the operations explained in the eleventh embodiment.

Combinations of read voltages and data definitions in the modifications of the eleventh embodiment are listed below. Data allocation and a write level for each of the following combinations are set as appropriate based on a combination of read voltages and data definitions.

(Example) Read voltage: [first page read ((x) read voltage of PL1, (y) read voltage of PL2), second page read ((x), (y)), third page read ((x), (y)), fourth page read ((x), (y)), fifth page read ((x), (y)), sixth page read ((x), (y))]; Data definitions: [first page read [(a) read data if H, H=result of reading PL1, result of reading PL2, (b) read data when L, H, (c) read data when H, L, (d) read data when L, L], second page read [(a), (b), (c), (d)], third page read [(a), (b), (c), (d)], fourth page read [(a), (b), (c), (d)], fifth page read [(a), (b), (c), (d)], sixth page read [(a), (b), (c), (d)]]

(1st Modification of Eleventh Embodiment)
Read Voltages: [(DR, GR), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(2nd Modification of Eleventh Embodiment)
Read Voltages: [(DR, GR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(3rd Modification of Eleventh Embodiment)
Read Voltages: [(DR, GR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(4th Modification of Eleventh Embodiment)
Read Voltages: [(DR, GR), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(5th Modification of Eleventh Embodiment)
Read Voltages: [(DR, GR), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(6th Modification of Eleventh Embodiment)
Read Voltages: [(AR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(7th Modification of Eleventh Embodiment)
Read Voltages: [(AR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(8th Modification of Eleventh Embodiment)
Read Voltages: [(AR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(9th Modification of Eleventh Embodiment)
Read Voltages: [(AR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(10th Modification of Eleventh Embodiment)
Read Voltages: [(AR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(11th Modification of Eleventh Embodiment)
Read Voltages: [(ER, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(12th Modification of Eleventh Embodiment)
Read Voltages: [(ER, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(13th Modification of Eleventh Embodiment)
Read Voltages: [(ER, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(14th Modification of Eleventh Embodiment)
Read Voltages: [(ER, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(15th Modification of Eleventh Embodiment)
Read Voltages: [(ER, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(16th Modification of Eleventh Embodiment)
Read Voltages: [(ER, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(17th Modification of Eleventh Embodiment)
Read Voltages: [(ER, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(18th Modification of Eleventh Embodiment)
Read Voltages: [(ER, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(19th Modification of Eleventh Embodiment)
Read Voltages: [(ER, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(20th Modification of Eleventh Embodiment)
Read Voltages: [(ER, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(21st Modification of Eleventh Embodiment)
Read Voltages: [(ER, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(22nd Modification of Eleventh Embodiment)
Read Voltages: [(ER, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(23rd Modification of Eleventh Embodiment)
Read Voltages: [(ER, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(24th Modification of Eleventh Embodiment)
Read Voltages: [(ER, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(25th Modification of Eleventh Embodiment)
Read Voltages: [(ER, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(26th Modification of Eleventh Embodiment)
Read Voltages: [(ER, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(27th Modification of Eleventh Embodiment)
Read Voltages: [(ER, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(28th Modification of Eleventh Embodiment)
Read Voltages: [(ER, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(29th Modification of Eleventh Embodiment)
Read Voltages: [(ER, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(30th Modification of Eleventh Embodiment)
Read Voltages: [(ER, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(31st Modification of Eleventh Embodiment)
Read Voltages: [(ER, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(32nd Modification of Eleventh Embodiment)
Read Voltages: [(ER, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(33rd Modification of Eleventh Embodiment)
Read Voltages: [(ER, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(34th Modification of Eleventh Embodiment)
Read Voltages: [(ER, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(35th Modification of Eleventh Embodiment)
Read Voltages: [(ER, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(36th Modification of Eleventh Embodiment)
Read Voltages: [(ER, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(37th Modification of Eleventh Embodiment)
Read Voltages: [(ER, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(38th Modification of Eleventh Embodiment)
Read Voltages: [(ER, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(39th Modification of Eleventh Embodiment)
Read Voltages: [(ER, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(40th Modification of Eleventh Embodiment)
Read Voltages: [(ER, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(41st Modification of Eleventh Embodiment)
Read Voltages: [(ER, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(42nd Modification of Eleventh Embodiment)
Read Voltages: [(ER, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(43rd Modification of Eleventh Embodiment)
Read Voltages: [(ER, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(44th Modification of Eleventh Embodiment)
Read Voltages: [(ER, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(45th Modification of Eleventh Embodiment)
Read Voltages: [(ER, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(46th Modification of Eleventh Embodiment)
Read Voltages: [(AR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(47th Modification of Eleventh Embodiment)
Read Voltages: [(AR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(48th Modification of Eleventh Embodiment)
Read Voltages: [(AR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(49th Modification of Eleventh Embodiment)
Read Voltages: [(AR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(50th Modification of Eleventh Embodiment)
Read Voltages: [(AR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(51st Modification of Eleventh Embodiment)
Read Voltages: [(ER, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(520d Modification of Eleventh Embodiment)
Read Voltages: [(ER, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(53rd Modification of Eleventh Embodiment)
Read Voltages: [(ER, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(54th Modification of Eleventh Embodiment)
Read Voltages: [(ER, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(55th Modification of Eleventh Embodiment)
Read Voltages: [(ER, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(56th Modification of Eleventh Embodiment)
Read Voltages: [(ER, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(57th Modification of Eleventh Embodiment)
Read Voltages: [(ER, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(58th Modification of Eleventh Embodiment)
Read Voltages: [(ER, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(59th Modification of Eleventh Embodiment)
Read Voltages: [(ER, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(60th Modification of Eleventh Embodiment)
Read Voltages: [(ER, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(61st Modification of Eleventh Embodiment)
Read Voltages: [(ER, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0] [0, 1, 1, 0]]

(62nd Modification of Eleventh Embodiment)
Read Voltages: [(ER, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(63rd Modification of Eleventh Embodiment)
Read Voltages: [(ER, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(64th Modification of Eleventh Embodiment)
Read Voltages: [(AR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(65th Modification of Eleventh Embodiment)
Read Voltages: [(AR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(66th Modification of Eleventh Embodiment)
Read Voltages: [(AR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(67th Modification of Eleventh Embodiment)
Read Voltages: [(AR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(68th Modification of Eleventh Embodiment)
Read Voltages: [(AR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(69th Modification of Eleventh Embodiment)
Read Voltages: [(FR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(70th Modification of Eleventh Embodiment)
Read Voltages: [(FR, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(71st Modification of Eleventh Embodiment)
Read Voltages: [(FR, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(72nd Modification of Eleventh Embodiment)
Read Voltages: [(FR, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(73rd Modification of Eleventh Embodiment)
Read Voltages: [(FR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(74th Modification of Eleventh Embodiment)
Read Voltages: [(FR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(75th Modification of Eleventh Embodiment)
Read Voltages: [(FR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(76th Modification of Eleventh Embodiment)
Read Voltages: [(FR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(77th Modification of Eleventh Embodiment)
Read Voltages: [(FR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(78th Modification of Eleventh Embodiment)
Read Voltages: [(FR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(79th Modification of Eleventh Embodiment)
Read Voltages: [(FR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 0, 1], [0, 1, 1, 0], [0, 1, 1, 0], [0, 1, 1, 0], [0, 1, 1, 0]]

(80th Modification of Eleventh Embodiment)
Read Voltages: [(FR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(81st Modification of Eleventh Embodiment)
Read Voltages: [(FR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(82nd Modification of Eleventh Embodiment)
Read Voltages: [(FR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(83rd Modification of Eleventh Embodiment)
Read Voltages: [(FR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(84th Modification of Eleventh Embodiment)
Read Voltages: [(FR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(85th Modification of Eleventh Embodiment)
Read Voltages: [(FR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(86th Modification of Eleventh Embodiment)
Read Voltages: [(FR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(87th Modification of Eleventh Embodiment)
Read Voltages: [(FR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(88th Modification of Eleventh Embodiment)
Read Voltages: [(FR, DR), (DR, DR), ((AR, GR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(89th Modification of Eleventh Embodiment)
Read Voltages: [(FR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(90th Modification of Eleventh Embodiment)
Read Voltages: [(FR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(91st Modification of Eleventh Embodiment)
Read Voltages: [(FR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(92nd Modification of Eleventh Embodiment)
Read Voltages: [(FR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(93rd Modification of Eleventh Embodiment)

Read Voltages: [(FR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(94th Modification of Eleventh Embodiment)

Read Voltages: [(FR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(95th Modification of Eleventh Embodiment)

Read Voltages: [(FR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 0, 1], [0, 1, 1, 0], [0, 1, 1, 0], [0, 1, 1, 0], [0, 1, 1, 0]]

(96th Modification of Eleventh Embodiment)

Read Voltages: [(FR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(97th Modification of Eleventh Embodiment)

Read Voltages: [(FR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(98th Modification of Eleventh Embodiment)

Read Voltages: [(FR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(99th Modification of Eleventh Embodiment)

Read Voltages: [(FR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(100th Modification of Eleventh Embodiment)

Read Voltages: [(FR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(101st Modification of Eleventh Embodiment)

Read Voltages: [(FR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(102nd Modification of Eleventh Embodiment)

Read Voltages: [(FR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(103rd Modification of Eleventh Embodiment)

Read Voltages: [(FR, DR), (DR, GR), ((AR, CR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(104th Modification of Eleventh Embodiment)

Read Voltages: [(FR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(105th Modification of Eleventh Embodiment)

Read Voltages: [(FR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(106th Modification of Eleventh Embodiment)

Read Voltages: [(FR, DR), (DR, BR), ((AR, GR), (BR, FR)), ((BR, FR), (AR, CR)), ((BR, FR), (ER, GR)), ((CR, ER), (BR, FR))]; Data Definitions: [[0, 1, 1], [0, 1, 1, 0], [0, 1, 1, 0], [0, 1, 1, 0], [0, 1, 1, 0], [0, 1, 1, 0]]

(107th Modification of Eleventh Embodiment)

Read Voltages: [(FR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(108th Modification of Eleventh Embodiment)

Read Voltages: [(FR, DR), (DR, DR) ((AR, CR), (BR, FR)), ((BR, FR), (AR, CR)), ((BR, FR), (ER, GR)), ((ER, GR), (BR, FR))]; Data Definitions: [[0, 0, 1, 1] [0, 1, 1, 0], [0, 1, 1, 0], [0, 1, 1, 0], [0, 1, 1, 0], [0, 1, 1, 0]]

(109th Modification of Eleventh Embodiment)

Read Voltages: [(FR, DR), (DR, DR) ((AR, CR), (BR, FR)), ((BR, FR), (AR, ER)), ((BR, FR), (CR, GR)), ((ER, GR), (BR, FR))]; Data Definitions: [[0, 0, 1, 1] [0, 1, 1, 0], [0, 1, 1, 0], [0, 1, 1, 0], [0, 1, 1, 0], [0, 1, 1, 0]]

(110th Modification of Eleventh Embodiment)

Read Voltages: [(FR, DR), (DR, DR) ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(111th Modification of Eleventh Embodiment)

Read Voltages: [(FR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(112th Modification of Eleventh Embodiment)

Read Voltages: [(FR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(113th Modification of Eleventh Embodiment)

Read Voltages: [(FR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(114th Modification of Eleventh Embodiment)

Read Voltages: [(FR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0], [0, 1, 1, 0]]

(115th Modification of Eleventh Embodiment)

Read Voltages: [(FR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(116th Modification of Eleventh Embodiment)

Read Voltages: [(FR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(117th Modification of Eleventh Embodiment)

Read Voltages: [(GR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(118th Modification of Eleventh Embodiment)

Read Voltages: [(CR, DR), (DR, AR) ((AR, CR), (BR, FR)), ((BR, FR), (AR, ER)), ((BR, FR), (CR, GR)), ((ER, GR), (BR, FR))]; Data Definitions: [[0, 0, 1, 1] [0, 1, 0, 1], [0, 1, 1, 0], [0, 1, 1, 0], [0, 1, 1, 0], [0, 1, 1, 0]]

(119th Modification of Eleventh Embodiment)
Read Voltages: [(GR, DR), (DR, AR) ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(120th Modification of Eleventh Embodiment)
Read Voltages: [(CR, DR), (DR, AR) ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(121st Modification of Eleventh Embodiment)
Read Voltages: [(CR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(122nd Modification of Eleventh Embodiment)
Read Voltages: [(CR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(123rd Modification of Eleventh Embodiment)
Read Voltages: [(GR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(124th Modification of Eleventh Embodiment)
Read Voltages: [(GR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(125th Modification of Eleventh Embodiment)
Read Voltages: [(GR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(126th Modification of Eleventh Embodiment)
Read Voltages: [(GR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(127th Modification of Eleventh Embodiment)
Read Voltages: [(GR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(128th Modification of Eleventh Embodiment)
Read Voltages: [(GR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(129th Modification of Eleventh Embodiment)
Read Voltages: [(GR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(130th Modification of Eleventh Embodiment)
Read Voltages: [(GR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(131st Modification of Eleventh Embodiment)
Read Voltages: [(GR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(132nd Modification of Eleventh Embodiment)
Read Voltages: [(GR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(133rd Modification of Eleventh Embodiment)
Read Voltages: [(GR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(134th Modification of Eleventh Embodiment)
Read Voltages: [(GR, DR), (DR, DR), ((AR, CR), (BR, FR)), ((BR, FR), (AR, CR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(135th Modification of Eleventh Embodiment)
Read Voltages: [(GR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(136th Modification of Eleventh Embodiment)
Read Voltages: [(GR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 0], [0, 1, 1, 0], [0, 1, 1, 0], [0, 1, 1, 0]]

(137th Modification of Eleventh Embodiment)
Read Voltages: [(GR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(138th Modification of Eleventh Embodiment)
Read Voltages: [(GR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(139th Modification of Eleventh Embodiment)
Read Voltages: [(GR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(140th Modification of Eleventh Embodiment)
Read Voltages: [(GR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(141st Modification of Eleventh Embodiment)
Read Voltages: [(GR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(142nd Modification of Eleventh Embodiment)
Read Voltages: [(GR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(143rd Modification of Eleventh Embodiment)
Read Voltages: [(GR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(144th Modification of Eleventh Embodiment)
Read Voltages: [(GR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(145th Modification of Eleventh Embodiment)
Read Voltages: [(GR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(146th Modification of Eleventh Embodiment)
Read Voltages: [(GR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(147th Modification of Eleventh Embodiment)
Read Voltages: [(GR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(148th Modification of Eleventh Embodiment)
Read Voltages: [(GR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(149th Modification of Eleventh Embodiment)
Read Voltages: [(GR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(150th Modification of Eleventh Embodiment)
Read Voltages: [(GR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(151st Modification of Eleventh Embodiment)
Read Voltages: [(GR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(152nd Modification of Eleventh Embodiment)
Read Voltages: [(GR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(153th Modification of Eleventh Embodiment)
Read Voltages: [(GR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(154th Modification of Eleventh Embodiment)
Read Voltages: [(GR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(155th Modification of Eleventh Embodiment)
Read Voltages: [(GR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(156th Modification of Eleventh Embodiment)
Read Voltages: [(GR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(157th Modification of Eleventh Embodiment)
Read Voltages: [(GR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(158th Modification of Eleventh Embodiment)
Read Voltages: [(GR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(159th Modification of Eleventh Embodiment)
Read Voltages: [(GR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(160th Modification of Eleventh Embodiment)
Read Voltages: [(GR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(161st Modification of Eleventh Embodiment)
Read Voltages: [(GR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(162nd Modification of Eleventh Embodiment)
Read Voltages: [(GR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0], [0, 1, 1, 0]]

(163rd Modification of Eleventh Embodiment)
Read Voltages: [(GR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(164th Modification of Eleventh Embodiment)
Read Voltages: [(GR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(165th Modification of Eleventh Embodiment)
Read Voltages: [(AR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(166th Modification of Eleventh Embodiment)
Read Voltages: [(DR, AR), (AR, DR), ((AR, CR), (BR, FR)), ((BR, FR), (AR, GR)), ((BR, FR), (CR, ER)), ((ER, GR), (BR, FR))]; Data Definitions: [[0, 1], 0, 11, [0, 1, 1, 0], [0, 1, 1, 0], [0, 1, 1, 0], [0, 1, 1, 0], [0, 1, 1, 0]]

(167th Modification of Eleventh Embodiment)
Read Voltages: [(DR, AR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(168th Modification of Eleventh Embodiment)
Read Voltages: [(DR, AR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(169th Modification of Eleventh Embodiment)
Read Voltages: [(DR, AR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(170th Modification of Eleventh Embodiment)
Read Voltages: [(AR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(171st Modification of Eleventh Embodiment)
Read Voltages: [(AR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(172nd Modification of Eleventh Embodiment)
Read Voltages: [(DR, AR), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(173rd Modification of Eleventh Embodiment)
Read Voltages: [(DR, AR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(174th Modification of Eleventh Embodiment)
Read Voltages: [(DR, AR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(175th Modification of Eleventh Embodiment)
Read Voltages: [(DR, AR), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(176th Modification of Eleventh Embodiment)
Read Voltages: [(DR, AR), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(177th Modification of Eleventh Embodiment)
Read Voltages: [(DR, AR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(178th Modification of Eleventh Embodiment)
Read Voltages: [(DR, AR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(179th Modification of Eleventh Embodiment)
Read Voltages: [(DR, AR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(180th Modification of Eleventh Embodiment)
Read Voltages: [(DR, AR), (GR, DR), ((AR, CR), (BR, FR)), ((BR, FR), (AR, GR)), ((BR, FR), (CR, ER)), ((ER, GR), (BR, FR))]; Data. Definitions: [[0, 1, 0, 1], [0, 1, 0], [0, 1, 1, 0], [0, 1, 1, 0], [0, 1, 1, 0], [0, 1, 1, 0]]

(181st Modification of Eleventh Embodiment)
Read Voltages: [(AR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(182th Modification of Eleventh Embodiment)
Read Voltages: [(DR, BR), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(183th Modification of Eleventh Embodiment)
Read Voltages: [(DR, BR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(184th Modification of Eleventh Embodiment)
Read Voltages: [(DR, BR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(185th Modification of Eleventh Embodiment)
Read Voltages: [(DR, BR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(186th Modification of Eleventh Embodiment)
Read Voltages: [(AR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(187th Modification of Eleventh Embodiment)
Read Voltages: [(AR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(188th Modification of Eleventh Embodiment)
Read Voltages: [(AR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(189th Modification of Eleventh Embodiment)
Read Voltages: [(AR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(190th Modification of Eleventh Embodiment)
Read Voltages: [(AR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(191st Modification of Eleventh Embodiment)
Read Voltages: [(DR, BR), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(192nd Modification of Eleventh Embodiment)
Read Voltages: [(DR, BR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(193rd Modification of Eleventh Embodiment)
Read Voltages: [(DR, BR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(194th Modification of Eleventh Embodiment)
Read Voltages: [(DR, BR), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(195th Modification of Eleventh Embodiment)
Read Voltages: [(DR, BR), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(196th Modification of Eleventh Embodiment)
Read Voltages: [(DR, BR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(197th Modification of Eleventh Embodiment)
Read Voltages: [(DR, BR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(198th Modification of Eleventh Embodiment)
Read Voltages: [(DR, BR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(199th Modification of Eleventh Embodiment)
Read Voltages: [(DR, BR), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(200th Modification of Eleventh Embodiment)
Read Voltages: [(AR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(201st Modification of Eleventh Embodiment)
Read Voltages: [(DR, CR), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(202nd Modification of Eleventh Embodiment)
Read Voltages: [(DR, CR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(203rd Modification of Eleventh Embodiment)
Read Voltages: [(DR, CR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(204th Modification of Eleventh Embodiment)
Read Voltages: [(DR, CR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(205th Modification of Eleventh Embodiment)
Read Voltages: [(DR, CR), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(206th Modification of Eleventh Embodiment)
Read Voltages: [(DR, CR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(207th Modification of Eleventh Embodiment)
Read Voltages: [(DR, CR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(208th Modification of Eleventh Embodiment)
Read Voltages: [(DR, CR), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(209th Modification of Eleventh Embodiment)
Read Voltages: [(DR, CR), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(210th Modification of Eleventh Embodiment)
Read Voltages: [(AR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0], [0, 1, 1, 0]]

(211th Modification of Eleventh Embodiment)
Read Voltages: [(AR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(212th Modification of Eleventh Embodiment)
Read Voltages: [(DR, CR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(213th Modification of Eleventh Embodiment)
Read Voltages: [(DR, CR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(214th Modification of Eleventh Embodiment)
Read Voltages: [(DR, CR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(215th Modification of Eleventh Embodiment)
Read Voltages: [(DR, CR), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(216th Modification of Eleventh Embodiment)
Read Voltages: [(DR, DR), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(217th Modification of Eleventh Embodiment)
Read Voltages: [(DR, DR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(218th Modification of Eleventh Embodiment)
Read Voltages: [(DR, DR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(219th Modification of Eleventh Embodiment)
Read Voltages: [(AR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(220th Modification of Eleventh Embodiment)
Read Voltages: [(DR, DR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(221st Modification of Eleventh Embodiment)
Read Voltages: [(DR, DR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(222nd Modification of Eleventh Embodiment)
Read Voltages: [(DR, DR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(223rd Modification of Eleventh Embodiment)
Read Voltages: [(DR, DR), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(224th Modification of Eleventh Embodiment)
Read Voltages: [(DR, DR), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(225th Modification of Eleventh Embodiment)
Read Voltages: [(DR, DR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(226th Modification of Eleventh Embodiment)
Read Voltages: [(DR, DR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(227th Modification of Eleventh Embodiment)
Read Voltages: [(DR, DR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(228th Modification of Eleventh Embodiment)
Read Voltages: [(DR, DR), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(229th Modification of Eleventh Embodiment)
Read Voltages: [(DR, ER), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(230th Modification of Eleventh Embodiment)
Read Voltages: [(DR, ER), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(231st Modification of Eleventh Embodiment)
Read Voltages: [(DR, ER), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(232nd Modification of Eleventh Embodiment)
Read Voltages: [(DR, ER), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(233rd Modification of Eleventh Embodiment)
Read Voltages: [(DR, ER), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(234th Modification of Eleventh Embodiment)
Read Voltages: [(DR, ER), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(235th Modification of Eleventh Embodiment)
Read Voltages: [(DR, ER), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(236th Modification of Eleventh Embodiment)
Read Voltages: [(DR, ER), (DR, DR), ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(237th Modification of Eleventh Embodiment)
Read Voltages: [(DR, ER), (DR, DR), ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(238th Modification of Eleventh Embodiment)
Read Voltages: [(DR, ER), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(239th Modification of Eleventh Embodiment)
Read Voltages: [(DR, ER), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(240th Modification of Eleventh Embodiment)
Read Voltages: [(DR, ER), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(241st Modification of Eleventh Embodiment)
Read Voltages: [(DR, ER), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(242nd Modification of Eleventh Embodiment)
Read Voltages: [(DR, FR), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(243rd Modification of Eleventh Embodiment)
Read Voltages: [(DR, FR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(244th Modification of Eleventh Embodiment)
Read Voltages: [(DR, FR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 1, 0], [0, 1, 1, 0], [0, 1, 1, 0]]

(245th Modification of Eleventh Embodiment)
Read Voltages: [(DR, FR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(246th Modification of Eleventh Embodiment)
Read Voltages: [(DR, FR), (DR, DR), ((AR, CR), (BR, FR)), ((BR, FR), (AR, CR)), ((BR, FR), (ER, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(247th Modification of Eleventh Embodiment)
Read Voltages: [(DR, FR), (DR, DR), ((AR, CR), (BR, FR)), ((BR, FR), (AR, ER)), ((BR, FR), (CR, GR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(248th Modification of Eleventh Embodiment)
Read Voltages: [(DR, FR), (DR, DR), ((AR, CR), (BR, FR)), ((BR, FR), (AR, GR)), ((BR, FR), (CR, ER)), ((ER, GR), (BR, FR))]; Data Definitions: [[0, 1, 0, 1] [0, 1, 1, 0], [0, 1, 1, 0], [0, 1, 1, 0], [0, 1, 1, 0], [0, 1, 1, 0]]

(249th Modification of Eleventh Embodiment)
Read Voltages: [(DR, FR), (DR, DR) ((AR, ER), (BR, FR)), ((BR, FR), (AR, CR)), ((BR, FR), (ER, GR)), ((CR, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(250th Modification of Eleventh Embodiment)
Read Voltages: [(DR, FR), (DR, DR) ((AR, GR), (BR, FR)), ((BR, FR), (AR, CR)), ((BR, FR), (ER, GR)), ((CR, ER), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(251st Modification of Eleventh Embodiment)
Read Voltages: [(DR, FR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(252nd Modification of Eleventh Embodiment)
Read Voltages: [(DR, FR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(253rd Modification of Eleventh Embodiment)
Read Voltages: [(DR, FR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(254th Modification of Eleventh Embodiment)
Read Voltages: [(DR, FR), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(255th Modification of Eleventh Embodiment)
Read Voltages: [(DR, GR), (AR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(255th Modification of Eleventh Embodiment)
Read Voltages: [(DR, GR), (BR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(257th Modification of Eleventh Embodiment)
Read Voltages: [(DR, GR), (BR, DR), ((AR, CR), (BR, FR)), ((BR, FR), (BR, FR)), ((ER, GR), (AR, ER)), ((ER, GR), (CR, GR))]; Data Definitions: [[0, 1, 0, 1], [0, 1, 1, 0], [0, 1, 1, 0], [0, 1, 0], [0, 1, 1, 0], [0, 1, 1, 0]]

(258th Modification of Eleventh Embodiment)
Read Voltages: [(DR, GR), (CR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(259th Modification of Eleventh Embodiment)
Read Voltages: [(DR, GR), (ER, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(260th Modification of Eleventh Embodiment)
Read Voltages: [(DR, GR), (FR, DR), ((AR, CR), (AR, ER)), ((AR, CR), (CR, GR)), ((BR, FR), (BR, FR)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(261st Modification of Eleventh Embodiment)
Read Voltages: [(DR, GR), (FR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(262nd Modification of Eleventh Embodiment)
Read Voltages: [(DR, GR), (GR, DR), ((AR, CR), (BR, FR)), ((BR, FR), (AR, GR)), ((BR, FR), (CR, ER)), ((ER, GR), (BR, FR))]; Data Definitions: [[0, 1, 0, 1], [0, 1, 1, 0], [0, 1, 1, 0], [0, 1, 1, 0], [0, 1, 1, 0], [0, 1, 1, 0]]

(263rd Modification of Eleventh Embodiment)
Read Voltages: [(BR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(264th Modification of Eleventh Embodiment)
Read Voltages: [(BR, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(265th Modification of Eleventh Embodiment)
Read Voltages: [(BR, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(266th Modification of Eleventh Embodiment)
Read Voltages: [(BR, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(267th Modification of Eleventh Embodiment)
Read Voltages: [(BR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(268th Modification of Eleventh Embodiment)
Read Voltages: [(BR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(269th Modification of Eleventh Embodiment)
Read Voltages: [(BR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(270th Modification of Eleventh Embodiment)
Read Voltages: [(BR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(271st Modification of Eleventh Embodiment)
Read Voltages: [(BR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(272nd Modification of Eleventh Embodiment)
Read Voltages: [(BR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(273rd Modification of Eleventh Embodiment)
Read Voltages: [(BR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(274th Modification of Eleventh Embodiment)
Read Voltages: [(BR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(275th Modification of Eleventh Embodiment)
Read Voltages: [(BR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(276th Modification of Eleventh Embodiment)
Read Voltages: [(BR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(277th Modification of Eleventh Embodiment)
Read Voltages: [(BR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(278th Modification of Eleventh Embodiment)
Read Voltages: [(BR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(279th Modification of Eleventh Embodiment)
Read Voltages: [(BR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(280th Modification of Eleventh Embodiment)
Read Voltages: [(BR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(281st Modification of Eleventh Embodiment)
Read Voltages: [(BR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(282nd Modification of Eleventh Embodiment)
Read Voltages: [(BR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(283rd Modification of Eleventh Embodiment)
Read Voltages: [(BR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(284th Modification of Eleventh Embodiment)
Read Voltages: [(BR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(285th Modification of Eleventh Embodiment)
Read Voltages: [(BR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(286th Modification of Eleventh Embodiment)
Read Voltages: [(BR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(287th Modification of Eleventh Embodiment)
Read Voltages: [(BR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(288th Modification of Eleventh Embodiment)
Read Voltages: [(BR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(289th Modification of Eleventh Embodiment)
Read Voltages: [(BR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(290th Modification of Eleventh Embodiment)
Read Voltages: [(BR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(291st Modification of Eleventh Embodiment)
Read Voltages: [(BR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(292nd Modification of Eleventh Embodiment)
Read Voltages: [(BR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(293rd Modification of Eleventh Embodiment)
Read Voltages: [(BR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(294th Modification of Eleventh Embodiment)
Read Voltages: [(BR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(295th Modification of Eleventh Embodiment)
Read Voltages: [(BR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(296th Modification of Eleventh Embodiment)
Read Voltages: [(BR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(297th Modification of Eleventh Embodiment)
Read Voltages: [(BR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(298th Modification of Eleventh Embodiment)
Read Voltages: [(BR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(299th Modification of Eleventh Embodiment)
Read Voltages: [(BR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(300th Modification of Eleventh Embodiment)
Read Voltages: [(BR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(301st Modification of Eleventh Embodiment)
Read Voltages: [(BR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(302nd Modification of Eleventh Embodiment)
Read Voltages: [(BR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(303rd Modification of Eleventh Embodiment)
Read Voltages: [(BR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(304th Modification of Eleventh Embodiment)
Read Voltages: [(BR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(305th Modification of Eleventh Embodiment)
Read Voltages: [(BR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(306th Modification of Eleventh Embodiment)
Read Voltages: [(BR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(307th Modification of Eleventh Embodiment)
Read Voltages: [(BR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(308th Modification of Eleventh Embodiment)
Read Voltages: [(BR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0], [0, 1, 1, 0]]

(309th Modification of Eleventh Embodiment)
Read Voltages: [(BR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(310th Modification of Eleventh Embodiment)
Read Voltages: [(BR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(311th Modification of Eleventh Embodiment)
Read Voltages: [(CR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(312th Modification of Eleventh Embodiment)
Read Voltages: [(CR, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(313th Modification of Eleventh Embodiment)
Read Voltages: [(CR, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(314th Modification of Eleventh Embodiment)
Read Voltages: [(CR, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(315th Modification of Eleventh Embodiment)
Read Voltages: [(CR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(316th Modification of Eleventh Embodiment)
Read Voltages: [(CR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(317th Modification of Eleventh Embodiment)
Read Voltages: [(CR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(318th Modification of Eleventh Embodiment)
Read Voltages: [(CR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(319th Modification of Eleventh Embodiment)
Read Voltages: [(CR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(320th Modification of Eleventh Embodiment)
Read Voltages: [(CR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(321st Modification of Eleventh Embodiment)
Read Voltages: [(CR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(322nd Modification of Eleventh Embodiment)
Read Voltages: [(CR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(323th Modification of Eleventh Embodiment)
Read Voltages: [(CR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(324th Modification of Eleventh Embodiment)
Read Voltages: [(CR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(325th Modification of Eleventh Embodiment)
Read Voltages: [(CR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(326th Modification of Eleventh Embodiment)
Read Voltages: [(CR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(327th Modification of Eleventh Embodiment)
Read Voltages: [(CR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(328th Modification of Eleventh Embodiment)
Read Voltages: [(CR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(329th Modification of Eleventh Embodiment)
Read Voltages: [(CR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(330th Modification of Eleventh Embodiment)
Read Voltages: [(CR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(331st Modification of Eleventh Embodiment)
Read Voltages: [(CR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(332nd Modification of Eleventh Embodiment)
Read Voltages: [(CR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(333rd Modification of Eleventh Embodiment)
Read Voltages: [(CR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(334th Modification of Eleventh Embodiment)
Read Voltages: [(CR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(335th Modification of Eleventh Embodiment)
Read Voltages: [(CR, DR), (DR, ER), ((AR, GR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(336th Modification of Eleventh Embodiment)
Read Voltages: [(AR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(337th Modification of Eleventh Embodiment)
Read Voltages: [(AR, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(338th Modification of Eleventh Embodiment)
Read Voltages: [(AR, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(339th Modification of Eleventh Embodiment)
Read Voltages: [(AR, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(340th Modification of Eleventh Embodiment)
Read Voltages: [(AR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(341st Modification of Eleventh Embodiment)
Read Voltages: [(CR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(342nd Modification of Eleventh Embodiment)
Read Voltages: [(CR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(343rd Modification of Eleventh Embodiment)
Read Voltages: [(CR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(344th Modification of Eleventh Embodiment)
Read Voltages: [(CR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(345th Modification of Eleventh Embodiment)
Read Voltages: [(CR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(346th Modification of Eleventh Embodiment)
Read Voltages: [(CR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(347th Modification of Eleventh Embodiment)
Read Voltages: [(CR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(348th Modification of Eleventh Embodiment)
Read Voltages: [(CR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(349th Modification of Eleventh Embodiment)
Read Voltages: [(CR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1],[0, 1, 1, 0], [0, 1, 1, 0], [0, 1, 1, 0], [0, 1, 1, 0]]

(350th Modification of Eleventh Embodiment)
Read Voltages: [(CR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(351st Modification of Eleventh Embodiment)
Read Voltages: [(CR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(352nd Modification of Eleventh Embodiment)
Read Voltages: [(CR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(353rd Modification of Eleventh Embodiment)
Read Voltages: [(CR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(354th Modification of Eleventh Embodiment)
Read Voltages: [(CR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(355th Modification of Eleventh Embodiment)
Read Voltages: [(CR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(356th Modification of Eleventh Embodiment)
Read Voltages: [(CR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(357th Modification of Eleventh Embodiment)
Read Voltages: [(CR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(358th Modification of Eleventh Embodiment)
Read Voltages: [(CR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(359th Modification of Eleventh Embodiment)
Read Voltages: [(CR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(360th Modification of Eleventh Embodiment)
Read Voltages: [(CR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(361st Modification of Eleventh Embodiment)
Read Voltages: [(AR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(362nd Modification of Eleventh Embodiment)
Read Voltages: [(AR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(363rd Modification of Eleventh Embodiment)
Read Voltages: [(AR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(364th Modification of Eleventh Embodiment)
Read Voltages: [(AR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(365th Modification of Eleventh Embodiment)
Read Voltages: [(AR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(366th Modification of Eleventh Embodiment)
Read Voltages: [(CR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1,], [0, 1, 1, 0], [0, 1, 1, 0], [0, 1, 1, 0], [0, 1, 1, 0]]

(367th Modification of Eleventh Embodiment)
Read Voltages: [(CR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(368th Modification of Eleventh Embodiment)
Read Voltages: [(CR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(369th Modification of Eleventh Embodiment)
Read Voltages: [(DR, DR), (DR, AR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(370th Modification of Eleventh Embodiment)
Read Voltages: [(DR, DR), (DR, AR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(371st Modification of Eleventh Embodiment)
Read Voltages: [(DR, DR), (DR, AR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(372nd Modification of Eleventh Embodiment)
Read Voltages: [(DR, DR), (DR, AR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(373rd Modification of Eleventh Embodiment)
Read Voltages: [(DR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(374th Modification of Eleventh Embodiment)
Read Voltages: [(DR, DR), (DR, BR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(375th Modification of Eleventh Embodiment)
Read Voltages: [(DR, DR), (DR, BR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(376th Modification of Eleventh Embodiment)
Read Voltages: [(DR, DR), (DR, BR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(377th Modification of Eleventh Embodiment)
Read Voltages: [(DR, DR), (DR, BR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(378th Modification of Eleventh Embodiment)
Read Voltages: [(DR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(379th Modification of Eleventh Embodiment)
Read Voltages: [(AR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(380th Modification of Eleventh Embodiment)
Read Voltages: [(AR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(381st Modification of Eleventh Embodiment)
Read Voltages: [(AR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(382nd Modification of Eleventh Embodiment)
Read Voltages: [(AR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(383rd Modification of Eleventh Embodiment)
Read Voltages: [(AR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(384th Modification of Eleventh Embodiment)
Read Voltages: [(DR, DR), (DR, CR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(385th Modification of Eleventh Embodiment)
Read Voltages: [(DR, DR), (DR, CR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(386th Modification of Eleventh Embodiment)
Read Voltages: [(DR, DR), (DR, CR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(387th Modification of Eleventh Embodiment)
Read Voltages: [(DR, DR), (DR, CR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(388th Modification of Eleventh Embodiment)
Read Voltages: [(DR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(389th Modification of Eleventh Embodiment)
Read Voltages: [(DR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(390th Modification of Eleventh Embodiment)
Read Voltages: [(DR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(391st Modification of Eleventh Embodiment)
Read Voltages: [(DR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(392nd Modification of Eleventh Embodiment)
Read Voltages: [(DR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(393rd Modification of Eleventh Embodiment)
Read Voltages: [(DR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(394th Modification of Eleventh Embodiment)
Read Voltages: [(DR, DR), (DR, ER), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(395th Modification of Eleventh Embodiment)
Read Voltages: [(DR, DR), (DR, ER), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(396th Modification of Eleventh Embodiment)
Read Voltages: [(DR, DR), (DR, ER), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(397th Modification of Eleventh Embodiment)
Read Voltages: [(DR, DR), (DR, ER), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 10], [0, 1, 1, 0]]

(398th Modification of Eleventh Embodiment)
Read Voltages: [(DR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(399th Modification of Eleventh Embodiment)
Read Voltages: [(DR, DR), (DR, FR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(400th Modification of Eleventh Embodiment)
Read Voltages: [(DR, DR), (DR, FR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(401st Modification of Eleventh Embodiment)
Read Voltages: [(DR, DR), (DR, FR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(402nd Modification of Eleventh Embodiment)
Read Voltages: [(DR, DR), (DR, FR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(403rd Modification of Eleventh Embodiment)
Read Voltages: [(DR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(404th Modification of Eleventh Embodiment)
Read Voltages: [(DR, DR), (DR, GR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(405th Modification of Eleventh Embodiment)
Read Voltages: [(DR, DR), (DR, GR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(406th Modification of Eleventh Embodiment)
Read Voltages: [(DR, DR), (DR, GR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(407th Modification of Eleventh Embodiment)
Read Voltages: [(DR, DR), (DR, GR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(408th Modification of Eleventh Embodiment)
Read Voltages: [(DR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(409th Modification of Eleventh Embodiment)
Read Voltages: [(DR, DR), (DR, AR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(410th Modification of Eleventh Embodiment)
Read Voltages: [(DR, DR), (DR, BR), ((AR, ER), (ER, GR)), ((BR, FR), (AR, CR)), ((BR, FR), (BR, FR)), ((CR, GR), (ER, GR))]; Data Definitions: [[0, 0, 1, 1], [0, 1, 1, 0], [0, 1, 1, 0], [0, 1, 1, 0], [0, 1, 1, 0], [0, 1, 1, 0]]

(411th Modification of Eleventh Embodiment)
Read Voltages: [(DR, DR), (DR, BR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(412th Modification of Eleventh Embodiment)
Read Voltages: [(AR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(413th Modification of Eleventh Embodiment)
Read Voltages: [(AR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(414th Modification of Eleventh Embodiment)
Read Voltages: [(AR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(415th Modification of Eleventh Embodiment)
Read Voltages: [(AR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(416th Modification of Eleventh Embodiment)
Read Voltages: [(AR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 0, 1], [0, 1, 1, 0], [0, 1, 1, 0], [0, 1, 1, 0], [0, 1, 1, 0]]

(417th Modification of Eleventh Embodiment)
Read Voltages: [(DR, DR), (DR, CR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(418th Modification of Eleventh Embodiment)
Read Voltages: [(DR, DR), (DR, DR), ((AR, CR), (BR, FR)), ((BR, FR), (AR, CR)), ((BR, FR), (ER, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(419th Modification of Eleventh Embodiment)
Read Voltages: [(DR, DR), (DR, DR), ((AR, CR), (BR, FR)), ((BR, FR), (AR, ER)), ((BR, FR), (CR, GR)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(420th Modification of Eleventh Embodiment)
Read Voltages: [(DR, DR), (DR, DR), ((AR, CR), (BR, FR)), ((BR, FR), (AR, GR)), ((BR, FR), (CR, ER)), ((ER, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(421st Modification of Eleventh Embodiment)
Read Voltages: [(DR, DR), (DR, DR), ((AR, ER), (BR, FR)), ((BR, FR), (AR, CR)), ((BR, FR), (ER, GR)), ((CR, GR), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(422nd Modification of Eleventh Embodiment)
Read Voltages: [(DR, DR), (DR, DR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(423rd Modification of Eleventh Embodiment)
Read Voltages: [(DR, DR), (DR, ER), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(424th Modification of Eleventh Embodiment)
Read Voltages: [(DR, DR), (DR, FR), ((AR, ER), (AR, CR)), ((BR, FR), (BR, FR)), ((BR, FR), (ER, GR)), ((CR, GR), (AR, CR))]; Data Definitions: [[0, 0, 1, 1], [0, 1, 1, 0], [0, 1, 1, 0], [0, 1, 1, 0], [0, 1, 1, 0], [0, 1, 1, 0]]

(425th Modification of Eleventh Embodiment)
Read Voltages: [(DR, DR), (DR, FR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

(426th Modification of Eleventh Embodiment)
Read Voltages: [(DR, DR), (DR, GR), ((AR, GR), (BR, FR)), ((BR, FR), (AR, CR)), ((BR, FR), (ER, GR)), ((CR, ER), (BR, FR))]; Data Definitions: [[0, 0, 1, 1], [0, 1, 1, 0], [0, 1, 1, 0], [0, 1, 1, 0], [0, 1, 1, 0], [0, 1, 1, 0]]

The semiconductor memory 10 of each of the above-described modifications of the eleventh embodiment is capable of performing the same operation as the eleventh embodiment, and can achieve similar advantageous effects.

In the eleventh embodiment, the write operations are simultaneously performed for the first to sixth pages after the data for the first through sixth pages is transferred to the sense amplifier module 17A of first plane PL1 and the sense amplifier module 17B of second plane PL2; however, a write operation may be performed page by page, as in the second through fifth embodiments. In the following, an example where the method described in the second embodiment is adopted in the semiconductor memory 10 storing 6-bit data in two memory cell transistors MT will be briefly explained.

For example, as in the second embodiment, in the semiconductor memory 10 according to the eleventh embodiment, the sequencer performs a first write operation in the memory cell transistors MT in first plane PL1 during the first page write, thereby storing 1-bit data corresponding to the first page data in the memory cell transistors MT.

The sequencer 14 performs a second write operation in the memory cell transistors MT in second plane PL2 during the second page write, thereby storing 1-bit data corresponding to the second page data in the memory cell transistors MT.

In the above example, the write data for the first and second pages is written after the data is input page by page; however, the present embodiment is not limited to this example. For example, the sequencer 14 may simultaneously perform a first write operation in first plane PL1 and a second write operation in second plane PL2 in parallel, after the first page write data is transferred to the sense amplifier module 17A, and the second page write data is transferred to the sense amplifier module 17B.

Thereafter, the semiconductor memory 10 transfers the write data for the third to sixth pages received from the memory controller 20 to the sense amplifier module 17A of first plane PL1 and the sense amplifier module 17B of second plane PL2.

Then, the sequencer 14 performs IDL to first plane PL1 to restore the data written by the first page write in the sense amplifier module 17A, and transfers the data to each of the sense amplifier module 17B.

Then, the sequencer 14 performs IDL to second plane PL2 to restore the data written by the second page write in the sense amplifier module 17B, and transfers the data to each of the sense amplifier module 17A.

Then, each of the sense amplifier modules 17A and 17B retains the first to sixth page data, and the sequencer 14 performs a write operation for the 6-page data based on the data allocation.

Thus, even in a case where 6-bit data is stored in two memory cell transistors MT, the semiconductor memory 10 can perform the operations similar to those in the second embodiment, and can achieve advantageous effects similar to those in the second embodiment. The semiconductor memory 10 can even perform operations similar to the operations explained in each of the third to fifth embodiments to store 6-bit a data in two memory cell transistors MT.

An example of writing the write data for the third to sixth pages by one write operation is explained above; however, a page-by-page write operation may be performed for each of the third to sixth pages. In this case, the semiconductor memory 10 reads data that has already been written in a lower page by performing IDL after receiving one-page write data, and restores the data of the lower page in the latch circuit of each of the sense amplifier modules 17A and 17B, and then performs a write operation for the page.

[12] Twelfth Embodiment

A semiconductor memory 10 according to the twelfth embodiment includes the same configuration as the semiconductor memory 10 according to the eleventh embodiment, and performs the 6-page write explained in the eleventh embodiment in two stages. In the following, differences of the semiconductor memory 10 according to the twelfth embodiment from the first to eleventh embodiments will be described.

[12-1] Configuration

[12-1-1] Threshold Distributions of Memory Cell Transistor MT

The semiconductor memory 10 according to the twelfth embodiment performs a rough write operation (the first stage write) to form two threshold distributions before forming the eight threshold distributions explained in the eleventh embodiment with reference to FIG. 104. Thereafter, the semiconductor memory 10 according to the twelfth embodiment performs a precise write operation (the second stage write) for the memory cell transistors MT in which data has been roughly written, and thereby forms the eight threshold distributions.

Figure 121:
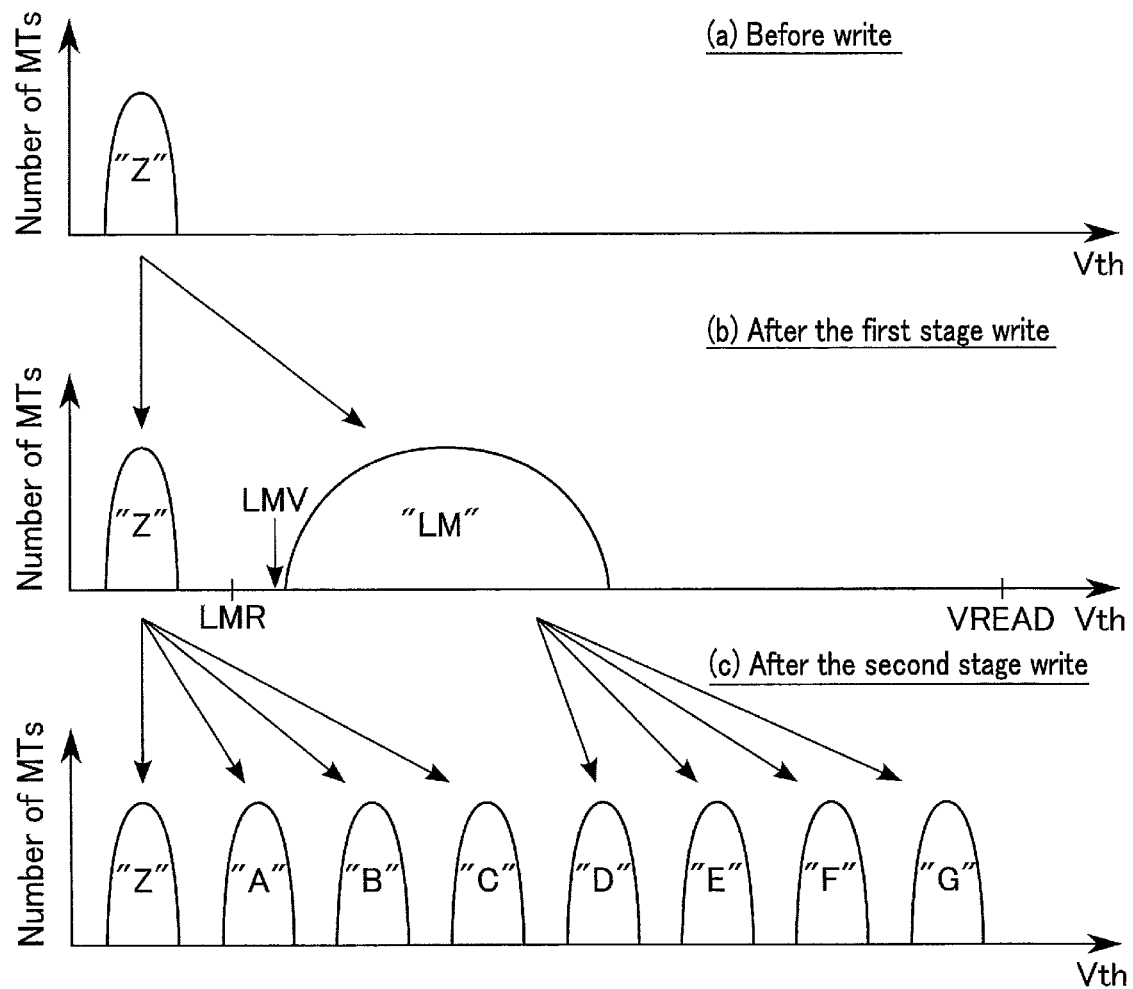
FIG. 121 is a threshold distribution diagram showing an example of distributions of threshold voltages of memory cell transistors according to the twelfth embodiment.

FIG. 121 shows an example of threshold distributions of the memory cell transistors MT, read voltages, and verify voltages in the semiconductor memory 10 according to the twelfth embodiment. In FIG. 121, (a) shows the threshold distributions of the memory cell transistors MT before the write (in other words, in an erase state); (b) shows the threshold distributions of the memory cell transistors MT after the first stage write is performed; and (c) shows the threshold distributions of the memory cell transistors MT after the second stage write is performed.

The semiconductor memory 10 according to the twelfth embodiment performs the first stage write to form the "Z"- and "LM"-state threshold distributions as shown in (b) of FIG. 121 from the "Z"-state threshold distribution shown in (a) of FIG. 121. Thereafter, the semiconductor memory 10 according to the twelfth embodiment performs the second stage write to form the "Z"-, "A"-, "B"-, and "C"-state threshold distributions as shown in (c) of FIG. 121 from the "Z"-state threshold distribution as shown in (b) of FIG. 121, and to form the "D"-, "E"-, "F"-, and "G"-state threshold distributions as shown in (c) of FIG. 121 from the "LM"-state threshold distribution as shown in (b) of FIG. 121.

The memory cell transistors MT included in the "LM"-state have threshold voltages higher than the "A" state and lower than the "D" state, for example. Specifically, the threshold voltages of the memory cell transistors MT included in the "LM"-state threshold distribution are set between a minimum threshold voltage in the "A"-state threshold distribution and a maximum threshold voltage in the "D"-state threshold distribution.

Then, a read voltage LMR is set between the "Z" state and the "LM" state, and a verify voltage LMV is set in accordance with the "LM" state. Specifically, the read voltage LMR is set between a maximum threshold voltage in the "Z" state and a minimum threshold voltage in the "LM" state. The verify voltage LMV is set between a maximum threshold voltage in the "Z" state and a minimum threshold voltage in the "LM" state, and in the vicinity of the "E" state. For example, the read pass voltage VREAD after the first stage write and before the second stage write is set higher than the maximum threshold voltage in the "LM" state.

The threshold voltages of the memory-cell transistors MT included in the "LM" state may be changed as appropriate based on a data allocation used for storing 6-bit data. For example, if the data allocation using the read voltages CR and DR is adopted for the first page read and the second page read, the threshold voltages of the memory cell transistors MT included in the "LM" state are set so as to be distributed higher than the "A" state and lower than the "C" state. Thus, the threshold distribution of the "LM" state is set based on the lowest read voltage among the read voltages used in the first page read and the second page read.

[12-1-2] Data Allocation

FIG. 122 shows an example of a data allocation for the first stage write in the twelfth embodiment. In the first stage write in the twelfth embodiment, as shown in FIG. 122 and thereafter, 2-bit data is allocated to each of four combinations, each consisting of one of two threshold voltages of the memory cell transistors MT in first plane PL1 and one of two threshold voltages of the memory cell transistors MT in second plane PL2.

(Example) "threshold voltage of memory cell transistors MT in first plane PL1", "threshold voltage of memory cell transistors MT in second plane PL2": "first bit/second bit" data (1) "Z" state, "Z" state: "11" data
(2) "Z" state, "LM" state: "10" data
(3) "LM" state, "Z" state: "01" data
(4) "LM" state, "M" state: "00" data Since the data allocation for the second stage write in the twelfth embodiment is the same as the data allocation explained in the eleventh embodiment with reference to FIGS. 105 and 106, the explanation thereof is omitted.

[12-2] Write Operation (First Stage Write)

FIG. 123 shows an example of commands, and signals and voltages applied to the lines in the first stage write in the semiconductor memory 10 according to the twelfth embodiment. In the first stage write in the twelfth embodiment, the first page write and the second page write are simultaneously performed, for example.

Specifically, as shown in FIG. 123, first, the memory controller 20 sequentially transmits a first command set CS1 and a second command set CS2 to the semiconductor memory 10. The command sets CS1 through CS2 include commands for instructing an operation for the first and second pages respectively, and include write data DAT to be written in the first and second pages respectively.

After receiving the command set CS1, the semiconductor memory 10 temporarily changes to a busy state, and transfers the received write data DAT to each of the latch circuits in the sense amplifier modules 17A and 17B.

The semiconductor memory 10 changes to a busy state after receiving the second command set CS2, and the sequencer 14 performs the first stage write based on the first and second page data retained in each of the latch circuits in the sense amplifier modules 17A and 17B. Specifically, the sequencer 14 simultaneously performs a first write operation for first plane PL1, and a second write operation for second plane PL2 in parallel based on the first to second page write data.

In FIG. 123, the semiconductor memory 10 temporarily changes to a busy state after receiving command set CS1; however, the embodiment is not limited to this example. For example, the semiconductor memory 10 may start the first stage write after the first and second page data is input, without temporarily changing to a busy state after receiving the command set CS1.

In each of the first write operation for first plane PL1 and the second write operation for second plane PL2, write-targeted and write-inhibited memory cell transistors MT are set based on the data allocation shown in FIG. 122, and the sequencer 14 performs a program loop. In the example shown in FIG. 122, since a "LM"-state write is performed in each of the first and second write operations, the verify voltage LMV is applied to a selected word line WLsel in the verify operation in each program loop. Since the details of each of the first write operation for first plane PL1 and the second write operation for second plane PL2 are the same as the first write operation explained with reference to FIG. 11 in the first embodiment, the description of the details is omitted.

When the first write operation for first plane PL1 and the second write operation for second plane PL2 are finished, the threshold voltages of the memory cell transistors MT in a cell unit CU selected in first plane PL1, and the threshold voltages of the memory cell transistors MT in a cell unit CU selected in second plane PL2, form two threshold distributions like those shown in (b) of FIG. 121. Then, when the sequencer 14 detects the finish of the first write operation for first plane PL1 and the second write operation for second plane PL2, the sequencer 14 finishes the first stage write, and changes the semiconductor memory 10 to a ready state.

In the twelfth embodiment, an initial value of the program voltage VPGM used in the first stage write may be set higher than an initial value of the program value VPGM used in the second stage write, which will be described later. A step-up width of the program voltage VPGM in the first state of the write may be set wider than a step-up width of the program voltage VPGM in the second stage write.

(Second Stage Write)

FIG. 124 shows an example of commands, and signals and voltages applied to the lines in the second stage write in the semiconductor memory 10 according to the twelfth embodiment. In the second stage write in the twelfth embodiment, the third page write through the sixth page write, for example, are performed in a batch.

Specifically, as shown in FIG. 124, the memory controller 20 transmits a third command set CS3, a fourth command set CS4, a fifth command set CS5, and a sixth command set CS6 to the semiconductor memory 10, in order. The command sets CS3 through CS6 include commands for instructing an operation for the third to sixth pages respectively, and include write data DAT to be written in the third to sixth pages respectively.

After receiving the command sets CS3 to CS5, the semiconductor memory 10 temporarily changes to a busy state, and transfers the received write data DAT to each of the latch circuits in the sense amplifier modules 17A and 17B. The semiconductor memory 10 changes to a busy state after receiving the sixth command set CS6, and the sequencer 14 performs the second stage write.

In FIG. 124, the semiconductor memory 10 temporarily changes to a busy state after receiving command sets CS3, CS4, and CS5; however, the embodiment is not limited to this example. For example, the semiconductor memory 10 may start the second stage write after the third, fourth, fifth, and sixth page data is input, without temporarily changing to a busy state after receiving the command sets CS3, CS4, and CS5.

In the second stage write, the sequencer 14 simultaneously performs internal data load (IDL) to first plane PL1 and second plane PL2 in parallel.

In the IDL to first plane PL1, a read operation using the read voltage LMR is performed, and a result of reading the write data in the first page is retained in, for example, latch circuits in each of the sense amplifier module 17A and 17B.

In the IDL to second plane PL2, a read operation using the read voltage LMR is performed, and a result of reading the write data in the second page is retained in, for example, latch circuits in each of the sense amplifier module 17A and 17B.

When the IDL to first plane PL1 and the IDL to second plane PL2 are finished, the sequencer 14 simultaneously performs a first write operation for first plane PL1 and a second write operation for second plane PL2 in parallel. In each of the first write operation for first plane PL1 and the second write operation for second plane PL2 in the second stage write, write-targeted and write-inhibited memory cell transistors MT are set based on the data allocation shown in FIGS. 105 and 106, and the sequencer 14 performs a program loop.

When the first write operation for first plane PL1 and the second write operation for second plane PL2 are finished, the threshold voltages of the memory cell transistors MT in a cell unit CU selected in first plane PL1, and the threshold voltages of the memory cell transistors MT in a cell unit CU selected in second plane PL2, form eight threshold distributions like those shown in (c) of FIG. 121.

Then, when the sequencer 14 detects the finish of the first write operation for first plane PL1 and the second write operation for second plane PL2, the sequencer 14 finishes the second stage write, and changes the semiconductor memory 10 to a ready state.

The changes in the threshold voltages of the memory cell transistors MT in first plane PL1 and second plane PL2 based on the data retained in the sense amplifier units SAU in the above-described first and second stages write are summarized below.

(1) If "first bit/second bit" data is "11" data:

The threshold voltages of the memory cell transistors MT in first plane PL1 are in the "Z" state after the first stage write, and are set to any of the "Z", "A", "B", and "C" states in accordance with "third bit/fourth bit/fifth bit/sixth bit" data after the second state of the write.

The threshold voltages of the memory cell transistors MT in second plane PL2 are in the "Z" state after the first stage write, and are set to any of the "Z", "A", "B", and "C" states in accordance with "third bit/fourth bit/fifth bit/sixth bit" data after the second state of the write.

(2) If "first bit/second bit" data is "10" data:

The threshold voltages of the memory cell transistors MT in first plane PL1 are in the "Z" state after the first stage write, and are set to any of the "Z", "A", "B", and "C" states in accordance with "third bit/fourth bit/fifth bit/sixth bit" data after the second state of the write.

The threshold voltages of the memory cell transistors MT in second plane PL2 are in the "LM" state after the first stage write, and are set to any of the "D", "E", "F", and "G" states in accordance with "third bit/fourth bit/fifth bit/sixth bit" data after the second state of the write.

(3) If "first bit/second bit" data is "00" data:

The threshold voltages of the memory cell transistors MT in first plane PL1 are in the "LM" state after the first stage write, and are set to any of the "D", "E", "F", and "G" states in accordance with "third bit/fourth bit/fifth bit/sixth bit" data after the second state of the write.

The threshold voltages of the memory cell transistors MT in second plane PL2 are in the "Z" state after the first stage write, and are set to any of the "Z", "A", "B", and "C" states in accordance with "third bit/fourth bit/fifth bit/sixth bit" data after the second state of the write.

(4) If "first bit/second bit" data is "01" data:

The threshold voltages of the memory cell transistors MT in first plane PL1 are in the "LM" state after the first stage write, and are set to any of the "D", "E", "F", and "G" states in accordance with "third bit/fourth bit/fifth bit/sixth bit" data after the second state of the write.

The threshold voltages of the memory cell transistors MT in second plane PL2 are in the "LM" state after the first stage write, and are set to any of the "D", "E", "F", and "G" states in accordance with "third bit/fourth bit/fifth bit/sixth bit" data after the second state of the write.

(Order of Write)

Figure 125:
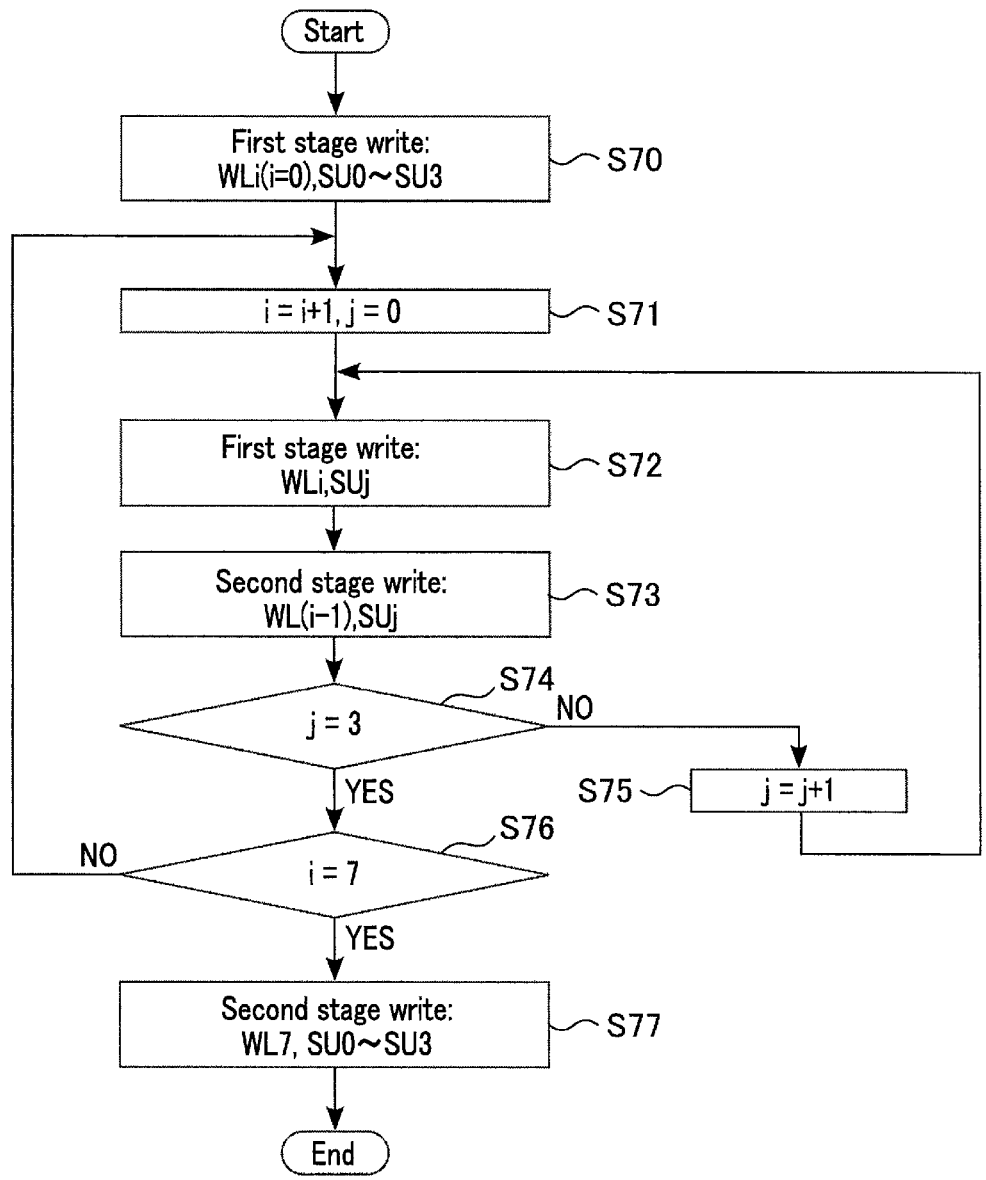
FIG. 125 is a flowchart showing a write operation in a semiconductor memory according to the twelfth embodiment.

FIG. 125 is a flowchart showing an example of a write order in a write operation in the semiconductor memory 10 according to the twelfth embodiment. In the following explanation, variables "i" and "j" will be used for the sake of brevity. The variables "i" and "j" are retained in a counter of the memory counter 20, for example, and are incremented by the control of the memory controller 20.

As shown in FIG. 125, first, the memory controller 20 instructs the semiconductor memory 10 to perform the first stage write in which word line WLi (i=0) is selected and string units SU0 through SU3 are selected in order (step S70). When the first stage write in step S70 is finished, the variable "i" is incremented, and the variable "j" is reset (j=0) (step S71). Then, the memory controller 20 instructs the semiconductor memory 10 to perform the first stage write in which word line WLi is selected and string unit SUj is selected (step S72). Specifically, the semiconductor memory 10 performs the first stage write in which word line WL1 is selected and string unit SU0 is selected.

Next, the memory controller 20 instructs the semiconductor memory 10 to perform the second stage write in which word line WL(i−1) is selected and string unit SUj is selected (step S73). Specifically, the semiconductor memory 10 performs the second stage write in which word line WL0 is selected and string unit SU0 is selected.

If j=3 does not hold true at the time when the second stage write in step S73 is finished (No in step S74), the variable j is incremented (step S75), and the operation in step S72 and thereafter is repeated. If j=3 (Yes, step S74), the value of the variable i is checked (step S76).

If I=7 does not hold true (No in step S76), the process returns to step S61, and after the variable i is incremented and the variable j is reset, the operation in step S62 and thereafter is repeated. If i=7 (Yes in step S76), the memory controller 20 instructs the semiconductor memory 10 to perform the second stage write in which word line WLi (i=7) is selected and string units SU0 through SU3 are selected in order (step S77).

Thus, after the first stage write is performed for the string unit SU corresponding to word line WL0, the semiconductor memory 10 according to the twelfth embodiment alternately performs the first stage write in which word line WL1 is selected and the second stage write in which word line WL0 is selected. This operation is performed for string units SU0 to SU3 in order.

Then, after the second stage write is performed for string unit SU3 corresponding to word line WL0, the semiconductor memory 10 alternately performs the first stage write in which word line WL2 is selected and the second stage write in which word line WL1 is selected. The operation is the same thereafter.

The order of the first stage write and the second stage write as described in the twelfth embodiment is merely an example, and the present embodiment is not limited thereto. At least, the second stage write in which a cell unit CU is selected should be performed after the first stage write in which a cell unit CU adjacent to the selected cell unit is performed.

[12-3] Advantageous Effects of Twelfth Embodiment

With the above-described semiconductor memory 10 according to the present embodiment, reliability of written data can be improved. Hereinafter, the advantageous effects will be described in detail.

In a semiconductor memory, a threshold voltage of a memory cell adjusted to a desired threshold voltage by a write operation may fluctuate after the write operation is performed to the memory cell. For example, there is a phenomenon called an initial fall in which a certain amount of electrons, which are injected into a charge storage layer of a memory cell by a write operation, is drawn out of the charge storage layer and a threshold voltage of the memory cell drops down. An amount of fluctuation in a threshold voltage due to this initial fall is based on an amount of electrons injected into a charge storage layer of a memory cell by a write operation.

If a write operation is performed to a memory cell adjacent to a memory cell in which data has been written, along with a rise of the threshold voltage of the adjacent memory cell, the threshold voltage of the memory cell in which data has already been written also rises. This phenomenon is caused by a change in a parasitic capacitance between the memory cells that are adjacent, and the greater the amount of fluctuation in a threshold voltage in the adjacent memory cell becomes, the greater the amount of fluctuation in a threshold voltage in the memory cell.

Thus, if a threshold voltage of the memory cell due to an initial fall of a threshold distribution, or due to a parasitic capacitance between the memory cells that are adjacent, the threshold distribution of the memory cell may become wider, and the number of error bits in a read operation may increase.

Accordingly, when 6-page data is written by the method explained in the eleventh embodiment, the semiconductor memory 10 according to the present embodiment adopts a two-stage write operation. Specifically, the semiconductor memory 10 writes 2-page data including the first and second bits in the first stage of a write operation (the first stage write), and writes 4-page data including the third through sixth bits in the second stage of the write operation (the second stage write).

In the semiconductor memory 10 according to the present embodiment, the first stage write in which an adjacent word line WL is selected is performed between the first stage and the second stage. Specifically, if the first stage write in which word line WL0 is selected is performed, for example, the first stage write in which adjacent selected word line WL1 is selected is performed, and then the second stage write in which word line WL0 is selected is performed.

In this case, an initial fall occurs in a memory cell corresponding to word line WL0 while the first stage write in which word line WL1 is selected is being performed. Then, the second stage write in which word line WL0 is selected is performed under the influence of a change in a parasitic capacitance between the adjacent memory cells caused by the first stage write in which word line WL1 is selected. As a result, those influences can be ignored in a finally-obtained threshold distribution.

Furthermore, the second stage write corresponds to a write operation performed to a memory cell transistor MT in which a threshold voltage is raised for a certain level as a result of the first stage write. As a result, an amount of fluctuation in the threshold voltage of the memory cell transistor MT due to the second stage write becomes smaller. In other words, an amount of electrons injected into a charge storage layer of the memory cell transistor MT in the second stage write becomes less than an amount of injected electrons in the case of writing data in a batch of 6 bits.

Thus, the semiconductor memory 10 according to the present embodiment can suppress the influence due to the initial fall of a threshold voltage and the influence due to a parasitic capacitance between adjacent memory cells, which both occur after data is written to the memory cells. Accordingly, the semiconductor memory 10 according to the present embodiment can inhibit a widened threshold distribution in a write operation, thereby improving the reliability of written data.

The first stage write in the twelfth embodiment is a write operation using only the first and second page data. Since smaller threshold distributions are formed in the second stage, an approximate forming of the threshold distributions in the first stage will do.

For this reason, the semiconductor memory 10 according to the twelfth embodiment can set an initial value of the program voltage VPGM used in the first stage write and the voltage DVPGM that is stepped up every program loop higher than those voltages in the second stage write. With the setting, the semiconductor memory 10 according to the present embodiment can enhance the speed of the first stage write operation when a two-stage write operation is performed.

In the above-explained example, the first and second page write is performed in the first stage write, and the third to sixth page write is performed in the second stage; however, the number of pages targeted in the first stage and the number of pages targeted in the second stage can be determined as appropriate in the twelfth embodiment.

For example, the semiconductor memory 10 may write the first to third page data in the first stage, and the fourth to sixth page data in the second stage. Even in this case, the semiconductor memory 10 can inhibit a widened threshold distribution in the write operation as explained in the twelfth embodiment, and can improve reliability of the written data.

Furthermore, the semiconductor memory 10 according to the twelfth embodiment may distinguish a state of write for each page by using flag cells, similar to the third embodiment and the fifth embodiment. In this case, the semiconductor memory 10 according to the twelfth embodiment can achieve the same advantageous effects as the third embodiment and the fifth embodiment.

[13] Thirteenth Embodiment

A semiconductor memory 10 according to the thirteenth embodiment includes the same configuration as the semiconductor memory 10 according to the eleventh embodiment, and a read operation is partially omitted by changing the order of the read operation in units of pages as described in the eleventh embodiment in the semiconductor memory 10. In the following, differences of the semiconductor memory 10 according to the thirteenth embodiment from the first to twelfth embodiments will be described.

[13-1] Read Operation

FIG. 126 shows the read order in a read operation in the thirteenth embodiment, and corresponding read voltages. The semiconductor memory 10 according to the thirteenth embodiment reads data in the order of the first page, the second page, the third page, the sixth page, the fifth page, and the fourth page.

In this case, for example, in the first page read and the second page read, the read voltages used in each of first plane PL1 and second plane PL2 are the same. In the second page read and the third page read, the read voltages used in second plane PL2 are the same. In the fourth page read and the fifth page read, the read voltages used in first plane PL1 are the same.

For this reason, the semiconductor memory 10 according to the thirteenth embodiment, similar to the read operation explained in the eighth embodiment, a read using the same read voltages is omitted in read operations for consecutive pages with only a change of the data definitions, thereby enabling the output of appropriate read data. Since the other operations in the semiconductor memory 10 according to the thirteenth embodiment are the same as the read operation as described in the eighth embodiment, a detailed description of the operations is omitted.

[13-2] Advantageous Effects of Thirteenth Embodiment

As described above, the semiconductor memory 10 according to the thirteenth embodiment can omit a read operation as needed, and can thereby reduce consumption power. Specifically, in the example shown in FIG. 126, the same read voltages are used in the first page read and the second page read, for example; therefore, the semiconductor memory 10 according to the thirteenth embodiment can omit an operation of applying a read voltage to a selected word line WLsel in the second page read, and can thereby reduce consumption power.

Furthermore, by changing the order of the pages to be read, the semiconductor memory 10 according to the thirteenth embodiment increases an opportunity of using the same read voltage in read operations in consecutive pages. Thus, the semiconductor memory 10 according to the thirteenth embodiment can increase omittable read operations, and can thereby further reduce consumption power compared to the case where the order of the pages to be read is not changed.

In the thirteenth embodiment, an example where the order of the pages to be read is changed for a data allocation is described; however, a data allocation may be changed. For example, in the data allocation explained with reference to FIGS. 105 and 106 in the eleventh embodiment, corresponding data allocations, data definitions, and read voltages may be interchanged between the fourth page and the sixth page. Even in such a case, the semiconductor memory 10 can increase an opportunity of using the same read voltage in read operations in consecutive pages, thereby reducing consumption power.

The semiconductor memory 10 according to the thirteenth embodiment is also capable of performing a batch read as explained in the ninth embodiment. In other words, a combination of the eighth embodiment with the ninth embodiment is applicable to the semiconductor 10 according to the thirteenth embodiment, and consumption power can be further reduced by omitting a read operation as needed.

[14] Fourteenth Embodiment

A semiconductor memory 10 according to the fourteenth embodiment relates to a method of storing data when redundant blocks are provided in the semiconductor memory 10 according to the first embodiment. In the following, differences of the semiconductor memory 10 according to the fourteenth embodiment from the first to thirteenth embodiments will be described.

[14-1] Configuration of Semiconductor Memory 10

FIG. 127 shows a configuration example of the semiconductor memory 10 according to the fourteenth embodiment, and some of the blocks BLK are taken as examples to represent the blocks BLK included in the memory cell arrays 11A and 11B.

As shown in FIG. 127, the memory cell array 11 according to the fourteenth embodiment is the same as the memory cell array 11 in the first embodiment described with reference to FIG. 1, except for a plurality of redundant blocks BLKRD.

Specifically, each of the memory cell arrays 11A and 11B includes redundant blocks BLKRD0 and BLKRD1. The number of the redundant blocks BLKRD included in each memory cell array 11 is not limited to this example, and the number of the redundant blocks BLKRD can be determined as appropriate. The configuration of the redundant blocks BLKRD is the same as the configuration of the blocks BLK, for example.

In the example shown in FIG. 127, blocks BLK0 through BLK7 in the memory cell array 11A are respectively associated with blocks BLK0 through BLK7 in the memory cell array 11B. This set of blocks BLK will be referred to as a block group BG hereinafter.

As shown in FIG. 127, block groups BG0 through BG7 respectively include block BLK0 through BLK7. A block group BG corresponds to a set for which a read operation and a write operation are performed as described in the first embodiment, for example, and each of block groups BG0 through BG7 stores data of one block BLK.

Redundant blocks BLKRD0 and BLKRD1 in the memory cell array 11A are respectively associated with redundant blocks BLKRD0 and BLKRD1 in the memory cell array 11B. This set of redundant blocks BLKRD is herein referred to as a redundant block group BGR.

As shown in FIG. 127, redundant block groups BGR0 and BGR1 respectively include redundant blocks BLKRD0 and BLKRD1. For the redundant block groups BGR, a read operation and a write operation are performed, similar to the block groups BG. Then, the redundant blocks groups BGR may be used as regions for storing data, instead of block groups BG including blocks BLK registered as a defective block due to a failure, for example.

[14-2] Operation

Figure 128:
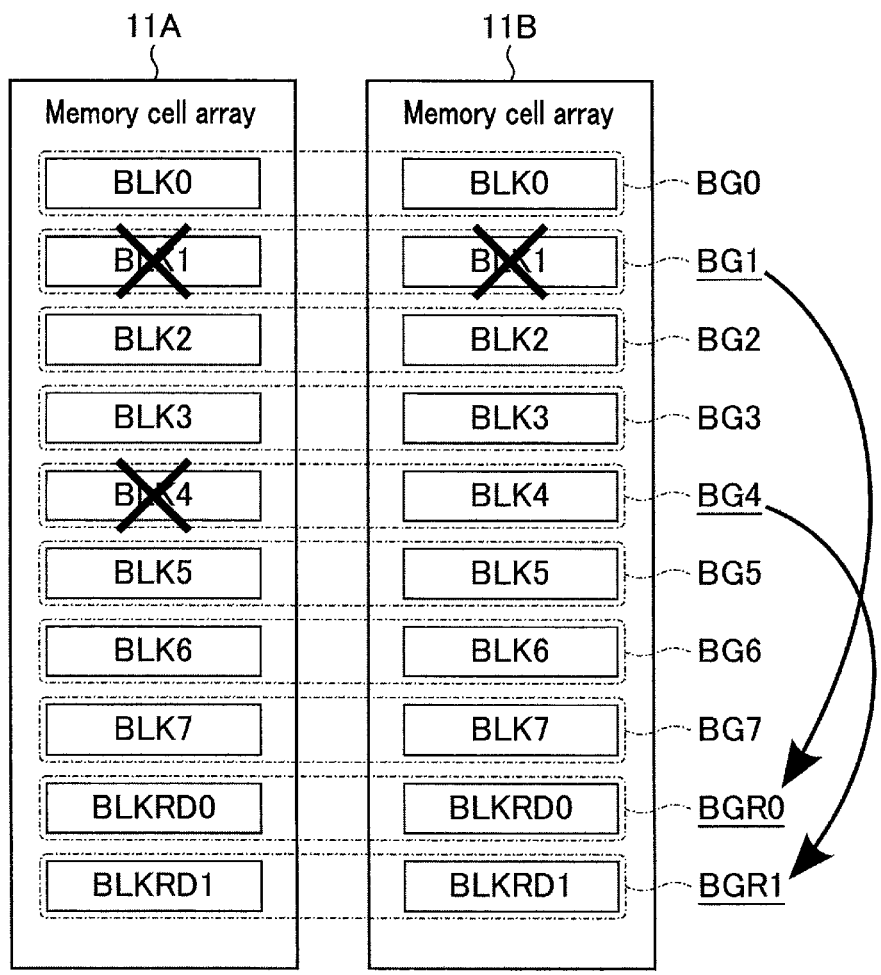

FIG. 128 shows an example of a compensation operation in units of block groups BG performed to a block group BG including a defective block in the semiconductor memory 10 according to the fourteenth embodiment.

In the example shown in FIG. 128, when a failure occurs in each of blocks BLK1 and BLK4 in the memory cell array 11A and block BLK1 in the memory cell array 11B, these blocks BLK are registered as defective blocks. In other words, each of the block groups BG1 and BG4 includes at least one defective block.

In this case, in the semiconductor memory 10 according to the fourteenth embodiment, for example, block group BG1 is replaced with redundant block group BGR0, and block group BG4 is replaced with redundant block group BGR1.

In the semiconductor memory 10 according to the fourteenth embodiment, a redundant block BLKRD provided in each memory cell array 11 may be used to compensate a defective block occurring in each plane, instead of being used as a redundant block group BGR. In other words, the defective blocks registered for each plane may be replaced with redundant blocks BLKRD in a plane where the defective blocks occur, as needed.

FIG. 129 shows an example where defective blocks are remedied within a plane where the defective blocks occur in the semiconductor memory 10 according to the fourteenth embodiment.

In the example shown in FIG. 129, when a failure occurs in each of blocks BLK2 and BLK4 in the memory cell array 11A and block BLK1 in the memory cell array 11B, these blocks BLK are registered as defective blocks.

In this case, in the semiconductor memory 10 according to the fourteenth embodiment, blocks BLK2 and BLK4 in the memory cell array 11A are respectively replaced with redundant blocks BLKRD0 and BLKRD1 in the memory cell array 11A, and block BLK1 in the memory cell array 11B is replaced with redundant block BLKRD1 in the memory cell array 11B.

If the defective blocks are thus remedied, for example, a set of block BLK1 in the memory cell array 11A and redundant block BLKRD0 in the memory cell array 11B functions as block group BG1; a set of redundant block BLKRD0 in the memory cell array 11A and block BLK2 in the memory cell array 11B functions as block group BG2; and a set of redundant block BLKRD1 in the memory cell array 11A and redundant block BLK3 in the memory cell array 11B functions as block group BG4.

As shown in FIG. 129, when defective blocks are remedied as above-explained with reference to FIG. 128 to address a failure occurring in each of blocks BLK2 and BLK4 in the memory cell array 11A and block BLK1 in the memory cell array 11B, there are not enough redundant blocks BGR for compensating the block groups BG including the blocks BLK in which a failure occurs.

Specifically, according to this example, up to only two block groups BG can be remedied in redundant block groups BGR0 and BGR1; accordingly, it becomes difficult to compensate all of blocks BG1, BG2, and BG4 including the blocks BLK in which a failure occurs.

In contrast, in the method of compensating defective blocks explained with reference to FIG. 129, defective blocks registered per plane are appropriately replaced with redundant blocks BLKRD in a plane where the defective blocks occur; therefore, it is possible to improve efficiency in compensating defective blocks compared to the method of compensating defective blocks explained with reference to FIG. 128.

[14-3] Advantageous Effects of Fourteenth Embodiment

As described above, the semiconductor memory 10 according to the fourteenth embodiment can compensate defective blocks occurring therein. Accordingly, the semiconductor memory 10 according to the fourteenth embodiment can improve a storage capacitance thereof.

A combination of blocks in the memory cell arrays 11A and 11B can be other than the one described in the above.

For example, in the configuration of the semiconductor memory 10 shown in FIG. 127, if block BLK0 of the memory cell array 11A is registered as a defective block, blocks BLK1 through BLK7 in the memory cell array 11A may be respectively associated with block BLK0 through BLK6 in the memory cell array 11B, and redundant block BLKRD0 in the memory cell array 11A may be associated with block BLK7 in the memory cell array 11B. A set of blocks BLK for storing data can be thus changed as appropriate.

In a case where three memory cell transistors MT are used to store a plurality of bits as in the sixth embodiment, the semiconductor memory 10 may include a redundant block BLKRD in the memory cell array 11 in each plane.

Even in this case, the semiconductor memory 10 can adopt a method of compensating defective blocks like the one described in the fourteenth embodiment. The semiconductor memory 10 can change the blocks BLK associated between planes as appropriate.

In the example explained with reference to FIG. 128, block BLK4 in the memory cell array 11B corresponding to block group BG4 is a non-defective block. The semiconductor memory 10 according to the fourteenth embodiment may store data in a single block BLK, without using non-defective blocks in a block group BG including such defective blocks as a block group BG.

In this case, the semiconductor memory 10 may use a non-defective block in a block group BG including defective blocks as a single-level cell (SLC) for storing 1-page data per cell unit CU, or as a multi-level cell (MLC) for storing data of two or more pages.

[15] Other Modifications Etc.

A semiconductor memory (for example, 1 in FIG. 1) of the embodiments includes a first memory cell array (for example, 11A in FIG. 1) including a plurality of first memory cells; and a second memory cell array (for example, 11B in FIG. 1) including a plurality of second memory cells. Each of threshold voltages of the first memory cells and the second memory cells is set to any of a first threshold voltage (for example, "Z"-state in FIG. 8), a second threshold voltage (for example, "A"-state in FIG. 8) higher than the first threshold voltage, and a third threshold voltage (for example, "B"-state in FIG. 8) higher than the second threshold voltage. Data of three or more bits including a first bit, a second bit, and a third bit is stored using a combination of a threshold voltage of the first memory cell and a threshold voltage of the second memory cell. Thus, the speed of reading multiple-bit data stored in the memory cells can be enhanced.

In the first to fourteenth embodiments, the examples of the semiconductor memory 10 having two or three memory cell arrays 11 are described; however, the semiconductor memory 10 may have four or more memory cell arrays 11. FIG. 130 shows a semiconductor memory 10 according to the modification of the first modification, and FIG. 131 shows a semiconductor memory 10 according to the modification of the sixth embodiment.

In the modification of the first embodiment shown in FIG. 130, the semiconductor memory 10 has four memory cell arrays 11A, 11B, 11C, and 11D (planes PL1 through PL4). In the modification shown in FIG. 130, plane PL1 and plane PL2 constitute first group GR1, and plane PL3 and plane PL4 constitute second group GR2.

In the present example, each of first group GR1 and second group GR2 is controlled in a manner similar to the control of the set of first plane PL1 and second plane PL2 as explained in, for example, the first embodiment. Thus, the semiconductor memory 10 may have two or more sets of two planes, like the one explained in the first embodiment.

In the modification of the sixth embodiment shown in FIG. 131, the semiconductor memory 10 has six memory cell arrays 11A, 11B, 11C, 11D, 11E, and 11F (planes PL1 through PL6). In the modification shown in FIG. 131, planes PL1 through PL3 constitute first group GR1, planes PL4 through PL6 constitute second group GR2.

In the present example, each of first group GR1 and second group GR2 is controlled in a manner similar to, for example, the control of the group of first to third planes PL1 to PL3 as explained in the sixth embodiment. The semiconductor memory 10 may have two or more groups of three planes, like the one explained in the sixth embodiment, as described herein.

In the foregoing embodiments, "plane" is defined by a set of a memory cell array 11, a row decoder module 16, and a sense amplifier module 17; however, "plane" including at least a memory cell array 11 will do in the embodiments. For example, a row decoder module 16 may be shared by multiple planes, or a sense amplifier module 17 may be shared by multiple planes.

In the read and write operations explained in the foregoing embodiments, operation timing may be different among multiple planes. For example, timing of applying a program voltage VPGM to a selected word line WLsel in a first write operation performed in first plane PL1 and timing of applying a program voltage VPGM to a selected word line WLsel in a second write operation performed in second plane PL2 may be different.

In the write operations described in the foregoing embodiments, when a write process is performed to the memory cell transistors MT in which their threshold voltages have already been raised, the sequencer 14 may perform the write process in the same state again, without setting the memory cell transistors MT to be write-inhibited. Furthermore, the sequencer 14 may perform a verify operation in advance of a first initial loop when performing an operation of writing to a page higher than the first page.

In each of the write operations and the read operations in the foregoing embodiments, a voltage to be applied to a selected word line WLsel is, for example, the same as the voltage of a signal line CG that supplies voltages to the low decoder module 16 from the driver circuit 15. In other words, voltages applied to the lines and a period during which each of the voltages is applied can be roughly known by checking a voltage of a signal line CG corresponding to a line.

To estimate voltages applied to the select gate lines and the word lines, etc. based on the voltages applied to each signal line coupled to the driver circuit 15, a voltage fall due to a transistor TR included in a row decoder RD may be considered. In this case, the voltages applied to each of the select gate lines and the word lines will be lowered for an amount of a voltage fall due to the transistor TR, compared to the voltages applied to the signal lines respectively corresponding to those lines.

In the foregoing embodiments, each of the commands "xxh", "yyh", "zzh", "xyh", "xzh", "yxh", "yzh", and "zyh" used in the explanations may be replaced with a command as appropriate.

In the foregoing embodiments, the examples of using commands "01h" through "06h" as commands for instructing operations corresponding to the first to sixth pages are described; however, the commands used in the embodiments are not limited thereto. For example, those commands may be replaced with other commands, or may be omitted if address information ADD includes page information.

In the present description, the term "coupled" means an electrical coupling, and does not exclude a coupling with an element being interposed in the coupling, for example. In the present description, "off state" refers to a state in which a voltage less than a threshold voltage of a transistor is applied to a gate of the transistor, and does not exclude a state in which a microcurrent, such as a leak current in a transistor, flows in the gate.

The configuration of the memory cell array 11 in the above-described embodiments may be a different configuration. As for the other configurations in the memory cell array 11, they are described in, for example, U.S. patent application Ser. No. 12/407,403 filed on Mar. 19, 2009 and entitled "THREE-DIMENSIONALLY STACKED NON-VOLATILE SEMICONDUCTOR MEMORY", U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF" are applied. The entire contents of these applications are incorporated herein by reference.

In the foregoing embodiments, the memory cell transistors MT provided in the memory cell array 11 are three-dimensionally stacked; however, the embodiments are not limited to this example. For example, the memory cell array 11 may be configured to be a flat NAND flash memory in which memory cell transistors MT are two-dimensionally arranged. Even in this configuration, the above embodiments can be realized, and similar advantageous effects can be achieved.

In the foregoing embodiments, a block BLK does not have to be a unit of erasure. The erase operation other than the one described herein is described in, for example, "NONVOLATILE SEMICONDUCTOR MEMORY DEVICE", which was filed under U.S. patent application Ser. No. 13/235,389 on Sep. 18, 2011, and in "NONVOLATILE SEMICONDUCTOR MEMORY DEVICE", which was filed under U.S. patent application Ser. No. 12/694,690 on Jan. 27, 2010. The entire contents of these applications are incorporated herein by reference.

In the foregoing embodiments, in a write operation, a voltage first applied to an odd-numbered selected word line and a voltage first applied to an even-numbered selected word line may be different. In a write operation, a pass voltage applied to a non-selected word line may be changed depending on whether the non-selected word line is an odd-numbered word line or an even-numbered word line.

The method of writing data per page as described in the second through fifth embodiments is applicable to 4-value write as in the sixth to ninth embodiments, 5-value write as in the tenth embodiment, and 8-value write as in the eleventh through thirteenth embodiments. The method of replacing independent redundant blocks in each plane as explained in the fourteenth embodiment is applicable to any of the first to thirteenth embodiments.

In the foregoing embodiments, the method of reducing the number of times of performing a read by storing multiple-bit data in two or more memory cells is explained; however, an erase operation to a memory cell storing multiple-bit data may be simultaneously performed. In order to do this, a source line SL or a well line in the memory cell array 11 in which a memory cell storing multiple-bit data may be coupled in common. Furthermore, a select gate line SGD or SGS may be controlled by one driver circuit as a common interconnect.

FIG. 132 shows an operation image of transferring initial data in a cell unit CU to the vicinity of an output circuit by using a pipeline as preparation for data output before the semiconductor memory 10 changes to a ready state after performing a read operation.

The example in FIG. 132 shows a pipeline during a read operation by a semiconductor memory 10 having two planes like the one in the first embodiment. Specifically, FIG. 132 shows a pipeline between the sense amplifying module 17A and the logic circuit 18 (output of the sense amplifier 17A), a pipeline between the sense amplifier module 17B and the logic circuit 18 (output of the sense amplifier 17B), and a pipeline between the logic circuit 18 and the output circuit of the semiconductor memory 10 (output of logic circuit 18). The numerals "1" through "9" shown in FIG. 132 indicate data related to first to ninth output data.

As shown in FIG. 132, the semiconductor memory 10 first performs a read operation based on received read command (ReadCMD). In the read operation, a desired read voltage (Read Level) is applied to a selected word line WLsel in each plane. Then, while the read voltage is being applied, the control signal STB is asserted, and a result of the read in the sense amplifier module 17A and 17B is determined.

Thereafter, each of the sense amplifier modules 17A and 17B outputs the result of the initial read ("1") to the logic circuit 18, and the logic circuit 18 which has received these results of the read performs computing on the data. At this time, the sense amplifier module 17A and 17B outputs a result of a next read ("2") to the logic circuit 18. Meanwhile, the semiconductor memory 10 changes to a ready state after the voltage of the word line WLsel drops down to a ground voltage.

The memory controller 20 controls a read enable signal REn based on a change from a busy state to a ready state in the semiconductor memory 10, and the semiconductor memory 10 outputs the read data ("1") determined by the logic circuit 18 to the memory controller 20 based on the change in the read enable signal REn. Along with this operation, the logic circuit 18 receives a result of the next reading ("2") from the sense amplifier modules 17A and 17B, and the sense amplifier modules 17A and 17B output a result of a read after the next ("3") to the logic circuit 18. The subsequent data is processed in a similar manner, and the semiconductor memory 10 sequentially outputs to the memory controller 20 the data that is read from the memory cell array 11 and computed by the logic circuit 18.

The above-described operation is applicable to any of the foregoing embodiments. Furthermore, the operation can be performed by the semiconductor memory 10 having three planes. In this case, an operation to the sense amplifier module 17C that operates in a manner similar to the sense amplifier modules 17A and 17B is added to the operation explained with reference to FIG. 132.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a first memory cell array including a plurality of first memory cells;
a second memory cell array including a plurality of second memory cells; and
a controller, wherein
each of threshold voltages of the first memory cells and the second memory cells is set to any of a first threshold voltage, a second threshold voltage higher than the first threshold voltage, and a third threshold voltage higher than the second threshold voltage,
data of three or more bits including a first bit, a second bit, and a third bit is stored using a combination of a threshold voltage of the first memory cell and a threshold voltage of the second memory cell,
the controller is configured to perform a read operation for one bit data based on the first memory cell and the second memory cell, and
the controller is configured to apply a first read voltage to the first memory cell and a second read voltage to the second memory cell in parallel in the read operation.

2. The memory of claim 1, further comprising:
a first word line coupled to the plurality of first memory cells; and
a second word line coupled to the plurality of second memory cells, wherein
upon reception write data of three pages including the first bit, the second bit, and the third bit, the controller performs a write operation to the plurality of first memory cells and to the plurality of second memory cells based on the three-page write data.

3. The memory of claim 2, wherein
in the write operation, when first data is written into a combination of the first memory cell and the second memory cell, the controller raises the threshold voltage of the first memory cell to the second threshold voltage, and raises the threshold voltage of the second memory cell to the third threshold voltage.

4. The memory of claim 3, wherein
in a read operation to a first page including the first bit, the controller reads data from the plurality of first memory cells and data from the plurality of second memory cells by applying one read voltage to each of the first word line and the second word line, determines read data of the first page based on first read data that is read from the plurality of first memory cells and second read data that is read from the plurality of second memory cells, and outputs the determined read data of the first page to an outside of the controller.

5. The memory of claim 4, wherein
in each of the read operation to the first page, a read operation to a second page including the second bit, and a read operation to a third page including the third bit, the controller applies one of a first read voltage and a second read voltage higher than the first read voltage to each of the first word line and the second word line,
a combination of the read voltages applied by the controller to each of the first word line and the second word line in the read operation to the first page, a combination of the read voltages applied by the controller to each of the first word line and the second word line in the read operation to the second page, and a combination of the read voltages applied by the controller to each of the first word line and the second word line in the read operation to the third page are different from each other.

6. The memory of claim 1, further comprising:
a first word line coupled to the plurality of first memory cells; and
a second word line coupled to the plurality of second memory cells, wherein
upon reception of write data of a first page including the first bit, the controller performs a first page write operation to the plurality of the first memory cells or to the plurality of the second memory cells, based on the received write data of the first page,
upon reception of write data of a second page including the second bit, the controller performs a second page write operation to the other of the plurality of the first memory cells and the plurality of the second memory cells, based on the received write data of the second page,
upon reception of write data to third page including the third bit, the controller reads data of the first page written in the plurality of first memory cells or in the plurality of second memory cells, reads data of the second page written in the plurality of first memory cells or in the plurality of second memory cells, and performs a third page write operation to the plurality of the first memory cells and to the plurality of second memory cells, based on the read data of the first page, the read data of the second page, and the received write data of the third page.

7. The memory of claim 6, wherein
in the first page read operation before data of the third page is written, the controller reads data from the plurality of first memory cells or from the plurality of second memory cells by applying one read voltage to the first word line or the second word line, and outputs the data that is read from the plurality of first memory cells or the plurality of second memory cells to an outside of the controller as read data of the first page,
in the first page read operation after data of the third page is written, the controller reads data from the plurality of first memory cells and data from the plurality of second memory cells by applying one read voltage to each of the first word line and the second word line, determines read data of the first page based on first read data that is read from the plurality of first memory cells and second read data that is read from the plurality of second memory cells, and outputs the determined read data of the first page to an outside of the controller.

8. The memory of claim 6, wherein
the plurality of first memory cells and the plurality of second memory cells include a flag cell,
in the third page write operation, the controller raises a threshold voltage of the flag cell to the second threshold voltage or to the third threshold voltage,
in a read operation to the first page,
the controller reads data from the plurality of first memory cells, the plurality of second memory cells, and the flag cell by applying one read voltage to each of the first word line and the second word line,
if the data that is read from the flag cell is first data, the controller outputs the data that is read from the plurality of first memory cells or the plurality of second memory cells, to an outside of the controller as read data of the first page,
if the data that is read from the flag cell is second data that is different from the first data, the controller determines read data of the first page based on first read data that is read from the plurality of first memory cells and second read data that is read from the plurality of second memory cells, and outputs the determined read data of the first page to an outside of the controller.

9. The memory of claim 8, wherein
the plurality of first memory cells and the plurality of second memory cells include a plurality of flag cells,
in a read operation to the first page, the controller determines data that is read from the plurality of flag cells by taking a majority vote or performing error correction on the data that is read from the flag cells.

10. The memory of claim 1, further comprising:
a first word line coupled to the plurality of first memory cells; and
a second word line coupled to the plurality of second memory cells, wherein
   upon reception of write data of a first page including the first bit, the controller performs a first page write operation to the plurality of the first memory cells and the plurality of the second memory cells based on the received write data of the first page,
   upon reception of write data of a second page including the second bit, the controller reads data of the first page written in the plurality of first memory cells and data of the first page written in the plurality of second memory cells, performs a second page write operation to the plurality of first memory cells based on the data of the first page that is read from the first memory cells and the received write data of the second page, and performs a second page write operation to the plurality of second memory cells based on the data of the first page that is read from the plurality of second memory cells and the received write data of the second page,
   upon reception of write data of a third page including the third bit, the controller reads data of the first page and data of the second page written in the plurality of first memory cells, and data of the first page and data of the second page written in the plurality of second memory cells, performs a third page write operation to the plurality of first memory cells based on the data of the first page and the data of the second page that are read from the first memory cells and the received write data of the third page, and performs a third page write operation to the plurality of second memory cells based on the data of the first page and the data of the second page that are read from the plurality of second memory cells and the received write data of the third page.

11. The memory of claim 10, wherein
in a read operation to the first page before data of the second page is written, the controller reads data from the plurality of first memory cells or the plurality of second memory cells by applying one read voltage to the first word line or the second word line, and outputs the data that is read from the plurality of first memory cells or the plurality of second memory cells to an outside of the controller as read data of the first page,
in a read operation to the first page after data of the second page is written and before data of the third page is written, the controller reads data from the plurality of first memory cells or the plurality of second memory cells by applying one read voltage to the first word line or the second word line, and outputs the data that is read from the plurality of first memory cells or the plurality of second memory cells to an outside of the controller as read data of the first page,
in a read operation to the first page after data of the third page is written, the controller reads data from the plurality of first memory cells and data from the plurality of second memory cells by applying one read voltage to each of the first word line and the second word line, determines read data of the first page based on first read data that is read from the plurality of first memory cells and second read data that is read from the plurality of second memory cells, and outputs the determined read data of the first page to an outside of the controller.

12. The memory of claim 11, wherein
the plurality of first memory cells and the plurality of second memory cells include a first flag cell and a second flag cell,
the controller
   raises a threshold voltage of the first flag cell to the second threshold voltage or to the third threshold voltage in the second page write operation,
   raises a threshold voltage of the second flag cell to the second threshold voltage or to the third threshold voltage in the third page write operation,
in the first page read operation,
   the controller reads data from the plurality of first memory cells, the plurality of second memory cells, the first flag cell, and the second flag cell by applying one read voltage to the first word line and the second word line,
   if the data that is read from the first flag cell is first data, the controller outputs the data that is read from the plurality of first memory cells or from the plurality of second memory cells, to an outside of the controller as read data of the first page,
   if the data that is read from the first flag cell is second data that is different from the first data and if the data that is read from the second flag cell is third data, the controller outputs the data that is read from the plurality of first memory cells or from the plurality of second memory cells, to an outside of the controller as read data of the first page,
   if the data that is read from the second flag cell is fourth data that is different from the third data, the controller determines read data of the first page based on first read data that is read from the plurality of first memory cells and second read data that is read from the plurality of second memory cells, and outputs the determined read data of the first page to an outside of the controller.

13. The memory of claim 12, wherein
the plurality of first memory cells and the plurality of second memory cells include a plurality of first flag cells and a plurality of second flag cells,
in a read operation to the first page, the controller determines data that is read from the first flag cells and data that is read from the second flag cells by taking a majority vote or performing error correction to the data that is read from the plurality of first flag cells and the data that is read from the plurality of second flag cells.

14. The memory of claim 6, wherein
in each of a read operation to the first page, a read operation to the second page, and a read operation to the third page after data of the third page is written, the controller applies one of a first read voltage and a second read voltage higher than the first read voltage to each of the first word line and the second word line, a combination of the read voltages applied by the controller to each of the first word line and the second word line in the read operation to the first page, a combination of the read voltages applied by the controller to each of the first word line and the second word line in the read operation to the second page, and a combination of the read voltages applied by the controller to each of the first word line and the second word line in the read operation to the third page are different from each other.

15. A semiconductor memory comprising:
a first memory cell array including a plurality of first memory cells;
a second memory cell array including a plurality of second memory cells;
a third memory cell array including a plurality of third memory cells; and
a controller, wherein
each of threshold voltages of the first memory cells, the second memory cells, and the third memory cells is set to any of a first threshold voltage, a second threshold voltage higher than the first threshold voltage, a third threshold voltage higher than the second threshold voltage, and a fourth threshold voltage higher than the third threshold voltage,
data of six or more bits including a first bit, a second bit, a third bit, a fourth bit, a fifth bit, and a sixth bit is stored using a combination of a threshold voltage of the first memory cell, a threshold voltage of the second memory cell, and a threshold voltage of the third memory cell,
the controller is configured to perform a read operation for one bit data based on the first memory cell, the second memory cell, and the third memory cell, and
the controller apply a first read voltage to the first memory cell, a second read voltage to the second memory cell, and a third read voltage to the third memory cell in parallel in the read operation.

16. The memory of claim 15, further comprising:
a first word line coupled to the plurality of first memory cells;
a second word line coupled to the plurality of second memory cells; and
a third word line coupled to the plurality of third memory cells, wherein
upon reception write data of six pages including the first bit, the second bit, the third bit, the fourth bit, the fifth bit, and the sixth bit, the controller performs a write operation to the plurality of first memory cells, the plurality of second memory cells, and the plurality of third memory cells, based on the six-page write data.

17. The memory of claim 16, wherein
in a read operation to a first page including the first bit, the controller reads data from the plurality of first memory cells, from the plurality of second memory cells, and from the plurality of third memory cells by applying one read voltage to each of the first word line, the second word line, and the third word line, determines read data of the first page based on first read data that is read from the plurality of first memory cells, second read data that is read from the plurality of second memory cells, and third read data that is read from the plurality of third memory cells, and outputs the determined read data of the first page to an outside of the controller.

18. A semiconductor memory comprising:
a first memory cell array including a plurality of first memory cells; and
a second memory cell array including a plurality of second memory cells, wherein
each of threshold voltages of the first memory cells and the second memory cells is set to be any of a first threshold voltage, a second threshold voltage higher than the first threshold voltage, a third threshold voltage higher than the second threshold voltage, a fourth threshold voltage higher than the third threshold voltage, a fifth threshold voltage higher than the fourth threshold voltage, a sixth threshold voltage higher than the fifth threshold voltage, a seventh threshold voltage higher than the sixth threshold voltage, and an eighth threshold voltage higher than the seventh threshold voltage,
data of six or more bits including a first bit, a second bit, a third bit, a fourth bit, a fifth bit, and a sixth bit is stored using a combination of a threshold voltage of the first memory cell and a threshold voltage of the second memory cell.

19. The memory of claim 18, further comprising:
a first word line coupled to the plurality of first memory cells; and
a second word line coupled to the plurality of second memory cells; and
a controller, wherein
upon reception write data of six pages including the first bit, the second bit, the third bit, the fourth bit, the fifth bit, and the sixth bit, the controller performs a write operation to the plurality of first memory cells and the plurality of second memory cells, based on the six-page write data.

20. The memory of claim 19, wherein
in a read operation to a first page including the first bit, the controller reads data from the plurality of first memory cells and from the plurality of second memory cells by applying one read voltage to each of the first word line and the second word line, determines read data of the first page based on first read data that is read from the plurality of first memory cells and second read data that is read from the plurality of second memory cells, and outputs the determined read data of the first page to an outside of the controller,
in a read operation to a third page including the third bit, the controller reads data from the plurality of first memory cells and from the plurality of second memory cells by applying two read voltages to each of the first word line and the second word line, determines read data of the third page based on third read data that is read from the plurality of first memory cells and fourth read data that is read from the plurality of second memory cells, and outputs the determined read data of the third page to an outside of the controller.

21. The memory of claim 1, further comprising:
a first sense amplifier configured to read data stored in the first memory cell array;
a second sense amplifier configured to read data stored in the second memory cell array; and
a logic circuit configured to determine read data based on read results with the first sense amplifier and the second sense amplifier.

* * * * *